United States Patent
Man et al.

(10) Patent No.: US 11,575,376 B2
(45) Date of Patent: Feb. 7, 2023

(54) NON-DISSIPATIVE ELEMENT-ENABLED CAPACITIVE ELEMENT DRIVING

(71) Applicant: Neolith LLC, Lexington, MA (US)

(72) Inventors: Tsz Yin Man, Shatin (HK); Chi Fan Yung, Ma on Shan (HK); Bruce C. Larson, Lexington, MA (US)

(73) Assignee: NEOLITH LLC, Tampa, FL (US)

( * ) Notice: Subject to any disclaimer, the term of this patent is extended or adjusted under 35 U.S.C. 154(b) by 0 days.

(21) Appl. No.: 17/032,409

(22) Filed: Sep. 25, 2020

(65) Prior Publication Data

US 2021/0099171 A1    Apr. 1, 2021

Related U.S. Application Data

(60) Provisional application No. 62/907,530, filed on Sep. 27, 2019, provisional application No. 63/075,083, filed on Sep. 4, 2020, provisional application No. 63/082,556, filed on Sep. 24, 2020.

(51) Int. Cl.
    *H03K 17/687* (2006.01)
(52) U.S. Cl.
    CPC .............................. *H03K 17/6871* (2013.01)
(58) Field of Classification Search
    CPC .................................................. H03K 17/6871
    See application file for complete search history.

(56) References Cited

U.S. PATENT DOCUMENTS

| | | | |
|---|---|---|---|
| 4,857,863 A | 8/1989 | Ganger | |
| 5,825,230 A | 10/1998 | Chen | |
| 7,728,651 B2 | 6/2010 | Nakai | |
| 7,808,285 B2 | 10/2010 | Sun | |
| 7,880,515 B2 | 2/2011 | Kitazawa | |
| 8,228,097 B2 | 7/2012 | Liao | |

(Continued)

FOREIGN PATENT DOCUMENTS

| | | |
|---|---|---|
| WO | 2015107498 | 7/2015 |
| WO | WO-2020119817 A1 * | 6/2020 |

OTHER PUBLICATIONS

WIPO/PCT International Search Report for Appln: PCT/US20/052672, filed Sep. 25, 2020; dated Dec. 21, 2020, ISA/US (18 pp.).

(Continued)

*Primary Examiner* — Metasebia T Retebo
(74) *Attorney, Agent, or Firm* — Maura K. Moran; Cambridge Technology Law LLC

(57) ABSTRACT

A circuit for driving the voltage of a capacitive element between two voltage levels has at least one driver cell with a first pair of switches connected in series between a first terminal of a voltage source and the capacitive element, and a second pair of switches connected in series between a second terminal of the voltage source and the capacitive element. One or more non-dissipative elements may be connected between the common node of the first pair of switches and the common node of the second pair of switches. Combinations of switches from the driver cells may be activated and deactivated in a defined sequence to provide step-wise transfer of energy to the capacitive element. In one sequence, switches in a selected driver cell may subtract a specified voltage from an input voltage, bypass the selected driver cell, and add the specified voltage to the input voltage.

67 Claims, 54 Drawing Sheets

(56) References Cited

U.S. PATENT DOCUMENTS

| | | |
|---|---|---|
| 9,601,088 B2 | 3/2017 | Hashimoto |
| 2002/0033644 A1 | 3/2002 | Takamura |
| 2014/0267210 A1 | 9/2014 | Todorovich et al. |
| 2014/0333327 A1 | 11/2014 | Baruch |
| 2015/0200593 A1 | 7/2015 | Stoichita et al. |

OTHER PUBLICATIONS

Svensson, Koller. Driving a Capacitative Load without Dissipating fCV 2, 1994 IEEE Symposium on Low Power Electronics, Digest of Tech., 1994, 10.3, 100-101, IEEE, USA (2 pp).

Choi, Kwon. Stepwise data driving method and circuits for low-power TFT-LCDs, IEEE Transactions on Consumer Electronics, Nov. 2000, 46(4), 1155-1160, IEEE, USA (6 pp).

\* cited by examiner

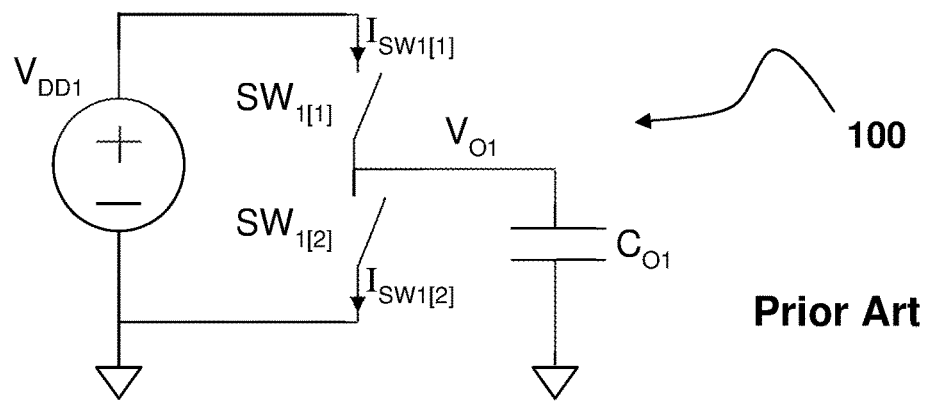
FIG. 1A
Prior Art
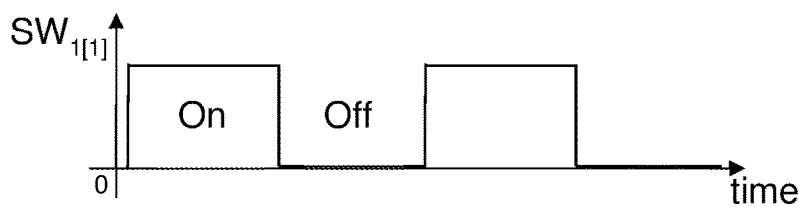
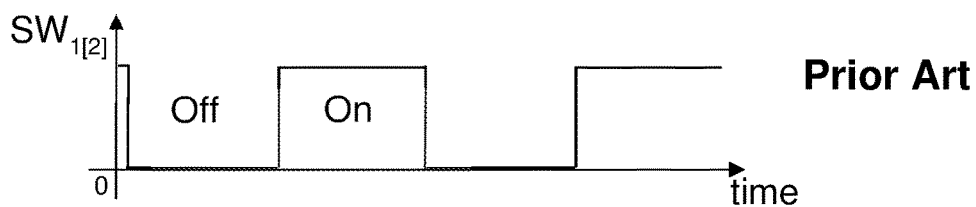
FIG. 1B
Prior Art
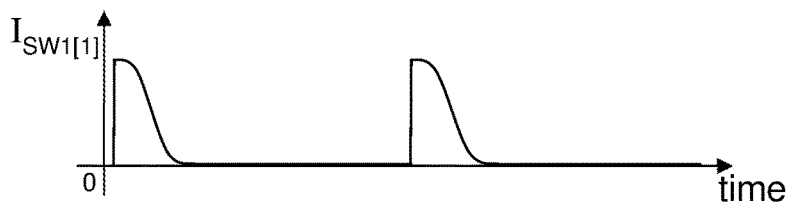
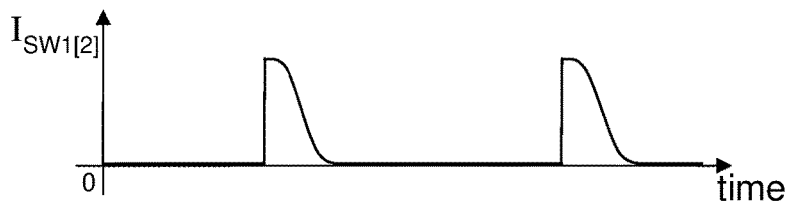
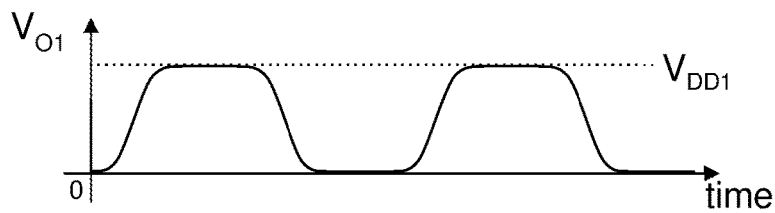

Prior Art

Prior Art

Stage 501(1)

Stage 501(2)

Stage 501(3)

Stage 501(4)

Stage 501(5)

Stage 501(6)

FIG. 5G
| STAGE | SW$_{4[0]}$ | SW$_{4[1]}$ | SW$_{4[2]}$ | SW$_{4[3]}$ | Drive V$_{O4}$ to: |
|---|---|---|---|---|---|
| 501(1) | Closed | Closed | | | Ground |
| 501(2) | Closed | | Closed | | V$_{CS4}$ |
| 501(3) | | Closed | | Closed | V$_{DD4}$ - V$_{CS4}$ |
| 501(4) | | | Closed | Closed | V$_{DD4}$ |
| 501(5) | | Closed | | Closed | V$_{DD4}$ - V$_{CS4}$ |
| 501(6) | Closed | | Closed | | V$_{CS4}$ |
| 501(1) | Closed | Closed | | | Ground |
410 spans SW$_{4[0]}$ and SW$_{4[1]}$; 420 spans SW$_{4[2]}$ and SW$_{4[3]}$.
Switching Sequence for Circuit 400
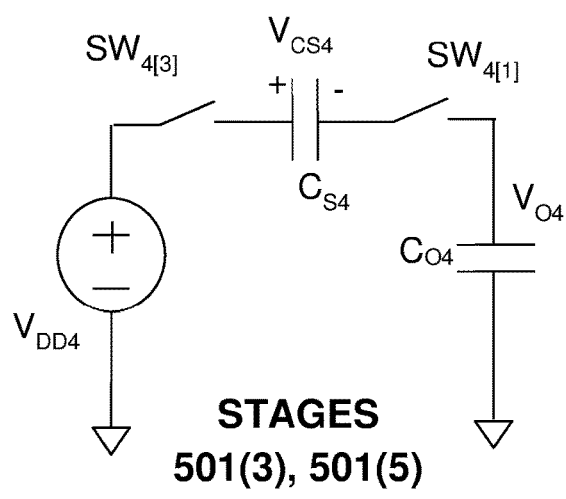
FIG. 5H
STAGES 501(3), 501(5)
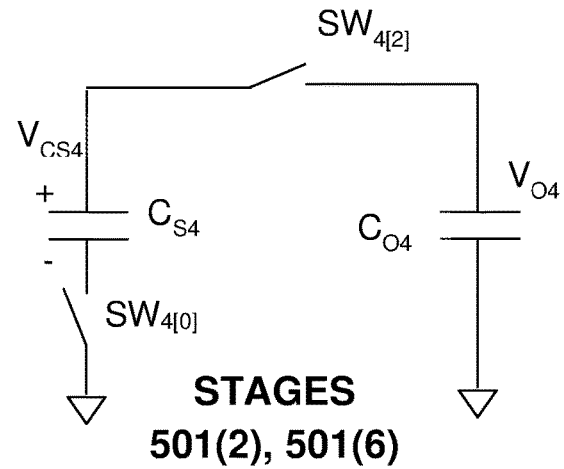
FIG. 5I
STAGES 501(2), 501(6)

FIG. 8B

Chart 850: Switching Sequence –
Circuit 700: General Case

| STAGE 801(z); z= | SW7A [0] | [1] | [2] | [3] | ... | [n-1] | [n] | [n+1] | [n+2] | Drive $V_{O7A}$ to: |
|---|---|---|---|---|---|---|---|---|---|---|
| 1 | C | C | | | | | | | | Ground |
| 2 | C | | C | | | | | | | $V_{CS7A[1]}$ |
| 3 | C | | | C | | | | | | $\sum_{i=1}^{2} V_{CS7A[i]}$ |
| ... | C | | | | | | | | | ... |
| n | C | | | | | | C | | | $\sum_{i=1}^{n-1} V_{CS7A[i]}$ |
| n+1 | C | | | | | | | C | | $\sum_{i=1}^{n} V_{CS7A[i]}$ |
| n+2 | | C | | | | | | | C | $V_{DD7A} - \sum_{j=1}^{n} V_{CS7A[j]}$ |
| n+3 | | | C | | | | | | C | $V_{DD7A} - \sum_{j=2}^{n} V_{CS7A[j]}$ |
| ... | | | | | | | | | C | ... |
| 2n+1 | | | | | | | C | | C | $V_{DD7A} - V_{CS7A[n]}$ |
| 2n+2 | | | | | | | | C | C | $V_{DD7A}$ |
| 2n+3 | | | | | | | C | | C | $V_{DD7A} - V_{CS7A[n]}$ |
| 2n+4 | | | | | | C | | | C | $V_{DD7A} - \sum_{j=n-1}^{n} V_{CS7A[j]}$ |
| ... | | | | | | | | | C | ... |
| 3n+2 | | C | | | | | | | C | $V_{DD7A} - \sum_{j=1}^{n} V_{CS7A[j]}$ |
| 3n+3 | C | | | | | | | C | | $\sum_{i=1}^{n} V_{CS7A[i]}$ |
| 3n+4 | C | | | | | | C | | | $\sum_{i=1}^{n-1} V_{CS7A[i]}$ |
| 3n+5 | C | | | | C | | | | | $\sum_{i=1}^{n-2} V_{CS7A[i]}$ |
| ... | C | | | | | | | | | ... |
| 4n+2 | C | | C | | | | | | | $V_{CS7A[1]}$ |
| 1 | C | C | | | | | | | | Ground |

FIG. 8C

Chart 880: Switching Sequence - Circuit 780 (3 $C_{S7B[w]}$; 6 $SW_{7B[w]}$)

| STAGES 801(z) | | $SW_{7B[w]}$ Closed ; w = | | | | | | Drive $V_{O7B}$ to: |
|---|---|---|---|---|---|---|---|---|
| Sequence | z= | [0] | [1] | [2] | [3] | [4] | [5] | |
| 811: $SW_{7B[0]}$ closed; $SW_{7B[1]}$ closed | 1 | C | C | | | | | Ground |
| 812: $SW_{7B[0]}$ closed; $SW_{7B[2]}$ - $SW_{7B[4]}$ closed sequentially | 2 | C | | C | | | | $V_{CS7B[1]}$ |
| | 3 | C | | | C | | | $\sum_{i=1}^{2} V_{CS7B[i]}$ |
| | 4 | C | | | | C | | $\sum_{i=1}^{3} V_{CS7B[i]}$ |
| 821: $SW_{7B[5]}$ closed; $SW_{7B[1]}$ - $SW_{7B[3]}$ closed sequentially | 5 | | C | | | | C | $V_{DD7B} - \sum_{j=1}^{3} V_{CS7B[j]}$ |
| | 6 | | | C | | | C | $V_{DD7B} - \sum_{j=2}^{3} V_{CS7B[j]}$ |
| | 7 | | | | C | | C | $V_{DD7B} - V_{CS7B[3]}$ |
| 822: $SW_{7B[5]}$ closed; $SW_{7B[4]}$ closed | 8 | | | | | C | C | $V_{DD7B}$ |
| 823: $SW_{7B[5]}$ closed; $SW_{7B[3]}$ to $SW_{7B[1]}$ closed sequentially | 9 | | | | C | | C | $V_{DD7B} - V_{CS7B[3]}$ |
| | 10 | | | C | | | C | $V_{DD7B} - \sum_{k=2}^{3} V_{CS7B[k]}$ |
| | 11 | | C | | | | C | $V_{DD7B} - \sum_{k=1}^{3} V_{CS7B[k]}$ |
| 830 (3rd phase): $SW_{7B[0]}$ closed; $SW_{7B[4]}$ to $SW_{7B[2]}$ closed sequentially | 12 | C | | | | C | | $\sum_{i=1}^{3} V_{CS7B[i]}$ |
| | 13 | C | | | C | | | $\sum_{i=1}^{2} V_{CS7B[i]}$ |
| | 14 | C | | C | | | | $V_{CS7B[1]}$ |
| 840: 4th phase $SW_{7B[0]}$ closed; $SW_{7B[1]}$ closed | 1 | C | C | | | | | Ground |

STAGE 2201[1]

STAGE 2201[2] (and STAGE 2201[18])

STAGE 2201[3] (and STAGE 2201[17])

STAGE 2201[4] (and STAGE 2201[16])

STAGE 2201[5] (and STAGE 2201[15])

STAGE 2201[6] and (and STAGE 2201[14])

STAGE 2201[7] (and STAGE 2201[13])

STAGE 2201[8] (and STAGE 2201[12])

STAGE 2201[9] (and STAGE 2201[11])

STAGE 2201[10]

FIG. 22K

| STAGE 2201(z): z = | SW[u] in Cell 2101-1: [u] = | | | | SW[u] in Cell 2101-2; [u] = | | | | Drive $V_{O21}$ to: |
|---|---|---|---|---|---|---|---|---|---|
| | [0] | [1] | [2] | [3] | [0] | [1] | [2] | [3] | |
| 1 | C | C | | | C | C | | | Ground |
| 2 | C | C | | | C | | C | | $V_{CS21[2]}$ |
| 3 | C | | C | | | C | | C | $2(V_{CS21[2]})$ |
| 4 | C | | C | | | | C | C | $3(V_{CS21[2]})$ |
| 5 | C | | C | | C | | C | | $4(V_{CS21[2]})$ |
| 6 | | C | | C | C | | C | | $5(V_{CS21[2]})$ |
| 7 | | C | | C | | | C | C | $6(V_{CS21[2]})$ |
| 8 | | C | | C | C | | C | | $7(V_{CS21[2]})$ |
| 9 | | | C | C | | C | | C | $8(V_{CS21[2]})$ |
| 10 | | | C | C | | | C | C | $9(V_{CS21[2]}) = V_{DD21}$ |
| 11 | | | C | C | | C | | C | $8(V_{CS21[2]})$ |
| 12 | | C | | C | C | | C | | $7(V_{CS21[2]})$ |
| 13 | | C | | C | | | C | C | $6(V_{CS21[2]})$ |
| 14 | | C | | C | C | | C | | $5(V_{CS21[2]})$ |
| 15 | C | | C | | C | | C | | $4(V_{CS21[2]})$ |
| 16 | C | | C | | | | C | C | $3(V_{CS21[2]})$ |
| 17 | C | | C | | | C | | C | $2(V_{CS21[2]})$ |
| 18 | C | C | | | C | | C | | $V_{CS21[2]}$ |

FIG. 22L-1

| Closed switch set | VOLTAGE ASSIGNMENT FUNCTIONALITY 2001-1: Cell x with 4 switches, 1 non-dissipative element, input voltage $V_{In[x]}$, and output voltage $V_{Out[x]}$ | |
|---|---|---|
| | Function | Key |
| (SW[0], SW[1]) | $V_{Out[x]} = V_{In[x]}$   (pass-through or by-pass) | b |
| (SW[0], SW[2]) | $V_{Out[x]} = V_{In[x]} + V[x]$ | + |
| (SW[1], SW[3]) | $V_{Out[x]} = V_{In[x]} - V[x]$ | - |
| (SW[2], SW[3]) | $V_{Out[x]} = V_{In[x]}$   (pass-through or bypass) | b |

FIG. 22L-2

| Closed switch set | VOLTAGE ASSIGNMENT FUNCTIONALITY 2001-2: Cell y with 5 switches, 2 non-dissipative elements, input voltage $V_{In[y]}$, and output voltage $V_{Out[y]}$ | |
|---|---|---|
| | Function | Key |
| (SW[0], SW[1]) | $V_{Out[y]} = V_{In[y]}$   (pass-through or bypass) | b |
| (SW[0], SW[2]) | $V_{Out[y]} = V_{In[y]} + V[y]$ | + |
| (SW[0], SW[3]) | $V_{Out[y]} = V_{In[y]} + 2V[y]$ | 2+ |
| (SW[1], SW[4]) | $V_{Out[y]} = V_{In[y]} - 2V[y]$ | 2- |
| (SW[2], SW[4]) | $V_{Out[y]} = V_{In[y]} - V[y]$ | - |
| (SW[3], SW[4]) | $V_{Out[y]} = V_{In[y]}$   (pass-through or bypass) | b |

FIG. 22L-3

| Closed switch set | Function | Key |
|---|---|---|
| VOLTAGE ASSIGNMENT FUNCTIONALITY 2001-q: Cell k with q+3 switches, q non-dissipative elements, input voltage $V_{In[k]}$, and output voltage $V_{Out[k]}$ | | |
| (SW[0], SW[1]) | $V_{Out[k]} = V_{In[k]}$ (pass-through or by-pass) | b |
| (SW[0], SW[2]) | $V_{Out[k]} = V_{In[k]} + V[k]$ | + |
| (SW[0], SW[3]) | $V_{Out[k]} = V_{In[k]} + 2V[k]$ | 2+ |
| . . . | | |
| (SW[0], SW[q]) | $V_{Out[k]} = V_{In[k]} + (q-1)(V[k])$ | (q-1)+ |
| (SW[0], SW[q+1]) | $V_{Out[k]} = V_{In[k]} + qV[k]$ | q+ |
| (SW[1], SW[q+2]) | $V_{Out[k]} = V_{In[k]} - qV[k]$ | q- |
| (SW[2], SW[q+2]) | $V_{Out[k]} = V_{In[k]} - (q-1)(V[k])$ | (q-1)- |
| . . . | | |
| (SW[q-1], SW[q+2]) | $V_{Out[k]} = V_{In[k]} - 2V[k]$ | 2- |
| (SW[q], SW[q+2]) | $V_{Out[k]} = V_{In[k]} - V[k]$ | - |
| (SW[q+1], SW[q+2]) | $V_{Out[k]} = V_{In[k]}$ (pass-through or by-pass) | b |

| STAGE 2201(z): z = | Switch set in Cell 2101-1 | Switch set in Cell 2101-2 | Drive $V_{O21}$ to: |
|---|---|---|---|
| 1 | [0], [1] | [0], [1] | Ground |
| 2, 18 | [0], [1] | [0], [2] | $= V_{CS21[2]}$ |
| 3, 17 | [0], [2] | [1], [3] | $V_{CS21[1]} - V_{CS21[2]} = 2V_{CS21[2]}$ |
| 4, 16 | [0], [2] | [2], [3] | $V_{CS21[1]} = 3V_{CS21[2]}$ |
| 5, 15 | [0], [2] | [0], [2] | $V_{CS21[1]} + V_{CS21[2]} = 4V_{CS21[2]}$ |
| 6, 14 | [1], [3] | [1], [3] | $V_{DD21} - V_{CS21[1]} - V_{CS21[2]} = 5V_{CS21[2]}$ |
| 7, 13 | [1], [3] | [2], [3] | $V_{DD21} - V_{CS21[1]} = 6V_{CS21[2]}$ |
| 8, 12 | [1], [3] | [0], [2] | $V_{DD21} - V_{CS21[1]} + V_{CS21[2]} = 7V_{CS21[2]}$ |
| 9, 11 | [2], [3] | [1], [3] | $V_{DD21} - V_{CS21[2]} = 8V_{CS21[2]}$ |
| 10 | [2], [3] | [2], [3] | $V_{DD21} = 9V_{CS21[2]}$ |

SWITCHING SEQUENCE METHODOLOGY 2200

2207  2204  2203-1*
            2203-2**

KEY:
\* For Stages 2201(1) to 2201(9)
\*\* For Stages 2201(11) to 2201(18), and to 2201(1)

FIG. 22M-2A1

SWITCHING SEQUENCE METHODOLOGY 2220

- Driving circuit [wxy], Cell [w], Cell [x], Cell [y] each with 1 non-dissipative element, 4 switches    $V_{DD[wxy]} = 3V[w] = 9V[x] = 27V[y]$

| STAGE 2221(z): | SW in Cell [w] | SW in Cell [x] | SW in Cell [y] | Drive $V_{O[wxy]}$ to: 2205-1*, 2205-2** | | | |
|---|---|---|---|---|---|---|---|
| 1 | [0], [1] | [0], [1] | [0], [1] | 2202-1*, 2202-2** | | | Ground |
| 2, 54 | [0], [1] | [0], [1] | [0], [2] | 2203-1*, 2203-2** | V[y] | = | V[y] |
| 3, 53 | [0], [1] | [0], [2] | [1], [3] | | V[x] − V[y] | = | 2V[y] |
| 4, 52 | [0], [1] | [0], [2] | [2], [3] | | V[x] | = | 3V[y] |
| 5, 51 | [0], [1] | [0], [2] | [0], [2] | 2228-1* | V[x] + V[y] | = | 4V[y] |
| 6, 50 | [0], [2] | [1], [3] | [1], [3] | 2226-1* V[w]− V[x] | − V[y] | = | 5V[y] |
| 7, 49 | [0], [2] | [1], [3] | [2], [3] | 2226-2** V[w]− V[x] | | = | 6V[y] |
| 8, 48 | [0], [2] | [1], [3] | [0], [2] | V[w] − V[x] | + V[y] | = | 7V[y] |
| 9, 47 | [0], [2] | [2], [3] | [1], [3] | V[w] | − V[y] | = | 8V[y] |
| 10, 46 | [0], [2] | [0], [1] | [0], [1] | V[w] | | = | 9V[y] |
| 11, 45 | [0], [2] | [0], [1] | [0], [2] | V[w] | + V[y] | = | 10V[y] |
| 12, 44 | [0], [2] | [0], [2] | [1], [3] | V[w] + V[x] | − V[y] | = | 11V[y] |
| 13, 43 | [0], [2] | [0], [2] | [2], [3] | 2228-2** V[w]+ V[x] | | = | 12V[y] |
| 14, 42 | [0], [2] | [0], [2] | [0], [2] | V[w] + V[x] | + V[y] | = | 13V[y] |
| 15, 41 | [1], [3] | [1], [3] | [1], [3] | $V_{DD[wxy]}$− V[w] − V[x] | − V[y] | = | 14V[y] |
| 16, 40 | [1], [3] | [1], [3] | [2], [3] | $V_{DD[wxy]}$− V[w] − V[x] | | = | 15V[y] |
| 17, 39 | [1], [3] | [1], [3] | [0], [2] | $V_{DD[wxy]}$− V[w] − V[x] | + V[y] | = | 16V[y] |
| 18, 38 | [1], [3] | [2], [3] | [1], [3] | $V_{DD[wxy]}$− V[w] | − V[y] | = | 17V[y] |
| 19, 37 | [1], [3] | [0], [1] | [0], [1] | $V_{DD[wxy]}$− V[w] | | = | 18V[y] |
| 20, 36 | [1], [3] | [0], [1] | [0], [2] | $V_{DD[wxy]}$− V[w] | + V[y] | = | 19V[y] |
| 21, 35 | [1], [3] | [0], [2] | [1], [3] | $V_{DD[wxy]}$− V[w] + V[x] | − V[y] | = | 20V[y] |
| 22, 34 | [1], [3] | [0], [2] | [2], [3] | $V_{DD[wxy]}$− V[w] + V[x] | | = | 21V[y] |
| 23, 33 | [1], [3] | [0], [2] | [0], [2] | $V_{DD[wxy]}$− V[w] + V[x] | + V[y] | = | 22V[y] |
| 24, 32 | [2], [3] | [1], [3] | [1], [3] | $V_{DD[wxy]}$ | − V[x] − V[y] | = | 23V[y] |
| 25, 31 | [2], [3] | [1], [3] | [2], [3] | $V_{DD[wxy]}$ | − V[x] | = | 24V[y] |
| 26, 30 | [2], [3] | [1], [3] | [0], [2] | $V_{DD[wxy]}$ | − V[x] + V[y] | = | 25V[y] |
| 27, 29 | [2], [3] | [2], [3] | [1], [3] | $V_{DD[wxy]}$ | − V[y] | = | 26V[y] |
| 28 | [2], [3] | [2], [3] | [2], [3] | $V_{DD[wxy]}$ | | = | 27V[y] |

2229    2207    2204

KEY:
- \* For Stages 2221(1) to 2221(27)
- \*\* For Stages 2221(29) to 2221(54), & 2221(1)

FIG. 22M-2A2
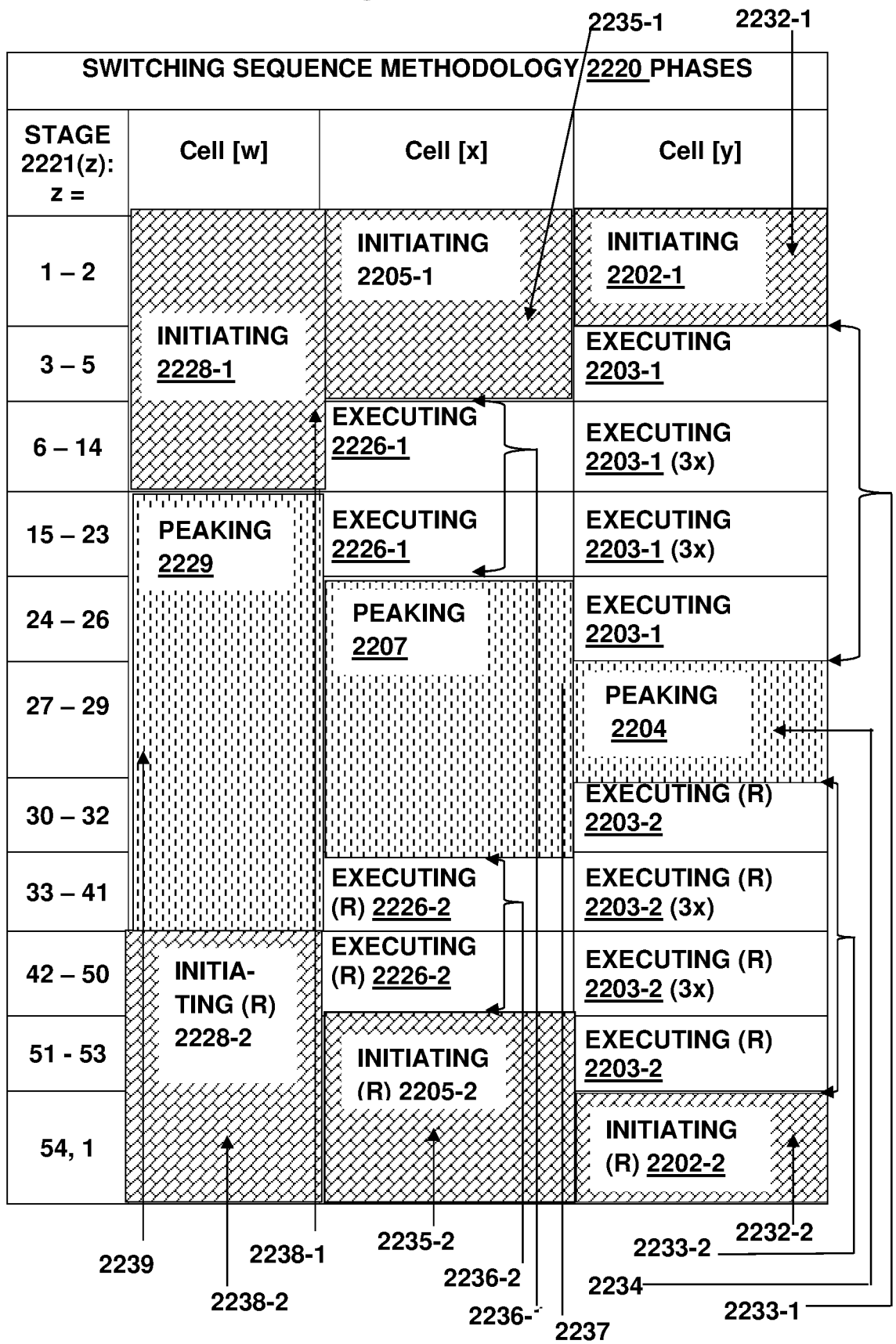

SWITCHING SEQUENCE METHODOLOGY 2240
- Driving circuit [vwxy] with Cells [v], [w], [x], [y], 1 non-dissipative element
  with b: {[0],[1], [2],[3]}; +: [0,2]; -: [1,3]
- $V_{DD[vwxy]} = 3V[v] = 9V[w] = 27V[x] = 81V[y]$

| Stage 2241(z): | Cell [v] | Cell [w] | Cell [x] | Cell [y] |
|---|---|---|---|---|
| 1–2, 162–1 | b (ground) | b | b | b, + |
| 3–5, 159–161 | b (ground) | b | + | -, b, + |
| 6–8, 156–158 | b (ground) | + | - | -, b, + |
| 9–11, 153–155 | b (ground) | + | b | -, b, + |
| 12–14, 150–152 | b (ground) | + | + | -, b, + |
| 15–17, 147–149 | + | - | - | -, b, + |
| 18–20, 144–146 | + | - | b | -, b, + |
| 21–23, 141–143 | + | - | + | -, b, + |
| 24–26, 138–140 | + | b | - | -, b, + |
| 27–29, 135–137 | + | b | b | -, b, + |
| 30–32, 132–134 | + | b | + | -, b, + |
| 33–35, 129–131 | + | + | - | -, b, + |
| 36–38, 126–128 | + | + | b | -, b, + |
| 39–41, 123–125 | + | + | + | -, b, + |
| 42–44, 120–122 | - | - | - | -, b, + |
| 45–47, 117–119 | - | - | b | -, b, + |
| 48–50, 114–116 | - | - | + | -, b, + |
| 51–53, 111–113 | - | b | - | -, b, + |
| 54–56, 108–110 | - | b | b | -, b, + |
| 57–59, 105–107 | - | b | + | -, b, + |
| 60–62, 102–104 | - | + | - | -, b, + |
| 63–65, 99–101 | - | + | b | -, b, + |
| 66–68, 96–98 | - | + | + | -, b, + |
| 69–71, 93–95 | b ($V_{DD[vwxy]}$) | - | - | -, b, + |
| 72–74, 90–92 | b ($V_{DD[vwxy]}$) | - | b | -, b, + |
| 75–77, 87–89 | b ($V_{DD[vwxy]}$) | - | + | -, b, + |
| 78–80, 84–86 | b ($V_{DD[vwxy]}$) | b | - | -, b, + |
| 81–83 | b ($V_{DD[vwxy]}$) | b | b | -, b, - |

KEY:
\* For Stages 2241(1) to 2241(81)   \*\* For Stages 2241(83) to 2241(162), & 2241(1)

FIG. 22M-2B2
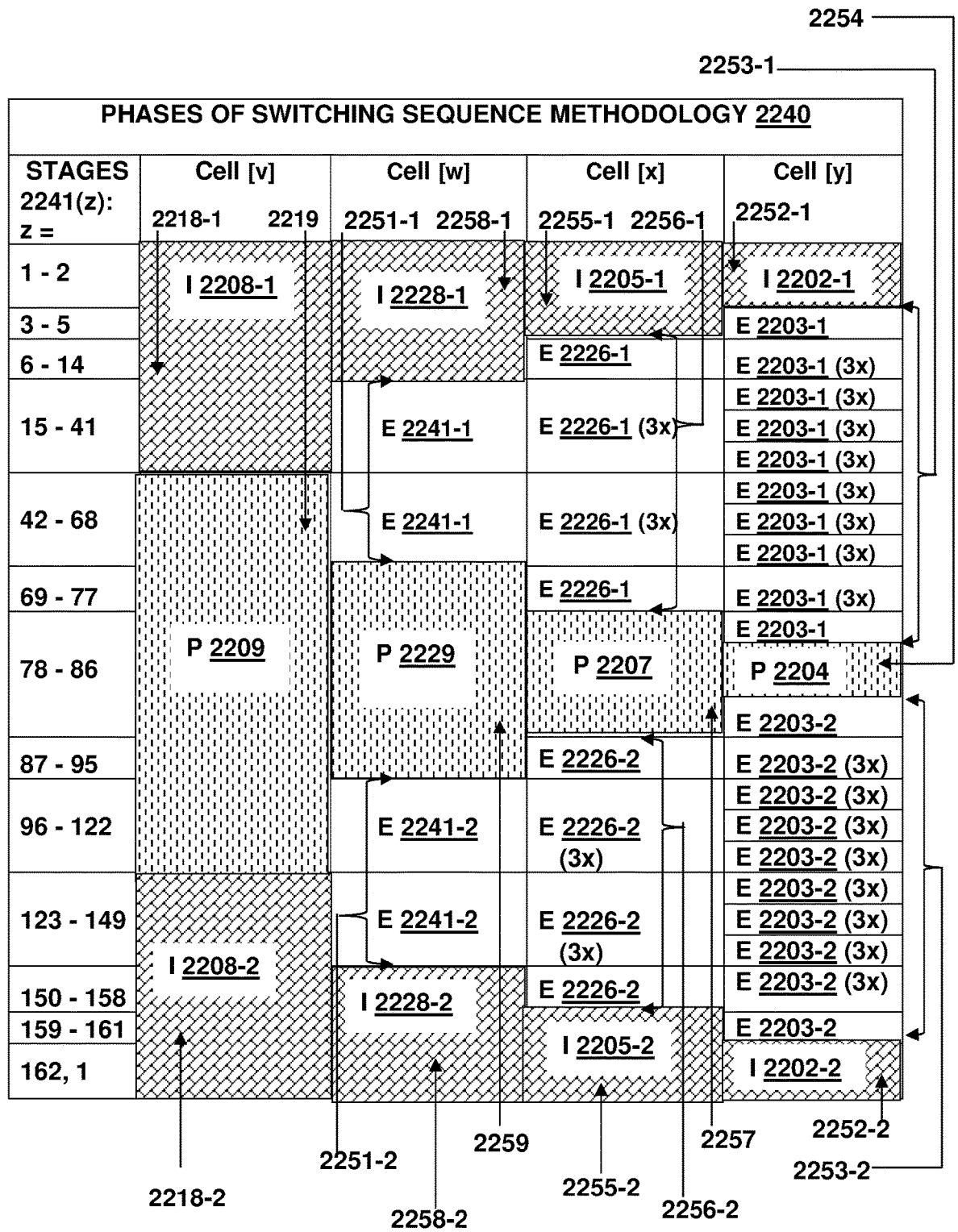

FIG. 22M-3A

| SWITCHING SEQUENCE METHODOLOGY 2260: |
|---|
| 2 cell driving circuit [ab] with |
| • First cell [a] with 1 non-dissipative element, 4 switches<br>    with    b: {[0],[1], [2],[3]};  +: [0],[2];  −: [1],[3] |
| • Second cell [b] with 2 non-dissipative elements, 5 switches<br>    with    b: {[0],[1], [3],[4]};  +: [0],[2];  2+: [0],[3];  −: [2],[4];  2−: [1],[4] |
| • $V_{DD[ab]} = 3V[a] = 15V[b]$ |

| STAGE 2261(z): z = | Cell [a] 2245-1*, 2245-2** | Cell [b] 2242-1*, 2242-2** | Drive $V_{O[ab]}$ to: 2243-1*, 2243-2** | | | |
|---|---|---|---|---|---|---|
| 1 | b (ground) | b | Ground | | | |
| 2, 30 | b (ground) | + | | V[b] | = | V[b] |
| 3, 29 | b (ground) | 2+ | | 2V[b] | = | 2V[b] |
| 4, 28 | + | 2− | V[a] | − 2V[b] | = | 3V[b] |
| 5, 27 | + | − | V[a] | − V[b] | = | 4V[b] |
| 6, 26 | + | b | V[a] | | = | 5V[b] |
| 7, 25 | + | + | V[a] | + V[b] | = | 6V[b] |
| 8, 24 | + | 2+ | V[a] | + 2V[b] | = | 7V[b] |
| 9, 23 | − | 2− | $V_{DD[ab]}$ − V[a] | − 2V[b] | = | 8V[b] |
| 10, 22 | − | − | $V_{DD[ab]}$ − V[a] | − V[b] | = | 9V[b] |
| 11, 21 | − | b | $V_{DD[ab]}$ − V[a] | | = | 10V[b] |
| 12, 20 | − | + | $V_{DD[ab]}$ − V[a] | + V[b] | = | 11V[b] |
| 13, 19 | − | 2+ | $V_{DD[ab]}$ − V[a] | + 2V[b] | = | 12V[b] |
| 14, 18 | b ($V_{DD[ab]}$) | 2− | $V_{DD[ab]}$ | − 2V[b] | = | 13V[b] |
| 15, 17 | b ($V_{DD[ab]}$) | − | $V_{DD[ab]}$ | − V[b] | = | 14V[b] |
| 16 | b ($V_{DD[ab]}$) | b | $V_{DD[ab]}$ | | = | 15V[b] |

2247  2244

KEY:
\* For Stages 2261(1) to 2261(15)    \*\* For Stages 2261(17) to 2261(30), and to 2261(1)

FIG. 22M-4A

SWITCHING SEQUENCE METHODOLOGY 2270:
2 cell driving circuit [mn] with
- First cell [m] with 2 non-dissipative elements, 5 switches
  with   b: {[0],[1], [3],[4]};  +: [0],[2];  2+: [0],[3];  -: [2], [4];  2-: [1],[4]
- Second cell [n] with 1 non-dissipative element, 4 switches
  with   b: {[0],[1], [2],[3]};  +: [0],[2];  -: [1],[3]
- $V_{DD[mn]} = 5V[m] = 15V[n]$

| STAGE 2271(z): z = | Cell [m] 2248-1*, 2248-2** | Cell [n] 2202-1*, 2202-2** | 2203-1*, 2203-2** Drive $V_{O[mn]}$ to: |
|---|---|---|---|
| 1 | b | b | Ground |
| 2, 30 | b | + | V[n] = V[n] |
| 3, 29 | + | - | V[m] − V[n] = 2V[n] |
| 4, 28 | + | b | V[m] = 3V[n] |
| 5, 27 | + | + | V[m] + V[n] = 4V[n] |
| 6, 26 | 2+ | - | 2V[m] − V[n] = 5V[n] |
| 7, 25 | 2+ | b | 2V[m] = 6V[n] |
| 8, 24 | 2+ | + | 2V[m] + V[n] = 7V[n] |
| 9, 23 | 2- | - | $V_{DD[mn]}$ − 2V[m] − V[n] = 8V[n] |
| 10, 22 | 2- | b | $V_{DD[mn]}$ − 2V[m] = 9V[n] |
| 11, 21 | 2- | + | $V_{DD[mn]}$ − 2V[m] + V[n] = 10V[n] |
| 12, 20 | - | - | $V_{DD[mn]}$ − V[m] − V[n] = 11V[n] |
| 13, 19 | - | b | $V_{DD[mn]}$ − V[m] = 12V[n] |
| 14, 18 | - | + | $V_{DD[mn]}$ − V[m] + V[n] = 13V[n] |
| 15, 17 | b ($V_{DD[mn]}$) | - | $V_{DD[mn]}$ − V[n] = 14V[n] |
| 16 | b ($V_{DD[mn]}$) | b | $V_{DD[mn]}$ = 15V[n] |

2249          2204

KEY:
*  For Stages 2271(1) to 2271(15);   ** For Stages 2271(17) to 2271(30), and to 2271(1)

FIG. 22M-5A1

SWITCHING SEQUENCE METHODOLOGY 2280:
3-cell driving circuit [mnp] with
- First cell [m] and second cell [n] with 2 non-dissipative elements
  with b: {[0],[1], [3],[4]}; +: [0],[2]; 2+: [0],[3]; -: [2], [4]; 2-: [1],[4]
- Third cell [p] with 3 non-dissipative elements
  with b: {[0],[1], [4],[5]}; +: [0],[2]; 2+:[0][3]; 3+: [0],[4]; -: [3],[5];
  2-: [2],[5]; 3-: [1],[5]       $V_{DDK} = 5V[m] = 25[n] = 175V[p]$

| STAGE 2281(z): | Cell [m] | Cell [n] 2285-1 | Cell [p] 2282-1      2283-1 |
|---|---|---|---|
| 1 – 4 | b | b | b, +, 2+, 3+ |
| 5 – 11 | b | + | 3-, 2-, -, b, +, 2+, 3+ |
| 12 – 18 | b | 2+ | 3-, 2-, -, b, +, 2+, 3+ |
| 19 – 25 | 2288-1 + | 2- | 3-, 2-, -, b, +, 2+, 3+ |
| 26 - 32 | + | - | 3-, 2-, -, b, +, 2+, 3+ |
| 33 – 39 | + | b | 3-, 2-, -, b, +, 2+, 3+ |
| 40 – 46 | + | + | 3-, 2-, -, b, +, 2+, 3+ |
| 47 – 53 | + | 2+ | 3-, 2-, -, b, +, 2+, 3+ |
| 54 – 60 | 2+ | 2- | 3-, 2-, -, b, +, 2+, 3+ |
| 61 – 67 | 2+ | - | 3-, 2-, -, b, +, 2+, 3+ |
| 68 – 74 | 2+ | b | 3-, 2-, -, b, +, 2+, 3+ |
| 75 – 81 | 2+ | + | 3-, 2-, -, b, +, 2+, 3+ |
| 82 – 88 | 2+ | 2+ | 3-, 2-, -, b, +, 2+, 3+ |
| 89 – 95 | 2- | 2- | 3-, 2-, -, b, +, 2+, 3+    2286-1 |
| 96 – 102 | 2- | - | 3-, 2-, -, b, +, 2+, 3+ |
| 103 – 109 | 2- | b | 3-, 2-, -, b, +, 2+, 3+ |
| 110 – 116 | 2- | + | 3-, 2-, -, b, +, 2+, 3+ |
| 117 – 123 | 2- | 2+ | 3-, 2-, -, b, +, 2+, 3+ |
| 124 – 130 | - | 2- | 3-, 2-, -, b, +, 2+, 3+ |
| 131 – 137 | - | - | 3-, 2-, -, b, +, 2+, 3+ |
| 138 – 144 | - | b | 3-, 2-, -, b, +, 2+, 3+ |
| 145 – 151 | - | + | 3-, 2-, -, b, +, 2+, 3+ |
| 152 – 158 | - | 2+ | 3-, 2-, -, b, +, 2+, 3+ |
| 159 – 165 | b ($V_{DD[mnp]}$) | 2- | 3-, 2-, -, b, +, 2+, 3+ |
| 166 – 172 | b ($V_{DD[mnp]}$) | - | 3-, 2-, -, b, +, 2+, 3+ |
| 173 - 176 | b ($V_{DD[mnp]}$) | b | 3-, 2-, -, b |

| STAGE 2281(z): | Cell [m] | Cell [n] | Cell [p] |
|---|---|---|---|
| \[SWITCHING SEQUENCE METHODOLOGY 2280 (contd.): 3-cell driving circuit [mnp]\] | | | |
| 348 – 350, 1 | b (ground) | b | 3+, 2+, +, b |
| 341 - 347 | b (ground) | + | 3+, 2+, +, b, -, 2-, 3- |
| 334 - 340 | b (ground) | 2+ | 3+, 2+, +, b, -, 2-, 3- |
| 327 - 333 | + | 2- | 3+, 2+, +, b, -, 2-, 3- |
| 320 - 326 | + | - | 3+, 2+, +, b, -, 2-, 3- |
| 313 - 319 | + | b | 3+, 2+, +, b, -, 2-, 3- |
| 306 - 312 | + | + | 3+, 2+, +, b, -, 2-, 3- |
| 299 - 305 | + | 2+ | 3+, 2+, +, b, -, 2-, 3- |
| 292 - 298 | 2+ | 2- | 3+, 2+, +, b, -, 2-, 3- |
| 285 - 291 | 2+ | - | 3+, 2+, +, b, -, 2-, 3- |
| 278 - 284 | 2+ | b | 3+, 2+, +, b, -, 2-, 3- |
| 271 - 277 | 2+ | + | 3+, 2+, +, b, -, 2-, 3- |
| 264 - 270 | 2+ | 2+ | 3+, 2+, +, b, -, 2-, 3- |
| 257 - 263 | 2- | 2- | 3+, 2+, +, b, -, 2-, 3- |
| 250 - 256 | 2- | - | 3+, 2+, +, b, -, 2-, 3- |
| 243 - 249 | 2- | b | 3+, 2+, +, b, -, 2-, 3- |
| 236 - 242 | 2- | + | 3+, 2+, +, b, -, 2-, 3- |
| 229 - 235 | 2- | 2+ | 3+, 2+, +, b, -, 2-, 3- |
| 222 - 228 | - | 2- | 3+, 2+, +, b, -, 2-, 3- |
| 215 - 221 | - | - | 3+, 2+, +, b, -, 2-, 3- |
| 208 - 214 | - | b | 3+, 2+, +, b, -, 2-, 3- |
| 201 - 207 | - | + | 3+, 2+, +, b, -, 2-, 3- |
| 194 - 200 | - | 2+ | 3+, 2+, +, b, -, 2-, 3- |
| 187 - 193 | b ($V_{DD[mnp]}$) | 2- | 3+, 2+, +, b, -, 2-, 3- |
| 180 - 186 | b ($V_{DD[mnp]}$) | - | 3+, 2+, +, b, -, 2-, 3- |
| 176 - 179 | b ($V_{DD[mnp]}$) | b | b, -, 2-, 3- |

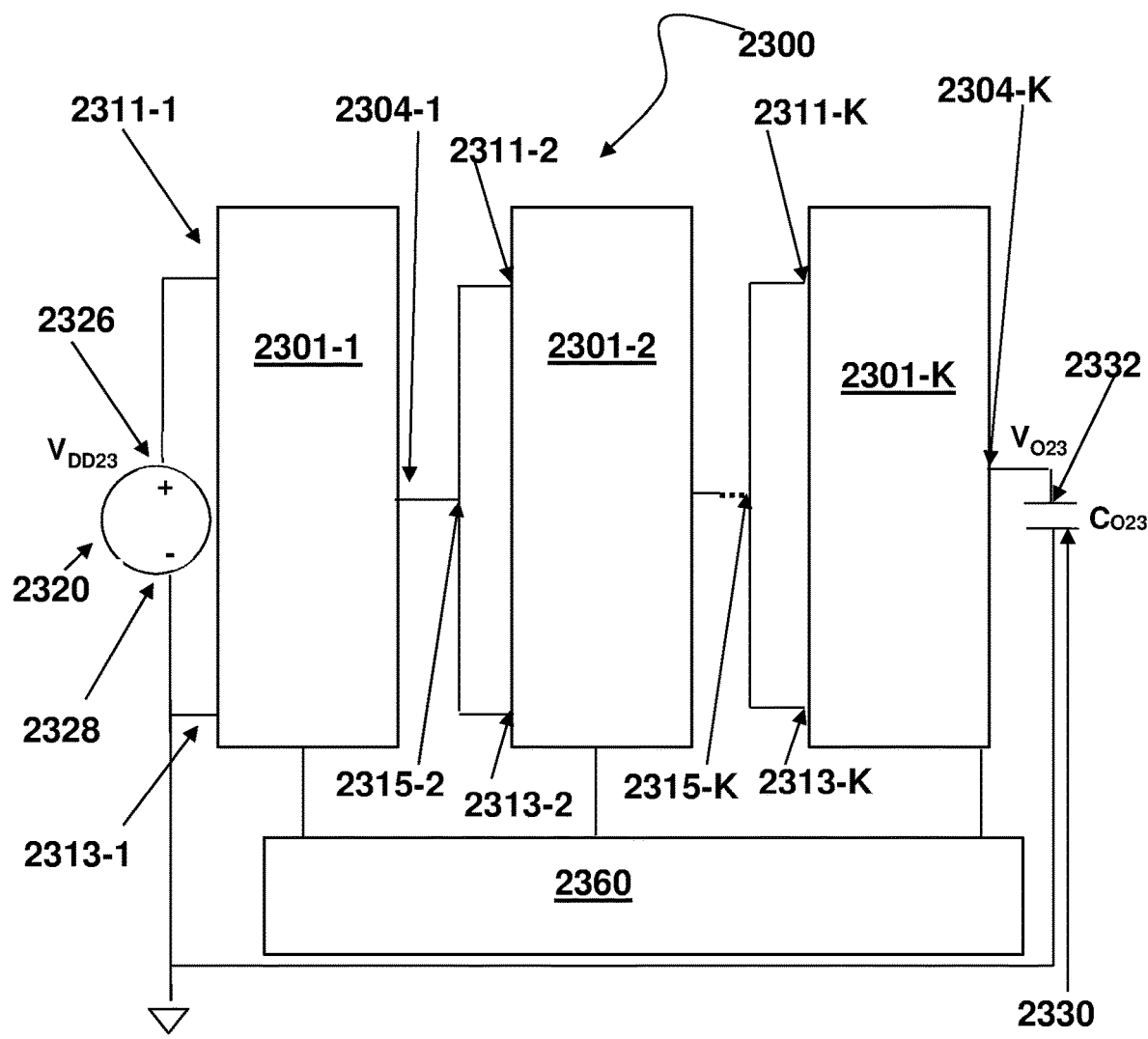

FIG. 24A

Phase 2412[1]-1, Pattern 2402[1]-1    2301-1 Bypass For 2402[2]-1

SWITCHING SEQUENCE METHODOLOGY 2400: Cell 2301-1

| Stage 2401(r): r = | Switch SW[u], [u] = | | | | | | | |
|---|---|---|---|---|---|---|---|---|
| | [0] | [1] | [2] | [3] | ... | n[1]-1 | n[1] | n[1]+1 | n[1]+2 |
| 1 (GROUND) | C | C | | | | | | | |
| ... | | | | | | | | | |
| g(1) | C | C | | | | | | | |
| g(1)+1 | C | | C | | | | | | |
| ... | | | | | | | | | |
| g(1)+f(1) | C | | C | | | | | | |
| ... | | | | | | | | | |
| g(1)+(n[1]-3)f(1)+1 | C | | | | | C | | | |
| ... | | | | | | | | | |
| g(1)+(n[1]-2)f(1) | C | | | | | C | | | |
| g(1)+(n[1]-2)f(1)+1 | C | | | | | | C | | |
| ... | | | | | | | | | |
| g(1)+(n[1]-1)f(1) | C | | | | | | C | | |
| g(1)+(n[1]-1)f(1)+1 | C | | | | | | | C | |
| ... | | | | | | | | | |
| g(1)+n[1]f(1) | C | | | | | | | C | |
| g(1)+n[1]f(1)+1 | | C | | | | | | | C |
| ... | | | | | | | | | |
| g(1)+(n[1]+1)f(1) | | C | | | | | | | C |
| g(1)+(n[1]+1)f(1)+1 | | | C | | | | | | C |
| ... | | | | | | | | | |
| g(1)+(n[1]+2)f(1) | | | C | | | | | | C |
| ... | | | | | | | | | |
| g(1)+(2n[1]-2)f(1)+1 | | | | | | C | | | C |
| ... | | | | | | | | | |
| g(1)+(2n[1]-1)f(1) | | | | | | C | | | C |
| g(1)+(2n[1]-1)f(1)+1 | | | | | | | C | | C |
| ... | | | | | | | | | |
| g(1)+2n[1]f(1) | | | | | | | C | | C |
| g(1)+2n[1]f(1)+1 | | | | | | | | C | C |
| ... | | 2301-1 BYPASS | | | | | | | |
| 2g(1)+2n[1]f(1) = N(K)+1  PEAK | | | | | | | | C | C |

Phase 2414[1], Pattern 2404[1]
Phase Continues w/ Pattern in Reverse until Phase 2412[1]-2

$V_{O23[1]}$ Increases by $V_{CS23[1]}$ w/ each Rep of 2403[2]-1

FIG. 24B-2

| SWITCHING SEQUENCE METHODOLOGY 2400: Executing Cell [z] Phase 2413[z]-1 for Cell 2301-z | | | | | | | | |
|---|---|---|---|---|---|---|---|---|
| Stage 2401(r): r = | Switch SW[u], [u] = | | | | | | | |
| | [0] | [1] | [2] | [3] | ... | [n[z]-1] | [n[z]] | [n[z]+1] | [n[z]+2] |
| $g(z)+n[z]f(z)+1$ $= g(z-1)+1$ | | C | | | | | | C |
| ... | | | | | | | | |
| $g(z-1)+ f(z)$ | | C | | | | | | C |
| $g(z-1)+ f(z)+1$ | | | C | | | | | C |
| ... | | | | | | | | |
| $g(z-1)+ 2f(z)$ | | | C | | | | | C |
| ... | | | | | | | | |
| $g(z-1)+ (n[z]-1)f(z)+1$ | | | | | | C | | C |
| ... | | | | | | | | |
| $g(z-1)+ n[z]f(z)$ | | | | | | C | | C |
| $g(z-1)+ n[z]f(z)+1$ | | | 2301-z BYPASS | | | | C | C |
| ... | | | | | | | | |
| $g(z-1)+ (n[z]+1)f(z)$ | | | | | | | C | C |
| $g(z-1)+ (n[z]+1)f(z)+1$ | C | | C | | | | | |
| ... | | | | | | | | |
| $g(z-1)+ (n[z]+2)f(z)$ | C | | C | | | | | |
| $g(z-1)+ (n[z]+2)f(z)+1$ | C | | | C | | | | |
| ... | | | | | | | | |
| $g(z-1)+ (n[z]+3)f(z)$ | C | | | C | | | | |
| ... | C | | | | | | | |
| $g(z-1)+ (2n[z]-1)f(z)+1$ | C | | | | | | C | |
| ... | | | | | | | | |
| $g(z-1)+ 2n[z]f(z)$ | C | | | | | | C | |
| $g(z-1)+ 2n[z]f(z)+1$ | C | | | | | | | C |
| ... | | | | | | | | |
| $g(z-1)+ (2n[z]+1)f(z)$ | C | | | | | | | C |
| Repeat Pattern 2403[z]-1 h(z-1)-1 times | | | | | | | | |
| $N(K)+1-g(z-1)$ | C | | | | | | | C |

$V_{O23[z]}$ Increases
$V_{O23[z]}$ Reductions

To Phase 2414[z]

2403[z]-1 (for reps of 2403[z+1]-1)

FIG. 24B-3

| SWITCHING SEQUENCE METHODOLOGY 2400: Peaking Cell [z] Phase 2414[z] for Cell 2301-z | | | | | | | | | |
|---|---|---|---|---|---|---|---|---|---|
| Stage 2401(r): r = | Switch SW[u], [u] = | | | | | | | | |
| | [0] | [1] | [2] | [3] | ... | [n[z]-1] | [n[z]] | [n[z]+1] | [n[z]+2] |
| N(K)+2-g(z-1) | C | | | | | | | | C |
| ... | | | | | | | | | C |
| N(K) + 1-g(z-1)+f(z) | | C | | | | | | | C |
| N(K)+2 -g(z-1)+f(z) | | | C | | | | | | C |
| N(K)+1 -g(z-1)+2f(z) | | | C | | | | | | C |
| ... | | | | | | | | | C |
| N(K)+2-g(z-1) +(n[z]-2)f(z) | | | | | | | C | | C |
| ... | | | | | | | | | |
| N(K)+1-g(z-1) +(n[z]-1)f(z) | | | | | | | C | | C |
| N(K)+2-g(z-1) +(n[z]-1)f(z) | | | | | | | | C | C |
| ... | | | | | | | | | |
| N(K)+1-g(z-1) +n[z]f(z) = N(K)+1-g(z) | | | | | | | | C | C |
| N(K)+2-g(z) | | | | | | | | | C | C |
| ... | 2310-z BYPASS | | | | | | | C | C |
| N(K)+1 PEAK | | | | | | | | C | C |

$V_{O23[z]}$ Decreases by $V_{CS23[z]}$ w/ each Rep of 2403[z+1]-1

2301-z Bypass For Phase 2414[z+1]

NON-DISSIPATIVE ELEMENT-ENABLED CAPACITIVE ELEMENT DRIVING

CROSS-REFERENCE TO RELATED APPLICATION

This application claims the priority of U.S. Patent Application No. 62/907,530, filed Sep. 27, 2019, U.S. Patent Application No. 63/075,083, filed Sep. 4, 2020, and U.S. Patent Application No. 63/082,556, filed Sep. 24, 2020, all three of which are entitled IMPROVEMENTS IN NON-DISSIPATIVE ELEMENT-ENABLED CAPACITIVE ELEMENT DRIVING, and the disclosures of all three of which are incorporated by reference in their entireties.

FIELD

The present invention relates to the field of circuits, and particularly to circuits and systems for capacitive driving.

BACKGROUND

This invention relates to methods and systems for driving the voltage of a capacitive element between two voltage levels such as ground and supply voltage. Non-dissipative elements such as capacitors may be used to improve the energy efficiency of capacitive element driving.

The control of an electronic or electrical device is normally performed by applying a voltage at its control terminal, for example, to activate or deactivate the device. The control terminal may be the control gate of a transistor of any type, including but not limited to a Metal Oxide Semiconductor Field Effect Transistor (MOSFET), a Gallium Nitride Field Effect Transistor (GaN-FET), a Silicon Carbide Field Effect Transistor (SiC-FET), a Junction Field Effect Transistor (JFET), or an Insulated Gate Bipolar Transistor (IGBT). The control terminal may also be a control input of another sort of electronic or electrical device, including but not limited to an electrostatic actuator or other systems such as micro motors, micro mirrors, and micro switches based on Micro-Electro-Mechanical Systems (MEMS) technology, memory and logic circuits based on multiferroic/magnetoelectric materials, ultrasonic transducers, piezoelectric actuators, electronic paper displays (E-paper), and actuators based on electroactive polymers.

In an electronic or electrical system in which devices have control terminals with capacitive elements, drivers are used to drive the voltage of those control terminals between two voltage levels to activate or deactivate those devices. Systems employing drivers include switch mode power converters, motor drivers, electrostatic actuators, electroactive polymer actuators, and multiferroic/magnetoelectric devices. Periodic switching is helpful in maintaining the average voltage of those storage capacitors at an unchanged level.

In conventional methods of capacitive element driving, a circuit 100 such as shown in FIG. 1A, with the operation of circuit 100 shown in the waveforms of FIG. 1B, may have two switches, $SW_{1[1]}$, $SW_{1[2]}$, with switch $SW_{1[1]}$ connected between the capacitive element $C_{O1}$ and one terminal of the voltage source $V_{DD1}$ and with switch $SW_{1[2]}$ connected between the capacitive element $C_{O1}$ and another terminal of the voltage source $V_{DD1}$, which are switched on and off alternately to drive the voltage of the capacitive element $C_{O1}$ between two levels (e.g. 0V and $V_{DD1}$). However, such driving methods are not energy efficient.

The waveforms of FIG. 1B show the operation of the circuit 100, in which, when the capacitive element voltage ($V_{O1}$) is driven from ground (or supply voltage) to the driving circuit's supply voltage (or ground), transient current flows through the switch $SW_{1[1]}$ (or $SW_{1[2]}$) until the voltage $V_{O1}$ is settled. Then energy $E_{CAP1}=\frac{1}{2}C_{O1}V_{DD1}^2$ is stored in (or taken away from) the capacitive element $C_{O1}$. When transient current $I_{SW1[1]}$ (or $I_{SW1[2]}$) flows through switch $SW_{1[1]}$ (or $SW_{1[2]}$), a voltage difference appears across the switch and energy is absorbed. Switch $SW_{1[1]}$ (or $SW_{1[2]}$) is a dissipative element, so that the absorbed energy ($E_{DISS1}=\frac{1}{2}C_{O1}V_{DD1}^2$) is dissipated. The energy loss per driving cycle ($E_{LOSS1}$) is $CV_{DD1}^2$.

One method for avoiding energy dissipation of circuit 100 is to introduce a resonant capacitive element driver in which an inductor is added to the input of a capacitive element, and to periodically drive capacitive elements between two voltage levels. One circuit 200 for resonant capacitive element driving is shown in FIG. 2A, with the operation of circuit 200 shown in the waveforms of FIG. 2B.

As shown in FIG. 2A, switches $SW_{2[1]}$ and $SW_{2[2]}$ are connected in series between the terminals of the voltage source $V_{DD2}$, diodes $D2_{[1]}$ and $D2_{[4]}$ are also connected in series between the terminals of the voltage source $V_{DD2}$, and diodes $D_{2[3]}$ and $D_{2[2]}$ are also connected in series between the terminals of the voltage source $V_{DD2}$. Switch $SW_{2[1]}$, diode $D2_{[4]}$, and diode $D_{2[2]}$ share a common node 202, which is electrically connected to the positive terminal of the voltage source $V_{DD2}$. Switch $SW_{2[2]}$, diode $D_{2[1]}$, and diode $D_{2[3]}$ share a common node 204, which is electrically connected to the negative terminal of the voltage source $V_{DD2}$; and switch $SW_{2[1]}$, $SW_{2[2]}$, diode $D_{2[4]}$, and diode $D_{2[1]}$ share a common node 206. An inductor $L_2$ may be disposed between the common-node 206 and a common node 208 shared by the diodes $D_{2[2]}$ and $D_{2[3]}$ and the capacitive element $C_{O2}$.

In operation, the circuit 200 stores the energy $E_{DISS2}$ in the inductor $L_2$. The use of a non-dissipative element such as the inductor $L_2$ in circuit 200 allows energy to be stored in the non-dissipative element instead of dissipated as heat on resistive element. Diodes $D_{2[1]}$ and $D_{2[2]}$ (or $D_{2[3]}$ and $D_{2[4]}$) may transfer the stored energy $E_{DISS2}$ back to the voltage source $V_{DD2}$ after the capacitive element voltage $V_{O2}$ is driven from ground to the driving circuit's supply voltage $V_{DD2}$ (or from supply voltage $V_{DD2}$ to ground).

Therefore, the inclusion of the inductor $L_2$ into the circuit 200 reduces the dissipation of energy, storing $E_{CAP2}=\frac{1}{2}C_{O2}V_{DD2}^2$ in the non-dissipative element, thus rendering the circuit 200 more energy efficient. However, there is a tradeoff between ramp rate of $V_{O2}$ and peak inductor current. The inductor $L_2$ and capacitive element $C_{O2}$ form a resonant network, which has its resonant period and characteristic impedance proportional to the value of the square root of $L_2$. To increase the $V_{O2}$ ramp rate, an inductor with a smaller value than the inductor $L_2$ may be used, but its substitution into circuit 200 also introduces a higher peak inductor current. Also, the inclusion of an additional element (inductor $L_2$) in circuit 200 introduces extra current and hence conduction loss due to resonant behaviour, rendering the circuit 200 bulky and costly.

A network with a capacitor and inductor may also be used as a resonant capacitive element driver in circuits designed to avoid dissipation energy. One circuit 300 for resonant capacitive element driving using an LC network is shown in FIG. 3A, with the operation of circuit 300 shown in the waveforms of FIG. 3B.

As shown in FIG. 3A, an inductor and a capacitor (LC) network $LC_3$ is inserted between common-node 310 of switches $SW_{3[1]}$ and $SW_{3[2]}$, and ground. Energy $E_{CAP3}$ may be transferred from the capacitive element $C_{O3}$ to the LC network $LC_3$ once voltage $V_{O3}$ is changed from supply voltage $V_{DD3}$ to ground; and transferred back from the LC network $LC_3$ to the capacitive element $C_{O3}$ when voltage $V_{O3}$ changes from ground to the driving circuit's supply voltage.

As with circuit 200, while the LC network $LC_3$ incorporated into the circuit 300 renders the circuit 300 more energy efficient because it prevents dissipation of energy $E_{CAP3}=\frac{1}{2}C_{O3}V_{DD3}^2$ stored in the capacitive element $C_{O3}$, the tradeoff between ramp rate of $V_{O2}$ and peak inductor current still exists in the circuit 300. Further, the additional element (LC network $LC_3$) still introduces extra current and hence conduction loss due to resonant behaviour into the circuit 300, rendering the circuit 300 even more bulky and costly than circuit 200.

It is desirable to have simple, convenient, energy-efficient methods, circuits, and systems for driving systems employing capacitive elements. It is desirable to have simple, convenient, energy-efficient methods, circuits, and systems for driving capacitive elements that simply and efficiently store energy in at least one non-dissipative element, that transfer the energy to drive a capacitive element between two voltage levels, and that may transfer the energy in a series of steps. Further, it may be desirable to develop simple, convenient, energy-efficient methods, circuits, and systems for driving capacitive elements in which energy may be transferred from non-dissipative elements while an average voltage level value for the non-dissipative element is maintained unchanged over time.

SUMMARY

Methods, circuits, and systems for driving the voltage of a capacitive element between two voltage levels such as ground and supply voltage are disclosed in which a capacitive element driver simply and efficiently stores energy in at least one non-dissipative element, transfers the energy to drive a capacitive element between two voltage levels, and may transfer the energy in a series of steps through operation of a sequence of stages on the at least one non-dissipative element, alternatingly turning on and off switches in sequential order to drive the voltage of the capacitive element between the two levels in step-wise fashion.

The capacitive element driver may have a first switch electrically connected between an input terminal of the capacitive element and a negative terminal of the voltage source, and a last switch electrically connected between the input terminal of the capacitive element and a positive terminal of the voltage source. In certain embodiments, the one or more non-dissipative elements may be connectable in series between terminals of the voltage source and the two or more switches are connectable at one of their ends to an input of the capacitive element. A first switch may be electrically connectable at its other end to a common node between the negative terminal of the voltage source and a first non-dissipative element, and a last switch may be electrically connectable at its other end to a common node between a positive terminal of the voltage source and a last non-dissipative element.

Further, the driver may have more than one driver cell arranged to supply the step-wise transfers of energy through operation of its own sequence of stages so that switches in the cells open and close in combinations in the sequences of switching stages to deliver an output voltage of the capacitive element driver between the two voltage levels while maintaining an average voltage level value of the non-dissipative element unchanged over time.

In certain embodiments, switching may be applied to the capacitive element driver by activating and deactivating selected switches in the plurality of switches to reduce the energy loss when a capacitive element is driven from one voltage to another.

In another embodiments, switching may be applied to the capacitive element driver by activating and deactivating selected switches in a sequence of switching stages defined to ensure that the average value of storage capacitor voltage remains unchanged over time. The switch sequencing may be further defined to form a capacitive element voltage driving cycle so that the combinations of switch activation operates to hold the average value of voltage of the storage capacitor(s) unchanged over time.

In certain embodiments, a capacitive element driver is disclosed for driving a capacitive element between voltage levels, with the capacitive element being an element having capacitive functionality and with the capacitive element driver arranged to drive the capacitive element from a high voltage level to a low voltage level or from a low voltage level to a high voltage level. The capacitive element driver may have a plurality of switches with a first pair of switches electrically connectable in series between a first input terminal of the capacitive element driver and an output terminal of the capacitive element driver, with the first input terminal of the capacitive element driver electrically connectable directly or indirectly to a first terminal of a voltage source for supplying a selected voltage to the capacitive element driver, and with the output terminal of the capacitive element driver electrically connectable directly or indirectly to an input of the capacitive element.

The plurality of switches may also have a second pair of switches electrically connectable in series between a second terminal of the voltage source and the output terminal of the capacitive element driver; and a non-dissipative element arranged to store and transfer energy for driving the capacitive element between the voltage levels, wherein the non-dissipative element is electrically connectable between a common node of the first pair of switches and a common node of the second pair of switches. The plurality of switches may be arranged to open and close in combinations in a sequence of switching stages to maintain an average voltage level value of the non-dissipative element unchanged over time.

In further embodiments, a controller may be electrically connectable to the plurality of switches to control the operation of the switches to open and close in combinations in the sequence of switching stages, the sequence of switching stages is arranged to provide step-wise transfer of the energy to the capacitive element, and the capacitive element driver may be arranged to drive the capacitive element from a high voltage level to a low voltage level or from a low voltage level to a high voltage level.

In other embodiments, the capacitive element driver may be a first driver cell in a capacitive element driving circuit, which may have a second driver cell electrically connectable between the first driver cell and the capacitive element. The second driver cell may have a second cell first input terminal electrically connectable to the first cell output terminal, a second cell output terminal electrically connectable directly or indirectly to the capacitive element, and a second plurality of switches with a second cell first pair of switches electrically connectable in series between the second cell first input terminal and the second cell output terminal, and a second cell second pair of switches electrically connectable in series between the first cell output terminal and the second cell output terminal. The second driver cell may also have a second non-dissipative element for storing and transferring additional energy for driving the capacitive element between the two voltage levels, with the second non-dissipative element electrically connectable between a common node of the second cell first pair of switches and a common node of the second cell second pair of switches.

In still further embodiments, the sequence of switching stages is a first sequence of stages; and the second plurality of switches is arranged to open or close in combinations in a second sequence of switching stages to maintain the average voltage level value of the second non-dissipative element unchanged over time.

In further embodiments, a circuit-wide sequence of switching for providing step-wise transfer of the energy to the capacitive element is disclosed in which the first plurality of switches and the second plurality of switches are selectively opened or closed in order to drive the capacitive element from the high voltage level to the low voltage level or from the low voltage level to the high voltage level. The controller is further electrically connectable to the second plurality of switches to control opening or closing of the second plurality of switches based on the circuit-wide sequence of switching stages.

In other embodiments, methods and systems are disclosed for driving the voltage of a capacitive element between two voltage levels such as ground and supply voltage. In the disclosed methods and systems, a first pair of a plurality of switches may be connected in series between a first terminal of a voltage source and an input of a capacitive element; and a second pair of the plurality of switches may be connected in series between a second terminal of the voltage source and the input of the capacitive element. In addition, a non-dissipative element such as a storage capacitor may be arranged to store and transfer energy when the capacitive element is being driven between the two voltage levels, with the non-dissipative element connected between the common node of the first pair of switches and the common node of the second pair of switches.

In other embodiments, processes for driving a capacitive element between two voltage levels are disclosed in which a first input terminal of a first capacitive element driver may be electrically connected directly or indirectly to a first terminal of a voltage source, an output terminal of the first capacitive element driver may be electrically connected directly or indirectly to an input of the capacitive element, and a second input terminal of the first capacitive element driver may be electrically connected directly or indirectly to a second terminal of the voltage source.

In further embodiments, in the process for driving a capacitive element between two voltage levels, the average voltage level value of the non-dissipative element may be maintained unchanged over time while the first capacitive element driver is operated through the first sequence of stages.

Additional energy may be stored in a non-dissipative element of the first capacitive element driver, with the non-dissipative element electrically connected between the first input terminal and the output terminal, and electrically connected between the second input terminal and the output terminal. The first capacitive element driver may be operated through a first sequence of stages, with the first sequence arranged to transfer the energy in a first set of voltage steps directly or indirectly to the capacitive element from a first high voltage level to a first low voltage level or from the first low voltage level to the first high voltage level. In further embodiments, in the process for driving a capacitive element between two voltage levels, the average voltage level value of the non-dissipative element may be maintained unchanged over time while the first capacitive element driver is operated through the first sequence of stages.

In other embodiments, the first capacitive element driver may be a first driver cell, and a second driver cell may be electrically connected between the first driver cell and the capacitive element. The second driver cell may have:
- a second cell first input terminal electrically connected directly or indirectly to the first terminal of the voltage source through the first driver cell,
- a second cell output terminal electrically connected directly or indirectly to the input of the capacitive element,
- a second cell second input terminal electrically connecting directly or indirectly to a second terminal of the voltage source through the first driver cell, and
- a non-dissipative element electrically connected between the second cell first input terminal and the second cell output terminal, and between the second cell second input terminal and the second cell output terminal.

Additional energy may be stored in the non-dissipative element of a second capacitive element driver, and the second driver cell may be operated through a second sequence of stages to transfer the additional energy in a second set of voltage steps directly or indirectly to the capacitive element from a second high voltage level to a second low voltage level or from the second low voltage level to the second high voltage level. Further, the second driver cell may be operated through the second sequence of stages in combination and cooperation with the first driver cell as it is operated through the first sequence of stages, with the cooperation further comprising sustaining an application of a first portion of a first pattern of activations of the first driver cell for a duration of an application of a second pattern of activations of the second driver cell.

The energy efficiency of capacitive element driving is improved by the disclosed apparatuses, methods and systems because they allow the non-dissipative element(s) store and transfer energy while the capacitive element is being driven between two voltage levels. In other embodiments, energy efficiency is further improved with a switching methodology in which selected switches are activated and deactivated in a sequence of switching stages in a driving cycle, the stages defined to hold the average value of the voltage across the non-dissipative element(s) unchanged over time.

The disclosed non-dissipative element-enabled capacitive element driving thus minimizes $E_{LOSS}$ without using relatively expensive larger-sized conductors or other inductors employed in conventional resonant capacitive element driving. In addition, the non-dissipative element(s), which in certain embodiments are storage capacitor(s), and switch(es) that are employed in the disclosed apparatuses, methods and systems are relatively area-efficient and inexpensive compared to the inductors employed in conventional resonant capacitive element driving.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

FIG. 1A is a diagram of a conventional circuit 100 for driving the voltage of a capacitive element between two voltage levels such as ground and supply voltage, and FIG. 1B is a diagram showing waveforms associated with the operation of circuit 100;

FIG. 5G is a chart showing the switching sequences of the capacitive element driver 400 during the stages of a complete $V_{O4}$ driving cycle;

FIG. 5H is a circuit diagram of the capacitive element driver 400 in operation when the switches $SW_{4[3]}$, $SW_{4[1]}$ are closed (and the switches $SW_{4[0]}$, $SW_{4[2]}$ are kept open) in a complete $V_{O4}$ driving cycle;

FIG. 5I is a circuit diagram of the capacitive element driver 400 in operation when the switches $SW_{4[0]}$, $SW_{4[2]}$ are closed (and the switches $SW_{4[3]}$, $SW_{4[1]}$ are kept open) in a complete $V_{O4}$ driving cycle;

FIGS. 7D and 7E are circuit diagrams of capacitive element drivers in which not all of the non-dissipative elements are electrically connected in series with one terminal of a first non-dissipative element in the series electronically and directly connected directly to one terminal of the voltage source and one terminal of a last non-dissipative element in the series electronically and directly connected to the other terminal of the voltage source, with.

FIG. 7D being a circuit diagram of a capacitive element driver 700D, which constitutes another alternative embodiment of the storage capacitor-enabled capacitive element driver 700A having a set of common nodes with a common node associated with each non-dissipative element and disposed between the negative terminal of the voltage source and one end of the subject non-dissipative element; and FIG. 7E being a circuit diagram of a capacitive element driver 700E, which constitutes another alternative embodiment of the storage capacitor-enabled capacitive element driver 700A having a set of common nodes with a common node associated with each non-dissipative element and disposed between the positive terminal of the voltage source and one end of the subject non-dissipative element.

FIG. 8B is a chart 850 showing an illustrative switching sequence methodology 80 for the capacitive element driver 700A during the stages of a complete $V_{O7A}$ driving cycle;

FIG. 8C is a chart 880 showing the switching sequences of the capacitive element driver 780 during the stages of a complete $V_{O7B}$ driving cycle;

FIGS. 10-18 are circuit diagrams of electrical systems illustrative of embodiments of the present invention, in which capacitive driving circuits are electrically connected to electrical device/networks having capacitive functionality, with:

FIG. 10 showing a capacitive element driver 1000 having a voltage source 1020 and a capacitive driving circuit 1010 electrically connected to an electrical device/network 1030 through one terminal of one impedance to a node 1004 of the driver 1000, and through a node 1006 of the driver 1000, and with the node 1006 electrically connected to the positive terminal 1026 of the voltage source $V_{DD10}$ (also known as voltage source 1020) of the driver 1000, FIG. 11 showing a capacitive element driver 1100 having a voltage source and a capacitive driving circuit 1110 electrically connected to an n-terminal device/network 1130 through one terminal to a node 1104 of the driver 1100 and through a node 1108 of the driver 1100, with the node 1108 of a capacitive driving circuit 1110 electrically connected to the negative terminal 1128 of a voltage source $V_{DD11}$ of the driver 1100, and FIG. 12 showing a capacitive element driver 1200 having a voltage source and a capacitive driving circuit 1210 electrically connected to an n-terminal device/network 1230 through one terminal to a node 1204 of the driver 1200 and through a node 1206 of the driver 1200, with the node 1206 electrically connected to the positive terminal 1226 of a voltage source $V_{DD12}$ of the capacitive element driver 1200;

FIGS. 13-16 are circuit diagrams of electrical systems in which capacitive driving circuits 1310, 1410, 1510, 1610 are electrically connected to gate terminal(s) of transistor(s), with:

FIG. 13 showing transistor(s) 1330 connected through source terminal(s) to the negative terminal of a voltage source $V_{DD13}$ of the capacitive driving circuit 1310, FIG. 14 showing the transistor(s) 1430 connected through source terminal(s) to the positive terminal of a voltage source $V_{DD14}$ of the capacitive driving circuit 1410, FIG. 15 showing transistor(s) 1530 connected through drain terminal(s) to the positive terminal of a voltage source $V_{DD15}$ of the capacitive driving circuit 1510, and FIG. 16 showing transistor(s) 1630 connected through drain terminal(s) to the negative terminal of a voltage source $V_{DD16}$ of the capacitive driving circuit 1610;

FIGS. 17-18 are circuit diagrams of electrical systems in which elements 1740, 1840 may be driven by capacitive driving circuits 1710, 1810, respectively, through transistor(s) 1730, 1830, respectively, with capacitive driving circuits 1710, 1810 electrically connected to gate terminal(s) of transistor(s) 1730, 1830, and with:

FIG. 17 showing the element 1740 connected through terminal(s) to source terminal(s) of the transistor(s) 1730 and through other terminals between the positive and negative terminals of the voltage source $V_{DD17}$ of the circuit 1710, and FIG. 18 showing the element 1840 connected through terminal(s) to drain terminal(s) of the transistor(s) 1830 and through other terminal(s) between the positive and negative terminals of the voltage source $V_{DD18}$ of the circuit 1810;

FIG. 22K is a chart illustrating an embodiment of the switching sequence methodology 2200 shown in the circuit diagrams of FIGS. 22A-22J;

FIGS. 22L-1-22L-3 are charts illustrating the voltage assignment functionality of sets of closed switches in an embodiment of switching sequences of driver cells in selected driving circuits, with:

FIG. 22L-1 showing the voltage assignment functionality 2001-1 of sets of closed switches in a driver cell x with one non-dissipative element (and four switches), FIG. 22L-2 showing the voltage assignment functionality 2001-2 of sets of closed switches in a driver cell y with two non-dissipative elements (and five switches), and FIG. 22L-3 showing the voltage assignment functionality 2001-$q$ of sets of closed switches in a generalized driver cell k with q non-dissipative elements (and q+3 switches);

FIGS. 22M-1A-22M-5B are charts illustrating switching sequence methodologies for selected driving circuits showing phases and patterns of switching using the notation for operation of sets of closed switches outlined in the voltage assignment functionalities 2001-1, 2001-2, 2001-$q$ shown in FIGS. 22L-1, 22L-2, 22L-3, respectively, with FIG. 22M-1A showing a more detailed specification of the voltage assigned by each stage of the switching sequence methodology 2200 of FIG. 22K for operating a driving circuit 2100 through the stages of a complete output voltage driving cycle, with FIG. 22M-1B showing phases of and switching patterns in the methodology 2200;

FIG. 22M-2A1 showing a switching sequence methodology 2220 for a driving circuit [wxy] through the stages of a complete output voltage driving cycle, with the circuit [wxy] having three driver cells, each with one non-dissipative element, and FIG. 22M-2A2 showing the phases of and switching patterns in the methodology 2220;

FIG. 22M-2B1 showing a switching sequence methodology 2240 for a driving circuit [vwxy] through the stages of a complete output voltage driving cycle, with the circuit [vwxy] having four driver cells, each with one non-dissipative element, and FIG. 22M-2B2 showing the phases of and switching patterns in the methodology 2240;

FIG. 22M-3A showing a switching sequence methodology 2260 for a driving circuit [ab] through the stages of a complete output voltage driving cycle, with the circuit [ab] having a first cell [a] with one non-dissipative element and a second cell [b] with two non-dissipative elements, and FIG. 22M-3B showing the phases of and switching patterns in the methodology 2260;

FIG. 22M-4A showing a switching sequence methodology 2270 for a driving circuit [mn] through the stages of a complete output voltage driving cycle, with the circuit [mn] having a first cell [m] having two non-dissipative elements and a second cell [n] with one non-dissipative element, and FIG. 22M-4B showing the phases of and switching patterns in the methodology 2270; and FIG. 22M-5A1, 22M-5A2, and FIG. 22M-5B showing a switching sequence methodology 2280 for a driving circuit [mnp] through the stages of a complete output voltage driving cycle, with the driving circuit [mnp] having a first cell [m] and second cell [n] with two non-dissipative elements each and a third cell [p] with three non-dissipative elements, and with:

FIG. 22M-5A1 showing the methodology 2280 for driving the circuit [mnp] from ground to its peak voltage, FIG. 22M-5A2 showing the methodology 2280 for driving the circuit [mnp] from its peak voltage to ground, and FIG. 22M-5B showing the phases of and switching patterns in the methodology 2280;

FIG. 23A is a circuit diagram showing one embodiment of a capacitive element driving circuit 2300 that constitutes a more generalized embodiment of the storage capacitor-enabled capacitive element driver 2100 with circuit 2300 having K cells, each with at least one non-dissipative element (the embodiment also known as a K-cell driving circuit 2300);

FIGS. 24A-24B-3 are charts illustrating the portion of a switching sequence methodology 2400 for operating the generalized driving circuit 2300 through the stages of a $V_{O23}$ driving cycle in which the multi-cell circuit 2300 drives its output voltage from ground to its peak voltage, with:

FIG. 24A showing the methodology phases and cell switching patterns for driving the cell 2301-1 from ground to its peak voltage, namely an initiating cell [1] phase 2412[1]-1 and a portion of a peaking cell [1] phase 2414[1]; and FIGS. 24B-1, 24B-2, and 24B-3 showing the methodology phases and cell switching patterns for driving the remainder of the cells 2301-z, where 2≤z≤K, from ground to its peak voltage, with FIGS. 24B-1 illustrating an initiating cell [z] phase 2412[z]-1, FIG. 24B-2 illustrating an executing cell [z] phase 2413[z]-1, and FIG. 24B-3 illustrating a portion of the peaking cell [z] phase 2414[z].

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

A Basic Non-Dissipative Element-Enabled Capacitive Element Driver

Capacitive Element Driver 400

Figure 4:
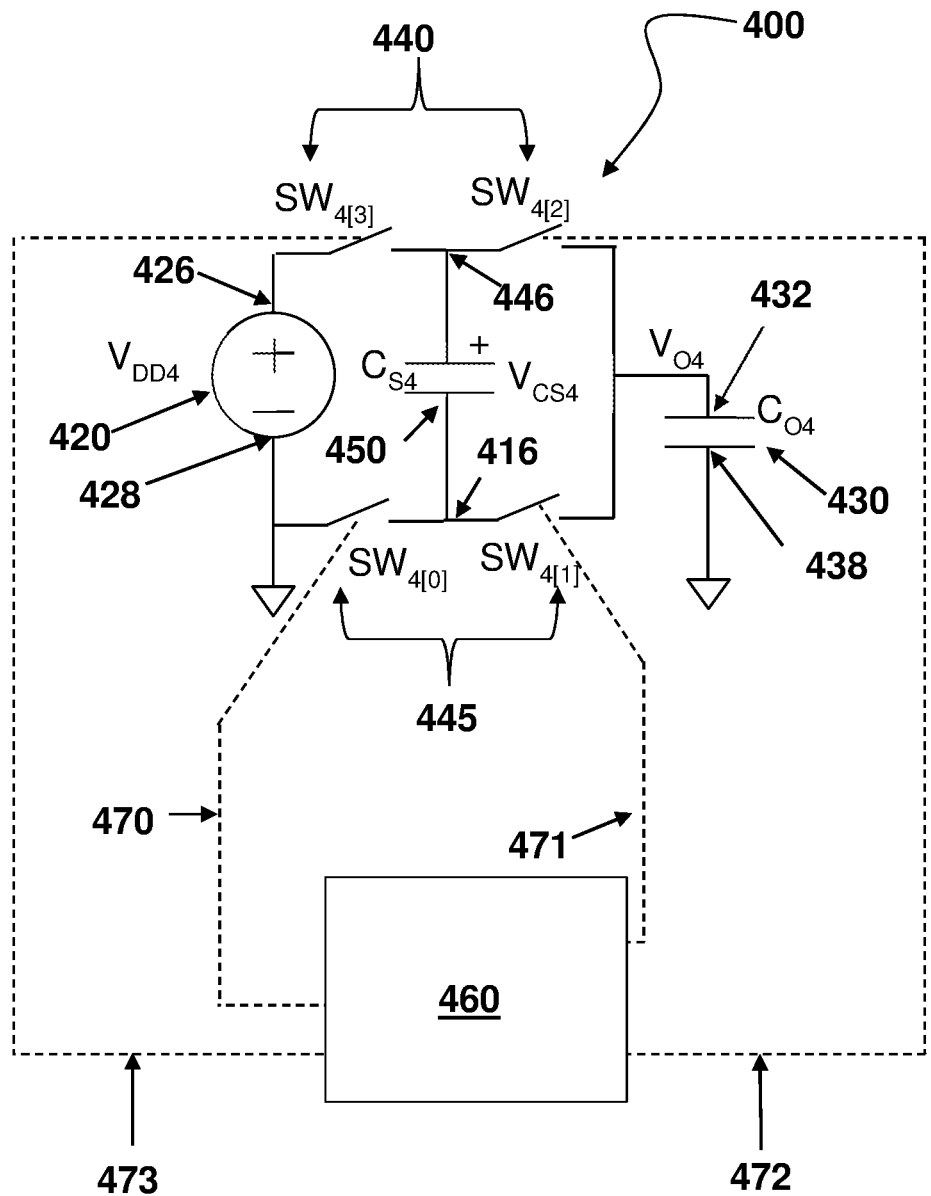
FIG. 4 is a circuit diagram of a capacitive element driver 400 for one embodiment of a storage capacitor-enabled capacitive element driver of the current invention.

One embodiment of the present invention, shown in FIG. 4, has a capacitive element driver 400, also known as a non-dissipative element-enabled capacitive element driver (or, in an illustrative but not necessarily preferred embodiment in which the non-dissipative elements may be storage capacitors, a storage capacitor-enabled capacitive element driver), which also may be known as a fractional capacitive element driver or a green capacitive element driver, for driving the voltage of a capacitive element 430 between two voltage levels such as ground and supply voltage.

The capacitive element driver 400 may have a first pair 445 of switches $SW_{4[0]}$ and $SW_{4[1]}$ connected in series and disposed between a voltage source 420 (also known as voltage supply and the voltage source $V_{DD4}$ for supplying a voltage of a value $V_{DD4}$ to the capacitive element driver 400) and a capacitive element 430 (also known as capacitive element $C_{O4}$, element, or $C_{O4}$), which is sized to hold a voltage of a value $V_{O4}$ thereacross. In the embodiment of FIG. 4, the voltage source $V_{DD4}$ is a component of the capacitive element driver 400, but in other embodiments, it may be a unit separate from and electronically attachable to the capacitive driving circuit of the capacitive element driver 400.

The capacitive element 430 may be a capacitor or any element capable of being positioned at an output terminal of a circuit and there function as a capacitor. For example, the capacitive element 430 may be one or more capacitive loading elements. In the embodiment of FIG. 4, the capacitive element 430 is a unit separate from and electronically attachable to the capacitive driving circuit of the capacitive element driver 400, but in other embodiments, it may be a component of the capacitive element driver 400, The switch $SW_{4[0]}$ is electrically connected to a negative terminal 428 of the voltage source 420 and a common node 416 between the switches $SW_{4[0]}$ and $SW_{4[1]}$; and the switch $SW_{4[1]}$ is electrically connected to the common node 416 and a terminal 432 of the capacitive element 430 (a terminal may also referred to as an input or node). The other terminal 438 of the capacitive element $C_{O4}$ may be connected to ground or to the negative terminal 428 of the voltage source.

The capacitive element driver 400 may have a second pair 440 of switches $SW_{4[2]}$ and $SW_{4[3]}$ connected in series and disposed between the voltage source 420 and the capacitive element 430. The switch $SW_{4[3]}$ is disposed to and electrically connected to a positive terminal 426 of the voltage source 420 and a common node 446 between the switches $SW_{4[3]}$, $SW_{4[2]}$; and the switch $SW_{4[2]}$ is disposed between and connected to the common node 446 and the input 432 of the capacitive element 430.

The capacitive element driver 400 also may have a non-dissipative element 450, which (in an illustrative but not necessarily preferred embodiment) may be a storage capacitor $C_{S4}$ disposed between and electrically connected to the common nodes 416, 446. Energy may be either stored in or transferred from the storage capacitor 450 when transient current flows through the capacitive element 430.

The capacitive element driver 400 also may have or be electrically connected to a controller 460 for controlling the activation and deactivation of the switches $SW_{4[0]}$, $SW_{4[1]}$, $SW_{4[2]}$, $SW_{4[3]}$ so that the switches are switched on and off in combinations in a switching sequence of stages within one complete $V_{O4}$ driving cycle that is defined to ensure the average value of voltage $V_{CS4}$ of the storage capacitor 450 remains unchanged over time. The controller 460 may be electrically connected to the switches $SW_{4[0]}$, $SW_{4[1]}$, $SW_{4[2]}$, $SW_{4[3]}$ through paths 470, 471, 472, 473 respectively (shown in FIG. 4 in broken lines) to provide control signals to signal the capacitive element driver 400 to start or stop a switching sequence methodology, such as is described below.

Switch Sequencing

Figure 5A:
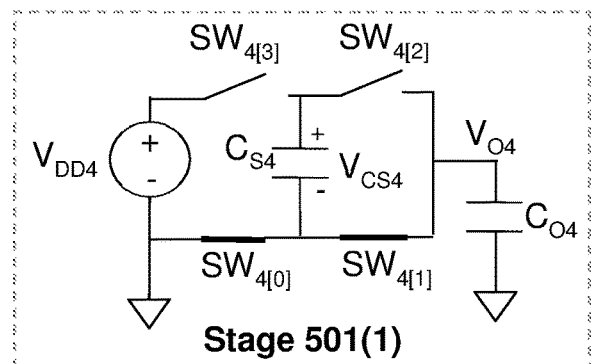
FIGS. 5A-5F are circuit diagrams showing the capacitive element driver 400 in operation through a complete $V_{O4}$ driving cycle.
Figure 5B:
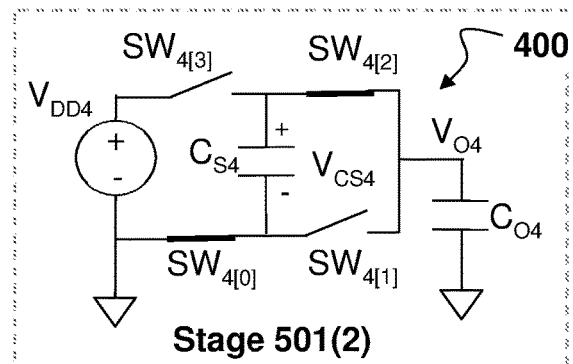
Figure 5C:
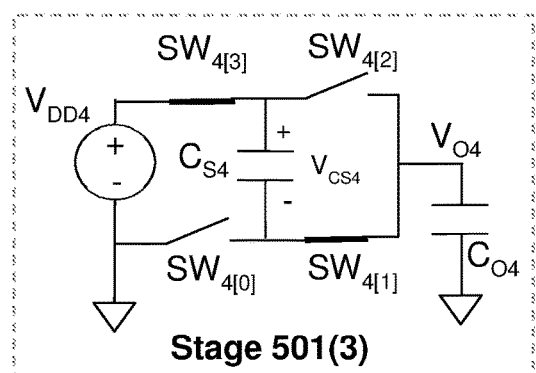
Figure 5D:
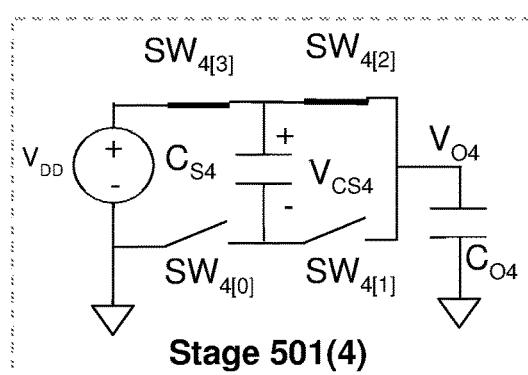
Figure 5E:
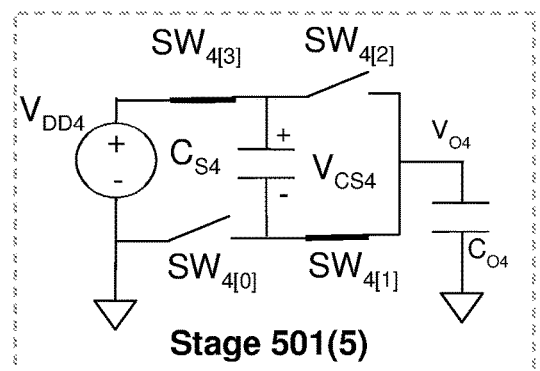
Figure 5F:
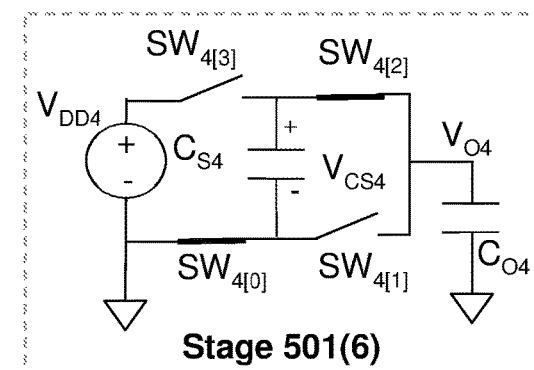

The controller 460 controls the activation and deactivation of the switches $SW_{4[0]}$, $SW_{4[1]}$, $SW_{4[2]}$, $SW_{4[3]}$ to drive the capacitive element driver 400 through a complete $V_{O4}$ driving cycle using a set of stages as shown in FIGS. 5A-5G:

In Stage 501(1), the switches $SW_{4[0]}$, $SW_{4[1]}$ are closed (and the switches $SW_{4[2]}$, $SW_{4[3]}$ are open) to drive the voltage $V_{O4}$ to ground (FIG. 5A);

In Stage 501(2), the switches $SW_{4[0]}$, $SW_{4[2]}$ are closed (and the switches $SW_{4[1]}$, $SW_{4[3]}$ are open), to drive $V_{O4}$ to $V_{CS4}$ (FIG. 5B);

In Stage 501(3), the switches $SW_{4[1]}$, $SW_{4[3]}$ are closed (and the switches $SW_{4[0]}$, $SW_{4[2]}$ are open) to drive $V_{O4}$ to ($V_{DD4}$-$V_{CS4}$) (FIG. 5C);

In Stage 501(4), the switches $SW_{4[2]}$, $SW_{4[3]}$ are closed (and the switches $SW_{4[0]}$, $SW_{4[1]}$ are open) to drive $V_{O4}$ to $V_{DD4}$ (FIG. 5D);

In Stage 501(5), the switches $SW_{4[1]}$, $SW_{4[3]}$ are closed (and the switches $SW_{4[0]}$, $SW_{4[2]}$ are open) to drive $V_{O4}$ to ($V_{DD4}$-$V_{CS4}$) (FIG. 5E); and In Stage 501(6), the switches $SW_{4[0]}$, $SW_{4[2]}$ are closed (and the switches $SW_{4[1]}$, $SW_{4[3]}$ are open) to drive $V_{O4}$ to $V_{CS4}$ (FIG. 5F).

The controller 460 may then return to Stage 501(1) to repeat the switching sequence. FIG. 5G is a chart showing the switching sequence and the resultant value of $V_{O4}$ to which the voltage across the capacitive element 430 is driven during one complete $V_{O4}$ driving cycle. FIG. 5G adopts the standard switching convention of illustrating a switching pattern by identifying switches that are closed with the term "Closed." Unless specified in the following description of the stages and phases, the switches not labelled "Closed" are open. In later charts herein, the term "Closed" may be abbreviated to "C."

FIG. 5H is an illustration of the capacitive element driver 400 in operation when the switches $SW_{4[3]}$, $SW_{4[1]}$ are closed (and the switches $SW_{4[0]}$, $SW_{4[2]}$ are kept open), as in Stages 501(3), 501(5). Referring to FIG. 5H, the storage capacitor $C_{S4}$ is in series between the capacitive element $C_{O4}$ and the voltage source $V_{DD4}$ through closure of the switches $SW_{4[3]}$, $SW_{4[1]}$. Energy is stored in the storage capacitor $C_{S4}$ when transient current flows through the capacitive element $C_{O4}$.

FIG. 5I is an illustration of the capacitive element driver 400 in operation when the switches $SW_{4[0]}$, $SW_{4[2]}$ are closed (and the switches $SW_{4[3]}$, $SW_{4[1]}$ are kept open), as in Stages 501(2), 501(6). Referring to FIG. 5I, the storage capacitor $C_{S4}$ is in parallel with the capacitive element $C_{O4}$ through closure of the switches $SW_{4[0]}$ and $SW_{4[2]}$. Energy stored in the storage capacitor $C_{S4}$ is transferred to the capacitive element $C_{O4}$.

Figure 6A:
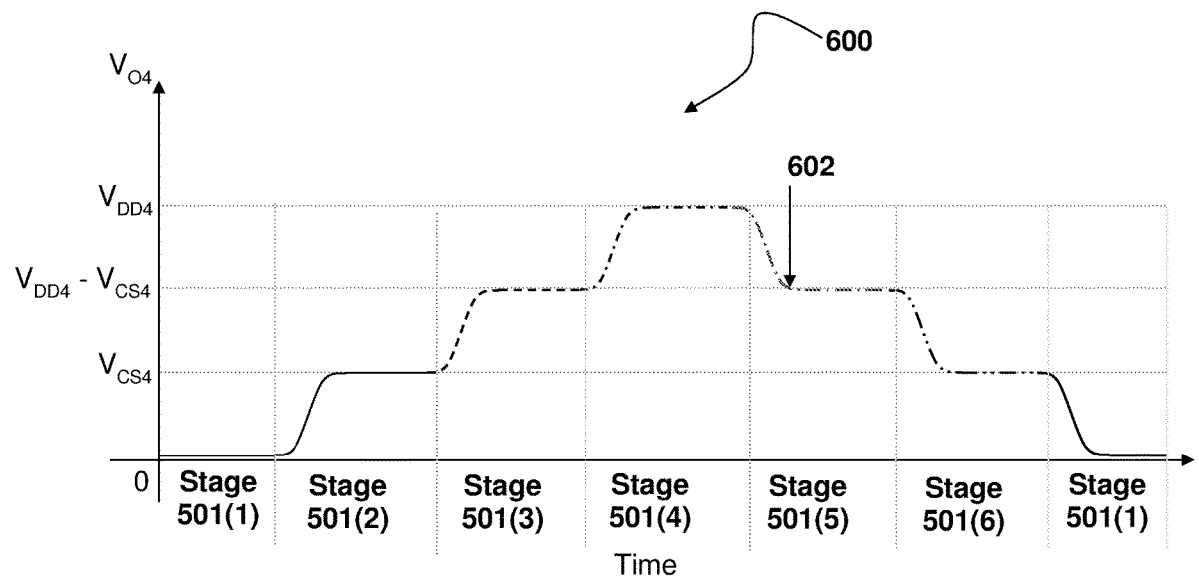
FIG. 6A is a graph 600 illustrating a waveform 602 of the voltage $V_{O4}$ inputted to the capacitive element 430 during a complete $V_{O4}$ driving cycle for the capacitive element driver 400.

A switching sequence, applied in Stages 501(1) through 501(6), holds the average current across the storage capacitor 450 at zero and maintains the average value of the voltage at the storage capacitor 450 unchanged over time, while proceeding through a complete $V_{O4}$ driving cycle. FIG. 6A is a graph 600 illustrating a waveform 602 of the voltage $V_{O4}$ inputted to the capacitive element 430 corresponding to operation of the capacitive element driver 400 in accordance with the Stages 501(1)-501(6). Graph 600 shows the $V_{O4}$ driving cycle provided by operation of the Stages 501(1)-501(6) as having a step-wise increase of the voltage $V_{O4}$ to a peak voltage $V_{DD4}$ (the voltage supplied by the voltage source 420), and then a step-wise decrease of the voltage $V_{O4}$ to ground.

This switching sequence of Stages 501(1) 501(6) ensures that the average current, hence net charge, of storage capacitor $C_{S4}$ holds at zero. Equating the net charge going into the storage capacitor 450 under one complete $V_{O4}$ driving cycle to zero, the average value of $V_{CS4}$ (equation 2) may be computed as following:

Net charge of $C_{S4}$=$[-C_{O4}V_{CS4}+C_{O4}(V_{DD4}-2V_{CS4})-$
$C_{O4}V_{CS4}+C_{O4}(V_{DD4}-2V_{CS4})]$ (1)

Equating the net charge of $C_{S4}$=0:

$[-C_{O4}V_{CS4}+C_{O4}(V_{DD4}-2V_{CS4})-C_{O4}V_{CS4}+C_{O4}$
$(V_{DD4}-2V_{CS4})]=0 \rightarrow V_{CS4}=V_{DD4}/3$ (2)

Thus the voltage $V_{O4}$ is changed per stage with a delta of $V_{DD4}/3$. The energy dissipated on switches per stage may be shown algorithmically in equation 3 as $$\frac{1}{2}C_{O4}\left(\frac{V_{DD4}}{3}\right)^2 = \frac{1}{18}C_{O4}V_{DD4}^2 \quad (3)$$

Figure 6B:
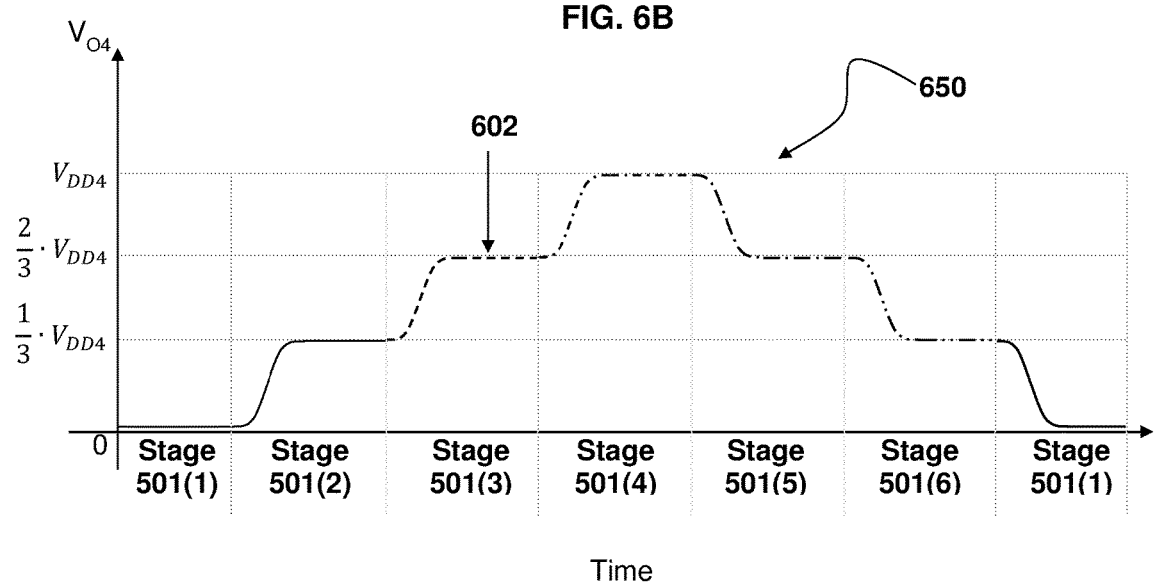
FIG. 6B is a graph 650 illustrating the waveform 602 of FIG. 6A with a more detailed y-axis label.

FIG. 6B is a graph 650 showing the waveform 602 of FIG. 6A with the y-axis label modified accordingly.

As shown in FIGS. 5A-5G, six stages of switching sequences in one complete $V_{O4}$ driving cycle may be defined, to achieve total energy dissipation (equation 4):

$$E_{t\_circuit\_400} = 6 \times \frac{1}{18}C_{O4}V_{DD4}^2 = \frac{1}{3}C_{O4}V_{DD4}^2. \quad (4)$$

Figure 2A:
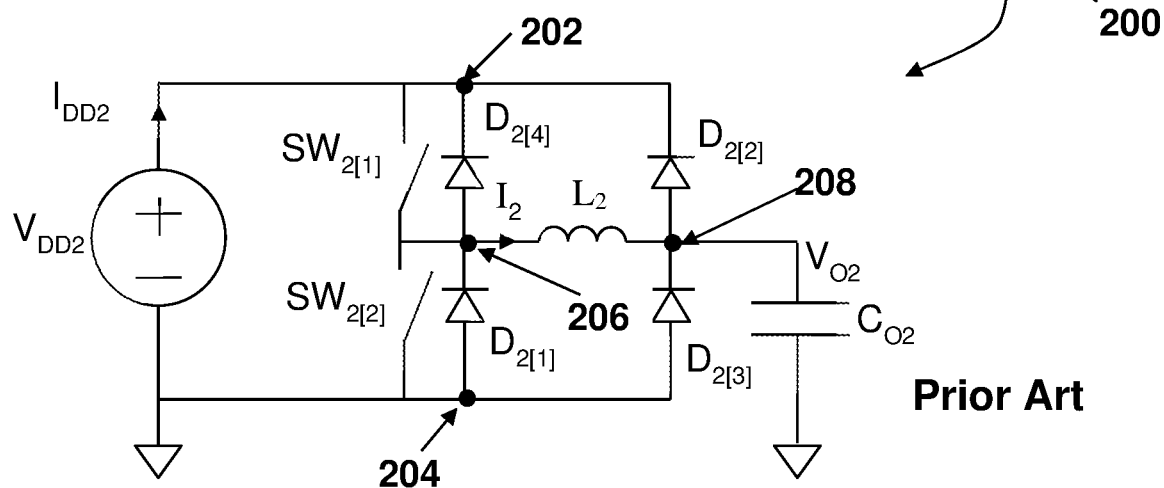
FIG. 2A is a circuit diagram of a conventional circuit 200 for resonant capacitive element driving between two voltage levels.
Figure 3A:
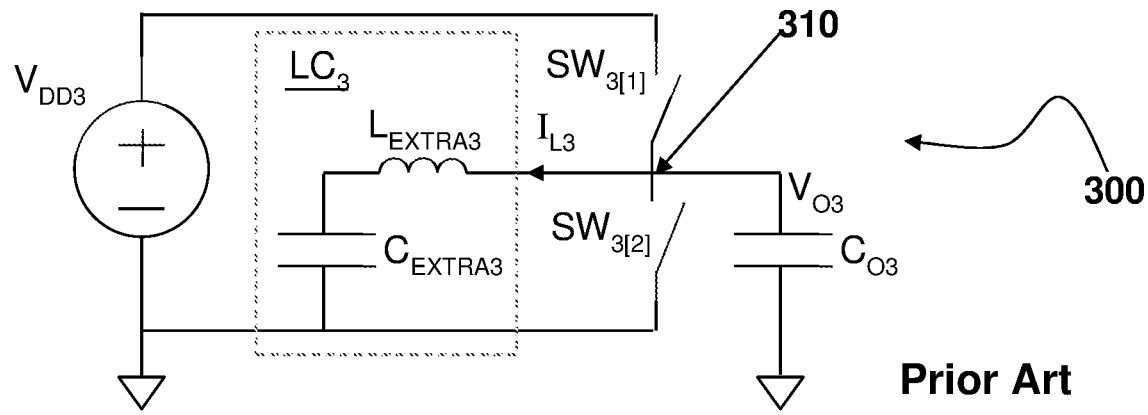
FIG. 3A is a circuit diagram of a conventional circuit 300 for capacitive element driving between two voltage levels using an inductor and a capacitor (LC) network $LC_3$.

In the conventional driving device, system, and process embodied in the circuit 100, the total energy dissipation of one complete $V_{O1}$ driving cycle is $E_{t\_circuit\_100}=C_{O1}V_{DD1}^2$. Therefore, the capacitive element driving device, system, and process embodied in the capacitive element driver 400 (FIG. 4) reduces the total energy dissipation per one $V_{O4}$ driving cycle by 3 times. Further, the driving device, system, and process embodied in the capacitive element driver 400 do not introduce extra current and hence extra conduction loss caused by the inclusion of inductor(s) in conventional resonant capacitive element drivers such as is shown in the driving device, system, and process embodied in the circuit 200 (FIG. 2A) and the circuit 300 (FIG. 3A). In addition, unlike the conventional resonant capacitive element driving illustrated in the circuit 200 and the circuit 300, the switch(es) used in the capacitive element driver 400 may be built on the same substrate (e.g. silicon), further minimizing the cost and size of capacitive element driving.

The energy saving provided by the use of the storage capacitor in capacitive element driver 400 results because of the average of the storage capacitor voltage $V_{CS4}$ remains between the supply voltage and ground. When the average voltage $V_{CS4}$ was equal to either the supply voltage or to ground, no energy saving would be achieved. For the case in capacitive element driver 400, when the average of $V_{CS4}$=⅓ of the supply voltage $V_{DD4}$, the energy saving is optimum.

Generalized Non-Dissipative Element-Enabled Capacitive Element Driver

Capacitive Element Driver 700A

Figure 7A:
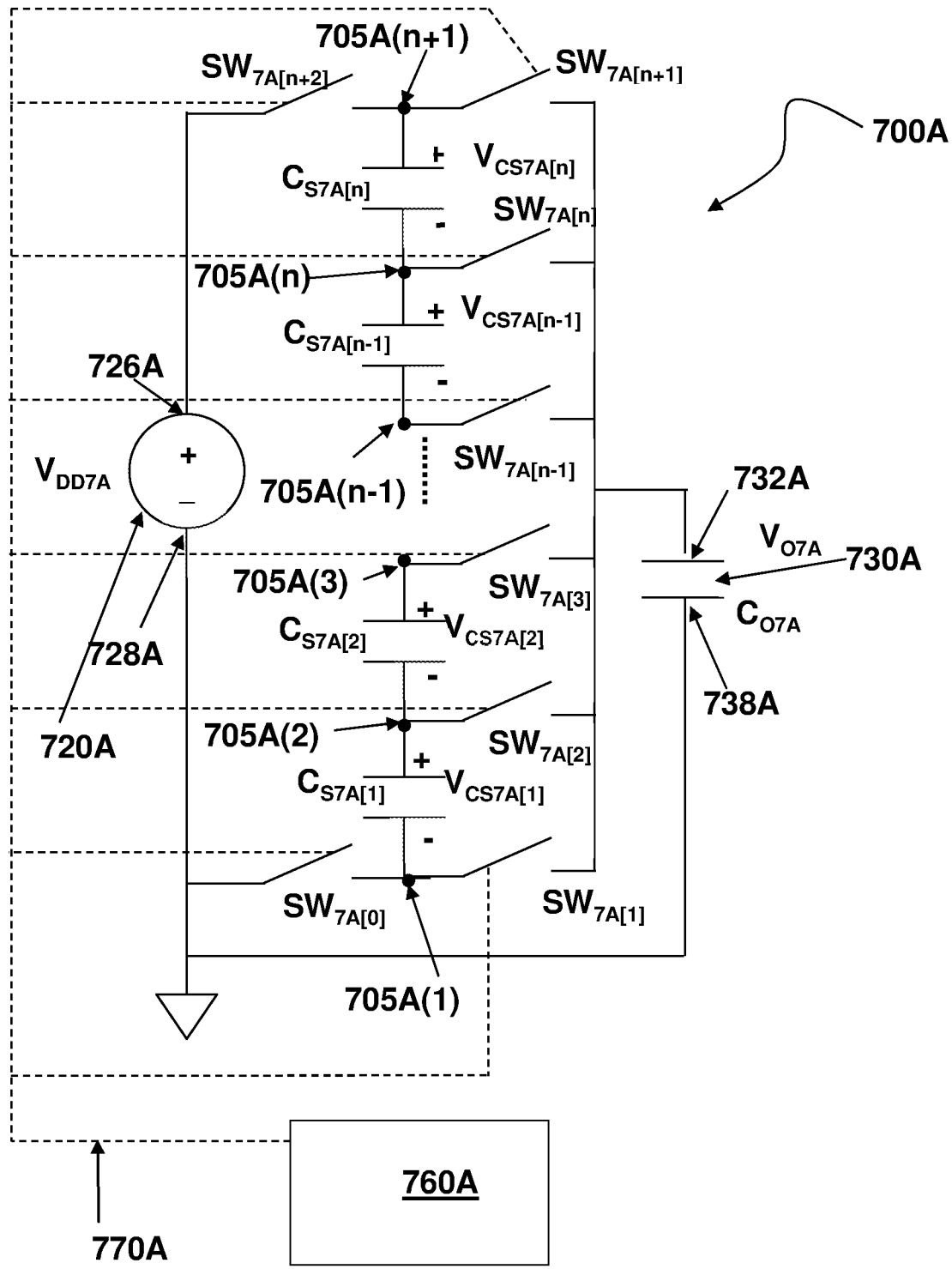
FIG. 7A is a circuit diagram of a capacitive element driver 700A that constitutes a more generalized embodiment of the storage capacitor-enabled capacitive element driver of capacitive element driver 400.

While FIG. 4 shows an embodiment of an improved capacitive element driver in which a single non-dissipative element 450 and four switches are included in a capacitive element driver 400, FIG. 7A illustrates a generalized embodiment of a non-dissipative element-enabled capacitive element driver in which a capacitive element driver 700A has n non-dissipative elements (which in an illustrative but not necessarily preferred embodiment may be storage capacitors) ($C_{S7A[1]}$, $C_{S7A[2]}$, $C_{S7A[3]}$, $C_{S7A[n-1]}$, $C_{S7A[n]}$); n+3 switches ($SW_{7A[0]}$, $SW_{7A[1]}$, $SW_{7A[2]}$, . . . , $SW_{7A[n]}$, $SW_{7A[n+1]}$, $SW_{7A[n+2]}$); a voltage source 720A for supplying a voltage $V_{DD7A}$, and a capacitive element 730A (also known as capacitive element $C_{O7A}$, element, or $C_{O7A}$) are included in a capacitive element driver 700A. The number n may be any positive integer. As noted above with respect to capacitive element 430, a capacitive element 730A may be a capacitor or any element capable of being positioned at the output terminal of a circuit and functioning as a capacitor. For example, the capacitive element 730A may be one or more capacitive loading elements.

As with the capacitive element driver 400, the capacitive element driver 700A may have the voltage source 720A (also known as the voltage source $V_{DD7A}$) for supplying a voltage of a value as a component of the capacitive element driver 700A, but in other embodiments, it may be a unit separate from and electronically attachable to the capacitive driving circuit of the capacitive element driver 700A. Also, as with the capacitive element 430, the capacitive element 730A is a unit separate from and electronically attachable to the capacitive driving circuit of the capacitive element driver 700A, but in other embodiments, it may be a component of the capacitive element driver 700A.

The switches $SW_{7A[0]}$, $SW_{7A[i]}$ are connected in series and are electrically connected to and disposed between a negative terminal 728A of a voltage source 720A (for supplying a voltage $V_{DD7A}$) and one terminal 732A of the capacitive element 730A, for holding a voltage $V_{O7A}$ thereacross. The switches $SW_{7A[n+1]}$, $SW_{7A[n+2]}$ are also connected in series, and are electrically connected to and disposed between a positive terminal 726A of the voltage source 720A and the input 732A of the capacitive element 730A. The other terminal 738A of the capacitive element $C_{O7A}$ may be electrically connected to ground or to the negative terminal 728A of the voltage source 720A.

The switch $SW_{7A[0]}$ may be disposed between and electrically connected to a negative terminal 728A of the voltage source 720A and a common node 705A(1) between the switches $SW_{7A[0]}$, $SW_{7A[1]}$. The switch $SW_{7A[n+2]}$ may be disposed between and electrically connected to a positive terminal 726A of the voltage source 720A and a common node 705A(n+1) between the switches $SW_{7A[n+1]}$, $SW_{7A[n+2]}$.

The n storage capacitors may be electrically connected in series and disposed between the common nodes 705A(1), 705A(n+1), with a storage capacitor $C_{S7A[x]}$, where x is from 1 to n, disposed between and electrically connected to nodes 705A(x), 705A(x+1). Further, the switch $SW_{7A[x]}$, where x is from 1 to n+1, may be disposed between and electrically connected to the node 705A(x) and the input 732A of the capacitive element $C_{O7A}$. Specifically,

- one terminal of switch $SW_{7A[1]}$ may be electrically connected to the input 732A of capacitive element $C_{O7A}$, and the other terminal may be electrically to the common node 705A(1) of the switches $SW_{7A[0]}$ and $SW_{7A[1]}$;
- one terminal of switch $SW_{7A[2]}$ may be electrically connected to the input 732A of capacitive element $C_{O7A}$, and the other one terminal may be electrically connected to the common node 705A(2) of storage capacitors $CS_{7A[1]}$ and $CS_{7A[2]}$;
- one terminal of switch $SW_{7A[3]}$ may be electrically connected to the input 732A of capacitive element $C_{O7A}$, and the other one terminal may be electrically connected to the common node 705A(3) of storage capacitors $CS_{7A[2]}$ and $CS_{7A[3]}$ (not shown);
- one terminal of switch $SW_{7A[n-1]}$ may be electrically connected to the input 732A of capacitive element $C_{O7A}$, and the other terminal may be electrically connected to the common node 705A(n-1) of storage capacitors $CS_{7A[n-2]}$ (not shown) and $CS_{7A[n-1]}$;
- one terminal of switch $SW_{7A[n]}$ may be electrically connected to the input 732A of capacitive element $C_{O7A}$, and the other terminal may be electrically connected to the common node 705A(n) of storage capacitors $CS_{7A[n-1]}$ and $CS_{7A[n]}$; and
- one terminal of switch $SW_{7A[n+1]}$ may be electrically connected to the input 732A of capacitive element $C_{O7A}$, and the other terminal may be electrically connected to the common node 705A(n+1) of the switches $SW_{7A[n+1]}$, $SW_{7A[n+2]}$.

The capacitive element driver 700A also has or is electrically connected via a path system 770A to a controller 760A, which is arranged to provide control signals to signal the capacitive element driver 700A to start or stop a switching sequence methodology. The path system 770A electrically connects the controller 760A to the switches to allow the controller 760A to selectively connect the storage capacitors, voltage source 720A, and the capacitive element in stages within one complete $V_{O7A}$ driving cycle in which switches are switched on and off in combinations in a sequence of stages within one complete $V_{O7A}$ driving cycle. The stages may be implemented in a sequencing methodology having a plurality of phases; the methodology is defined to ensure the average value of voltage of the storage capacitors remains unchanged over time.

Switch Sequencing

Figure 8A:
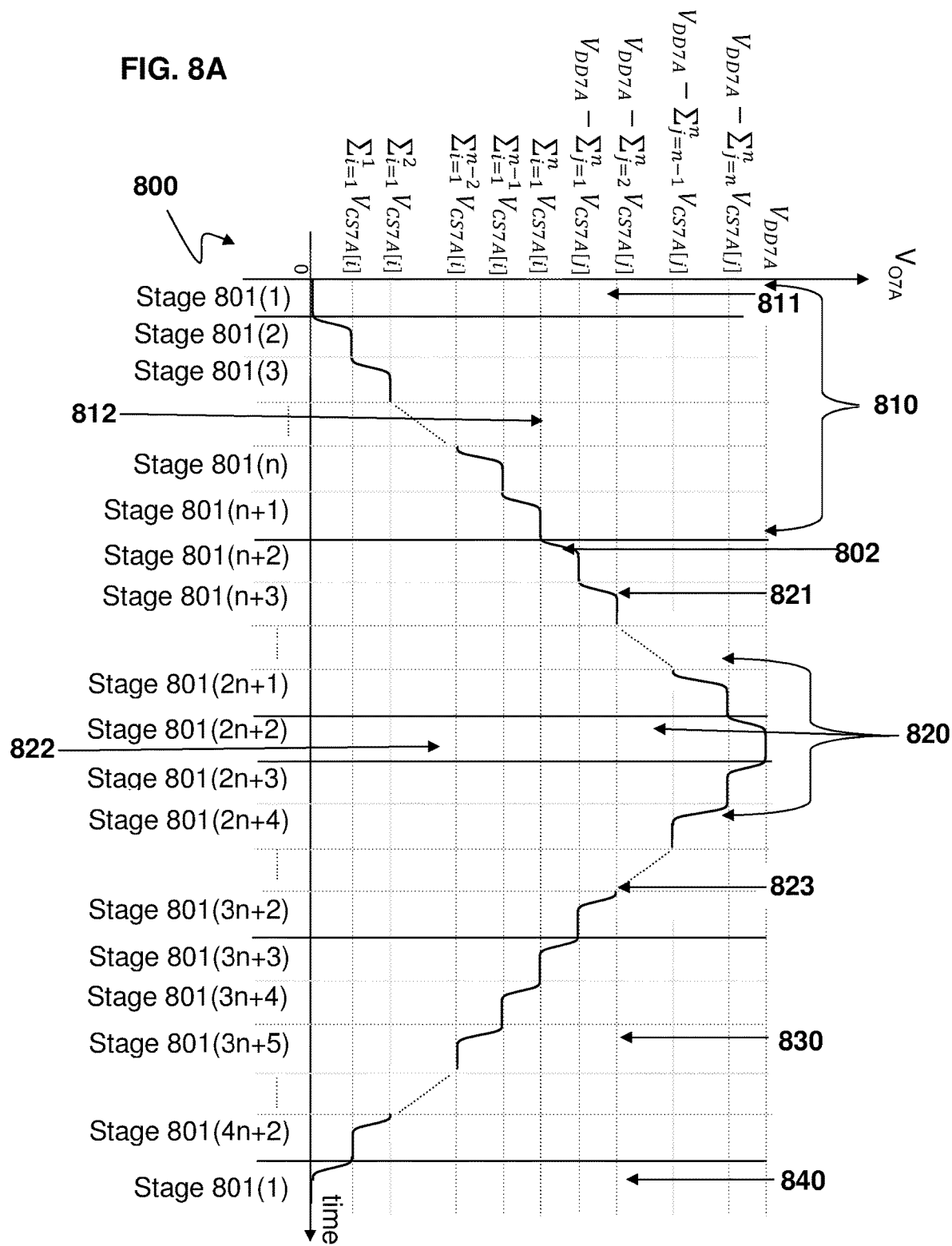
FIG. 8A is a graph 800 illustrating a waveform 802 of the voltage $V_{O7A}$ inputted to the capacitive element 730A during a complete $V_{O7A}$ driving cycle for the capacitive element driver 700A.

Referring to FIG. 8A, a graph 800 illustrates a waveform 802 of the voltage $V_{O7A}$ inputted to the capacitive element 730A corresponding to operation of the capacitive element driver 700A in accordance with the Stages 801(1)-801(4n+2) and the switching sequence methodology disclosed herein. Graph 800 shows the $V_{O7A}$ driving cycle as having a step-wise increase of the voltage $V_{O7A}$ to a peak voltage $V_{DD7A}$ (the voltage supplied by the voltage source 720A), and then a step-wise decrease of the voltage $V_{O7A}$ to ground.

The switching sequence methodology 80 calls for switches to be activated in combinations within one complete $V_{O7A}$ driving cycle to ensure that the average value of the voltage $V_{CS7A[1]}$, $V_{CS7A[2]}$, $V_{CS7A[3]}$, $V_{CS7A[n-1]}$, and $V_{CS7A[n]}$ of the storage capacitors does not change over time. Referring to FIG. 8B, a chart 850 illustrates the stages that may be used to control the n+3 switches throughout a $V_{O7A}$ driving cycle, including the phase of the switching methodology associated with the selected stage, the switches that are activated during the selected state, the voltage to which $V_{O7A}$ at the capacitive element 730A is driven during the selected stage.

FIG. 8B identifies switches that are closed with the term "C," which, as noted above, is an abbreviation of "Closed." Unless specified in the following description of the stages and phases, the switches not labelled "C" are open.

Switching Sequence Phase 810 for Stages 801(1) to 801(n+1): Phase 810 constitutes a first phase of the switching sequence methodology 80, in which the switch $SW_{7A[0]}$ (the switch electrically connected to the negative terminal 728A of voltage source $V_{DD7A}$) is closed and remains closed, and the switch $SW_{7A[n+2]}$ (the switch electrically connected to the positive terminal 726A of voltage source $V_{DD7A}$) is open until the end of Stage 801(n+1).

Switching Sequence Sub-Phase 811 for Stage 801(1): Switch $SW_{7A[1]}$ is closed until $V_{O7A}$ is driven to ground level (e.g. 0V).

Switching Sequence Sub-Phase 812 for Stages 801(2) to 801(n+1): The switches $SW_{7A[2]}$ to $SW_{7A[n+1]}$ are closed sequentially. The stages operate sequentially and, during a Stage 801(s), with s from 2 to n+1, the switch $SW_{7A[w]}$, with w also from 2 to n+1, is closed until $V_{O7A}$ is driven to a voltage level=$\Sigma_{i=1}^{w-1} V_{CS7A[i]}$.

It can be seen that, through the sub-phase 812, the value of w increments as s increments. To illustrate for capacitive element driver 700A:

In a Stage 801(2), switch $SW_{7A[2]}$ is closed first, which drives $V_{O7A}$ to $V_{CS7A[1]}$.

In a Stage 801(3), switch $SW_{7A[3]}$ is closed, which drives $V_{O7A}$ to $\Sigma_{i=1}^{2} V_{CS7A[i]}$.

In a Stage 801(4), switch $SW_{7A[4]}$ is closed, which drives $V_{O7A}$ to $\Sigma_{i=1}^{3} V_{CS7A[i]}$.

The switch sequencing in sub-phase 812 continues until switch $SW_{7A[n+1]}$ is closed, which drives $V_{O7A}$ to $\Sigma_{i=1}^{n} V_{CS7A[i]}$.

Switching sequence Phase 820 for Stages 801(n+2) to 801(3n+2): Phase 820 constitutes a second phase of the switching sequence methodology 80, in which the switch $SW_{7A[0]}$ is open and switch $SW_{7A[n+2]}$ is closed until the end of Stage 801(3n+2). The conventional practice of opening a currently closed switch, then closing a currently open switch is described for this and later-described switch activation transitions; opening the currently closed switch $SW_{7A[n+2]}$ first and then closing the currently open switch $SW_{7A[0]}$ prevents current flowing from the voltage source through all the non-dissipative elements during the switch activation transition. Switching sequence sub-phase 821 and switching sequence sub-phase 822 constitute a first sub-phase of the second phase 820, and switching sequence sub-phase 823 constitutes a second sub-phase of the second phase 820.

Switching Sequence Sub-Phase 821 for Stages 801(n+2) to 801(2n+1): During the stages in the stage range [specifically, the Stages 801(s), with s from (n+2) to (2n+1)], the switches in the switch range ($SW_{7A[i]}$ to $SW_{7A[n]}$), or more generally, switch $SW_{7A[x]}$, where x is from 1 to n, are closed sequentially until $V_{O7A}$ is driven to a voltage level=$V_{DD7A}-\Sigma_{j=x}^{n} V_{CS7A[j]}$.

It can be seen that, through the sub-phase 821, the value of x increments as s increments. To generalize, for a selected switch $SW_{7A[x]}$:
x=a+(s−b), where
  a is the first switch in the switch range in the selected sub-phase,
  s is the current stage, and
  b is the first stage in the sub-phase.

In the switching sequence sub-phase 821, in which a=1 and b=n+2:

$$x = 1 + [s - (n+2)]$$
$$= 1 + s - n - 2$$
$$= s - n + 1 - 2$$
$$= s - (n+1)$$
$$\rightarrow SW_{7A[x]} = SW_{7A[s-(n+1)]}.$$

To illustrate for capacitive element driver 700A:
In a Stage 801(n+2), switch $SW_{7A[1]}$ is closed, which drives $V_{O7A}$ to $(V_{DD7A}-\Sigma_{j=1}^{n} V_{CS7A[j]})$.
In a Stage 801(n+3), switch $SW_{7A[2]}$ is closed, which drives $V_{O7A}$ to $(V_{DD7A}-\Sigma_{j=2}^{n} V_{CS7A[j]})$.
In a Stage 801(n+4), switch $SW_{7A[3]}$ is closed, which drives $V_{O7A}$ to $(V_{DD7A}-\Sigma_{j=3}^{n} V_{CS7A[j]})$.
The switching sequence in sub-phase 821 continues until switch $SW_{7A[n]}$ is closed to drive $V_{O7A}$ to $(V_{DD7A}-V_{CS7A[n]})$.

Switching Sequence Sub-phase 822 for Stage 801(2n+2): During the Stage 801(2n+2), the which the switch $SW_{7A[0]}$ is open and the switch $SW_{7A[n+1]}$ is closed until $V_{O7A}$ is driven to the driving circuit's supply voltage $V_{DD7A}$.

Switching Sequence Sub-Phase 823 for Stages 801(2n+3) to 801(3n+2): During the stages in the stage range [specifically, the Stages 801(s), with s from (2n+3) to (3n+2)], the switches in the switch range ($SW_{7A[n]}$ to $SW_{7A[1]}$), or more generally switch $SW_{7A[y]}$, where y is from n to 1, are closed in a switching pattern to achieve a step-wise decrease from the supply voltage $V_{DD7A}$. The switching pattern to achieve a step-wise decrease constitutes a reversing of the order of the steps in the switching order of sub-phase 821. A Stage 801(s) operates such that an associated switch $SW_{7A[y]}$ is closed until $V_{O7A}$ is driven to a voltage level=$V_{DD}-\Sigma_{k=y}^{n} V_{CS[k]}$. Going forward, the practice of step-wise decrease added to a switching pattern illustrating a step-wise increase in voltage may be known as operating the switching pattern "in reverse order." Also, herein a "switching pattern" may also be referred to as a "pattern of switching," a "switch activation pattern," and a "pattern of switch activation."

It can be seen that, through the Sub-Phase 823, the value of y decrements as s increments. To generalize, for a selected switch $SW_{7A[y]}$:
y=a−(s−b), where:
  a is the first switch in the switch range in the selected sub-phase,
  s is the current stage, and
  b is the first stage in the selected sub-phase.

In the switching sequence sub-phase 821, in which a=n and b=(2n+3):

$$y = n - [s - (2n+3)]$$
$$= n - s + 2n + 3$$
$$= 3n + 3 - s$$
$$\rightarrow SW_{7A[y]} = SW_{7A[3n+3-s]}.$$

To illustrate for capacitive element driver 700A:
In a Stage 801(2n+3), switch $SW_{7A[n]}$ is closed first, which drive $V_{O7A}$ to $(V_{DD7A}-V_{CS7A[n]})$.
In a Stage 801(2n+4), switch $SW_{7A[n-1]}$ is closed, which drives $V_{O7A}$ to $(V_{DD7A}-\Sigma_{k=n-1}^{n} V_{CS7A[k]})$.
In a Stage 801(2n+5), switch $SW_{7A[n-2]}$ is closed, which drives $V_{O7A}$ to $(V_{DD7A}-\Sigma_{k=n-2}^{n} V_{CS7A[k]})$.
The switch sequencing in sub-phase 823 continues until $SW_{7A[1]}$ is closed to drive $V_{O7A}$ to $(V_{DD7A}-\Sigma_{k=1}^{n} V_{CS7A[k]})$.

Switching Sequence Phase 830 for Stages 801(3n+3) to 801(4n+2): Phase 830 constitutes a third phase of the switching sequence methodology 80, in which the switch $SW_{7A[n+2]}$ is open and switch $SW_{7A[0]}$ is closed.

During the stages in the stage range of the switching sequence phase 830 [specifically, the Stages 801(s), with s from (3n+3) to (4n+2)], the switches in the switch range $SW_{7A[n+1]}$ to $SW_{7A[2]}$, or more generally, switch $SW_{7A[z]}$, where z is from (n+1) to 2 are closed in a reverse order as compared to the sub-phase 812. A Stage 801(s) operates such that an associated switch $SW_{7A[z]}$ is closed until $V_{O7A}$ is driven to a voltage level=$\Sigma_{l=1}^{z-1} V_{CS7A[l]}$.

It can be seen that, through the phase 830, the value of z decrements as s increments. To generalize, for a selected switch $SW_{7A[z]}$:
z=a−(s−b), where:
  a is the first switch in the switch range in the selected phase,
  s is the current stage, and
  b is the first stage in the phase.

In the switching sequence phase 830, in which a=n+1 and b=(3n+3):

$$z = (n+1) - [s - (3n+3)]$$
$$= n + 1 - s + 3n + 3$$
$$= 4n + 4 - s$$
$$\rightarrow SW_{7A[z]} = SW_{7A[4n+4-s]}.$$

To illustrate for capacitive element driver 700A:
In a Stage 801(3n+3), switch $SW_{7A[n+1]}$ is closed, which drives $V_{O7A}$ to $\Sigma_{l=1}^{n} V_{CS7A[l]}$.
In a Stage 801(3n+4), switch $SW_{7A[n]}$ is closed, which drives $V_{O7A}$ to $\Sigma_{l=1}^{n-1} V_{CS7A[l]}$.
In a Stage 801(3n+5), switch $SW_{7A[1-1]}$ is closed, which drives $V_{O7A}$ to $\Sigma_{l=1}^{n-2} V_{CS7A[l]}$.
The switching sequence in Phase 830 continues until $SW_{7A[2]}$ is closed to drive $V_{O7A}$ to $V_{CS7A[1]}$.

Switching Sequence Phase 840: Phase 840, which constitutes a fourth phase of the switching sequence methodology 80, in which the switching may return to switching sequence phase 810 to restart the sequence.

In total, the switching sequence phase methodology has 2(2n+1) stages in one complete $V_{O7A}$ driving cycle to ensure that the average current, hence net charge Q, of storage capacitor $C_{S7A[u]}$ is held to zero (e.g. $Q_{CS7A[u]}=0$), where u is any integer from 1 to n. The corresponding waveform of $V_{O7A}$ under the above 2(2n+1) stages is illustrated in FIG. 8A.

When $Q_{CS7A[u]}=0$ is equated under one complete $V_{O7A}$ driving cycle, the average value of $V_{CS7A[u]}$ may be computed as follows:

$$Q_{CS7A[u]} = C_{O7A}\left\{-\sum_{j=u}^{n} V_{CS7A[j]} + \left[V_{DD7A} - \sum_{j=1}^{n} V_{CS7A[j]} - \sum_{j=u}^{n} V_{CS7A[j]}\right] - \sum_{j=1}^{u} V_{CS7A[j]} + \left[V_{DD7A} - \sum_{j=1}^{n} V_{CS7A[j]} - \sum_{j=1}^{u} V_{CS7A[j]}\right]\right\} =$$

$$0. = C_{O7A}\left\{V_{DD7A} - 2\sum_{j=1}^{n} V_{CS7A[j]} - V_{CS7A[u]}\right\} = 0.$$

$$V_{CS7A[u]} = V_{DD7A} - 2\sum_{j=1}^{n} V_{CS7A[j]},$$

where $\left[V_{DD7A} - 2\sum_{j=1}^{n} V_{CS7A[j]}\right]$ is independent of $u. = V_{CS7A[v]}$ for $u \neq v$ where both $u$ and $v$ are any integer ranged from 1 to $n$.

When $V_{CS7A[u]}=V_{CS7A}$, $\{V_{DD7A}-2nV_{CS7A}-V_{CS7A}\}=0$.

$$\rightarrow V_{CS7A[u]} = V_{CS7A} = \frac{V_{DD7A}}{2n+1}.$$

Therefore, it can be seen that the voltage $V_{O7A}$ is changed per stage by a delta of $V_{DD7A}/[2n+1]$; and that the energy dissipated on switches per stage is shown in equation (5):

$$\frac{1}{2}C_{O7A}\left(\frac{V_{DD7A}}{2n+1}\right)^2 = \frac{1}{2[2n+1]^2}C_{O7A}V_{DD7A}^2. \quad (5)$$

There are 2(2n+1) stages per one complete $V_{O7A}$ driving cycle with a total energy dissipation of:

$$E_{t\_Circuit\_7A} = 2[2n+1] \times \frac{1}{2[2n+1]^2}C_{O7A}V_{DD7A}^2 = \frac{1}{2n+1}C_{O7A}V_{DD7A}^2. \quad (6)$$

In the conventional driving scheme (e.g. the circuit 100 of FIG. 1A), the total energy dissipation of one complete $V_{O1}$ driving cycle was $E_{circuit1}=C_{O1}V_{DD1}^2$. With n storage capacitors and the sequencing of switches as disclosed herein, the capacitive element driver 700A reduces total energy dissipation per one $V_{O7A}$ driving cycle by (2n+1) times.

Other Generalized Non-Dissipative Element-Enabled Capacitive Element Drivers

As noted above, FIG. 7A illustrates a generalized embodiment of a capacitive element driver, in which a capacitive element driver 700A has a capacitive element 730A (also known as $C_{O7A}$), n non-dissipative elements (in an illustrative but not necessarily preferred embodiment, storage capacitors), and n+3 switches. The number n may be any positive integer.

Capacitive Element Driver 400

The earlier-described FIG. 4 illustrates an embodiment of a capacitive element driver in which a single storage capacitor 450 (n=1) and four (n+3) switches $SW_{4[0]}$, $SW_{4[1]}$, $SW_{4[2]}$, $SW_{4[3]}$, are included in a capacitive element driver 400. During the operation of the capacitive element driver 400 through a complete $V_{O4}$ driving cycle, the embodiment of capacitive element driver 400 undergoes the stages and switching sequence phases and sub-phases disclosed with reference to capacitive element driver 700A. For example, referring to FIG. 5G, capacitive element driver 400 is switched in six stages, which corresponds to the 2(2n+1) stages of the switching sequence phase outlined for capacitive element driver 700A. Further, the phases that the capacitive element driver 400 undergoes while switching correspond to the switching sequence phases outlined for capacitive element driver 700A. Given that n=1 for capacitive element driver 400:

Stage 501(1) corresponds to Stage 801(1) (phases 811, 840).

Stage 501(2) corresponds to Stages 801(2) and 801(n+1) (respectively, the first and last stages of phase 812).

Stage 501(3) corresponds to Stages 801(n+2) and 801(2n+1) (respectively, the first and last stages of phase 821).

Stage 501(4) corresponds to Stage 801(2n+2) (phase 822).

Stage 501(5) corresponds to Stages 801(2n+3) and 801(3n+2) (respectively, the first and last stages of phase 823).

Stage 501(6) corresponds to Stages 801(3n+3) and 801(4n+2) (respectively, the first and last stages of phase 830).

Capacitive Element Driver 780

Figure 7B:
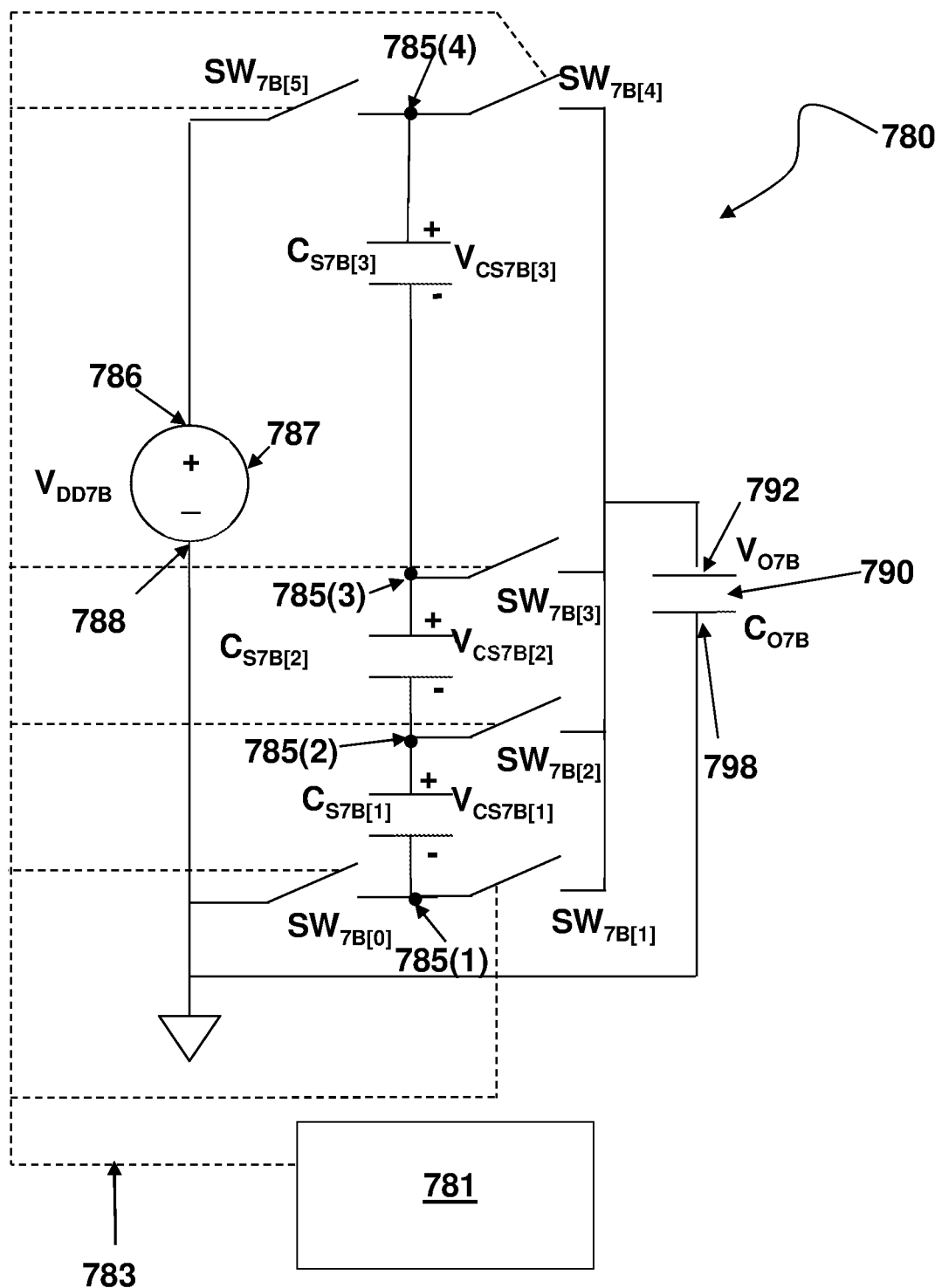
FIG. 7B is a circuit diagram of a capacitive element driver 780, which is an embodiment of the storage capacitor-enabled capacitive element driver 700A having three (n=3) storage capacitors.

FIG. 7B illustrates another embodiment of the capacitive element driver for the instantiation (n=3), in which a capacitive element driver 780 has a capacitive element 790 (also known as $C_om$), three (n=3) storage capacitors $C_{S7B[1]}$, $C_{S7B[2]}$, $C_{S7B[3]}$, and six (n+3=6) switches $SW_{7B[0]}$, $SW_{7B[1]}$, $SW_{7B[2]}$, $SW_{7B[3]}$, $SW_{7B[4]}$, and $SW_{7B[5]}$, with a common node 785(1) between the switches $SW_{7B[0]}$, $SW_{7B[1]}$; a common node 785(2) between the capacitors $C_{SW7B[1]}$, $C_{S7B[2]}$ and the switch $SW_{7B[2]}$; a common node 785(3) between the capacitors $C_{S7B[2]}$, $C_{S7B[3]}$ and the switch $SW_{7B[3]}$; and a common node 785(4) between the switches $SW_{7B[4]}$, $SW_{7B[5]}$. The capacitive element 790 has one terminal 792 to which switches $SW_{7B[1]}$, $SW_{7B[2]}$, $SW_{7B[3]}$, and $SW_{7B[4]}$ may be connected, and another terminal 798 that may be electrically connected to the negative terminal 788 of the voltage source 787. The capacitive element driver 780 has or is electrically connected to a controller 781 via a path system 783 for electrically connecting the controller 781 to the switches to allow the controller 781 to selectively connect the storage capacitors and the positive terminal 786 and negative terminal 788 of a voltage source 787 in a sequence of switching stages within one complete $V_{O7B}$ driving cycle such that average value of the voltage $V_{CS7B[1]}$, $V_{CS7B[2]}$, $V_{CS7B[3]}$, of the storage capacitors not change with time.

The capacitive element driver 780 has been illustrated in FIG. 7B to conform to its generalized capacitive element driver 700A of FIG. 7A, including its components and nomenclature, and so will not be described in detail here. FIG. 8C shows a chart 880 that illustrates the stages that may be used to control the n+3=6 switches throughout a $V_{O7B}$ driving cycle, including the phase of the switching methodology associated with the selected stage, the switches that are activated during the selected state, the voltage to which $V_{O7B}$ at the capacitive element 790 is driven during the selected stage.

During the operation of the capacitive element driver 780 through a complete $V_{O7B}$ driving cycle, the embodiment of capacitive element driver 780 undergoes the same stages and switching sequence phases and sub-phases disclosed with reference to capacitive element driver 700A. For example, referring to FIG. 8C, the capacitive element driver 780 is switched in fourteen stages, which corresponds to the 2(2n+1) stages of the switching sequence phase outlined for capacitive element driver 700A and are provided with the same reference numerals for ease of presentation. Further, the phases that the capacitive element driver 780 undergoes while switching correspond to the switching sequence phases outlined for capacitive element driver 700A, and so the reference numerals for the stages and switching sequence phases and sub-phases for capacitive element driver 700A are used herein for capacitive element driver 780. Given that n=3 for capacitive element driver 780:

The $V_{O7B}$ driving cycle for capacitive element driver 780 starts with Stage 801(1) (phase 811).

The capacitive element driver 780 undergoes phase 812 in Stages 801(2)-801(4).

The capacitive element driver 780 undergoes phase 821 in Stages 801(5)-801(7).

The capacitive element driver 780 undergoes phase 822 in Stage 801(8).

The capacitive element driver 780 undergoes phase 823 in Stages 801(9)-801(11).

The capacitive element driver 780 undergoes phase 830 in Stages 801(12)-801(14).

The capacitive element driver 780 returns to Stage 801(1) in phases 840.

Capacitive Element Driver 700C

Figure 7C:
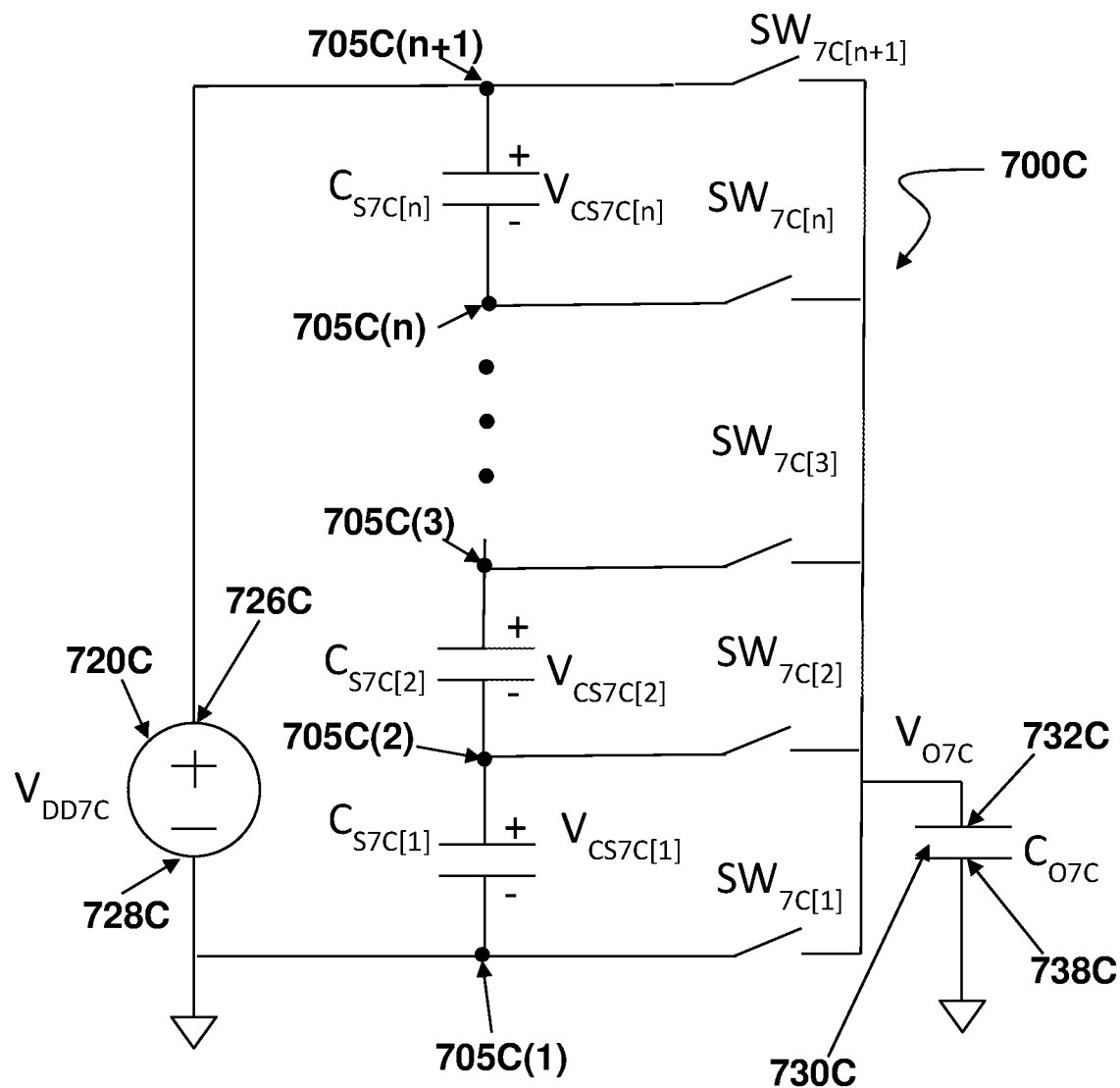
FIG. 7C is a circuit diagram of a capacitive element driver 700C, in which one or more non-dissipative elements are connected in series between terminals of the voltage source and the two or more switches are connected at one of their ends to an input of the capacitive element.

FIG. 7C illustrates a generalized embodiment of a non-dissipative element-enabled capacitive element driver 700C which differs from the capacitive element driver 700 by the driver's first and last switches (which would be switches $SW_{7C[0]}$ and $SW_{7C[n+2]}$) being closed or replaced with hard-wired connections. The switches $SW_{7C[1]}$, $SW_{7C[2]}$, $SW_{7C[n+1]}$) may be arranged to open and close one at time, in sequence ($SW_{7C[1]}$, $SW_{7C[2]}$, ..., $SW_{7C[n+1]}$) to raise the voltage of the capacitive element $C_{O7C}$ from ground (0V) to $V_{DD7C}$. The switches may be arranged to open and close one at time, in reverse sequence ($SW_{7A[n+1]}$, $SW_{7C[n]}$, ..., $SW_{7C[1]}$) to lower the voltage of $C_{O7C}$ from $V_{DD7C}$ to ground (0V).

As with the capacitive element driver 700A, the non-dissipative element-enabled capacitive element driver 700C minimizes $E_{LOSS}$ without using relatively expensive larger-sized conductors or other inductors employed in conventional resonant capacitive element driving. For a complete switching cycle, the energy loss per driving cycle ($E_{LOSS[7C]}$)

$$E_{LOSS[7C]} = C_{O7C} * (V_{DD7C})^2 / (n+1).$$

The capacitive element driver 700C has n non-dissipative elements (which in an illustrative but not necessarily preferred embodiment may be storage capacitors) ($C_{S7C[1]}$, $C_{S7C[2]}$, $C_{S7C[3]}$, $C_{S7C[n-1]}$, $C_{S7C[n]}$); n+1 switches ($SW_{7C[1]}$, $SW_{7C[2]}$, ..., $SW_{7C[n]}$, $SW_{7C[n+1]}$); a voltage source 720C for supplying a voltage $V_{DD7C}$, and a capacitive element 730C (also known as capacitive element $C_{O7C}$, element, or $C_{O7C}$) are included in a capacitive element driver 700C. The number n may be any positive integer. A capacitive element 730C may be a capacitor or any element capable of being positioned at the output terminal of a circuit and there function as a capacitor. For example, the capacitive element 730C may be one or more capacitive loading elements.

Thus in driver 700C, the one or more non-dissipative elements are connected in series between terminals of the voltage source, and the two or more switches are connected at one of their ends to an input of the capacitive element. A first switch $SW_{7C[1]}$ may be electrically connected at its other end to a common node 705C[1] between the negative terminal 728C of the voltage source 720C and a first non-dissipative element $C_{S7C[1]}$, and a last switch $SW_{7C[n+1]}$, may be electrically connected at its other end to a common node 705C [n+1] between a positive terminal 726C of the voltage source and a last non-dissipative element $C_{S7C[n]}$.

The capacitive element driver 700C may have the voltage source 720C (also known as the voltage source $V_{DD7C}$) for supplying a voltage of a value as a component of the capacitive element driver 700A, but in other embodiments, it may be a unit separate from and electronically attachable to the capacitive driving circuit of the capacitive element driver 700C. Also, the capacitive element 730C may be a unit separate from and electronically attachable to the capacitive driving circuit of the capacitive element driver 700C, but in other embodiments, it may be a component of the capacitive element driver 700C.

The switch $SW_{7C[1]}$ is electrically connected to and disposed between a negative terminal 728C of the voltage source 720C (for supplying a voltage $V_{DD7C}$) and one terminal 732C of the capacitive element 730C, for holding a voltage $V_{O7C}$ thereacross. The switch $SW_{7C[n+1]}$ is electrically connected to and disposed between a positive terminal 726C of the voltage source 720C and the input 732C of the capacitive element 730C. The other terminal 738C of the capacitive element $C_{O7C}$ may be electrically connected to ground or to the negative terminal 728C of the voltage source 720C.

The negative terminal 728C of the voltage source 720C may be electrically connected to a common node 705C(1) between the non-dissipative element $C_{S7C[l]}$ and the switch $SW_{7C[l]}$. The positive terminal 726C of the voltage source 720C may be electrically connected to a common node 705C(n+1) between the non-dissipative element $C_{S7C[n]}$ and the switch $SW_{7C[n+1]}$.

The n storage capacitors may be electrically connected in series and disposed between the common nodes 705C(1), 705C(n+1), with a storage capacitor $C_{S7C[x]}$, where x is from 1 to n, disposed between and electrically connected to nodes 705C(x), 705C(x+1). Further, the switch $SW_{7C[x]}$, where x is between 1 to n+1, may be disposed between and electrically connected to nodes 705C(x) and the input 732C of capacitive element $C_{O7C}$. Further, the operation of the driver 700C allows for driving the voltage of a capacitive element between two voltage levels such as ground and supply voltage by transferring the energy stored in the driver's non-dissipative elements to the capacitive element in stepswise transfers, by alternatingly turning on and off two or more of the driver's switches in sequential order to drive the voltage of the capacitive element between the two levels. Specifically, one terminal of switch $SW_{7C[i]}$ may be electrically connected to the input 732C of the capacitive element $C_{O7C}$, and the other terminal may be electrically to the common node 705C(1) of the non-dissipative element $CS_{7C[i]}$ and the negative terminal 728C of the voltage source 720C, with the closing of the switch $SW_{7C[i]}$ when the other switches are open causing a "bypass" of the non-dissipative elements of the driver 700c, passing the grounded voltage at the negative terminal 728C to the input 732C of the capacitive element $C_{O7C}$;

one terminal of switch $SW_{7C[2]}$ may be electrically connected to the input 732C of the capacitive element $C_{O7C}$, and the other one terminal may be electrically connected to the common node 705C(2) of the non-dissipative elements $CS_{7C[1]}$ and $CS_{7C[2]}$, with the closing of the switch $SW_{7C[2]}$ when the other switches are open causing delivery of voltage equal to $V_{CS7C[1]}$ to the input of the capacitive element $C_{O7C}$;

one terminal of switch $SW_{7C[3]}$ (not shown) may be electrically connected to the input 732C of capacitive element $C_{O7C}$, and the other terminal may be electrically connected to the common node 705C(3) of the non-dissipative elements $CS_{7C[2]}$, $CS_{7C[3]}$ (not shown), with the closing of the switch $SW_{7C[3]}$ when the other switches are open are open causing delivery of voltage equal to $V_{CS7C[1]} + V_{CS7C[2]}$ to the input of the capacitive element $C_{O7C}$;

one terminal of switch $SW_{7C[n]}$ may be electrically connected to the input 732C of capacitive element $C_{O7C}$, and the other terminal may be electrically connected to the common node 705C(n) of the non-dissipative elements $CS_{7C[n-1]}$ (not shown), $CS_{7C[n]}$, with the closing of the switch $SW_{7C[n]}$ when the other switches are open causing delivery of voltage level equal to $\Sigma_{i=1}^{n-1} V_{CS7C[i]}$ v from the non-dissipative elements to the input of the capacitive element $C_{O7C}$;

one terminal of switch $SW_{7C[n+1]}$ may be electrically connected to the input 732C of the non-dissipative element $C_{O7C}$, and the other terminal may be electrically connected to the common node 705C(n+1) of the non-dissipative element $CS_{7C[n+1]}$ and the positive terminal 726C of the voltage source 720C, with the closing of the switch $SW_{7C[n+1]}$ when the other switches are open causing a "bypass" of the non-dissipative elements of the driver 700C, passing the supply voltage at the positive terminal 726C to the input 732C of the capacitive element $C_{O7C}$; and After achieving peak voltage with this sequence of switch activation, the switches $SW_{7C[i]}$ to $SW_{7C[n+1]}$ may be closed, one at a time, sequentially in reverse order ($SW_{7C[n+1]}$ to $SW_{7C[1]}$) to drive $V_{O7C}$ back to the grounded voltage level at the negative terminal 728C.

The capacitive element driver 700C also has or is electrically connected via a path system, not shown, to a controller, not shown, which is arranged to provide control signals to signal the capacitive element driver 700C to start or stop a switching sequence methodology. The path system electrically connects the controller to the switches to allow the controller to selectively connect the storage capacitors, voltage source 720C, and the capacitive element in stages within one complete $V_{O7C}$ driving cycle in which switches are switched on and off in a sequence of stages within one complete $V_{O7C}$ driving cycle. As with the driver 700A, the stages may be implemented in a sequencing methodology having a plurality of phases; the methodology is defined to ensure the average value of voltage of the storage capacitors remains unchanged over time.

In circuits having a single non-dissipative element and two switches, the first switch may be electrically connected at its other end to one end of the single non-dissipative element, and a last switch may be electrically connected at its other end to the other end of the single non-dissipative element. In circuits having n non-dissipative elements and n+1 switches, for the remaining switches $SW_{[i]}$ (1≤i≤n), a switch $SW_{[i]}$ may be electrically connected at one end to the input terminal of the capacitive element and at its other end to a common node between non-dissipative elements $C_{[i-1]}$, $C_{[i]}$.

Capacitive Element Drivers 700D/700E

Figure 7D:
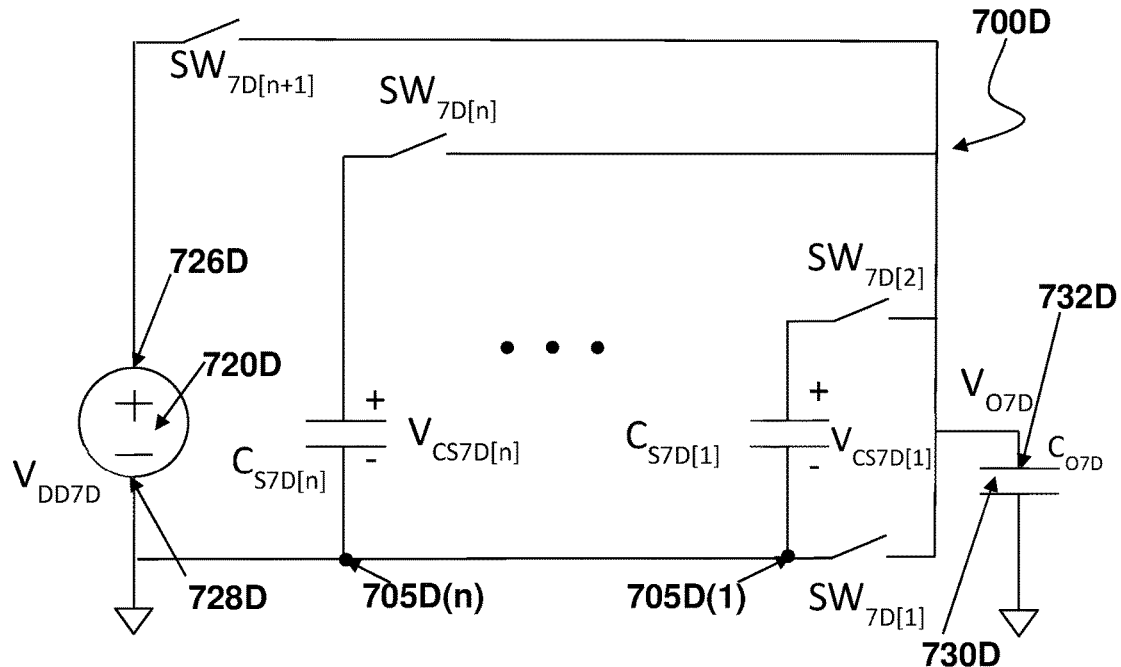
Figure 7E:
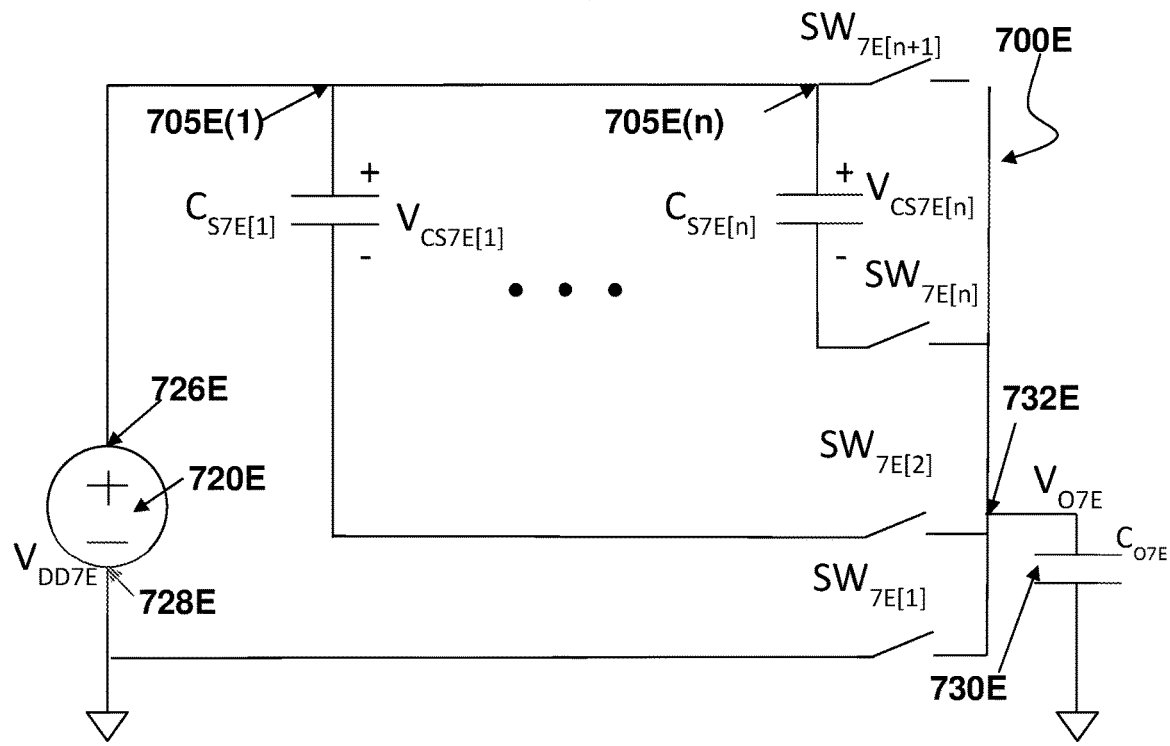

FIGS. 7D and 7E illustrate other embodiments of the capacitive element driver of the instant invention. In capacitive element drivers 700D and 700E, the storage capacitors (non-dissipative elements) are not limited to having their terminals connected together in series with one terminal of a first non-dissipative element in the series electronically and directly connected directly to one terminal of the voltage source and one terminal of a last non-dissipative element in the series electronically and directly connected to the other terminal of the voltage source. In the drivers 700D and 700E, the terminals of the non-dissipative elements may be connected to other nodes. For instance, they may be electrically connected to the negative terminal of the voltage source (ground), or to the positive terminal of the voltage source, or to any number of other connections or combinations thereof. The terminals of a driver's non-dissipative elements may be electrically connected to ground, the voltage source, or any number of other nodes in the circuit, for example, low-impedance voltage nodes. Further, as would be recognized by a person of ordinary skill in the art of circuit design, the terminals of some of the non-dissipative elements may be connected in series and others connected to other common nodes. In general, the terminals of a driver's non-dissipative elements may be electrically connected directly or indirectly between the terminals of the voltage source.

In other embodiments of a driver having two or more non-dissipative elements and three or more switches, as before, the switches may be electrically connected at one of their ends to the input terminal of the capacitive element, with the first and last switches electrically connected at their other ends to the negative terminal and positive terminals, respectively, of the voltage source. The other embodiments disclosed here differ from the earlier disclosed embodiments in that:

one or more non-dissipative elements are not connected in series between terminals of the voltage source;

one of the first and last switches may be electrically connected at its other end to one of the terminals of the voltage source but electrically unconnected at its other end to a non-dissipative element;

the other of the first and last switches may be electrically connected at its other end to the voltage source indirectly, in the specific instance of drivers 700D and 700E through a set of common nodes having a common node associated with one of the non-dissipative elements and disposed between the other one of the terminals of the voltage source and one end of the subject non-dissipative element; and for the remaining switches $SW_{[i]}$ (1≤i≤n), a switch $SW_{[i]}$ may be electrically connected at one end to the input terminal of the capacitive element and at its other end to the other end of a non-dissipative element $C_{[i-1]}$.

In the driver 700D shown in FIG. 7D, the first switch $SW_{7D[i]}$ may be electrically connected at its other end to the voltage source 720D through a set of common nodes 705D(1), . . . , 705D(n), in which a generalized common node 705D(i) associated with a non-dissipative element $C_{S7D[i]}$ may be disposed between the negative terminal 728D of the voltage source 720D and one end of the subject non-dissipative element $SW_{7D[1]}$; and the last switch $SW_{[n+1]}$ may be electrically connected at its other end to the positive terminal 726D of the voltage source but electrically unconnected at its other end to a non-dissipative element.

The operation of the driver 700D allows for driving the voltage of a capacitive element between two voltage levels such as ground and supply voltage by transferring the energy stored in the non-dissipative elements to the capacitive element in step-wise transfers, by alternatingly turning on and off two or more switches in sequential order to drive the voltage of the capacitive element between the two levels. It may be necessary for the driver 700D to operate initially over multiple switching cycles/sequences for the n non-dissipative elements of the driver 700D to reach steady-state (equilibrium) values that approximate those achieved by the non-dissipative elements of the driver 700A from the start of driver operation. During the initial switching operation of the driver 700D, the charge will be re-distributed by the capacitive element to the n non-dissipative elements of the driver 700D until the n non-dissipative elements reach their steady-state (equilibrium) values. When the n non-dissipative elements of the driver 700D reach steady-state (equilibrium) values, the voltages that they may supply become integer fractions of the voltage $V_{DD7D}$, specifically $V_{CS7D[i]}=V_{DD7D}*i/(n+1)$, where i is the i-th non-dissipative element in the set of n non-dissipative elements of the driver 700D. After the initial operation of multiple switching cycles/sequences, the switching methodology for the driver 700D may yield the following results:

When the switch $SW_{7D[1]}$ is closed and the other switches are open, a "bypass" of the non-dissipative elements of the driver 700D results, passing the grounded voltage at the negative terminal 728D to the input 732D of the capacitive element $C_{O7D}$;

When the switch $SW_{7D[2]}$ is closed and the other switches are open, voltage equal to $V_{CS7D[1]}$ is delivered to the input of the capacitive element $C_{O7D}$;

When the switch $SW_{7D[3]}$ (not shown) is closed and the other switches are open, voltage equal to $V_{CS7D[2]}$ is delivered to the input of the capacitive element $C_{O7D}$; and When the switch $SW_{7D[n]}$ is closed and the other switches are open are open, voltage equal to $V_{CS7D[n]}$ is delivered to the input of the capacitive element $C_{O7D}$; and When the switch $SW_{7D[n+1]}$ is closed and the other switches are open, a "bypass" of the non-dissipative elements of the driver 700D results, passing the supply voltage $V_{DD7D}$ at the positive terminal 726D to the input 732D of the capacitive element $C_{O7D}$.

The switching methodology for the driver 700D may include reversing the switching process to drive the voltage of the capacitive element back to the initial level. Specifically:

When the switch $SW_{7D[n]}$ is closed and the other switches are open are open, voltage equal to $V_{CS7D[n]}$ is delivered to the input of the capacitive element $C_{O7D}$;

When the switch $SW_{7D[3]}$ (not shown) is closed and the other switches are open, voltage equal to $V_{CS7D[2]}$ is delivered to the input of the capacitive element $C_{O7D}$;

When the switch $SW_{7D[2]}$ is closed and the other switches are open, voltage equal to $V_{CS7D[1]}$ is delivered to the input of the capacitive element $C_{O7D}$; and When the switch $SW_{7D[1]}$ is closed and the other switches are open, a "bypass" of the non-dissipative elements of the driver 700D results, passing the grounded voltage at the negative terminal 728D to the input 732D of the capacitive element $C_{O7D}$.

As noted above, in the driver 700D, an initial operation of repeated cycles of the switching sequence will re-distribute electrical charge between the non-dissipative elements until the steady state average voltage on the non-dissipative elements is given by:

$$V_{CS7D[i]}=V_{DD7D}*i/(n+1).$$

In the driver 700E of FIG. 7E, the first switch $SW_{7E[1]}$ may be electrically connected to the negative terminal 728E of the voltage source 720E but electrically unconnected at its other end to a non-dissipative element; and the last switch $SW_{7E[n+1]}$ may be electrically connected at its other end to the voltage source 720E through a set of common nodes 705E(1), . . . , 705E(n), in which a generalized common node 705E(i) associated with a non-dissipative element $C_{S7E[i]}$ may be disposed between the positive terminal 726E of the voltage source 720E and one end of the subject non-dissipative element $SW_{7E[i]}$;

The operation of the driver 700E is similar to the operation of the driver 700D, and allows for driving the voltage of a capacitive element between two voltage levels such as ground and supply voltage by transferring the energy stored in the non-dissipative elements to the capacitive element in steps-wise transfers, by alternatingly turning on and off two or more switches in sequential order to drive the voltage of the capacitive element between the two levels. As with the driver 700D, it may be necessary for the driver 700E to operate initially over multiple switching cycles/sequences for the n non-dissipative elements of the driver 700E to reach steady-state (equilibrium) values that approximate those achieved by the non-dissipative elements of the driver 700A from the start of driver operation. During the initial switching operation of the driver 700E, the charge will be re-distributed by the capacitive element to the n non-dissipative elements of the driver 700E until the n non-dissipative elements reach their steady-state (equilibrium) values. When the n non-dissipative elements of the driver 700E reach steady-state (equilibrium) values, the voltages that they may supply become integer fractions of the voltage $V_{DD7E}$, specifically $V_{CS7E[i]}=V_{DD7E}*(n+1-i)/(n+1)$, where i is the i-th non-dissipative element in the set of n non-dissipative elements of the driver 700E. After the initial operation of multiple switching cycles/sequences, the switching methodology for the driver 700E may yield the following results:

When the switch $SW_{7E[1]}$ is closed and the other switches are open, a "bypass" of the non-dissipative elements of the driver 700E results, passing the grounded voltage at the negative terminal 728E to the input 732E of the capacitive element $C_{O7E}$;

When the switch $SW_{7E[2]}$ is closed and the other switches are open, voltage equal to $V_{DD7E}$ minus $V_{CS7E[1]}$ is delivered to the input of the capacitive element $C_{O7E}$;

When the switch $SW_{7E[3]}$ (not shown) is closed and the other switches are open, voltage equal to minus $V_{CS7E[n]}$ is delivered to the input of the capacitive element $C_{O7E}$;

When the switch $SW_{7E[n]}$ is closed and the other switches are open are open, voltage equal to $V_{DD7E}$ minus $V_{CS7E[n]}$ is delivered to the input of the capacitive element $C_{O7E}$;

When the switch $SW_{7E[n+1]}$ is closed and the other switches are open, a "bypass" of the non-dissipative elements of the driver 700E results, passing the supply voltage $V_{DD7E}$ at the positive terminal 726E to the input 732E of the capacitive element $C_{O7E}$.

As in the switching methodology for the driver 700D, the switching methodology for the driver 700E may include reversing the switching process to drive the voltage of the capacitive element back to the initial level. Specifically:

When the switch $SW_{7E[n]}$ is closed and the other switches are open, voltage equal to $V_{DD7E}$ minus $V_{CS7E[n]}$ is delivered to the input of the capacitive element $C_{O7E}$;

When the switch $SW_{7E[3]}$ (not shown) is closed and the other switches are open, voltage equal to $V_{DD7E}$ minus $V_{CS7E[2]}$ is delivered to the input of the capacitive element $C_{O7E}$;

When the switch $SW_{7E[2]}$ is closed and the other switches are open, voltage equal to $V_{DD7E}$ minus $V_{CS7E[1]}$ is delivered to the input of the capacitive element $C_{O7E}$; and When the switch $SW_{7E[1]}$ is closed and the other switches are open, a "bypass" of the non-dissipative elements of the driver 700D results, passing the grounded voltage at the negative terminal 728E to the input 732E of the capacitive element $C_{O7E}$;

As with the driver 700D, an initial operation of repeated cycles of the switching sequence will re-distribute electrical charge between the non-dissipative elements until the steady state average voltage on the non-dissipative elements is given by:

$$V_{CS7E[i]} = V_{DD7E} * (n+1-i)/(n+1) = V_{DD7E} - V_{DD7E} * (i)/(n+1)$$

During the operation of the capacitive element drivers 700D, 700E, through their complete driving cycles, the embodiments of capacitive element drivers 700D, 700E may undergo the same stages and switching sequence phases and sub-phases disclosed with reference to capacitive element driver 700A, with the average voltage level value of the non-dissipative element may be maintained unchanged over time while the first capacitive element driver is operated through the first sequence of stages.

For example, as with the driver 700A, the sequence of stages for driver 700D may have a pattern of switch activation with a bypass portion in which the capacitive element driver is bypassed during application thereof on the capacitive element driver; and an addition portion that may be applied to the capacitive element driver after application of the bypass portion on the capacitive element driver, and in which voltage is added to an input voltage of the capacitive element driver during application thereof on the capacitive element driver. Further, the pattern of switch activation may have a second addition portion to be applied to the capacitive element driver before application of the bypass portion on the capacitive element driver, and arranged to cause another addition of voltage to the input voltage of the capacitive element driver during application thereof on the capacitive element driver.

In addition, as with the driver 700A, the sequence of switching stages may have a switching pattern in a capacitive element driver, the switching pattern in which a subtraction portion may be applied to the driver to cause subtraction of voltage from an input voltage of the capacitive element driver during application thereof on the capacitive element driver; and a bypass portion arranged to be applied to the capacitive element driver after application of the subtraction portion on the capacitive element driver, and to cause bypassing of the capacitive element driver capacitive element driver during application thereof on the capacitive element driver. Further, the switching pattern may have a second subtraction portion arranged to be applied to the capacitive element driver after application of the bypass portion on the capacitive element driver, and arranged to cause another subtraction of voltage from the input voltage of the capacitive element driver during application thereof on the capacitive element driver.

When the drivers 700A, 700C are matched with properly sized components (which would be readily achieved by a circuit designer of ordinary skill in the art), the "series" configuration of the non-dissipative elements in the drivers 700A, 700C allows the voltages on their respective storage capacitors (non-dissipative elements) immediately to set to their respective steady-state values whenever the supply voltage ($V_{DD7A}$, $V_{DD7C}$) changes. Alternatively, the independently connected or independently referenced (sometimes referred to as "nested") configuration of the non-dissipative elements in the drivers 700D, 700E call for the drivers to operate to transfer charge between non-dissipative elements through multiple switching cycles before their non-dissipative elements are brought to their steady-state voltages.

Capacitive Element Driver Components

As the capacitive element drivers 400, 780 are embodiments of the capacitive element driver 700A, for the description herein of components for capacitive element drivers of the present invention, the components of the capacitive element driver 700A will be used herein as representative of the components in capacitive element drivers 400, 780 and any other capacitive element drivers encompassed by the present invention.

Non-Dissipative Elements

The embodiment shown in capacitive element driver 700A has no requirements and/or constraints on the relationship between the value of one non-dissipative element and the value of another, different non-dissipative element. For example, the value of one non-dissipative element may be equal to the value of another, different non-dissipative element; or the value of one may be different from the value of another, different non-dissipative element, with the difference in value of a non-dissipative element close or not at all close to the value the other, different non-dissipative element.

Additionally, the embodiment shown in capacitive element driver 700A has no requirements and/or constraints on the type of one non-dissipative element and the type of another, different non-dissipative element. In illustrative but not necessarily preferred embodiments, the type of one non-dissipative element may be a storage capacitor. In such embodiments, the type of another non-dissipative element may also be a storage capacitor or another type of non-dissipative element, such as a rechargeable battery, a reverse-biased semiconductor PN-junction, or a capacitor with its capacitance modified by a transformer.

A storage capacitor in capacitive element driver 700A may be of any suitable type. For example, without limitation, a storage capacitor may be a transistor; it may be ceramic or electrolytic, or it may be created using any known method, including without being limiting Poly-Insulator-Poly (PIP), Metal-Insulator-Metal (MIM), Metal-Oxide-Metal (MOM), or Metal-Oxide-Semiconductor (MOS). The storage capacitors do not need to be of the same type; one storage capacitor may be identical to, similar to or of a different type than another storage capacitor.

Switches

There are no requirements and/or constraints on the implementation of a switch and/or configurations of switches in the capacitive element driver 700A. Without limitation, examples of suitable switches for use in the capacitive element driver 700A are illustrated in FIGS.

9A-9G. While certain figures herein show and the disclosures herein describe certain transistors as n-channel or p-channel, it is to be understood that any suitable transistor may be used. For example, an n-channel or p-channel field effect transistor (FET) may be employed in lieu of n-channel or p-channel transistors. An NPN or PNP bipolar junction transistor (BJT) may be employed in lieu of n-channel or p-channel transistors, with the BJT having an emitter in lieu of a source and a collector in lieu of a drain.

Figure 9A:
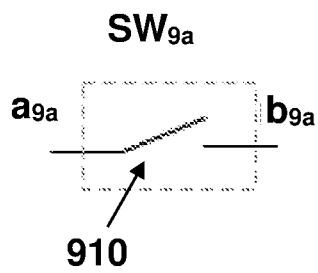
FIGS. 9A-9G are circuit diagrams of switches illustrative of embodiments of switches that may be deployed in the capacitive element driver 700A.

FIG. 9A shows a configuration of a switch $SW_{9a}$ (910) with terminals $a_{9a}$ and $b_{9a}$.

Figure 9B:
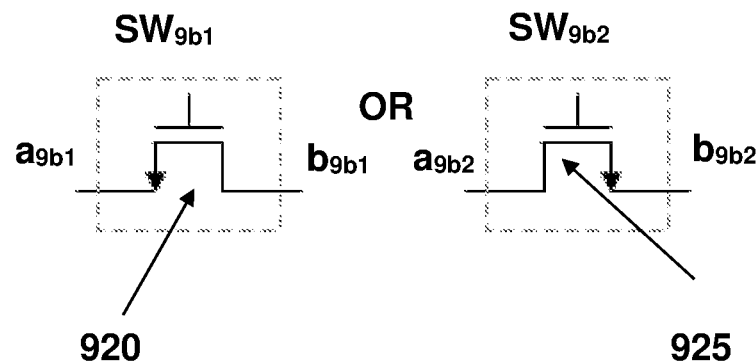

FIG. 9B shows two configurations of an n-channel transistor $SW_{9b1}$ (920) with the terminal $a_{9b1}$ at its source and the terminal $b_{9b1}$ at its drain; and an n-channel transistor $SW_{9b2}$ (925) with the terminal $a_{9b2}$ at its drain and the terminal $b_{9b2}$ at its source.

Figure 9C:
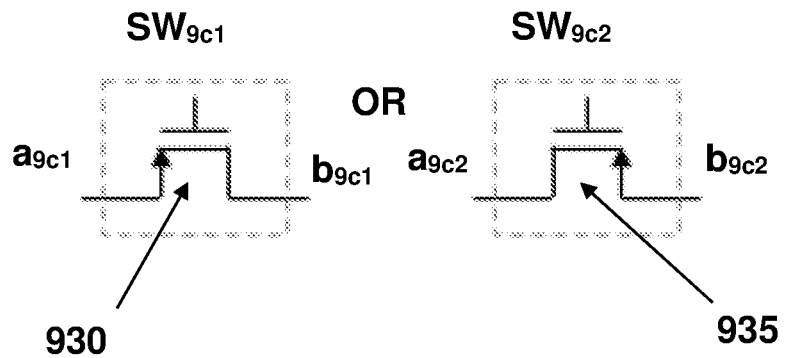

FIG. 9C shows two configurations of a p-channel transistor $SW_{9c1}$ (930) with terminal $a_{9c1}$ at its source and terminal $b_{9c1}$ at its drain; and p-channel transistor $SW_{9c2}$ (935) with terminal $a_{9c2}$ at its drain and terminal $b_{9c2}$ at its source.

Figure 9D:
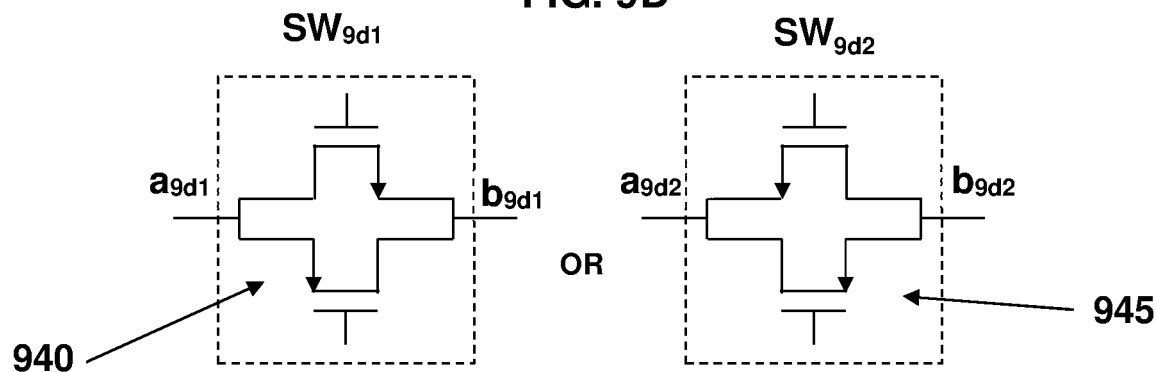

FIG. 9D shows two configurations of a switch formed by an n-channel and a p-channel transistor in parallel:

Switch $SW_{9d1}$ (940) has the drain of an n-channel transistor $SW_{9b2}$ (925) electrically connected to the source of a p-channel transistor $SW_{9c1}$ (930) at their terminal $a_{9d1}$, and with the source of the n-channel transistor $SW_{9b2}$ (925) electrically connected to the drain of the p-channel transistor $SW_{9c1}$ (930) at their terminal $b_{9d1}$.

Switch $SW_{9d2}$ (945) has the source of an n-channel transistor $SW_{9b1}$ (920) electrically connected to the drain of a p-channel transistor $SW_{9c2}$ (935) at their terminal $a_{9d2}$, and with the drain of the n-channel transistor $SW_{9b1}$ (920) electrically connected to the source of the p-channel transistor $SW_{9c2}$ (935) at their terminal $b_{9d2}$.

Figure 9E:
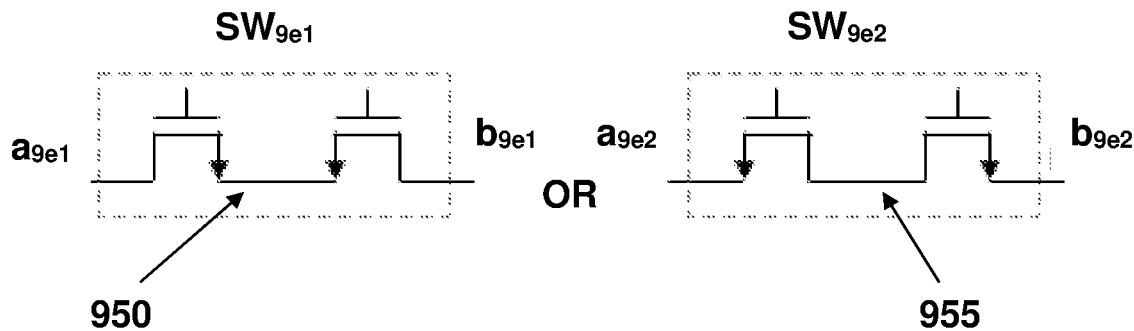

FIG. 9E shows two configurations of a switch formed by two n-channel transistors in series.

Switch $SW_{9e1}$ (950) has the n-channel transistor $SW_{9b2}$ (925) with its drain electrically connected to the switch terminal $a_{9e1}$, and with its source electrically connected to the source of the n-channel transistor $SW_{9b1}$ (920), which has its drain at the switch terminal $b_{9e1}$.

Switch $SW_{9e2}$ (955) has the n-channel transistor $SW_{9b1}$ (920) with its source electrically connected to the switch terminal $a_{9e2}$, and with its drain electrically connected to the drain of the n-channel transistor $SW_{9b2}$ (925), which has its source at the switch terminal $b_{9e2}$.

Figure 9F:
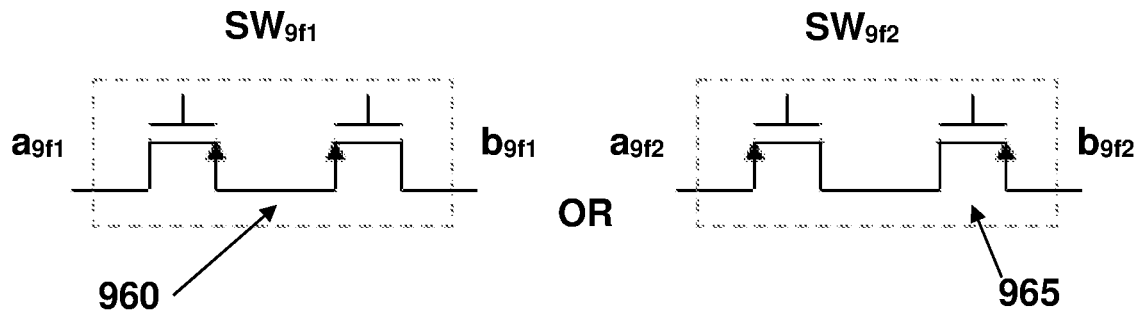

FIG. 9F shows configurations of a switch formed by two p-channel transistors in series.

Switch $SW_{9f1}$ (960) has the p-channel transistor $SW_{9c2}$ (935) with its drain electrically connected to the switch terminal $a_{9f1}$, and with its source electrically connected to the source of the p-channel transistor $SW_{9c1}$ (930), which has its drain at the switch terminal $b_{9f1}$.

Switch $SW_{9f2}$ (965) has the p-channel transistor $SW_{9c1}$ (930) with its source electrically connected to the switch terminal $a_{9f2}$, and with its drain electrically connected to the drain of the p-channel transistor $SW_{9c2}$ (935), which has its source at the switch terminal $b_{9f2}$.

Figure 9G:
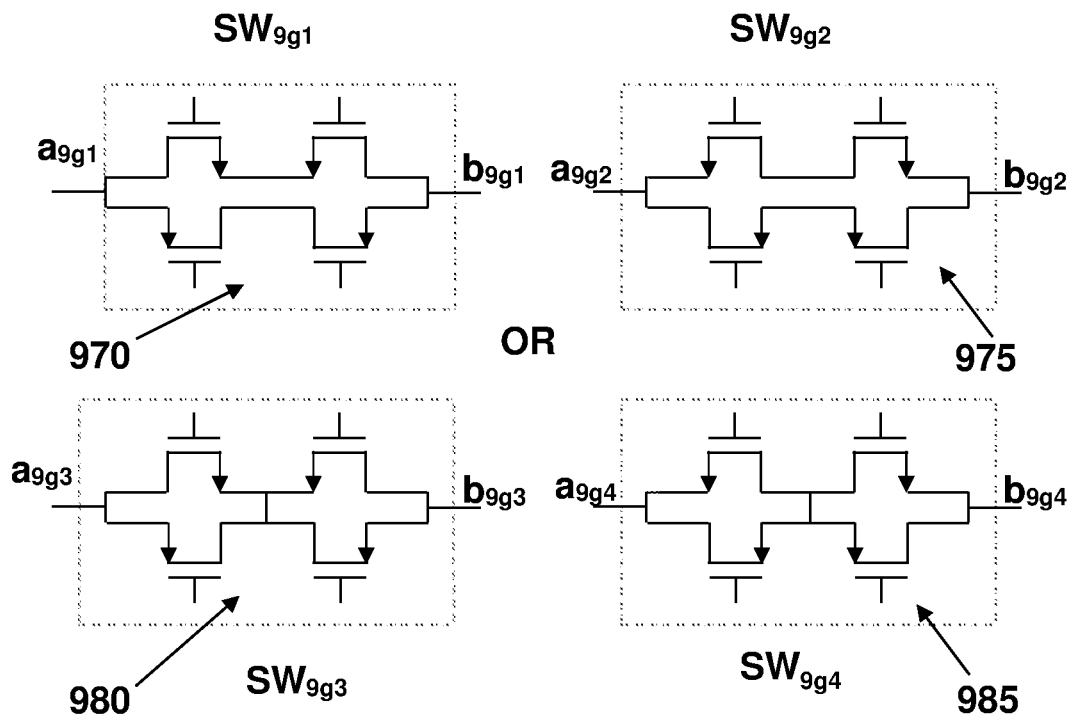

FIG. 9G shows four configurations of a switch formed by two n-channel and two p-channel transistors.

Switch $SW_{9g1}$ (970) and switch $SW_{9g2}$ (975) show two configurations of a switch formed by two switches in parallel (with one switch having two n-channel transistors in series and another switch with two p-channel transistors in series).

Switch $SW_{9g1}$ (970) has the switch $SW_{9e1}$ (950) with its switch terminal $a_{9e1}$ electrically connected to the switch terminal $a_{9g1}$ of the switch $SW_{9g1}$ (970) and the switch terminal $a_{9f2}$ of the switch $SW_{9f2}$ (965); and with its switch terminal $b_{9e1}$ electrically connected to the switch terminal $b_{9g1}$ of the switch $SW_{9g1}$ (970) and the switch terminal $b_{9f2}$ of the switch $SW_{9f2}$ (965).

Switch $SW_{9g2}$ (975) has the switch $SW_{9e2}$ (955) with its switch terminal $a_{9e2}$ electrically connected to the switch terminal $a_{9g2}$ of the switch $SW_{9g2}$ (975) and the switch terminal $a_{9f1}$ of the switch $SW_{9f1}$ (960); and with its switch terminal $b_{9e2}$ electrically connected to the switch terminal $b_{9g2}$ of the switch $SW_{9g2}$ (975) and the switch terminal $b_{9f1}$ of the switch $SW_{9f1}$ (960).

Switch $SW_{9g3}$ (980) and switch $SW_{9g4}$ (985) show two configurations of a switch formed by two switches in series (with each switch having an n-channel and a p-channel transistor in parallel).

Switch $SW_{9g3}$ (980) has the switch $SW_{9d1}$ (940) with its switch terminal $a_{9d1}$ electrically connected to the switch terminal $a_{9g3}$ of the switch $SW_{9g3}$ (980); and with its switch terminal $b_{9d1}$ electrically connected to the switch terminal $a_{9d2}$ of the switch $SW_{9d2}$ (945), which has its switch terminal $b_{9d2}$ electrically connected to the switch terminal $b_{9g3}$ of the switch $SW_{9g3}$ (980).

Switch $SW_{9g4}$ (985) has the switch $SW_{9d2}$ (945) with its switch terminal $a_{9d2}$ electrically connected to the switch terminal $a_{9g4}$ of the switch $SW_{9g4}$ (985); and with its switch terminal $b_{9d2}$ electrically connected to the switch terminal $a_{9d1}$ of the switch $SW_{9d1}$ (940), which has its switch terminal $b_{9d1}$ electrically connected to the switch terminal $b_{9g4}$ of the switch $SW_{9g4}$ (985).

Capacitive Elements

As noted above, a capacitive element may be a capacitor or any element capable of being positioned at the output terminal of a circuit and there function as a capacitor. For example, the capacitive element may be one or more capacitive loading elements. Also, as with the capacitive elements 430, 730A a capacitive element may be a unit separate from and electronically attachable to the capacitive driving circuit of the capacitive element driver, but in other embodiments, it may be a component of the capacitive element driver.

There are no constraints on the type of capacitive element to be driven in a capacitive element driver 700A. Whether an electrical device/network (such as those shown in FIGS. 10-18) is of a two-terminal or a multiple-terminal type, an impedance (Z) between any two of the terminals shows capacitive functionality in the electrical device/network, and the capacitive element driver 700A may be used to drive the electrical device/network with reduced total energy dissipation per complete $V_{O7A}$ driving cycle.

Figure 10:
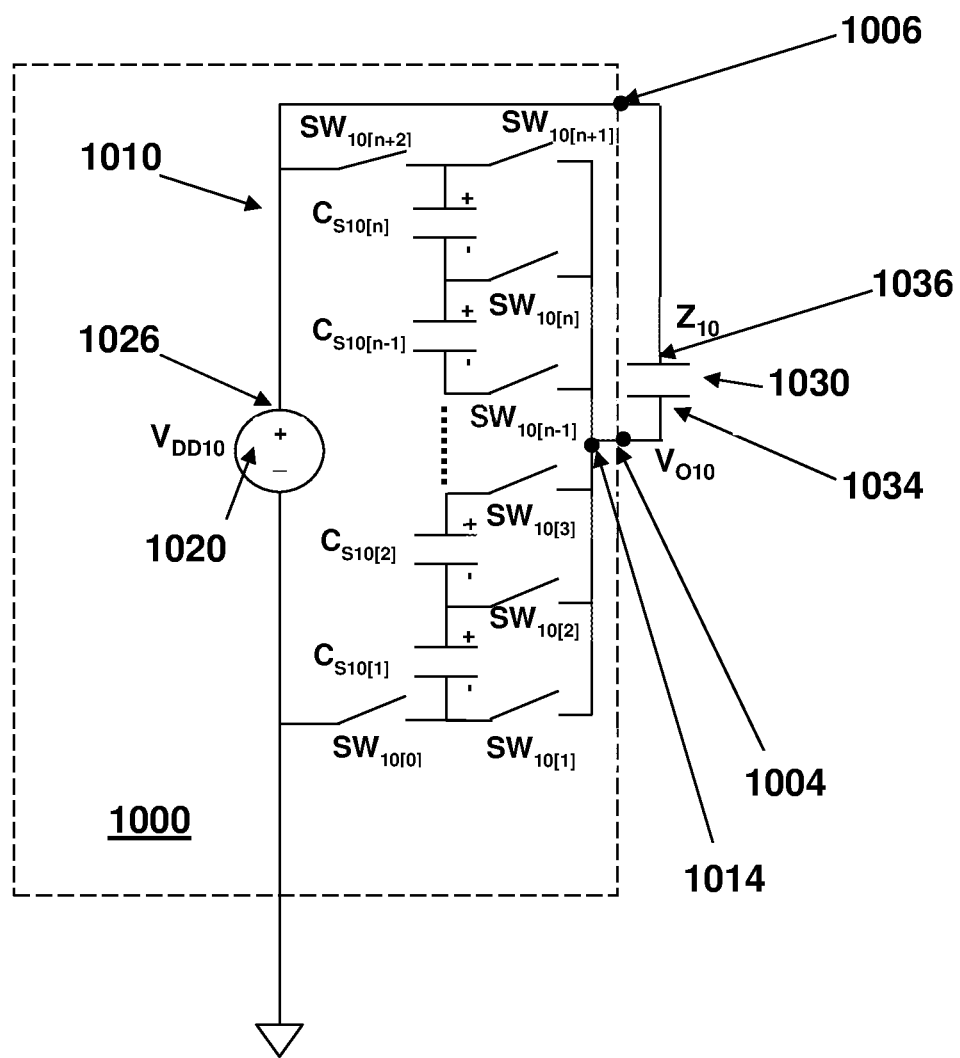

In operation, an electrical device/network 1030 may be attached to the driver 1000 of FIG. 10 by electrically connecting its terminal 1034 of impedance $Z_{10}$ to a first node 1004 (also known as a $V_{O10}$ node) of the driver 1000, the node 1004 being electrically connected to a common node 1014 of the switches $SW_{10[i]}$ to $SW_{10[n+1]}$ of the driving circuit 1010, and by electrically connecting its terminal 1036, which in this illustrative but not necessarily preferred embodiment, is of the same impedance $Z_{10}$, to a node 1006 that is electrically connected to the positive terminal 1026 of the voltage source 1020 (e.g. voltage source $V_{DD10}$) of the driver 1000.

Figure 11:
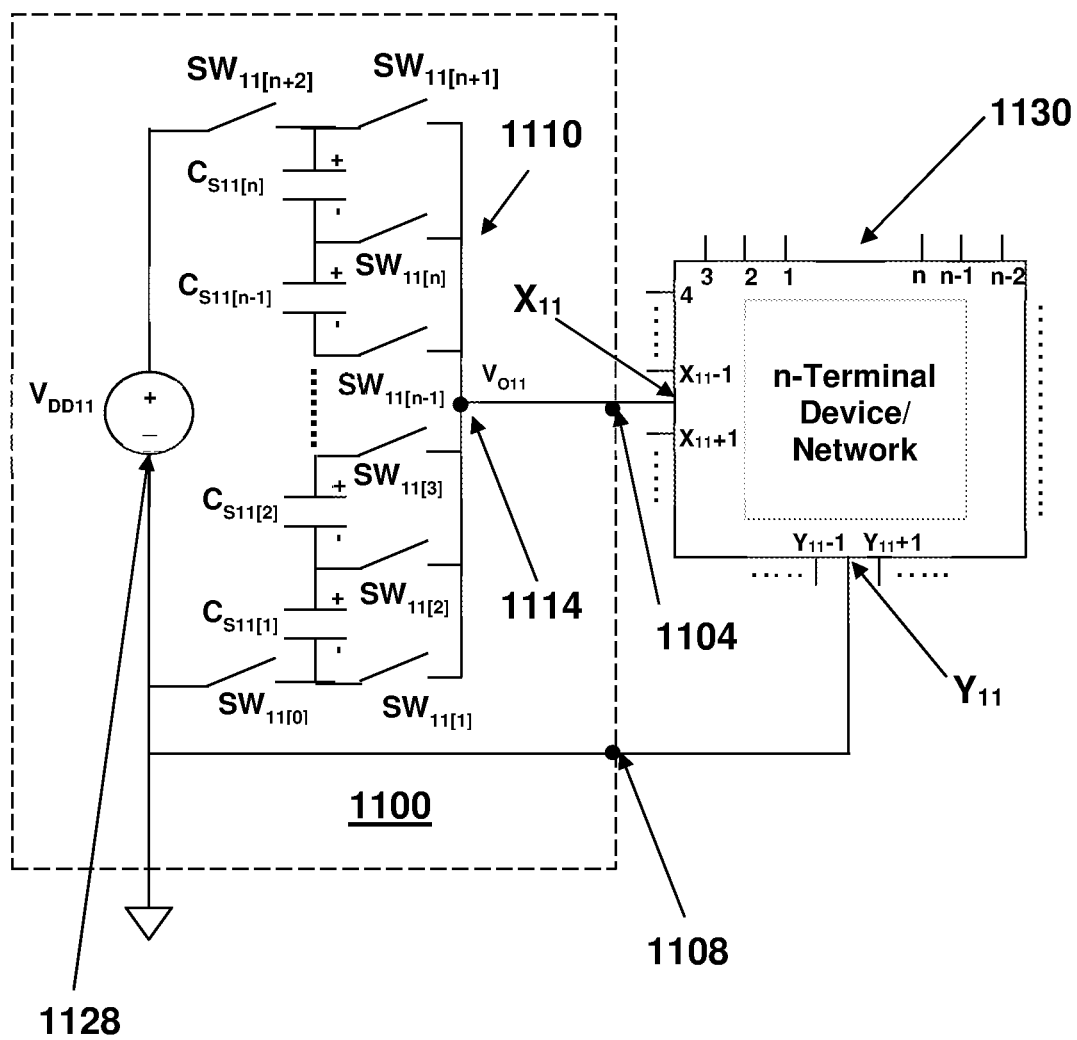

Another embodiment of a capacitive element driver is shown in FIG. 11, in which an n-terminal device/network 1130 has an impedance ($Z_{XY11}$) existing between terminal $X_{11}$ and terminal $Y_{11}$, and shows capacitive functionality in the electrical device/network. The driver 1100 has a capacitive driving circuit 1110 that may be used to drive the electrical device/network 1130 with reduced total energy dissipation per complete $V_{O11}$ driving cycle. As shown in FIG. 11, the terminal $X_{11}$ of the n-terminal electrical device/network 1130 may be connected to the $V_{O11}$ node 1104 of the driver 1100, which is electrically connected to a common node 1114 of the switches $SW_{11[1]}$ to $SW_{11[n+1]}$ of the capacitive driving circuit 1110, and the terminal $Y_{11}$ of the n-terminal electrical device/network 1130 may be connected to a node 1108 that is electrically connected to the negative terminal 1128 of the voltage source $V_{DD11}$ of the driver 1100.

Figure 12:
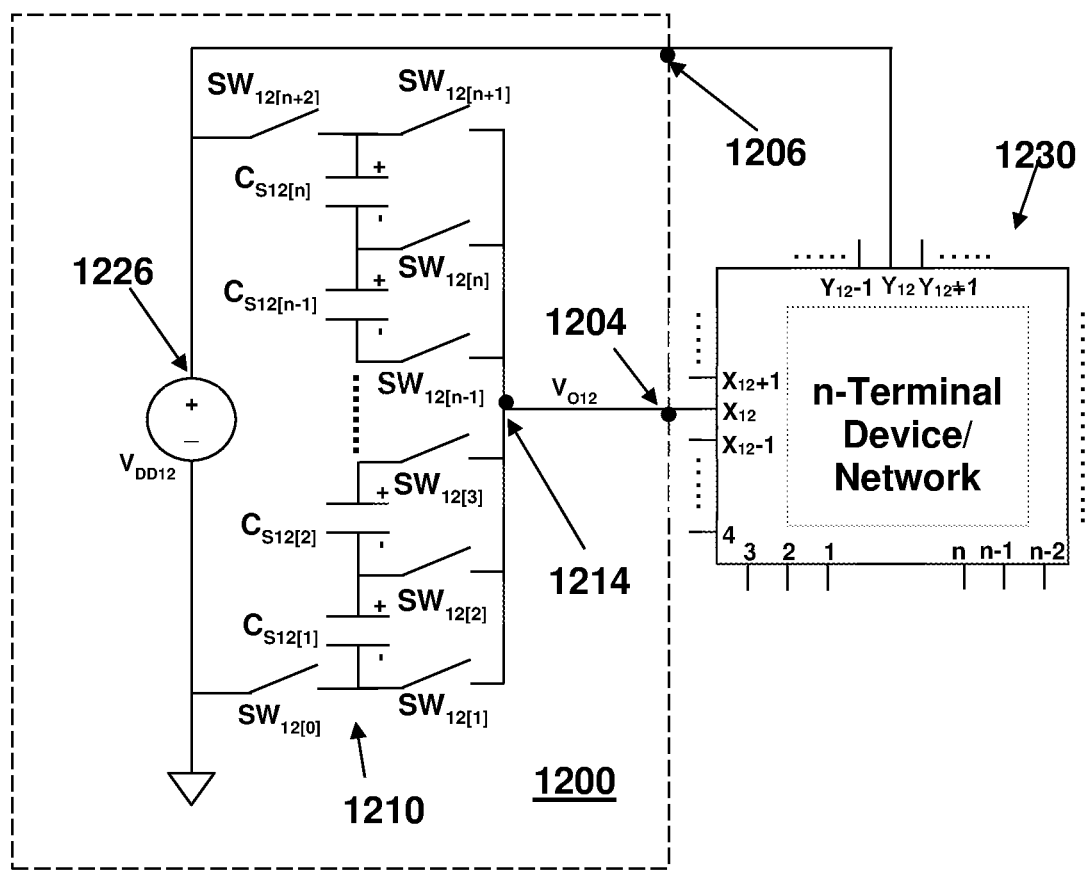

Another embodiment of a capacitive element driver is shown in FIG. 12, in which an n-terminal device/network 1230 has an impedance ($Z_{XY12}$) existing between the terminal $X_{12}$ and terminal $Y_{12}$, and shows capacitive functionality in the electrical device/network. The driver 1200 has a capacitive driving circuit 1210 that may be used to drive the electrical device/network 1230 with reduced total energy dissipation per complete $V_{O12}$ driving cycle. As shown in FIG. 12, the terminal $X_{12}$ of the n-terminal electrical device/network 1230 may be connected to the $V_{O12}$ node 1204 of the driver 1200, which is electrically connected to a common node 1214 of the switches $SW_{12[1]}$ to $SW_{12[n+1]}$ of the capacitive driving circuit 1210, and the terminal $Y_{12}$ of the n-terminal electrical device/network 1230 may be connected to a node 1206 that is electrically connected to the positive terminal 1226 of the voltage source $V_{DD12}$.

An n-terminal device/network may be of any suitable type, including without limitation a transistor, which may have an impedance (Z) existing between its gate and source terminal, and may show capacitive functionality; therefore, a capacitive driving circuit such as those described here may be used to drive the transistor with reduced total energy dissipation per complete output voltage driving cycle. Such transistors may be of any suitable type, including MOSFET(s), GaN-FET(s), SiC-FET(s), JFET(s) or IGBT(s), and may be formed of a single transistor or a plurality of transistors.

Four such embodiments are shown in FIGS. 13-16, in which the gate terminal(s) of the transistors 1330, 1430, 1530, 1630 are electrically connected to the $V_{O13}$ node 1314 of the capacitive driving circuit 1310, the $V_{O14}$ node 1414 of the capacitive driving circuit 1410, the $V_{O15}$ node 1514 of the capacitive driving circuit 1510, the $V_{O16}$ node 1614 of the capacitive driving circuit 1610, respectively.

Figure 13:
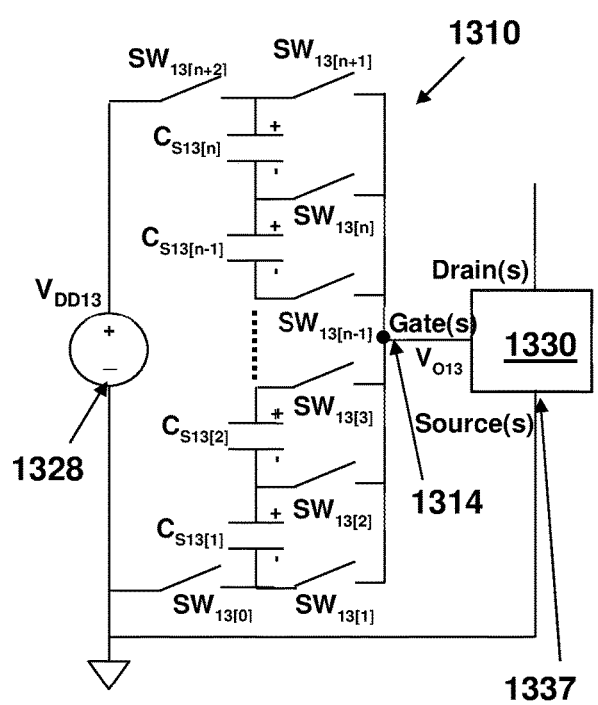

In FIG. 13, the source terminal(s) 1337 of the transistor(s) 1330 is(are) electrically connected to the negative terminal 1328 of the voltage source $V_{DD13}$ electrically connected to the circuit 1310.

Figure 14:
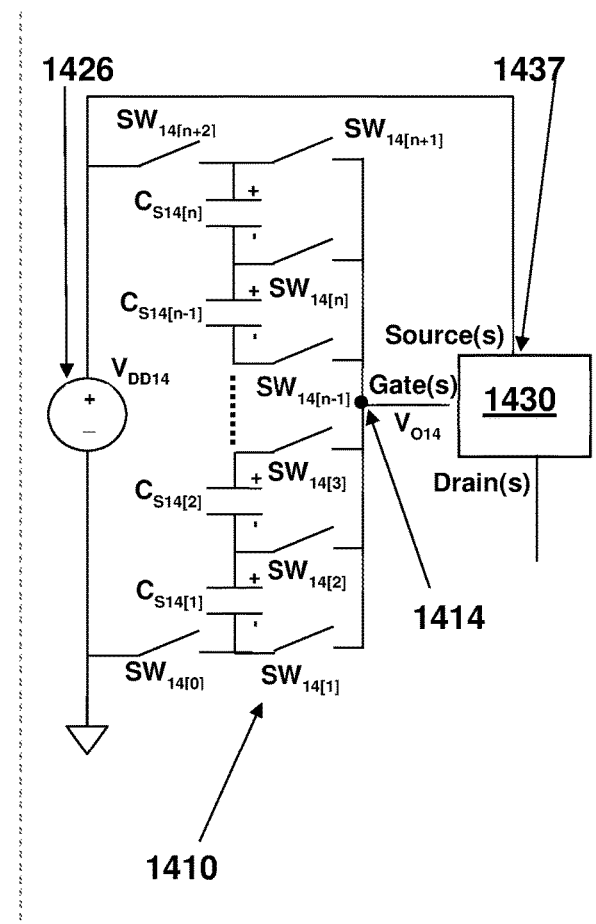

In FIG. 14, the source terminal(s) 1437 of the transistor(s) 1430 is(are) electrically connected to the positive terminal 1426 of the voltage source $V_{DD14}$ electrically connected to the circuit 1410.

Figure 15:
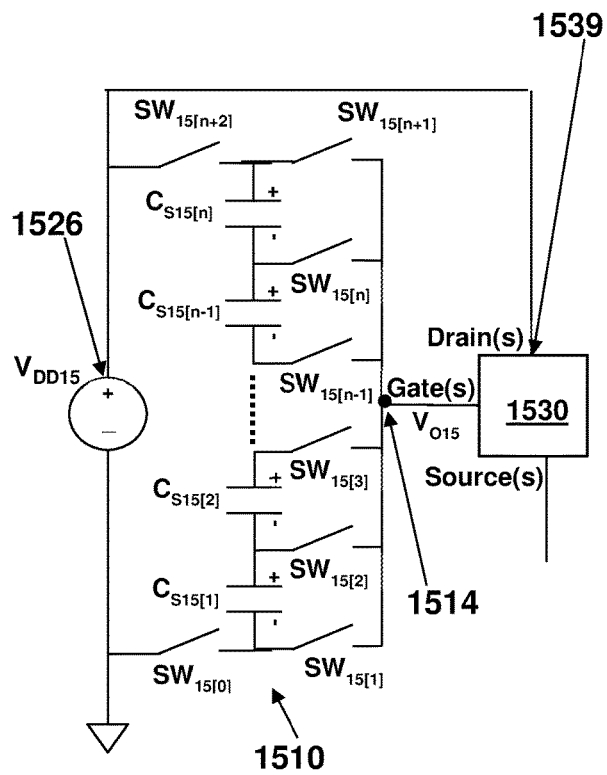

In FIG. 15, the drain terminal(s) 1539 of the transistor(s) 1530 is(are) electrically connected to the positive terminal 1526 of the voltage source $V_{DD15}$ electrically connected to the circuit 1510.

Figure 16:
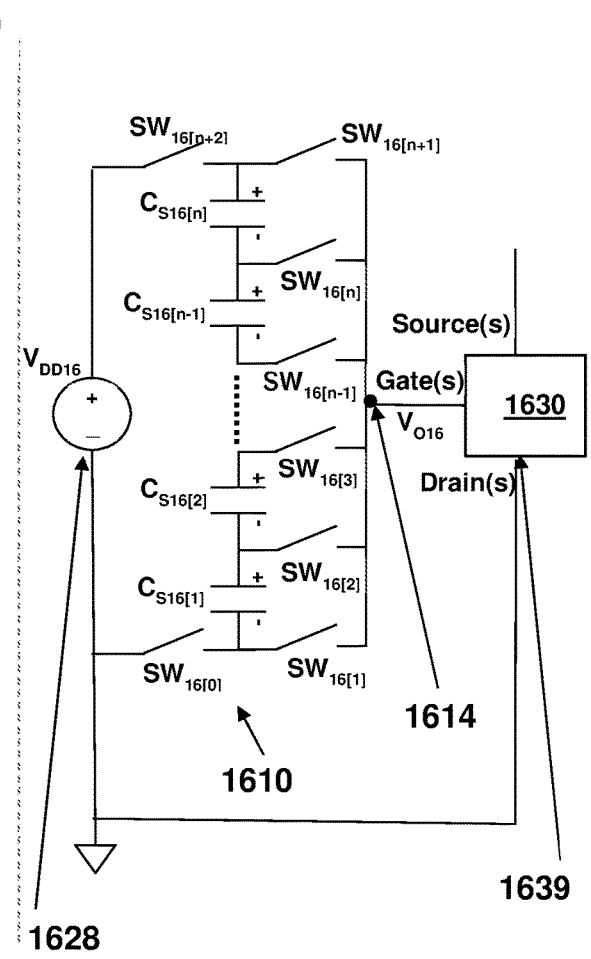

In FIG. 16, the drain terminal(s) 1639 of the transistor(s) 1630 is(are) electrically connected to the negative terminal 1628 of the voltage source $V_{DD16}$ electrically connected to the circuit 1610.

In the circuits of FIGS. 13-16, the Source and Drain terminals are shown as unconnected for simplicity. It will be apparent to one of ordinary skill in the art of circuits that such terminals are electrically connectable to another component such as a power supply (for example, a voltage source).

Figure 17:
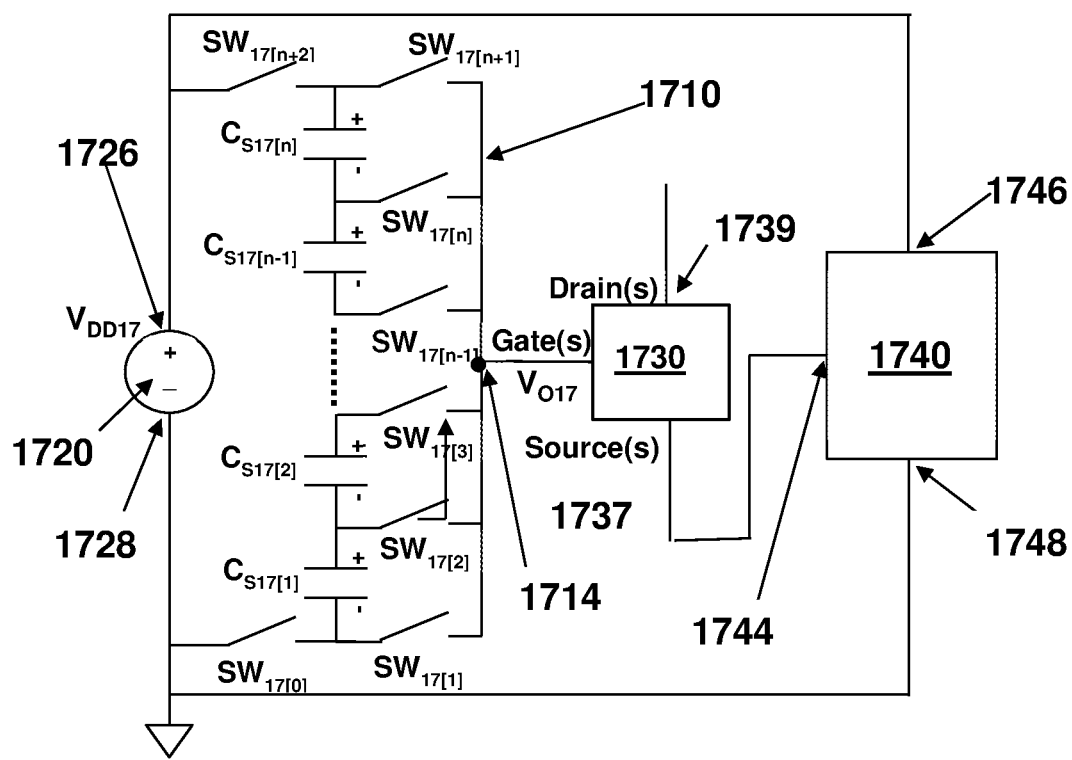
Figure 18:
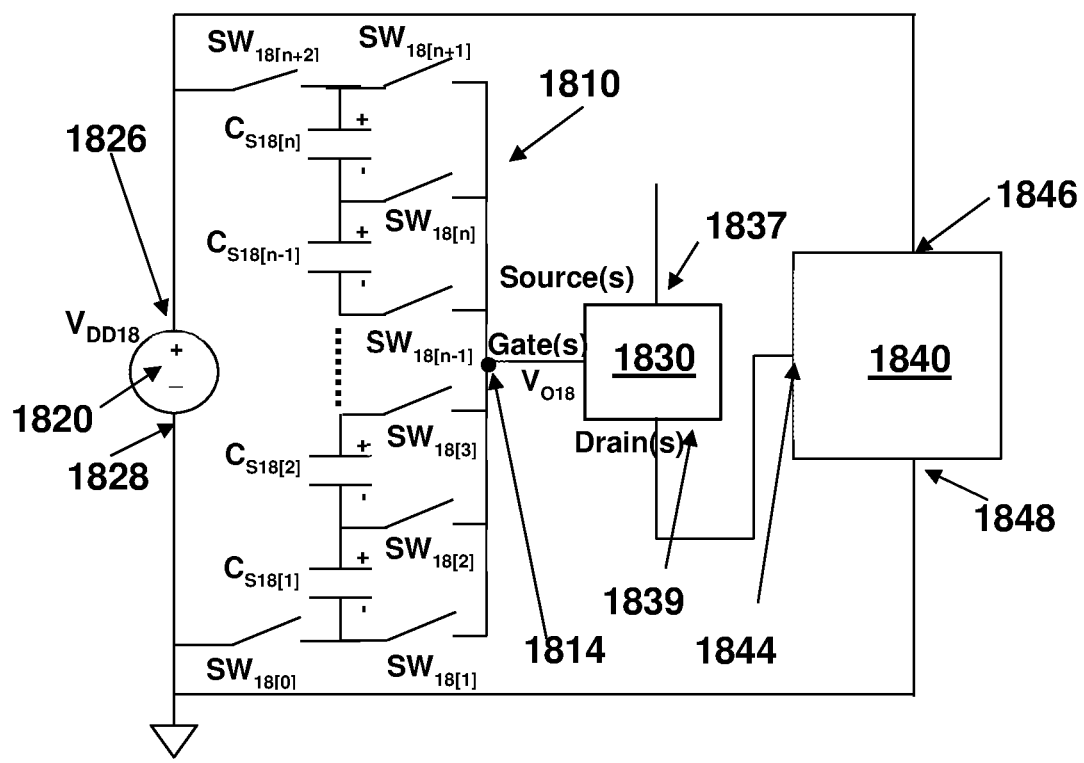

Two other embodiments of a capacitive element driver are shown in FIGS. 17-18, in which an element such as a device/network 1740, 1840 may be driven by capacitive driving circuits 1710, 1810, respectively, through capacitive elements 1730, 1830 respectively. The capacitive element 1740, 1840 may be one or more transistors or a device/network formed of any combination of different passive elements (e.g. resistors, capacitors, inductors) and/or active elements (e.g. transistors). The device/networks 1740, 1840 may have two or more terminals and may have an impedance (Z) existing thereacross; so device/networks 1740, 1840 may show capacitive functionality and may be driven with a capacitive driving circuit, for example capacitive driving circuit 1710, 1810, respectively, so as to reduce total energy dissipation per complete output voltage driving cycle.

FIGS. 17 and 18 show the capacitive driving circuits 1710, 1810 electrically connected to the capacitive elements 1730, 1830, which are, in turn, electrically connected to the device/networks 1740, 1840 respectively. The device/networks 1740, 1840 are electrically connected to the capacitive driving circuits 1710, 1810 through the voltage sources 1720, 1820, with the terminals 1746, 1846 of the device/networks 1740, 1840 electrically connected to the positive terminals 1726, 1826 of the voltage sources 1720, 1820, respectively; and with the terminals 1748, 1848 electrically connected to the negative terminal 1728, 1828 of the voltage sources $V_{DD17}$, $V_{DD18}$, respectively.

In the illustrative but not necessarily preferred embodiments of FIGS. 17, 18, the capacitive elements 1730, 1830 are transistors, but it is to be understood that any suitable electrical device(s) or network(s) having capacitive functionality may be used as capacitive elements 1730, 1830. FIGS. 17, 18 show transistors 1730, 1830 electrically connected through gate terminal(s) to the $V_{O17}$ node 1714 of the circuit 1710 and the $V_{O18}$ node 1814 of the capacitive driving circuit 1810, respectively.

FIG. 17 shows the source terminal(s) 1737 of the transistor(s) 1730 connected to a node 1744 of the device/network 1740; and FIG. 18 shows the drain terminal(s) 1839 of the transistor(s) 1830 connected to a node 1844 of the device/network 1840. In other embodiments of FIG. 17, the drain terminal(s) 1739 of the transistor(s) 1730 may be connected to extra terminals of the device/network 1740; and in other embodiments of FIG. 18, the source terminal(s) 1837 of the transistor(s) 1830 may be connected to extra terminals of the device/network 1840, In operation, the capacitive driving circuit 1710, 1810, drives the device/network 1740, 1840 though the capacitive element 1730, 1830, respectively, in stages within one complete $V_{O17}$, $V_{O18}$ driving cycle in which the switches of the capacitive driving circuit 1710, 1810 are closed and opened in combinations in a sequence of switching stages within one complete $V_{O17}$, $V_{O18}$ driving cycle from ground to $V_{DD17}$, $V_{DD18}$. The stages may be those described herein and implemented in a switching sequence methodology that that is defined to ensure the average value of voltage of the storage capacitors remains unchanged over time.

In FIGS. 17, 18, the device/networks 1740, 1840 are shown with three terminals. When the device/networks 1740, 1840 are two terminal systems, one of the network/device terminals is connected to either the drain or the source terminal of transistor 1730, 1830, and the other of the network/device terminals is electrically connected to either the positive or the negative terminal of the voltage source $V_{DD17}$, $V_{DD18}$. In other embodiments, the other of the network/device terminals may be electrically connected to either the positive or the negative terminal of the voltage source $V_{DD17}$, $V_{DD18}$, through any of multiple terminals of a "black box" electrically connected between the device/network 1740, 1840 and the voltage source $V_{DD17}$, $V_{DD18}$.

Applications of Switch Sequencing

Although the switching sequence methodology described herein contemplates being repeatable across a plurality of output voltage driving cycles to provide periodic charging of a capacitive element or a device/system that is functional as a capacitive element, it may be understood that the capacitive element drivers and the switching sequence methodology described herein may be used to provide a periodic driving for a selected number of output voltage driving cycles or a selected period, followed by inactivity.

It may also be understood that the switching sequence methodology described herein may be implemented in a discontinuous manner without constraints on in which stage the switching sequence methodology should be started. For example, as referred to FIG. 8A, the capacitive element driver may be started at any stage from Stage 801(1) to Stage 801(4n+2). The capacitive element driver may then be switched by following a switching sequence methodology such as the methodologies disclosed herein, and may be stopped at any stage followed by inactivity.

It may be understood that while the capacitive drivers and the switching sequence methodology described herein may be used in applications in which periodic switching is used to maintain the voltage of storage capacitors in the driver, the capacitive drivers and the switching sequence methodology may also be used to reduce energy loss in an application involving a one-time driving of a capacitive element. While periodic switching may be employed to maintain voltage of storage capacitors in the driver, it can be seen that, once the voltage of storage capacitors in the drivers is maintained, then a one-time driving of capacitive element may be performed with reduced energy loss.

High-Frequency Switching Capacitive Element Driving Circuit

The devices, methods, and systems for driving the voltage of a capacitive element between two voltage levels such as ground and supply voltage may be used to provide efficient high-frequency switching.

Figure 19A:
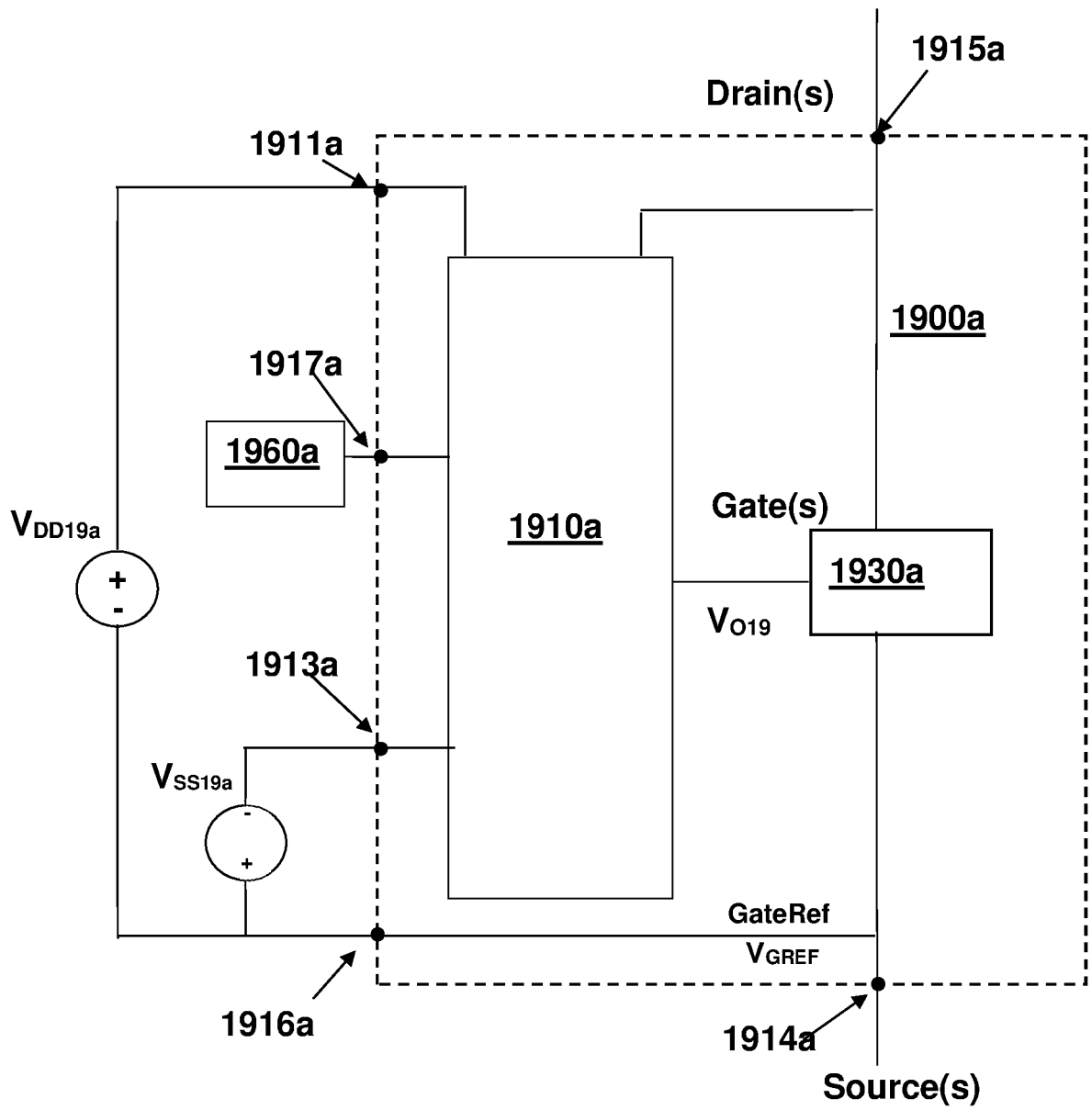
FIGS. 19A and 19B are circuit diagrams showing high-efficiency switches systems 1900a, 1900b, in which a capacitive driving element 1910a, 1910b may be electrically connected to the gate of a power switch such as a high-frequency power switch 1930a, 1930b.
Figure 19B:
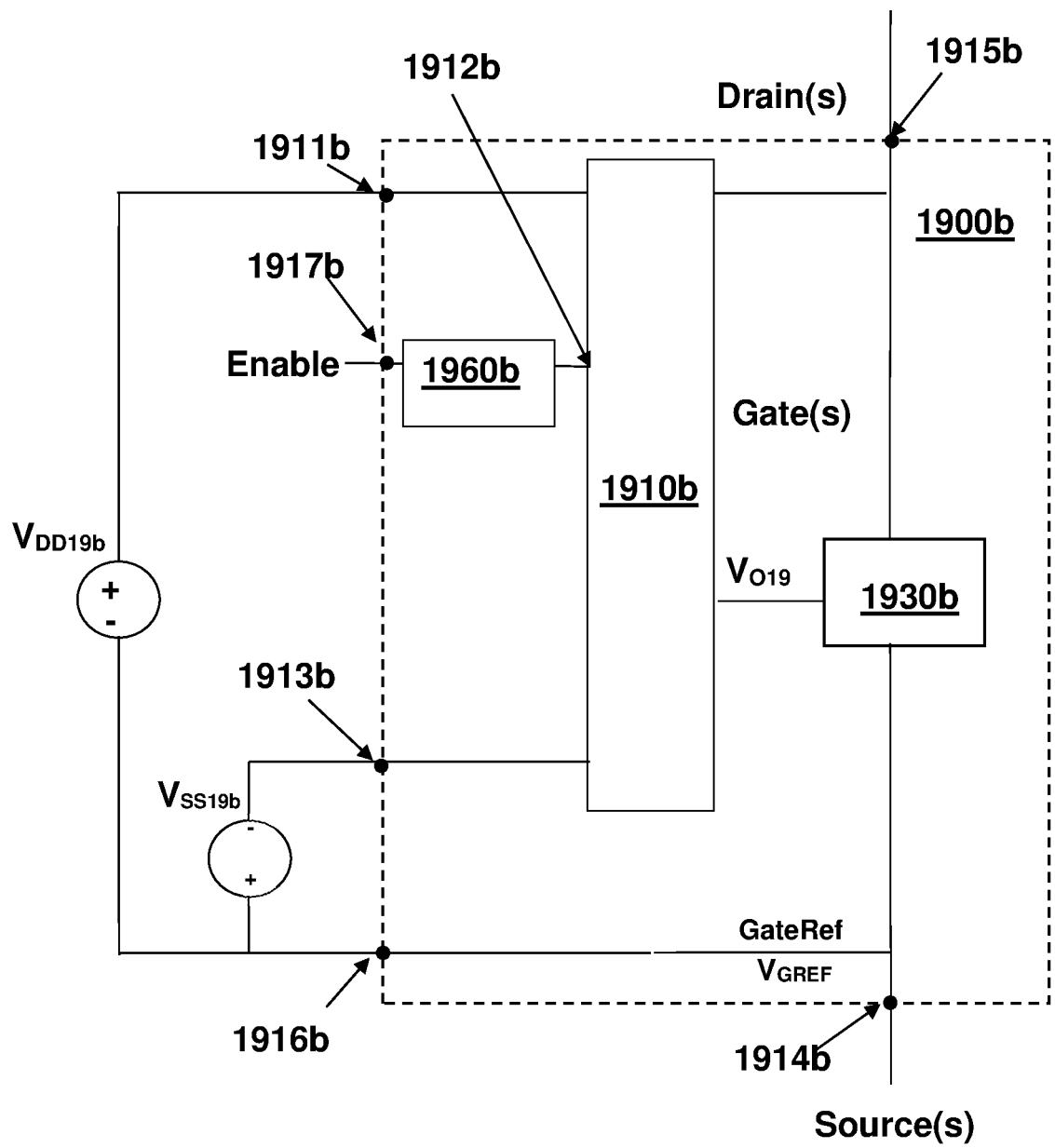

The capacitive element disclosed herein may be combined with a power switch to create a high efficiency switch. FIG. 19A is a circuit diagram showing a high-efficiency switch system 1900a in which a capacitive element driver 1910a may be electrically connected to the gate of a power switch 1930a, which may be a circuit but in this illustrative but not necessarily preferred embodiment is a transistor, and which may be switched at very high frequency. The drain and the source of the power switch 1930a may be accessed by the user through the terminals 1915a, 1914a, respectively, and may be connected according to the needs of the application. Similarly, FIG. 19B is a circuit diagram showing a high-efficiency switch system 1900b in which a capacitive element driver 1910b may be electrically connected to the gate of a power switch 1930b; and the drain and the source of the power switch 1930b may be accessed through the terminals 1915b, 1914b. The high-efficiency switch system 1900b may have a switching controller 1960b electrically connected to the capacitive element driver 1910b through terminal 1912b. To control the gate of the power switch 1930a, the high-efficiency switch system 1900a may have a switching controller 1960a electrically connected to the capacitive element driver 1910a to provide control signals to signal the capacitive element driver 1910a to start or stop a switching sequence methodology such as one of them disclosed herein (e.g. FIG. 8A).

The high-efficiency switch system 1900a may have dual voltage sources $V_{DD19a}$ and $V_{SS19a}$. As shown in FIG. 19A, the positive terminal of the voltage source $V_{DD19a}$ may be connected to the system 1900a through the terminal 1911a; the negative terminal of the voltage source $V_{SS19a}$ may be connected to the system 1900a through the terminal 1913a; the negative terminal of voltage source $V_{DD19a}$, and the positive terminal of voltage source $V_{SS19a}$ may both be connected to the system 1900a through the terminal 1916a. Similarly, as shown in FIG. 19B, the positive terminal of the voltage source $V_{DD19b}$ may be connected to the system 1900b through the terminal 1911b; the negative terminal of the voltage source $V_{SS19b}$ may be connected to the system 1900b through the terminal 1913b; the negative terminal of voltage source $V_{DD19b}$, and the positive terminal of voltage source $V_{SS19b}$ may both be connected to the system 1900b through the terminal 1916b.

Although not shown in FIG. 19A, it can be seen with reference to the capacitive element driver 700A of FIG. 7A or the capacitive driving circuit 1610 shown in FIG. 16 that:

The positive terminal of voltage source $V_{DD19a}$ may be electrically connected through the terminal 1911a to the last switch $SW_{19[n+2]}$ (not shown) of the capacitive element driver 1910a (analogously to the manner in which the positive terminal of voltage source $V_{DD7A}$ may be electrically connected to the last switch $SW_{7[n+2]}$ of the capacitive element driver 700A and the positive terminal of voltage source $V_{DD16}$ may be electrically connected to the last switch $SW_{16[n+2]}$ of the capacitive driving circuit 1610), and the negative terminal of voltage source $V_{SS19a}$ electrically connected through the terminal 1913a to the first switch $SW_{19[0]}$ (not shown) of the capacitive element driver 1910a (analogously to the manner in which the negative terminal of voltage source $V_{DD7A}$ may be electrically connected to the first switch $SW_{7[0]}$ of the capacitive element driver 700A and the negative terminal of voltage source $V_{DD16}$ may be electrically connected to the first switch $SW_{16[0]}$ of the capacitive driving circuit 1610).

A terminal $V_{GREF}$ may electrically connect two terminals, specifically, the terminal 1916a and the source terminal 1914a of power switch 1930a. It can be seen that, were voltage source $V_{SS19a}$ to be removed from the capacitive element driver 1910a and the terminal 1913a electrically connected to the terminal 1916a, the circuit design of the capacitive element driver 1910a would be almost identical to the circuit design of the capacitive driving circuit 1610 shown in FIG. 16, except for the order in which the sources and drains of the power switch 1930a and the power switch 1630 are connected to the drivers 1910a, 1610, respectively. FIG. 13 may also be referred to for the comparison because FIG. 19A illustrates a circuit that, after the voltage source $V_{SS19a}$ of FIG. 19A is removed therefrom, is identical to the circuit shown in FIG. 13.

Under a switching sequence methodology 2200, which is a modification of the methodology 80 shown in FIG. 8B, with methodology 2200 reflecting the number of non-dissipative elements and switches in the system 1900a, the gate of power switch 1930a may be driven from $V_{GREF}-V_{SS19a}$ to $V_{GREF}+V_{DD19a}$ and then from $V_{GREF}+V_{DD19a}$ to $V_{GREF}-V_{SS19a}$ to respectively turn the switch on or off according to the signals from the controller 1960a, which may be electrically connected through the terminal 1917a to the switches $SW_{19[0]}$–$SW_{19[n+2]}$ of the capacitive element driver 1910a. In an embodiment in which the capacitive element driver 1910a has more than one driver cell, as is disclosed below, such as the two-cell capacitive element driving circuit 2100, a switching sequence methodology such as those shown in FIG. 22K through FIG. 22M-5B or FIG. 24A-24B-3 may be implemented.

It may be noted that, in previously described embodiments, such as those shown in FIG. 4, the voltage source is part of the disclosed systems, and in the embodiment shown in FIGS. 19A, 19B, the voltage sources $V_{DD19a}$, $V_{SS19a}$, $V_{DD19b}$, $V_{SS19b}$, are positioned outside of the systems 1900a, 1900b. Either positioning is acceptable and the selection of position of the voltage source is at the option of the designer, regardless of whether one or multiple voltage sources are employed in or for the system.

Similarly, in certain embodiments, such as is shown in FIG. 19A, the switching controller 1960a is positioned outside of the system 1900a, electrically connected to the system 1900a through terminal 1917a, but in other embodiments, such as shown in FIG. 19B, the switching controller 1960b is a part of the system 1900b, and is connected to a control path system (not shown) through a terminal 1917b to receive instructions such as ENABLE to trigger the switching controller 1960b to signal the circuitry and components of system 1900b.

Additionally, in certain embodiments, the capacitive element, for example, an electrical device/network 1030 such as is shown in FIG. 10, is positioned outside of the system 1000, and has no direct connection with a switching controller. In other embodiments, a capacitive element, for example, a capacitive element 1930a and 1930b such as are shown in FIGS. 19A, 19B, respectively, is part of the system 1900a, 1900b, and may have a direct connection with a switching controller 1960a, 1960b.

Thus, it can be seen that the capacitive element drivers 1910a, 1910b and the capacitive elements 1930a, 1930b, one or both of which may be a transistor, may be packaged together to form a high efficiency switch system 1900a, 1900b.

Multi-driver Cell Capacitive Element Driving Circuit

Capacitive Element Driver Cell

Figure 20:
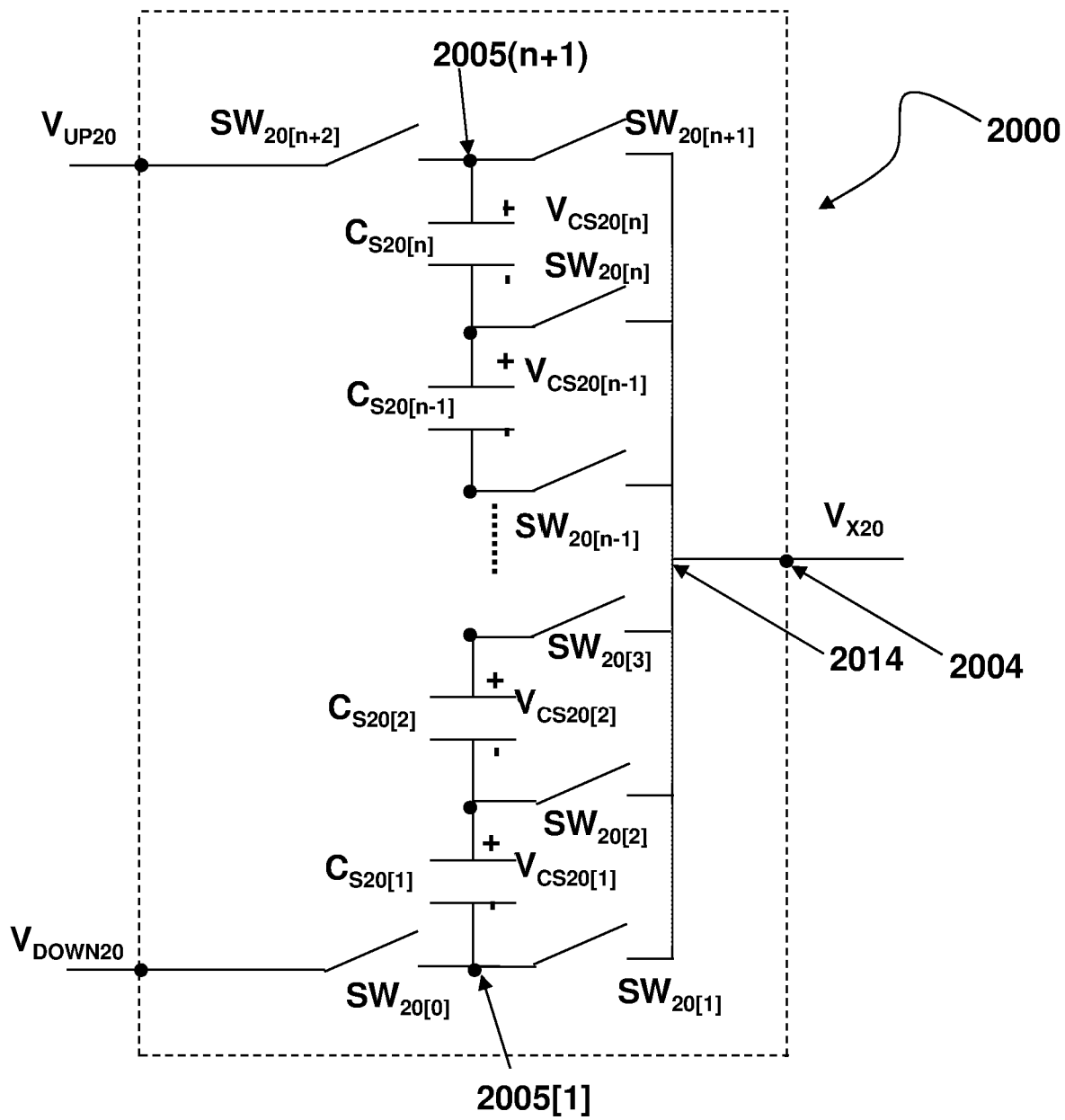
FIG. 20 is a circuit diagram showing a capacitive element driver cell 2000 that may be combined with other capacitive element driver cells to construct a capacitive element driving circuit for further reducing the total energy dissipation of a capacitive element driver per one output voltage driving cycle.

FIG. 20 shows a capacitive element driver cell (also known as a "driver cell" or simply "cell") 2000 that may be combined with other driver cells to construct a capacitive element driving circuit that may be used to further reduce the total energy dissipation of a capacitive element driver per one output voltage driving cycle. The driver cell 2000 may be constructed similarly to the capacitive element driver 700A in FIG. 7A, with n non-dissipative elements, which may be storage capacitors ($C_{S20[1]}$, $C_{S20[2]}$, $C_{S20[3]}$, ..., $C_{S20[n-1]}$, $C_{S20[n]}$) that can store and release a voltage $V_{CS20[1]}$, $V_{CS20[2]}$, $V_{CS20[3]}$, ..., $V_{CS20[n-1]}$, $V_{CS20[n]}$, respectively. The driver cell 2000 may also have n+3 switches ($SW_{20[0]}$, $SW_{20[1]}$, $SW_{20[2]}$, ..., $SW_{20[n+2]}$) connected as the n storage capacitors and n+3 switches of driver 700A, with a common node 2005[1] between the switches $SW_{20[0]}$, $SW_{20[1]}$ and a common node 2005(n+1) between the switches $SW_{20[n+1]}$, $SW_{20[n+2]}$, but with the following exceptions:

One terminal of switch $SW_{20[0]}$ (analogous to the terminal of switch $SW_{7A[0]}$ that is connected to the negative terminal 728A of the voltage source $V_{DD7A}$) operates as a terminal $V_{DOWN20}$ for the driver cell 2000;

One terminal of switch $SW_{20[n+2]}$ (analogous to the terminal of switch $SW_{20[n+2]}$ that is connected to the positive terminal 726A of the voltage source $V_{DD7A}$) operates as a terminal $V_{UP20}$ for the driver cell 2000; and for each switch $SW_{20[y]}$, where y is from 1 to n+1, one terminal of the switch $SW_{20[y]}$ (analogous to the terminal of switch $SW_{7A[y]}$ that is connected to the terminal 732A of the capacitive element 730A (e.g. $C_{O7A}$)) operates as a terminal $V_{X20}$ 2004 of the driver cell 2000 that is electrically connected to a common node 2014 of the switches inclusively between switches $SW_{20[1]}$ and $SW_{20(n+1)}$.

In an illustrative but not necessarily preferred embodiment, the non-dissipative elements may be storage capacitors. In other embodiments, the non-dissipative elements may all be another type of non-dissipative element, such as a rechargeable battery, a reverse-biased semiconductor PN-junction, or a capacitor with its capacitance modified by a transformer. Further in some embodiments, the non-dissipative elements may be all of the same type, and in other embodiments, the non-dissipative elements may all be a combination of types of non-dissipative elements.

Figure 21:
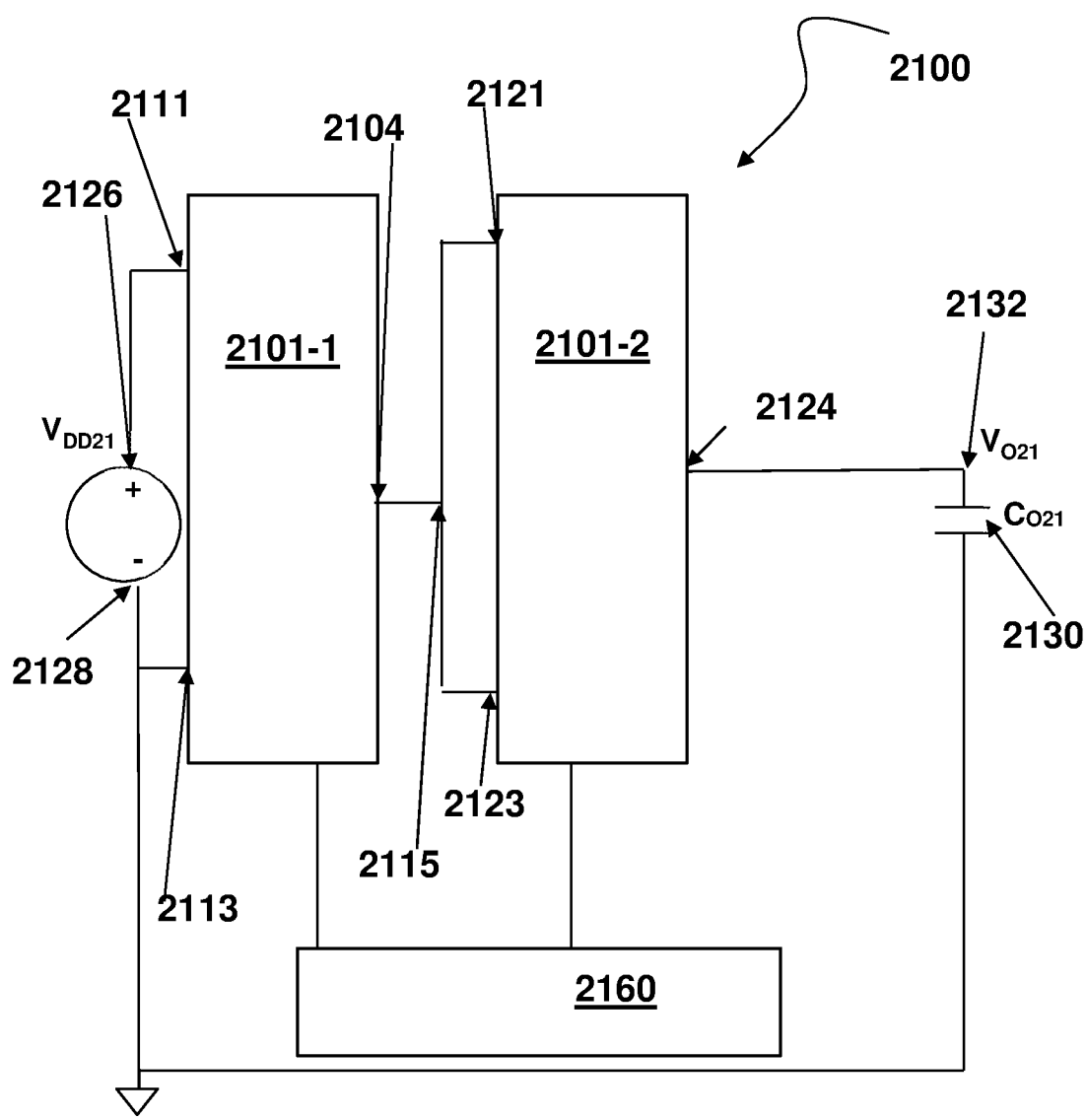
FIG. 21 is a circuit diagram showing one embodiment of a capacitive element driving circuit 2100 in which cells 2101-1, 2101-2, are electrically connected in series.

FIG. 21: A Basic Multi-Cell Driving Circuit

The driver cell 2000 may be connected in series with one or more driver cells 2000 to form a capacitive element multi-cell driving circuit 2100 that can further reduce the energy dissipation of capacitive element drivers with fewer numbers of non-dissipative elements.

FIG. 21 shows the basic embodiment in which a capacitive element driving circuit 2100 (also known as "circuit 2100"). In the K-cell driving circuit shown in FIG. 21, K equals 2, with the circuit 2100 having two driver cells 2101-1, 2101-2, each with a single non-dissipative element to further reduce the energy dissipation of capacitive element drivers. In an illustrative but not necessarily preferred embodiment, the non-dissipative elements both may be storage capacitors. In other embodiments, the non-dissipative elements may all be of a different type, or at least one of the non-dissipative elements may be of a different type.

Further, while the K-cell driving circuit 2100 illustrated in FIG. 21 is shown as formed from two driver cells 2000 (which, as noted above, may be constructed similarly to the capacitive element driver 700A), it is to be understood that the capacitive element drivers 700C, 700D, and 700E disclosed above may be used as the first driver cell 2101-1 in the multi-driver circuit 2100 and in any other embodiment of the multi-driver circuit disclosed below.

FIGS. 22A-22J illustrate the circuit 2100 in operation.

Referring to FIGS. 21 and 22A-22J, driver cells 2101-1, 2101-2 are connected in series, with cell 2101-1 having:

a terminal 2111 electrically connected to its switch SW[3], a terminal 2113 electrically connected to its switch SW[0], and a terminal 2104 electrically connected to the common node 2114 of its switches SW[1] and SW[2].

The voltage source $V_{DD21}$ is connected to the cell 2101-1, with the positive terminal 2126 of voltage source $V_{DD21}$ electrically connected to the terminal 2111, and the negative terminal 2128 of the voltage source $V_{DD21}$ electrically connected to the terminal 2113. The terminal 2104 is electrically connected to a common node 2115 between the terminals 2121, 2123 of the driver cell 2101-2, in which:

a terminal 2121 is electrically connected to the switch SW[3] of the cell 2101-2;

a terminal 2123 is electrically connected to the switch SW[0] of the cell 2101-2;

a terminal 2124 is electrically connected to a common node 2134 of the switches SW[1] and SW[2] of the cell 2101-2, and with the terminal 2124 electrically connected to the terminal 2132 of the capacitive element 2130 (e.g. $C_{O21}$).

In a K-cell driving circuit, with the terminal 2104 of one driver cell being electrically connected to the common node between the input terminals of another driver cell, hereinafter the one and other cell may be referred to as "adjacent" to each other. Further, when the one cell is electrically connected between the other cell and the circuit's voltage source, hereinafter the one cell may be referred to as "upstream" of the other cell; and with the other cell electrically connected between the one cell and the output terminal of the circuit, hereinafter the other cell may be referred to as "downstream" of the one cell in the circuit. Accordingly, the cell 2101-1 may be said to be upstream to its adjacent cell 2101-2, and the cell 2101-2 may be said to be downstream to its adjacent cell 2101-1.

It was shown before in the discussion of circuit 400, which had a single storage capacitor and switched in accordance with switching sequence of Stages 501(1) 501(6), the average current, hence net charge, of a storage capacitor $C_S$ is held at zero and the average value of $V_{CS4}=V_{DD4}/3$. Using the same reasoning, $V_{CS21[1]}=V_{DD21}/3$.

During the operation of cell 2101-1 and 2101-2, VCS21 [1], the output of the cell 2101-1, operates as the input of the cell 2101-2. Therefore, using the same reasoning as above, the average value of $V_{CS21[2]}$ is equal to $V_{CS21[1]}/3=(V_{DD21}/3)/3=V_{DD21}/9$. Therefore, $V_{DD21}=3V_{CS21[1]}=9V_{CS21[2]}$.

In the operation of the circuit 2100, 18 stages are associated with one complete $V_{O21}$ driving cycle, and a change of $V_{DD21}/9$ per stage occurs over the 18 stages of one complete $V_{O21}$ driving cycle.

Figure 22A:
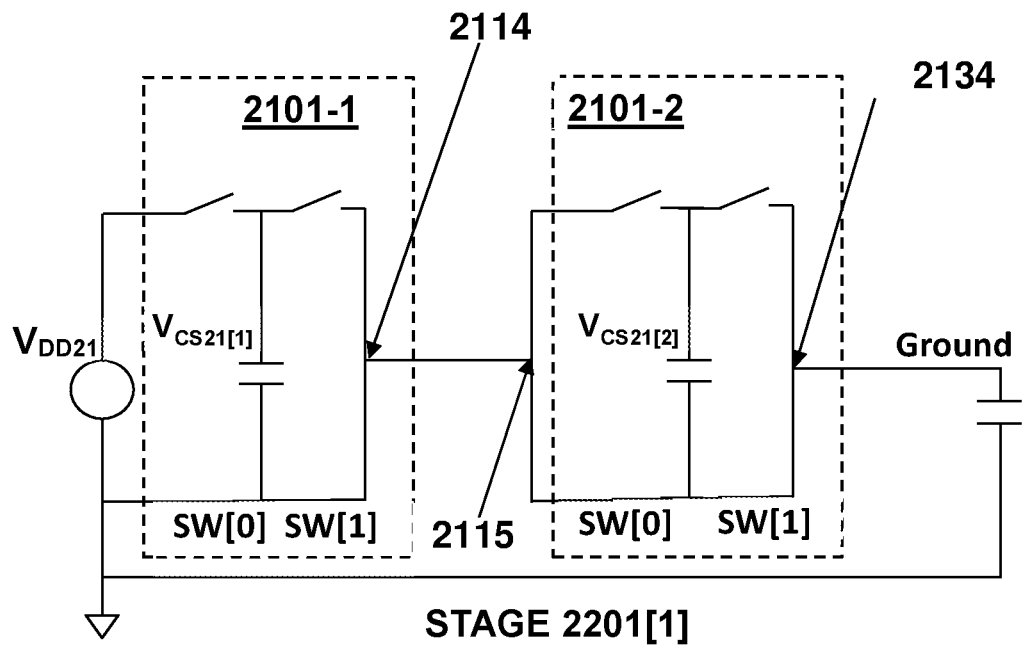
FIGS. 22A-22J are circuit diagrams of the two-cell capacitive element driving circuit 2100 in operation, illustrating an embodiment of switching that may be deployed in the driving circuit 2100 during the stages of a complete $V_{O21}$ driving cycle.
Figure 22B:
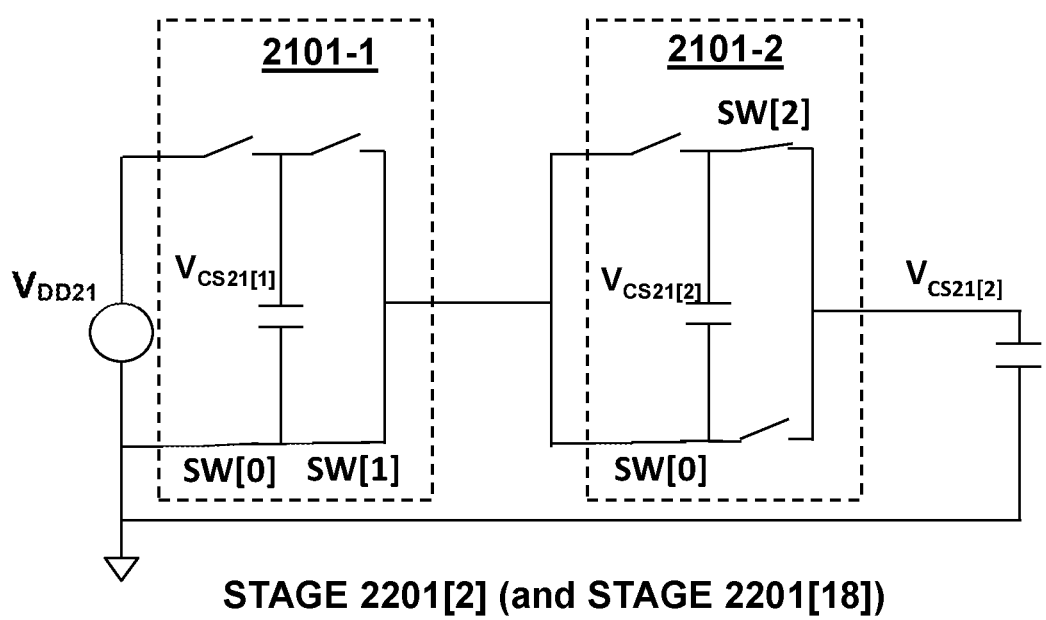

As with the capacitive element driver 700A, the driving circuit 2100 has or is electrically connected via a path system to a controller 2160, which is arranged to provide control signals to signal the capacitive element driving circuit 2100 to start or stop a switching sequence methodology. The switching controller 2160 controls the activation and deactivation of the switches in driver cells 2101-1, 2101-2 to drive the circuit 2100 through the complete $V_{O21}$ driving cycle, in which $V_{O21}$ is driven from ground to $V_{DD21}$, and then back to ground, and using a set of stages as shown in FIGS. 22A-22J:

In FIG. 22A, at Stage 2201(1), switch sets (SW[0], SW[1]) of cell 2101-1 and (SW[0], SW[1]) of cell 2101-2 are closed, and $V_{O21}$ is driven to the ground level (e.g. 0V);

In FIG. 22B, at Stage 2201(2), switch sets (SW[0], SW[1]) of cell 2101-1 and (SW[0], SW[2]) of cell 2101-2 are closed, and $V_{O21}$ is driven to $V_{CS21[2]}$.

Figure 22C:
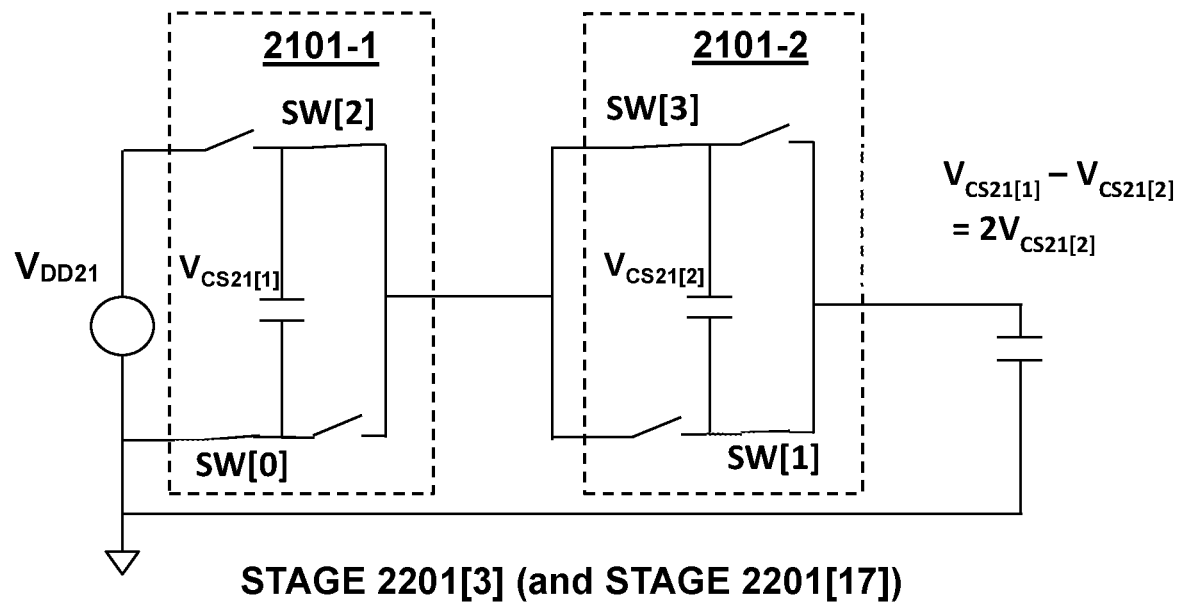

In FIG. 22C, at Stage 2201(3), switch sets (SW[0], SW[2]) of cell 2101-1 and (SW[1], SW[3]) of cell 2101-2 are closed, and $V_{O21}$ is driven to ($V_{CS21[1]}-V_{CS21[2]}=2V_{CS21[2]}$).

Figure 22D:
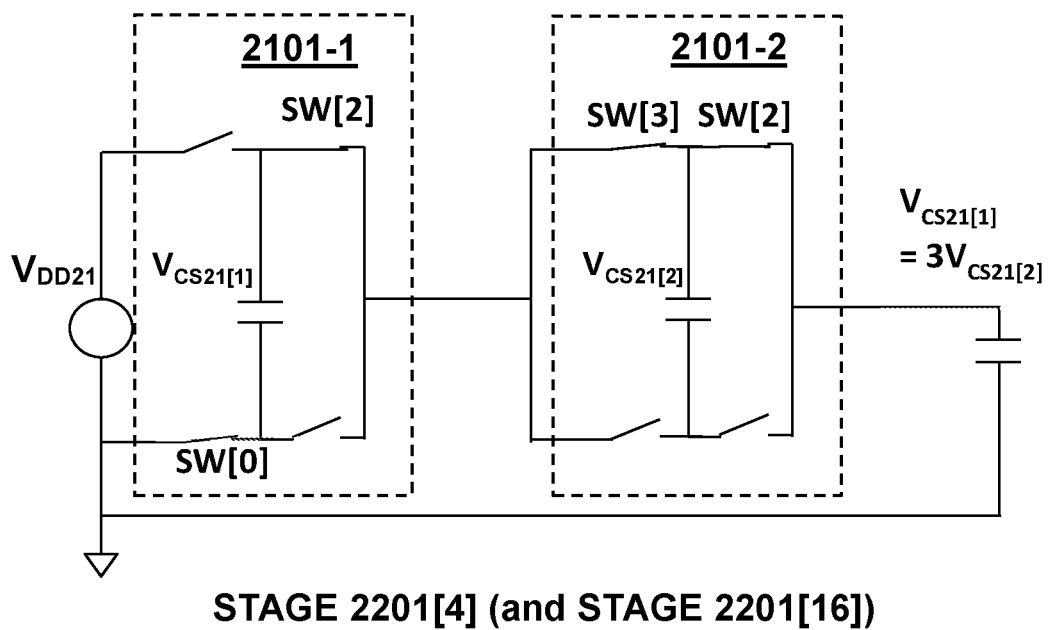

In FIG. 22D, at Stage 2201(4), switch sets (SW[0], SW[2]) of cell 2101-1 and (SW[2], SW[3]) of cell 2101-2 are closed, and $V_{O21}$ is driven to ($V_{CS21[1]}=3V_{CS21[2]}$).

Figure 22E:
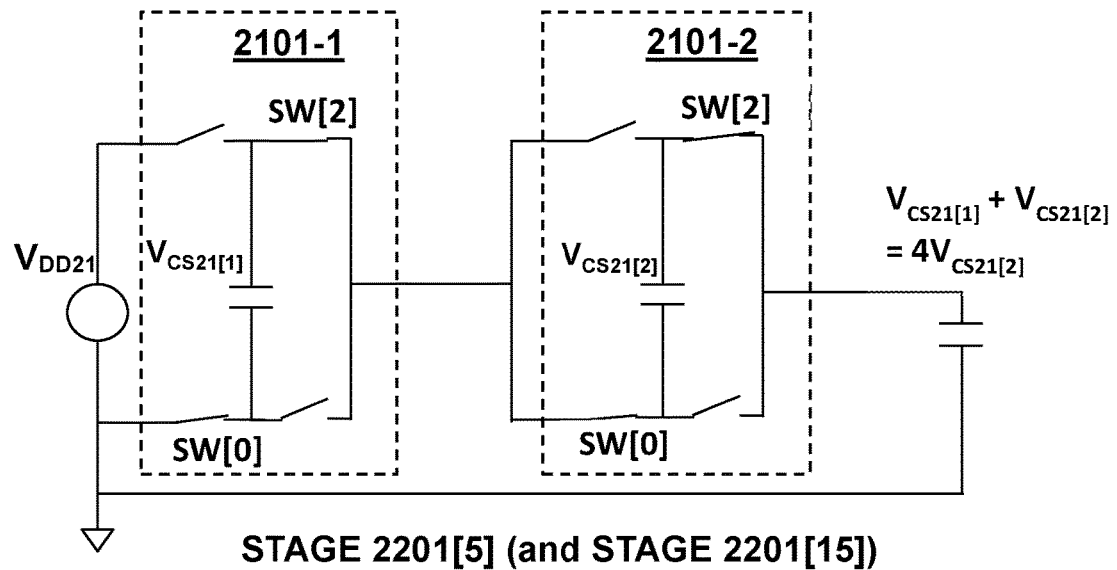

In FIG. 22E, at Stage 2201(5), switch sets (SW[0], SW[2]) of cell 2101-1 and (SW[0], SW[2]) of cell 2101-2 are closed, and $V_{O21}$ is driven to ($V_{CS21[1]}+V_{CS21[2]}=4V_{CS21[2]}$).

Figure 22F:
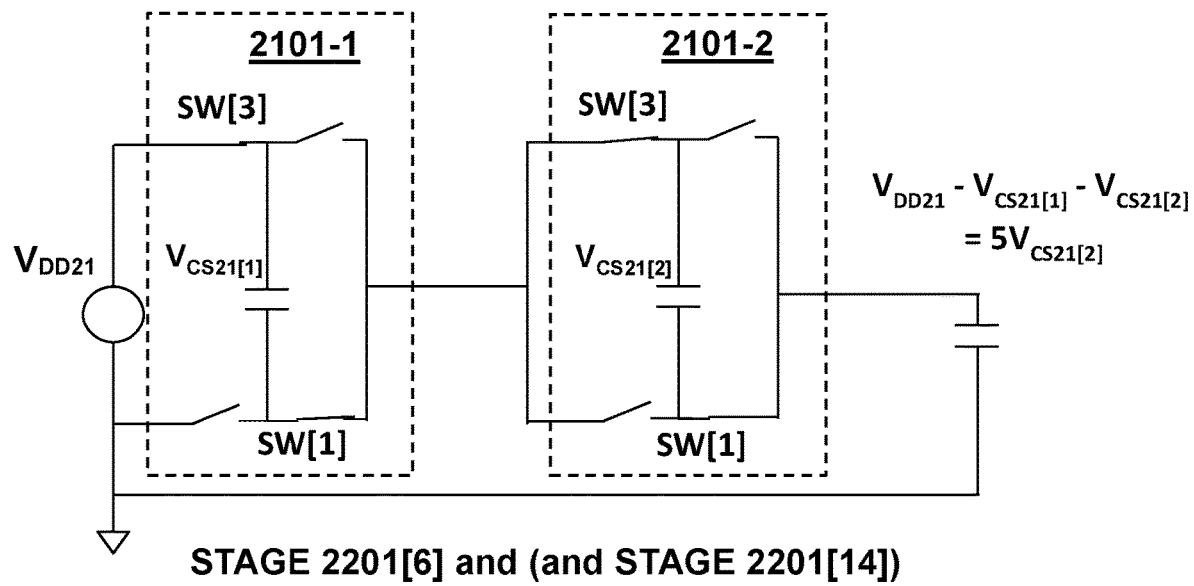

In FIG. 22F, at Stage 2201(6), switch sets (SW[1], SW[3]) of cell 2101-1 and (SW[1], SW[3]) of cell 2101-2 are closed, and $V_{O21}$ is driven to ($V_{DD21}-V_{CS21[1]}-V_{CS21[2]}=5V_{CS21[2]}$).

Figure 22G:
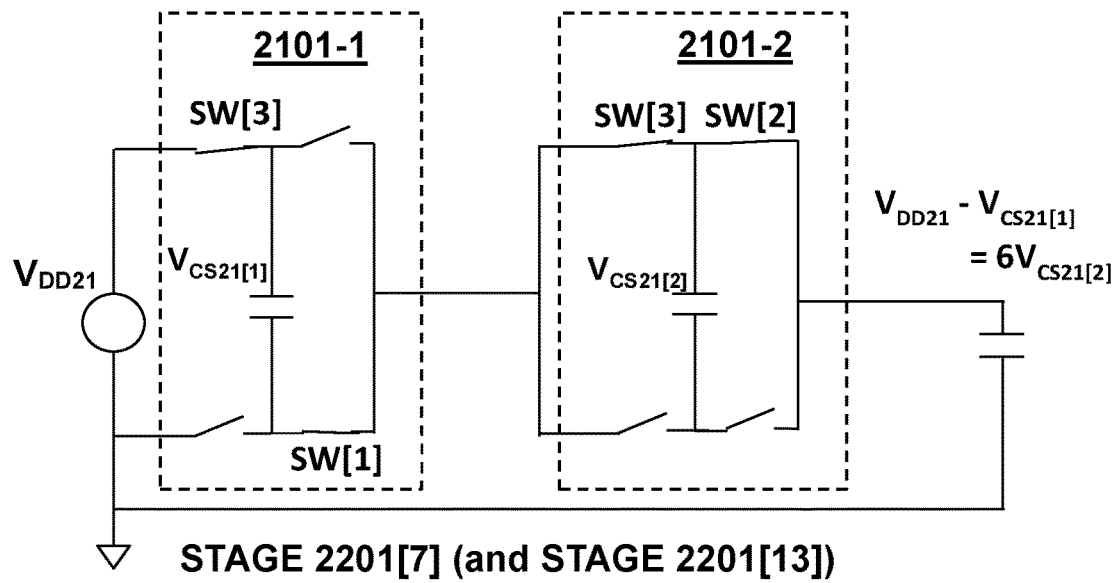

In FIG. 22G, at Stage 2201(7), switch sets (SW[1], SW[3]) of cell 2101-1 and (SW[2], SW[3]) of cell 2101-2 are closed, and $V_{O21}$ is driven to ($V_{DD21}-V_{S21[1]}=6V_{CS21[2]}$).

Figure 22H:
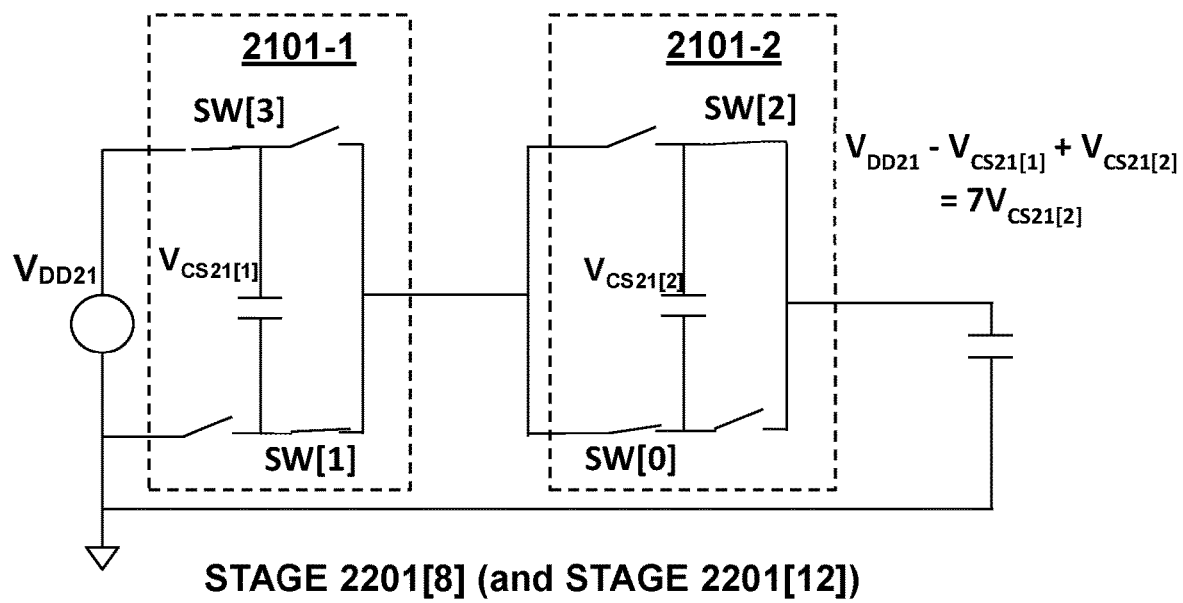

In FIG. 22H, at Stage 2201(8), switch sets (SW[1], SW[3]) of cell 2101-1 and (SW[0], SW[2]) of cell 2101-2 are closed, and $V_{O21}$ is driven to ($V_{DD21}-V_{CS21[1]}+V_{CS21[2]}=7V_{CS21[2]}$).

Figure 22I:
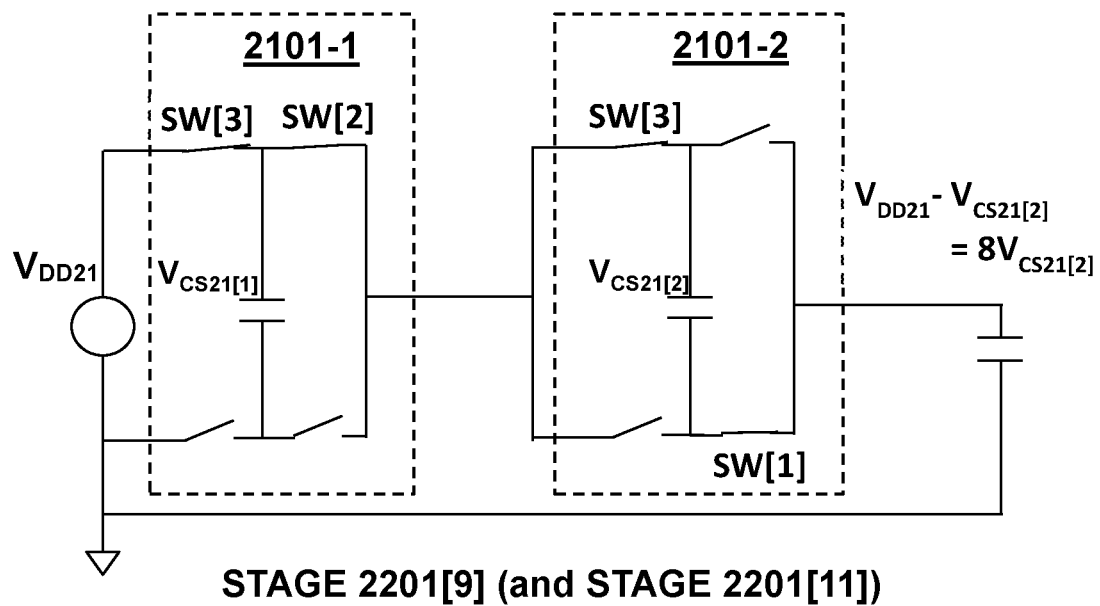

In FIG. 22I, at Stage 2201(9), switch sets (SW[2], SW[3]) of cell 2101-1 and (SW[1], SW[3]) of cell 2101-2 are closed, and $V_{O21}$ is driven to ($V_{DD21}-V_{CS21[2]}=8V_{CS21[2]}$).

Figure 22J:
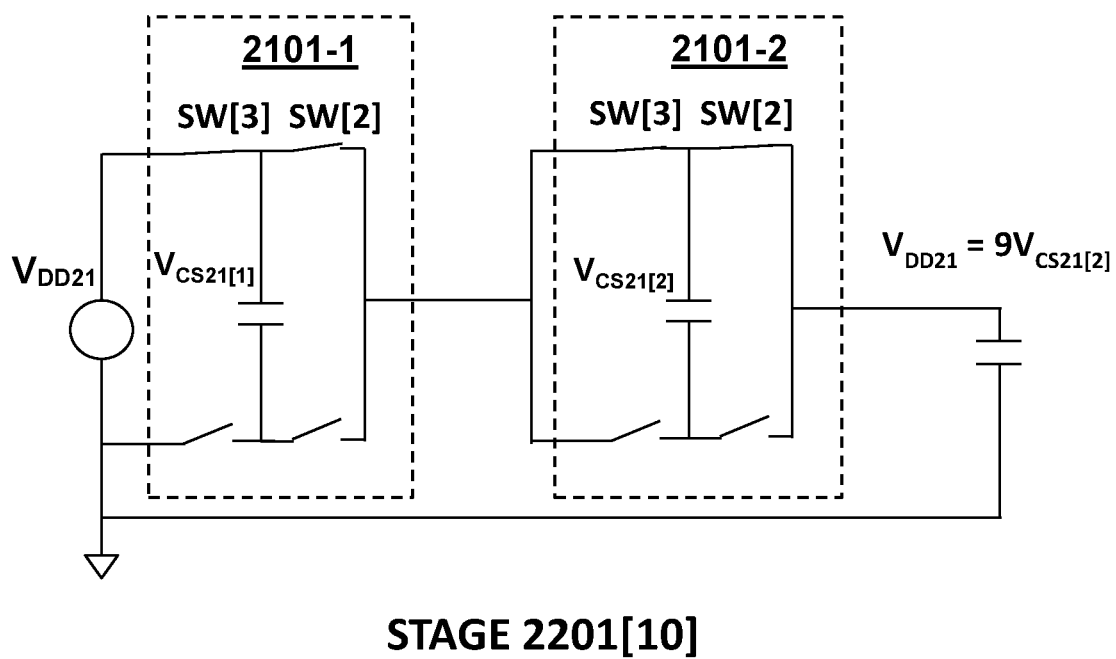

In FIG. 22J, at Stage 2201(10), switch sets (SW[2], SW[3]) of cell 2101-1 and (SW[2], SW[3]) of cell 2101-2 are closed, and $V_{O21}$ is driven to ($9V_{CS21[2]}=V_{DD21}$).

In FIG. 22I, at Stage 2201(11), the switches operate as in Stage 2201(9), and $V_{O21}$ is driven to $8V_{CS21[2]}$.

In FIG. 22H, at Stage 2201(12), the switches operate as in Stage 2201(8), and $V_{O21}$ is driven to $7V_{CS21[2]}$.

In FIG. 22G, at Stage 2201(13), the switches operate as in Stage 2201(7), and $V_{O21}$ is driven to $6V_{CS21[2]}$.

In FIG. 22F, at Stage 2201(14), the switches operate as in Stage 2201(6), and $V_{O21}$ is driven to $5V_{CS21[2]}$.

In FIG. 22E, at Stage 2201(15), the switches operate as in Stage 2201(5), and $V_{O21}$ is driven to $4V_{CS21[2]}$.

In FIG. 22D, at Stage 2201(16), the switches operate as in Stage 2201(4), and $V_{O21}$ is driven to $3V_{CS21[2]}$.

In FIG. 22C, at Stage 2201(17), the switches operate as in Stage 2201(3), and $V_{O21}$ is driven to $2V_{CS21[2]}$.

In FIG. 22B, at Stage 2201(18), the switches operate as in Stage 2201(2), and $V_{O21}$ is driven to $V_{CS21[2]}$.

The controller 2160 may then return to Stage 2201(1) (In FIG. 22A) to drive the output voltage of the circuit 2100 to ground. Thus it can be seen that the incremental and selective closing and opening of switches in the cells of a multi-cell driving circuit may provide step-wise increases from ground to a peak voltage for the selected cell, with each switch set providing either a decrease in or increase to the output voltage of a selected amount of voltage, or no change to the output voltage. FIG. 22K is a chart showing the switching sequence and the resultant value of $V_{O21}$ to which the voltage across the capacitive element 2130 is driven during one complete $V_{O21}$ driving cycle. It can be seen that the stages and phases through which the driving circuit operates to drive voltage from ground to the supply voltage are mirrored in the stages and phases through which the driving circuit operates to drive the voltage from the supply voltage to ground. Therefore, the stages after Stage 2201 (10), in which $V_{O21}$ is driven to ground may be known by reference to the Stage 2201(1) to Stage 2201(10).

It can also be seen in FIG. 22K that the Stage 2201(18) constitutes the last stage of the output voltage driving cycle for circuit 2100. In the Stage 2201(18), the cell 2101-1 is bypassed to provide ground to the input of the cell 2101-2 and the cell 2101-2 is driven to provide $V_{CS21[2]}$. In order to bring the output voltage of the cell 2100 to ground after completion of the Stage 2201(18), the switching sequence methodology 2200 may apply the switching operations of the Stage 2201(1) (shown in FIG. 22A) to the circuit 2100 in order to bypass the cell 2101-1 in such a manner that the negative terminal 2128 of the voltage source for the circuit 2100, which provides ground, is electrically connected to the output of the cell 2101-1 so that the input of the cell 2101-2 is grounded, and to bypass the cell 2101-2 so that the output of the cell 2101-2, and hence the output of the circuit 2100, is grounded.

When the driving circuit 2100 is arranged to cease operation after one application of the output voltage driving cycle, the last stage of the switching sequence methodology 2200 may constitute repeating the Stage 2201(1) operation to bring the output of the circuit 2100 to ground. When the driving circuit is arranged to continue operation, the last stage of the switching sequence methodology 2200 may constitute the first stage of the next iteration of the output voltage driving cycle for the circuit 2100.

Going forward, it is to be understood that future references to completing an output voltage driving cycle for a capacitive element driving circuit includes bringing the output of the capacitive element driving circuit to ground by applying the first stage of a switching sequence methodology after the last stage of a switching sequence methodology; and future references to applying the first stage of a switching sequence methodology contemplates applying either of the above-described methods for bringing the output of a capacitive element driving circuit to ground.

Voltage Assignment Functionalities

Figures 1, 24B:
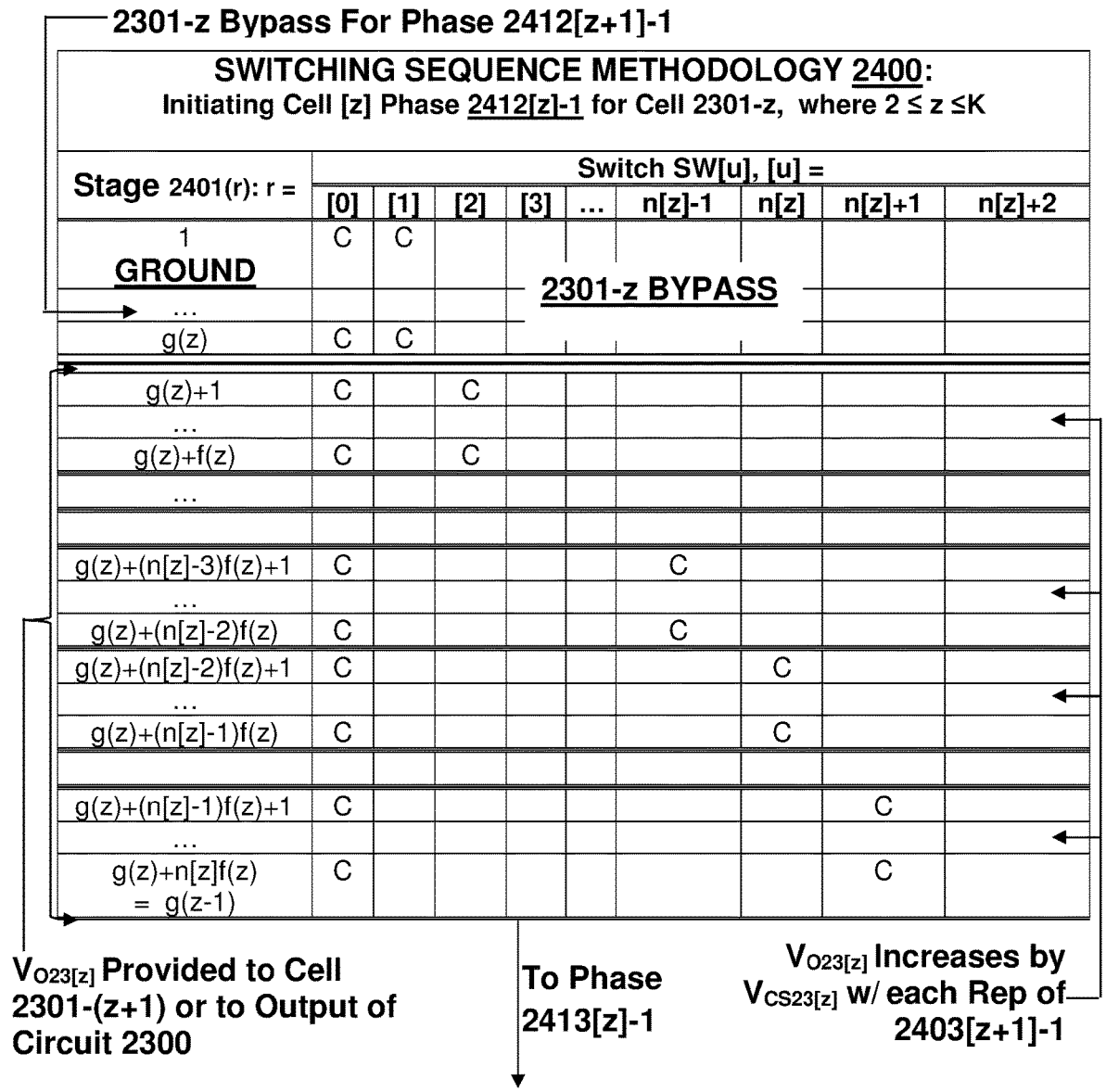

FIGS. 22L-1-22L-3 are charts specifying the voltage assignment functionality of sets of closed switches in embodiments of switching sequences of driver cells in selected driving circuits. In this embodiment, for convenience of calculation, the non-dissipative elements are assumed to have identical voltage storage capacities but it is to be understood that it will be the choice of designer to select the voltage storage capacities of any of the non-dissipative elements in any driver cell of driving circuit.

In certain embodiments in which a cell has more than one non-dissipative element and the voltage of any two such elements are not equal to each other, the switching may occur as is disclosed for FIGS. 22A-22J to produce a step-wise increase in voltage from ground to the supply voltage and then to ground, but the steps (change in voltage) may not be uniform.

FIG. 22L-1: 1-Non-Dissipative Element Driver Cell

Specifically, FIG. 22L-1 shows the voltage assignment functionality 2001-1 of a driver cell x with one non-dissipative element and four switches. The driver cell x is operable as the cell 2101-2 in FIGS. 22A-J, which has a voltage output and a voltage input that is electrically connectable to the output of 2101-1 and to the voltage input for both switches SW[0] and SW[3] of cell 2101-2.

In FIGS. 22A-22J, it can be seen that, in cell 2101-1, when the switch sets (SW[0], SW[1]) or (SW[2], SW[3]) are closed, the non-dissipative element of cell 2101-1 is bypassed, with the switch set (SW[0], SW[1]) electrically connecting the negative terminal of the voltage source to the output of the cell 2101-1 and supplying a ground as an output for the cell 2101-1. The switch set (SW[2], SW[3]) of cell 2101-1 also operates to bypass the non-dissipative element, electrically connecting the positive terminal of the voltage source to the output of the cell 2101-1 and supplying the voltage output $V_{DD}$ of the voltage source as the output of the cell 2101-1. In the cell 2101-2, because the cell's voltage input operates as the voltage input for both switches SW[0] and SW[3] of cell 2101-2, both of the switch sets (SW[0], SW[1]) and (SW[2], SW[3]) function to bypass the non-dissipative element of the cell 2101-2, electrically connecting the input of cell 2101-2 to the output of cell 2101-2.

Therefore, in cell x, which is operable as the cell 2101-2 and which has a voltage output $V_{Out[x]}$ and a voltage input $V_{In[x]}$ that is electrically connectable to the output of its upstream adjacent cell and to both switches SW[0] and SW[3] of cell x, both of the switch sets (SW[0], SW[1]) and (SW[2], SW[3]) function to bypass the non-dissipative element of the cell x. FIG. 22L-1 shows the functionality of the switch sets (SW[0], SW[1]), (SW[2], SW[3]) of the driver cell x to both electrically connect the input of the driver cell x to its output. FIG. 22L-1 also shows the functionality of the switch set (SW[0], SW[2]), releasing V[x] (the non-dissipative element's voltage storage capacity) to add to $V_{In[x]}$; and the functionality of the switch set (SW[1], SW[3]), subtracting V[x] from $V_{In[x]}$.

Figure 2B:
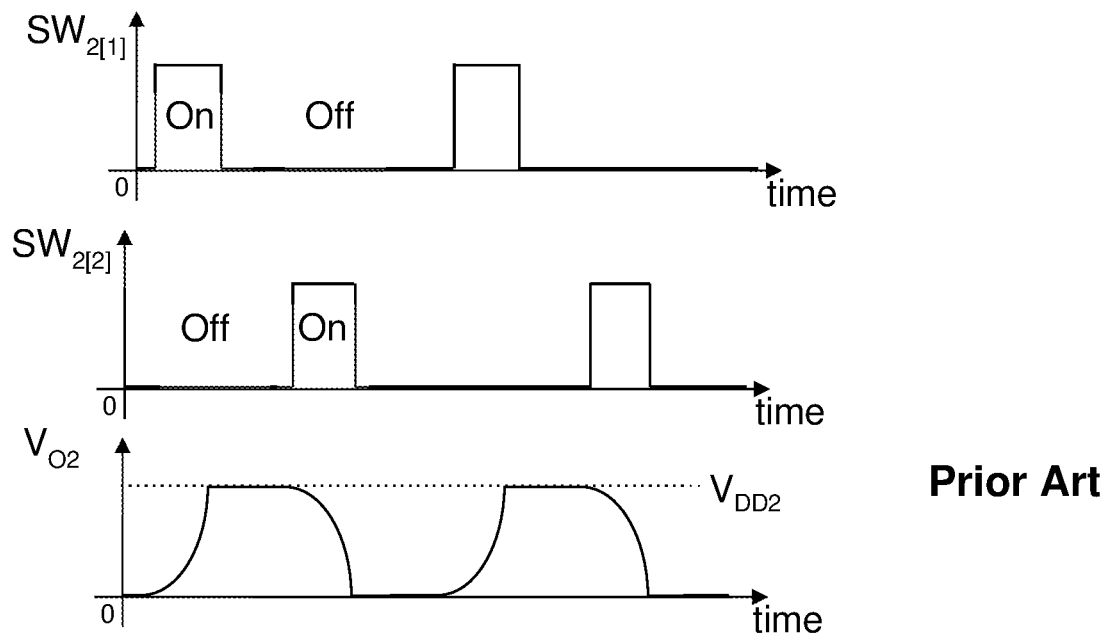
FIG. 2B is a diagram showing waveforms associated with the operation of circuit 200.
Figure 2B:
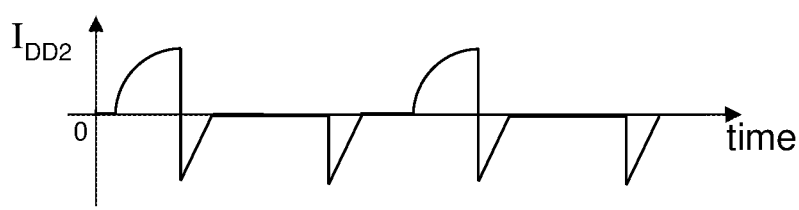

FIG. 22L-2: 2-Non-Dissipative Element Driver Cell

FIG. 22L-2 shows the voltage assignment functionality 2001-2 for a driver cell y, which may also be operable as the cell 2101-2. The driver cell y has two non-dissipative elements and five switches, with the switch sets (SW[0], SW[1]) and (SW[3], SW[4]) operating to bypass the non-dissipative elements. The switch sets (SW[0], SW[2]), (SW[0], SW[3]) add a selected amount of voltage to the input voltage $V_{In[y]}$; and the switch sets (SW[1], SW[4]), (SW[2], SW[4]) subtract a selected amount of voltage from $V_{In[y]}$. When the non-dissipative elements have identical voltage storage capacities, for example the voltage V[y]:

the switch set (SW[0], SW[2]) adds V[y] to the input voltage $V_{In[y]}$,
the switch set (SW[0], SW[3]) adds twice V[y] to $V_{In[y]}$,
the switch set (SW[1], SW[4]) subtracts twice V[y] from $V_{In[y]}$, and
the switch set (SW[2], SW[4]) subtracts V[y] from $V_{In[y]}$.

FIG. 22L-3: Generalized Driver Cell

FIG. 22L-3 shows the voltage assignment functionality 2001-q of sets of closed switches in a generalized driver cell k which may also be operable as the cell 2101-2. The driver cell k has q non-dissipative elements and q+3 switches. As with the embodiments of FIG. 22L-1 and FIG. 22L-2, the switch sets (SW[0], SW[1]) and (SW[q+1], SW[q+2]) operate to bypass the non-dissipative elements passing the input voltage $V_{In[k]}$ to the output of cell k; the switch sets (SW[0], SW[2]) through (SW[0], SW[q+1]) add a selected amount of voltage to the input voltage $V_{In[k]}$; and the switch sets (SW[1], SW[q+2]) through (SW[q], SW[q+2]) subtract a selected amount of voltage from $V_{In[k]}$. When the non-dissipative elements have identical voltage storage capacities, for example the voltage V[k]:

the switch set (SW[0], SW[2]) adds V[k] to $V_{In[k]}$;
the switch sets (SW[0], SW[3]) through (SW[0], SW[q+1]) add 2V[k] through qV[k], respectively, to $V_{In[k]}$; and
the switch sets (SW[1], SW[q+2]) through (SW[q−1], SW[q+2]) subtract qV[k] through 2V[k], respectively, from $V_{In[k]}$.

The switch set (SW[q], SW[q+2]) subtracts V[k] from $V_{In[k]}$. A comparison of the switch activation in the voltage assignment functionality 2001-q of FIG. 22L-3 and the voltage assignment functionalities 2001-1, 2001-2 in FIGS. 22L-1 and 22L-2 shows that increasing the number of non-dissipative elements in a driver cell allows for the number of steps in the step-wise process to increase and the difference between the amount of voltage delivered per step to reduce. Thus, the delivery of voltage to a driving circuit's output may be made smoother.

Switching Sequence Methodologies

Figures 1B, 22M:
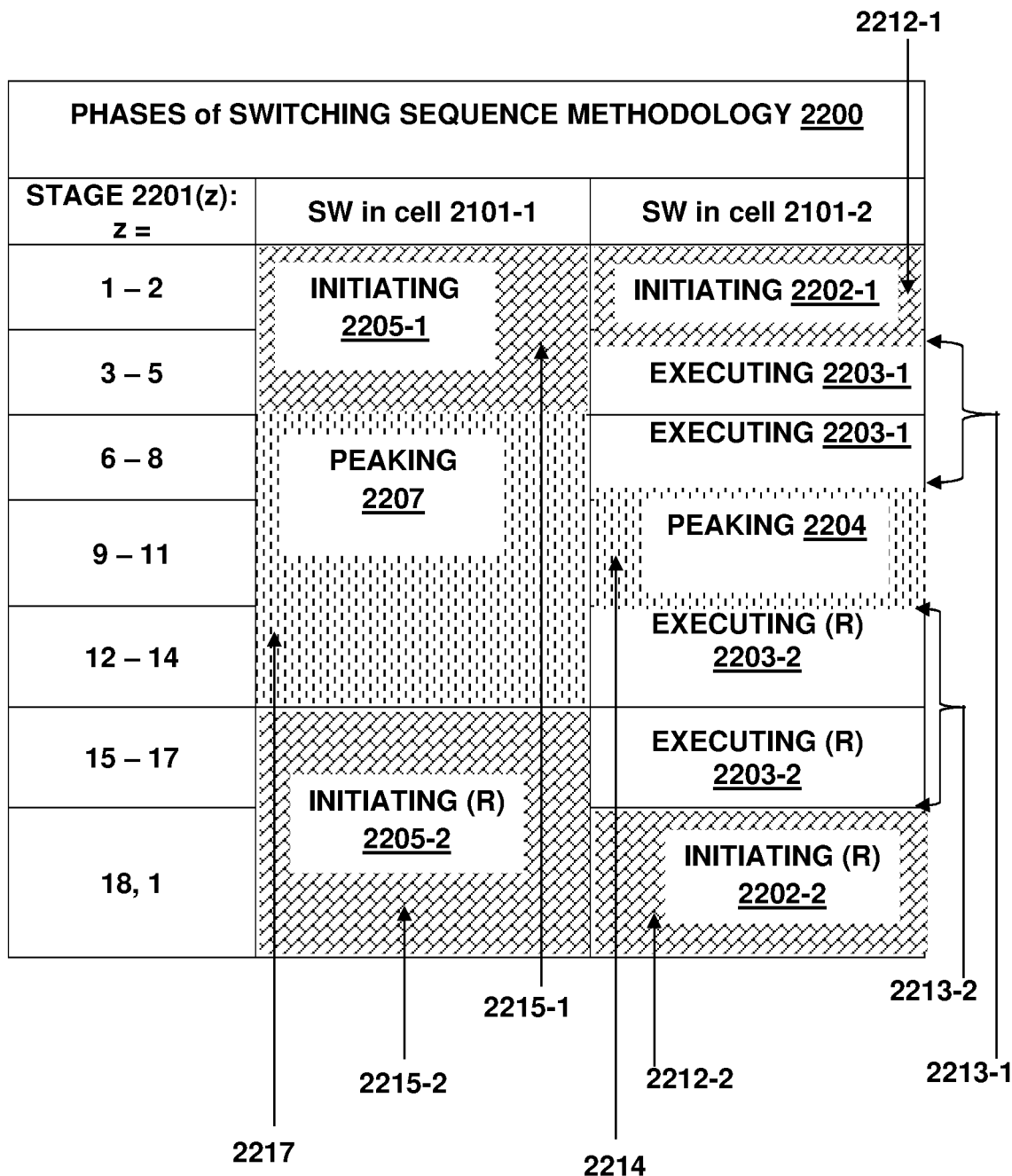
Figures 3B, 22M:
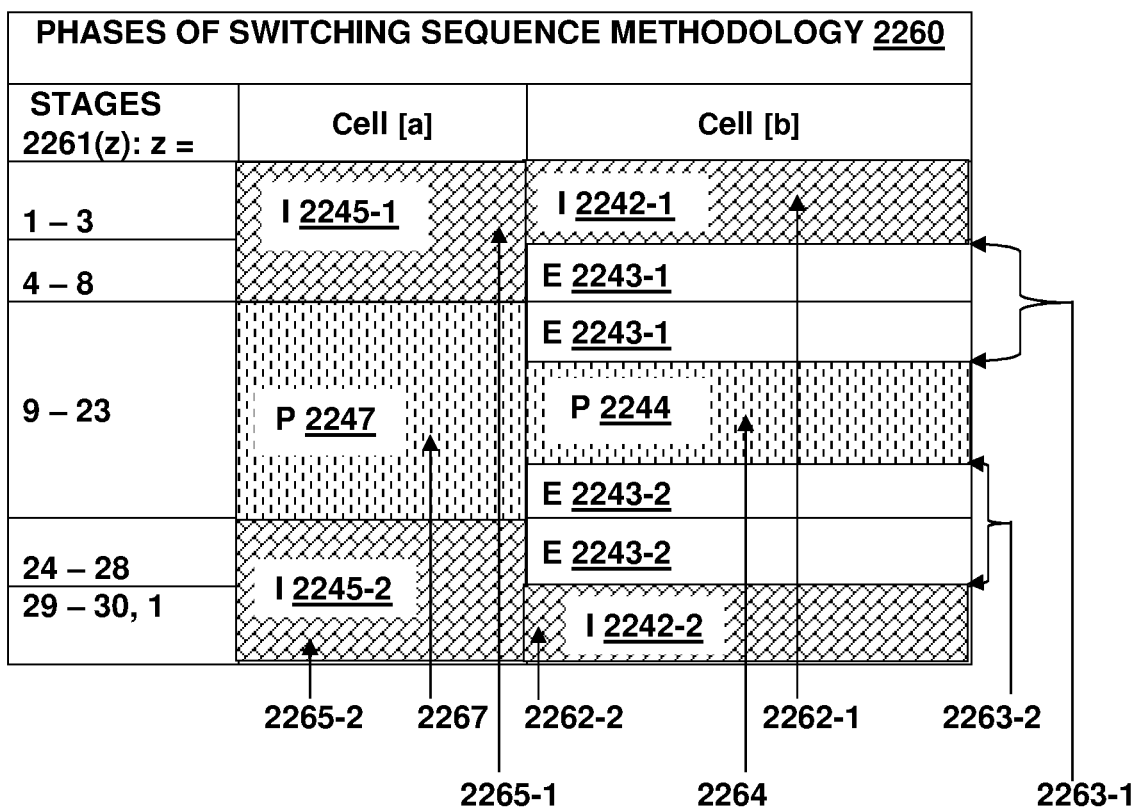

FIGS. 22M-1A-22M-5B are charts illustrating switching sequence methodologies for selected driving circuits when the non-dissipative elements of the cells in the driving circuits have identical voltage storage capacities, adopting the notation for operation of sets of closed switches shown in the voltage assignment functionalities of FIGS. 22L-1-22L-3.

FIG. 22M-1A, 22M-1B show a more detailed specification of the voltage supplied at each stage of the switching sequence methodology 2200 of FIG. 22K, as described above, in which the switches in the first and second cells 2101-1, 2101-2 are opened and closed in a sequence to increase the supplied voltage in a step-wise manner to VDD21 and then are opened and closed in a sequence to decrease the supplied voltage in a step-wise manner to ground, the entire switching sequence defining one $V_{O21}$ driving cycle.

FIG. 22M-2A1, 22M-2A2 show a switching sequence methodology 2220 for a driving circuit [wxy] with three driver cells [w], [x], [y], each with one non-dissipative element.

FIG. 22M-2B1, 22M2B2 show a switching sequence methodology 2240 for a driving circuit [vwxy] with four driver cells [v], [w], [x], [y], each with one non-dissipative element.

Figure 3B:
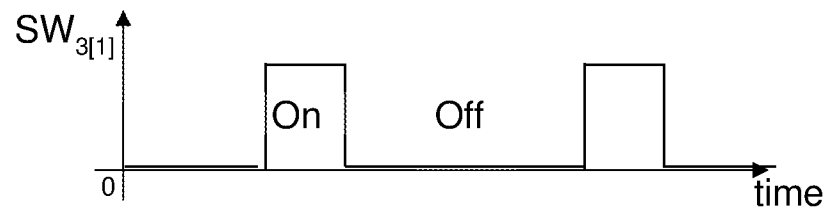
FIG. 3B is a diagram showing waveforms associated with the operation of circuit 300.
Figure 3B:
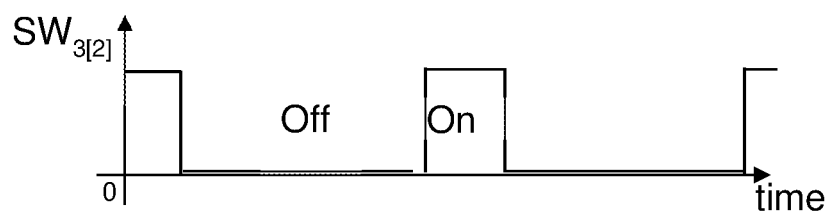
Figure 3B:
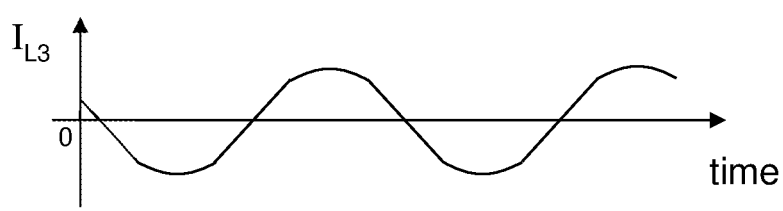
Figure 3B:
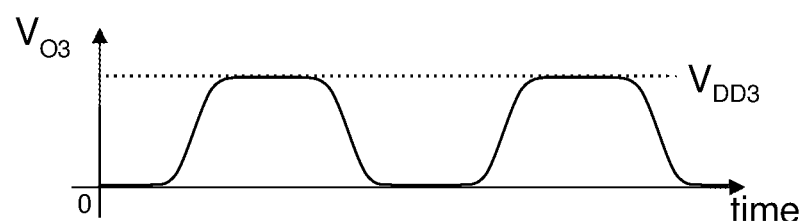

FIG. 22M-3A, 22M-3B show a switching sequence methodology 2260 for a driving circuit [ab] with two driver cells, with a first cell [a] with one non-dissipative element and four switches and a second cell [b] with two non-dissipative elements and five switches.

Figures 4B, 22M:
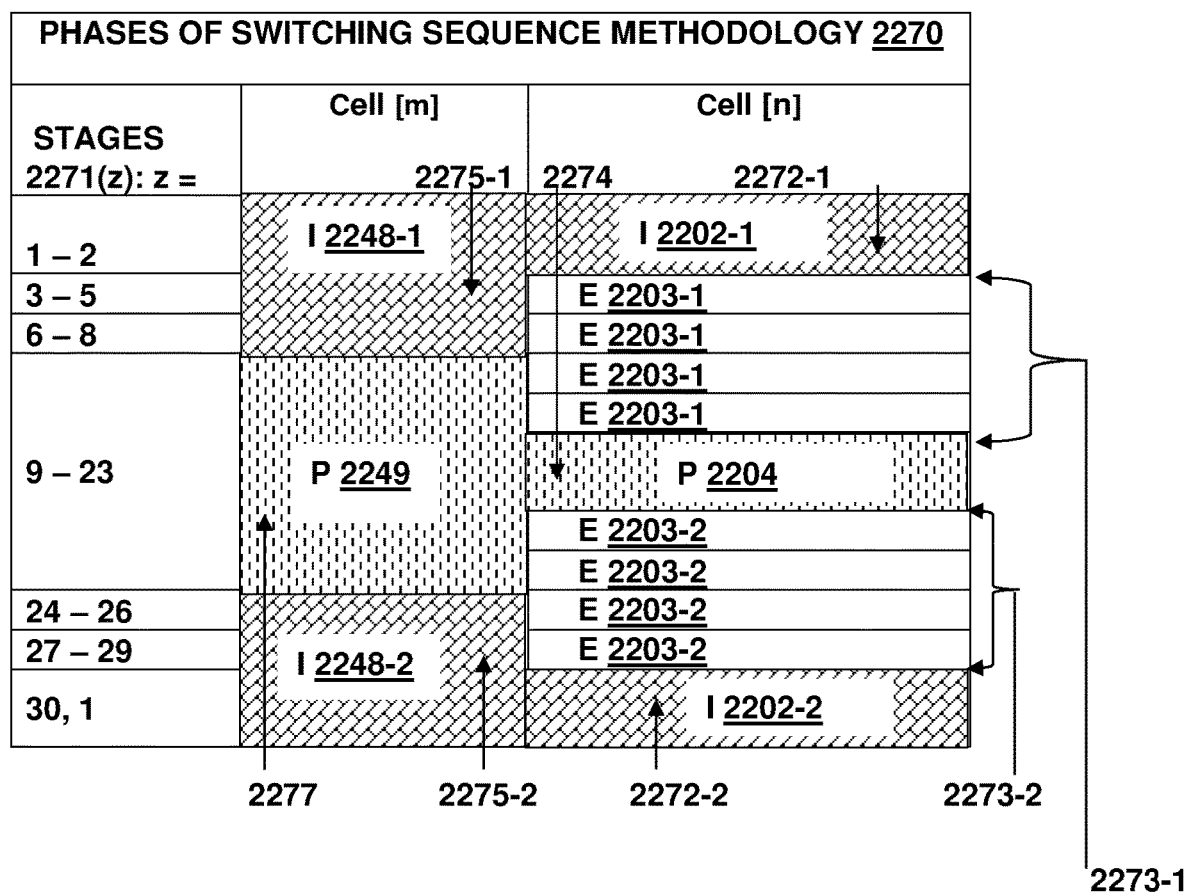
Figures 5B, 22M:
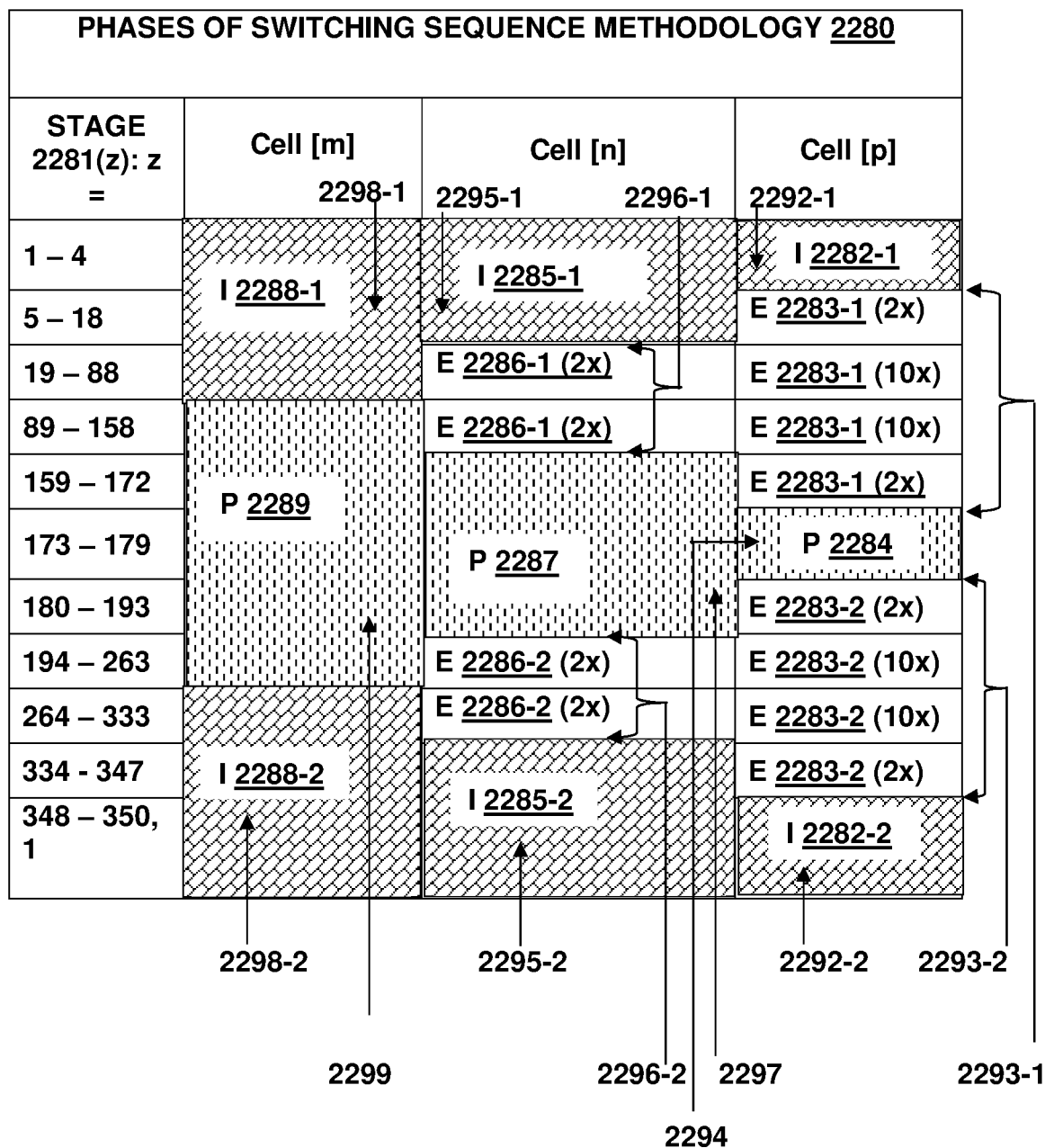

FIG. 22M-4A, 22M-4B show a switching methodology 2270 for a driving circuit [mn] with two driver cells, with a first cell [m] with two non-dissipative elements and five switches and a second cell [n] with one non-dissipative element and four switches.

FIG. 22M-5A1, 22M-5A2, 22M-5B show a switching sequence methodology 2280 for a driving circuit [mnp] with a first cell [m] and second cell [n] with two non-dissipative elements each and a third cell [p] with three non-dissipative elements.

As noted above, in the illustrative but not necessarily preferred embodiment described herein, a switch sequencing methodology may be defined to operate a multi-cell circuit to produce step-wise changes in the output voltage of the circuit. The circuit's switch sequencing methodology may be formed of a set of cell-switching methodologies, with a cell-switching methodology defining a sequence for activating switch sets in one of the cells in the circuit. The circuit may be operated according to the circuit's switch sequencing methodology by applying the cell switching methodologies on their associated cells concurrently and synchronously across the circuit. The cells in the multi-cell circuit are arranged in series, with the output voltage of one cell providing the input voltage of its downstream adjacent cell, so that an incremental change in an upstream cell impacts the voltage production of other cells downstream in the circuit.

The incremental changes in upstream and downstream cells may be seen in the selective closing and opening of switches in the cells of a multi-cell driving circuit. The switching may provide step-wise increases from ground to a peak voltage for a selected cell, with each switch set providing either a decrease in or increase to the output voltage of a selected amount of voltage, or no change to the output voltage. The increases may be seen in FIGS. 22M-1A and 22M-1B from Stages 2201(1) to 2201(10), and the decreases may be seen in FIGS. 22M-1A and 22M-1B from Stages 2201(10) to 2201(1), the first stage of applying the switching sequence methodology 2200 on the circuit 2100.

FIGS. 22M-1A to 22M-5B illustrates several examples of switch sequencing methodologies for operating a multi-cell circuit. The methodologies described below may be seen to be defined by an ordered set of phases, with phase defined by an ordered set of patterns of cell activation, and with a pattern of cell activation defined by an ordered set of stages which are applied in chronological order to activate a switch set in the cell to produce a series of desired output voltage results. When the methodologies are operated concurrently and synchronously, the desired result of incremental change in the cell's output voltage may be achieved.

The illustrated methodologies may be seen to have common phases of operation, with the phases activating switch sets according to common switching patterns, to produce the step-wise increases in the output voltage of the multi-cell circuit 2100 up to its peak voltage and, if desired, to provide for operation of the phases and switching patterns in reverse order to produce step-wise decreases in the output voltage of the multi-cell circuit 2100 from its peak voltage to approaching ground.

Going forward, operation of a methodology in reverse order shall mean operation of its constituent phases in reverse order, with a phase operated in reverse order meaning operation of its constituent switching patterns in reverse order, and with operation of a switching pattern in reverse order meaning operation of its defined constituent stages in reverse chronological order as well. Further, going forward, a phase operated in reverse order shall be known as a "reverse phase," and a switching pattern operated in reverse order shall be known as a "reverse switching pattern."

Except for the cell electrically connected to the voltage source (here called the "first cell"), the methodologies for step-wise driving of the cells in the multi-cell driving circuit have the following phases which apply the following step-wise cell-switching patterns to a cell [i], where $2 \leq i \leq K$:

The initiating cell [i] phase applies an initiating cell [i] switching pattern on a selected cell [i] that is arranged:
to provide the input voltage of the cell [i] as its output voltage (effecting a "bypass" of the cell [i]) by closing one of the sets of switches, either the switch set (SW[0], SW[1]) or the switch set (SW[n[i]+2], SW[n[i]+1]), that effects bypass, and
then to increase incrementally the cell [i]'s output voltage by the voltage $V_{CS[i]}$ provided by a non-dissipative element of the cell hi, by selectively activating the set(s) of switches of the cell [i] that increase the output voltage $V_{O[i]}$, with the switch activations, where there is more than one such set, performed in an order to produce increasing amounts of output voltage increases.

The executing cell [i] phase may proceed after the completion of the initiating cell [i] phase. The executing cell [i] phase may implement a series of executing cell [i] switching patterns on the cell with an application of the executing cell-switching pattern arranged:
first to reduce incrementally the cell [i]'s output voltage by selectively activating the set(s) of switches in the cell [i] that subtract a voltage storage capacity of non-dissipative element(s) from the input voltage of the cell with the switch activations, where there is more than one such set, performed in an order to produce decreasing amounts of output voltage reduction(s), and with the reduction in the input voltage being $V_{CS[i]}$ when cell [i] contains a single non-dissipative element, or $V_{[i]}$ or a multiple thereof when cell [i] contains more than one non-dissipative element.

It should be noted here that the subtraction of $V_{[i]}$ or multiples thereof from the input voltage of the cell [i] during the first stage of an executing cell [i] switching pattern does not result in a reduction of the output voltage of the cell [i] At the same time that voltage is being subtracted from the cell [i] input voltage during a cell [i] switching pattern, a switching pattern operating on one or more cells upstream to the cell [i] increases the input voltage of the cell [i] by a selected amount of voltage for at least the duration of the cell [i] switching pattern on the cell [i]. Therefore, while the subtraction operation reduces the amount of input voltage for the cell [i], the increase in cell [i]'s input voltage is greater than the amount of voltage subtracted from the input voltage, resulting in a net increase in the amount of voltage available at the cell [i] output.

then to bypass the cell [i] by selectively activating a set of switches of the cell [i] that provides the input voltage of cell [i] as its output voltage; and then to increase incrementally the cell [i]'s output voltage by selectively activating the sets of switches in the cell [i] that increase the output voltage, with the switch activations ordered to produce increasing amounts of output voltage.

The peaking cell [i] phase applies a peaking cell [i] switching pattern on the cell [i] that is arranged:

first to reduce incrementally the cell [i]'s output voltage by selectively activating the set(s) of switches in the cell [i] that reduce the output voltage, with the switch activations, where there is more than one such set, ordered to produce decreasing amounts of output voltage reductions; and then to bypass the cell [i] by selectively activating a set of switches of the cell [i] that provides the input voltage of cell [i] as its output voltage.

When the driving circuit is arranged to cease operation when its output voltage reaches its peak voltage, the peaking cell [i] phase may end, and, with it, the methodologies end.

Should the driving circuit be arranged to operate through a complete output voltage driving cycle from ground to peak to approaching ground again, the methodologies may continue on a cell [i] to reduce the cell's output voltage from the peak voltage in step-wise decreases back to ground using the following phases which apply the following step-wise switching patterns to the cell [i].

After the cell [i+1] reaches its peak output voltage, the peaking cell [i] phase applies the remainder of the peaking cell [i] switching pattern on the cell [i] that is arranged:

to maintain the bypass of the cell [i] for the duration of one stage of the cell [i] methodology switching pattern when the cell [i] is the cell that has an output terminal that is or is electrically connected to the output terminal of the driving circuit (hereinafter known as the "last cell"), or otherwise until the completion of the remainder of the peaking cell [i+1] switching pattern on the cell [i+1], and to reduce incrementally the cell [i]'s output voltage by selectively activating the set(s) of switches in the cell [i] that reduce the output voltage, with the switch activations, where there is more than one such set, ordered to produce increasing amounts of output voltage reductions.

The reverse executing cell [i] phase, in which a series of reverse executing cell switching patterns may be implemented in reverse order, may begin at the completion of the peaking cell [i] phase. The reverse executing cell [i] phase may implement a series of reverse executing cell [i] switching patterns in which the stages of the executing cell [i] switching pattern are implemented in reverse order. An application of the reverse executing cell [i] switching pattern may be arranged:

first to increase incrementally the cell [i]'s output voltage by selectively activating the set(s) of switches in the cell [i] that increase the output voltage, with the switch activations, where there is more than one such set, ordered to produce decreasing amounts of output voltage increases;

then to bypass the cell [i] by selectively activating a set of switches of the cell [i] that provides the input voltage of cell [i] as its output voltage; and then to reduce incrementally the cell [i]'s output voltage by selectively activating set(s) of switches in the cell [i] that reduce the output voltage, with the switch activations, where there is more than one such set, ordered to produce increasing amounts of output voltage reductions.

Similar to the voltage subtraction operation in the executing cell [i] switching pattern, the addition of $V_{[1]}$ or multiples thereof to the input voltage of the cell [i] during the first stage of a reverse executing cell [i] switching pattern does not result in an increase in the output voltage of the cell [i]. At the same time that voltage is being added to the cell [i] input voltage during a reverse cell [i] switching pattern, a switching pattern operating on one or more cells upstream to the cell [i] decreases the input voltage of the cell [i] by a selected amount of voltage for at least the duration of the reverse cell [i] switching pattern on the cell [i]. Therefore, while the addition operation increases the amount of input voltage for the cell [i], the decrease in cell [i]'s input voltage is greater than the amount of voltage added to the input voltage, resulting in a net decrease in the amount of voltage available at the cell [i] output.

The reverse initiating cell [i] phase may be implemented at the completion of the reverse executing cell [i] phase. In the reverse initiating cell [i] phase, a reverse initiating cell [i] switching pattern, in which the stages of an initiating cell [i] switching pattern is implemented in reverse order, is then applied on the cell [i], to:

first increase incrementally the cell [i]'s output voltage by selectively activating the set(s) of switches of the cell [i] that increase the output voltage $V_{O[i]}$, with the switch activations, where there is more than one such set, ordered to produce decreasing amounts of output voltage increases; and then bypass the cell [i] by selectively activating a set of switches of the cell [i] that provides the input voltage of cell [i] as its output voltage, with the bypass of the cell [i] maintained until the output voltage of the last cell (cell [K]) in the K-cell circuit is at $V_{CS[K]}$, which is one step away from being driven to ground.

In the last stage of the output voltage driving cycle, the cells [i] for $2 \leq i \leq (K-1)$ are bypassed to provide ground to the input of the cell [K] to allow the cell [K] to be driven to provide $V_{CS[K]}$. In order to bring the output voltage of the cell [K] to ground, the switching sequence methodology may apply its first stage. As noted above, when the output voltage of the driving circuit reaches $V_{CS[K]}$, and the driving circuit is arranged to cease operation after one application of the output voltage driving cycle, the last stage of the reverse initiating cell [i] phase may call for subjecting the cell [i] to a single application of the first stage of the output voltage driving cycle to bypass the cell [i]. When the driving circuit is arranged to continue operation, the last stage of the reverse initiating cell [i] phase may call for subjecting the cell [i] to the first stage of the output voltage driving cycle to bypass the cell [i].

The first cell in the multi-cell driving circuit (cell [1]) may be seen to operate with the above-described initiating cell [i] phase, followed by the above-described peaking cell [i] phase, both with i=1, and with the initiating cell [1] phase's bypass operations achieved by selectively activating a set of switches of the cell [1] that provides the voltage of the negative terminal of the voltage source for the circuit 2100 (shown to be ground in the voltage source in FIG. 21) to the input of the cell [2]. Similarly, the cell's bypass operations in the peaking phase may be achieved by selectively activating a set of switches of the cell [1] that provides the supply voltage of the circuit's voltage source to the input of the cell [2].

Upon completion of the output voltage driving circle, the output voltage of driving circuit is at $V_{CS[K]}$, which is one step away from ground. When the driving circuit is arranged to cease operation after one application of the output voltage driving cycle, the cell [1] may be subjected to an application of the first stage of the output voltage driving cycle to bypass the cell [1] in such a manner that the negative terminal of the voltage source for the circuit, which provides ground, is electrically connected to the output of the cell [1] so that the input of the cell [2] is also grounded. Should the driving circuit be arranged to continue operation to drive the circuit through repeated output voltage driving cycles, the methodology may proceed after applying the last stage of the driving cycle to apply the first stage of the next iteration of the driving cycle. The first stage also bypasses the cell [1], resulting in a grounding of the output voltage of the cell [1] and returning the methodology to its initiating cell [1] phase to begin the step wise drive of the circuit's output from ground to peak to ground again.

In the embodiments disclosed herein, the number of stages in which a switched set activation is maintained on a selected cell (cell [i]) that is not a last cell ("cell [K]") may be based on the number of non-dissipative elements in its adjacent downstream cell (hereinafter "cell [i+1]") in the K-cell circuit. As described in more detail in the illustrious but not necessarily preferred embodiments disclosed above and below, a switched set activation may be maintained in the selected cell [i] for the duration of the methodology switching pattern that is concurrently being performed on the cell [i+1]. When the selected cell (cell [i]) is the last cell (cell [K]) of the K-cell circuit, there is no cell [i+1] and a switched set activation may be maintained in the cell [i] for the duration of one stage of the methodology switching pattern.

Further, as described in more detail below, the number of stages in which a cell switching pattern operates on a selected cell is also based on the number of non-dissipative elements in the selected cell. For example, a cell with one non-dissipative element has only one switch set that may be closed to increase its output voltage, while a cell with three non-dissipative elements has three switch sets that may be closed to increase its output voltage. The same holds for the number of sets of switches in the cell [i] that may be closed to reduce its output voltage. Accordingly, the number of step wise voltage changes in a selected cell's cell switching patterns will be based on the number of non-dissipative elements in the cell.

In order to understand how the cells of the multi-cell driving circuit concurrently and synchronously operate to close and open the switches provide incremental increase and then decrease of output voltages of the cells, which in turn drives incremental increase and then decrease of the overall output voltage of the driving circuit, attention will be now turned to FIGS. 22M-1A to 22M-5B, to describe examples of cell-switching methodologies for circuits having varying numbers of cells and for cells having varying numbers of non-dissipative elements.

Initiating cell phases and switching patterns, executing cell phases and switching patterns, and peaking cell phases and switching patterns will also be in the figures as "INITIATING" or "I," "EXECUTING" or "E," and "PEAKING" or "P," respectively.

K-Cell Driving Circuits, Each Cell With One Non-Dissipative Element

FIG. 22M-1A: 2-Cell Driving Circuit

FIGS. 22K, 22M-1A, and 22M-1B show the illustrative but not necessarily preferred embodiment of the methodology 2200 for opening and closing the switches in the driver cells so as to increment the voltage output in a step-wise manner from a driving circuit having two cells, each with one non-dissipative element. The methodology 2200 starts with a Stage 2201(1), in which the switches (SW[0], SW[1]) of both driver cells are activated to drive the driving circuit's output to ground. In a Stage 2201(2), the switches (SW[0], SW[1]) of the driver cell 2101-1 stay activated to drive the cell's output to ground (thus preventing the driver cell 2101-1 from contributing voltage to the driving circuit's output), while the switches (SW[0], SW[2]) of the driver cell 2101-2 (which is closest in the circuit to the output terminal) are activated to release $V_{CS21[2]}$, the voltage storage capacity from its one non-dissipative element, so that $V_{CS21[2]}$ becomes the output of the driving circuit 2100.

Once the $V_{CS21[2]}$ has been reached, in Stages 2201(3) through 2201(5), the switches (SW[0], SW[2]) of the driver cell 2101-1 may be activated to release $V_{CS21[1]}$, its voltage storage capacity, from its non-dissipative element so that $V_{CS21[1]}$ is provided as the voltage output of the cell 2101-1.

In the Stage 2201(3), the switches (SW[1], SW[3]) of the driver cell 2101-2 are operated to reduce $V_{CS21[1]}$ by $V_{CS21[2]}$.

In a Stage 2201(4), the switches (SW[2], SW[3]) of the driver cell 2101-2 are operated to bypass the non-dissipative element of the driver cell 2101-2, raising the output voltage to $V_{CS21[1]}$, which equals three times the output voltage $V_{CS21[2]}$. In other equally illustrative but not necessarily preferred embodiments, the bypass in the cell 2101-2 may be accomplished by operating the switches (SW[0], SW[1]) of cell 2101-2 rather than the switches (SW[2], SW[3]).

In a Stage 2201(5), the switches (SW[0], SW[2]) of the driver cell 2101-2 are operated so that both driver cells provide their available voltage storage capacity to increase the output voltage from $V_{CS21[1]}$. To $V_{CS21[1]}$+ $V_{CS21[2]}$=4$V_{CS21[2]}$.

In Stages 2201(6) through 2201(8), the switch set (SW[1], SW[3]) of the driver cell 2101-1 is activated to raise the input of the cell 2101-1 to the driving circuit's supply voltage $V_{DD21}$, and then to reduce $V_{DD21}$ by the cell 2101-1 voltage storage capacity $V_{CS21[1]}$ so as to provide $V_{DD21}-V_{CS21[1]}$ as the voltage output of the cell 2101-1.

In the Stage 2201(6), the switch set (SW[1], SW[3]) of the driver cell 2101-1 is activated to subtract the cell 2101-2 voltage storage capacity $V_{CS21[2]}$ from the voltage output of the cell 2101-1, resulting in a voltage output $5V_{CS21[2]}$ for the driving circuit.

In a Stage 2201(7), the cell 2101-2 is bypassed by activating switch set (SW[2], SW[3]) or, as noted earlier, switch set (SW[0], SW[1]), to provide the voltage output of the cell 2101-1, namely $V_{DD21}-V_{CS21[1]}$ or $6V_{CS21[2]}$.

In a Stage 2201(8), the switch set (SW[0], SW[2]) of cell 2101-2 is activated to add $V_{CS21[2]}$ to the voltage output of the cell 2101-1, thus providing $7V_{CS21[2]}$ as the voltage output of the driving circuit.

In Stages 2201(9) and 2201(10), the switch set (SW[2], SW[3]), or switch set (SW[0], SW[1]), of the driver cell 2101-1 are activated to bypass the non-dissipative element of the cell 2101-1, thus delivering the driving circuit's supply voltage $V_{DD21}$ as the voltage output of the cell 2101-1.

In Stages 2201(9), the switch set (SW[1], SW[3]) of cell 2101-2 is activated to subtract $V_{CS21[2]}$ from $V_{DD21}$ to provide a voltage output $8V_{CS21[2]}$ for the driving circuit; and In Stages 2201(10), the switch set (SW[2], SW[3]) or, as noted earlier, switch set (SW[0], SW[1]) of cell 2101-2 are activated to bypass the non-dissipative elements of the cell 2101-2 to provide a voltage output $V_{DD21}=9V_{CS21[2]}$ for the driving circuit.

Switch activation according to the methodology 2200 continues to provide a step-wise increase of the voltage output for the driving circuit from ground to the maximum voltage releasable by circuit 2100, namely to $V_{DD21}$. In Stages 2201(11) to 2201(18), switch activation according to the methodology 2200 may continue in reverse to reduce the voltage output in a step-wise manner from $V_{DD21}$ to $V_{CS21[2]}$. The circuit's output voltage may be driven from $V_{CS21[2]}$ to ground by applying a Stage 2201(1) as a stand-alone or as the first stage of the next operation of the output voltage driving cycle to drive the output voltage of the circuit in a step-wise increase back to $V_{DD21}$, and then to drive the output voltage in a step-wise decrease back to $V_{CS21[2]}$.

As noted above, in certain embodiments, in any selected cell that is not the first cell in the driving circuit (i.e. in cells that do not have input terminals electrically connected to the driving circuit's voltage source), the pass-through switch sets (SW[0], SW[1]) and (SW[2], SW[3]) may be interchangeable, as both sets of switches, when closed, electrically connect the selected cell's inputs to its output.

FIG. 22M-1A and FIG. 22M-1B show the phases of and patterns in switch sequencing that may be applied to cause the methodology 2200 to provide a step-wise increase and then decrease of output voltage during a complete driving cycle. Specifically:

In an initiating cell [2] phase 2212-1 for cell 2101-2, a two-stage initiating cell [2] switching pattern 2202-1 may be applied to the cell 2101-2 in Stages 2201-1 to 2201-2, so that the switches of the second cell 2101-2 are operated to bypass the cell 2101-2 for one stage and then supply $V_{CS21[2]}$ to the output voltage of the driving circuit 2100 in another stage.

An executing cell [2] phase 2213-1 for the cell 2101-2 may begin after the completion of the initiating cell [2] phase 2212-1. In the executing cell [2] phase 2213-1, a three-stage executing cell [2] switching pattern 2203-1 may be applied to the switches in the cell 2101-2 simultaneously with the initiating cell [1] phase 2215-1 (described below) operating on the cell 2101-1 to increase the input voltage of the cell 2101-2 by $V_{CS21[1]}$ so that the application of the executing cell [2] switching pattern 2203-1 drives the output voltage of the circuit 2100 to $4V_{CS21[2]}$. The switches in the cell 2101-2, which are operated to first subtract $V_{CS21[2]}$ from the input voltage of the cell 2101-2, then bypass cell 2101-2, and then supply $V_{CS21[2]}$ to the output voltage of the cell 2101-2.

As noted above in general terms, the subtraction of $V_{CS21[2]}$ from the output voltage of the cell 2101-2 during the first stage of the switching pattern 2203-1 does not result in a reduction of the output voltage of the cell 2101-2 (which is also the output voltage of the circuit 2100). At the same time that the subtraction of the switching pattern 2203-1 occurs, an initiating cell [1] phase 2215-1 (described below) operates on the cell 2101-1 to increase the input voltage of the cell 2101-2 by $V_{CS21[1]}$ for the duration of the executing cell [2] switching pattern 2203-1 on the cell 2101-2. Therefore, while the subtraction operation on the cell 2101-2 results in a reduction of the newly increased input voltage of the cell 2101-2, the output voltage of the cell 2101-2 is $V_{CS21[1]}-V_{CS21[2]}=2V_{CS21[2]}$.

In the next stage of the executing cell [2] switching pattern 2203-1 on the cell 2101-2, the cell 2101-2 is bypassed allowing the output voltage of the cell 2101-2 to reach $V_{CS21[1]}=3V_{CS21[2]}$; and the next stage of the executing cell [2] switching pattern 2203-1 supplies $V_{CS21[2]}$ to the output voltage of the cell 2101-2, resulting in an output voltage of $V_{CS21[1]}+V_{CS21[2]}=4V_{CS21[2]}$.

In the phase 2213-1, the executing cell [2] switching pattern 2203-1 may be repeated on the cell 2101-2 simultaneously with the peaking cell [1] phase 2217 (described below) operating on the cell 2101-1 to increase the input voltage of the cell 2101-2 by $V_{DD21}-V_{CS21[1]}$ so that the repetition of the the executing cell [2] switching pattern 2203-1 drives the output voltage of the circuit 2100 to $5V_{CS21[2]}$, then to $6V_{CS21[2]}$, and then to $7V_{CS21[2]}$.

A peaking cell [2] phase 2214 may begin after the completion of the executing cell [2] phase 2213-1. In the peaking cell [2] phase 2214, two stages of the peaking cell [2] switching pattern 2204 may be applied to the second cell 2101-2 to reach a peak output voltage of $9V_{CS21[2]}$, by first subtracting $V_{CS21[2]}$ from the input voltage of the cell 2101-2 in a Stage 2201(9), and then by bypassing the cell 2101-2 in a Stage 2201(10).

Simultaneously, the switches of the cell 2101-1 may be activated as follows:

In an initiating cell [1] phase 2215-1, a five-stage initiating cell [1] switching pattern 2205-1 may be applied on the cell 2101-1. The initiating cell [1] switching pattern 2205-1 may begin by operating the switches of the cell 2101-1 first to ground the input of cell 2101-2 during the application of the two-stage initiating cell [2] switching pattern 2202-1 on cell 2101-2 in the Stages 2201-1 to 2201-2, and then to provide $V_{CS21[1]}$ to cell 2101-2 as its input voltage during the first application of the three-stage executing cell [2] switching pattern 2203-1 on the cell 2101-2. Throughout the initiating cell [1] phase 2215-1, in the cell 2101-1, the switch SW[0] (electrically connected to the negative terminal of the voltage source) is maintained closed, and the switch SW[3] of the cell 2101-1 (electrically connected to the positive terminal of the voltage source) remains open.

A peaking cell [1] phase 2217, in which the switch SW[0] is maintained open and the switch SW[3] (electrically connected to the positive terminal of the voltage source) is maintained closed, may begin after the completion of the initiating cell [1] phase 2215-1. In the peaking cell [1] phase 2217, a five-stage peaking cell [1] switching pattern 2207 may be applied on the cell 2101-1 during the Stages 2201(6)-2201(10) to drive the cell 2101-1 to its peak output voltage, first by activating the switches in the cell 2101-1 in the Stages 2201(6)-2201(8) during the second application of the executing cell [2] switching pattern 2203-1 on the cell 2101-2 to provide $V_{DD21}$ less $V_{CS21[1]}$ to the cell 2101-2 as its input voltage, and then in the Stages 2201(9)-2201(10) during the application of the peaking cell [2] switching pattern 2204 on the cell 2101-2 to provide the supply voltage $V_{DD21}$ to the input of cell 2101-2 (in effect, bypassing cell 2101-1). Throughout the peaking cell [1] phase 2217 of the cell 2101-1, the switch SW[0] is maintained open, and the switch SW[3] remains closed.

The switching methodology 2200, having thus achieved a peak output of VDD21 for the driving circuit 2100 at the completion of the Stage 2201(10), may then be applied to the circuit 2100 in reverse order to operate a complete driving cycle in which the output voltage of the cell 2100, having been increased in a step-wise manner to an output voltage of $V_{DD21}$, may be returned in step-wise decreases back to ground. The cell switching will include switch activation through Stages 2201(11)-2201(18) to effect the step-wise decrease of the circuit's output voltage to $V_{CS21[2]}$.

The driving cycle being completed at Stage 2201(18), the next operation of the driving cycle may drive the output voltage to ground in its first stage. The cycle may repeat to drive the output voltage in a step-wise manner to $V_{DD21}$ then back to $V_{CS21[2]}$.

The changes to the cell switching patterns for driving the cell 2101-2 in reverse order through Stages 2201(11)-2201(18) follow:

After the peaking cell [2] switching phase 2214 increases the output voltage of the circuit 2100 to $V_{DD21}$=$9V_{CS21[2]}$ at the completion of the second stage of the peaking cell [2] phase 2214 at the Stage 2201(10), the phase 2214 may continue at Stage 2201(11) to activate the switch set that had been activated in Stage 2201(9), thus subtracting $V_{CS21[2]}$ from $V_{DD21}$, the input voltage of the cell 2101-2.

A reverse executing cell [2] phase 2213-2 may begin after the completion of the peaking cell [2] phase 2214 on the cell 2101-2. The reverse executing cell [2] phase 2213-2 may constitute an executing cell [2] phase 2213-1 operated on the cell 2101-2 in reverse order. In the reverse executing cell [2] phase 2213-2, a three-stage reverse executing cell [2] switching pattern 2203-2 may be applied twice to the switches in the cell 2101-2. The reverse executing cell [2] switching pattern 2203-2, in which the stages of the executing cell [2] switching pattern 2203-1 may be implemented in reverse order, may be applied to activate the switch set in cell 2101-2 to supply $V_{CS21[2]}$ to the output voltage of the cell 2101-2, then to bypass cell 2101-2, and then to subtract $V_{CS21[2]}$ from the cell 2101-2 input voltage $V_{DD21}$. The second application of the reverse executing cell [2] switching pattern 2203-2 brings the output voltage of the circuit 2100 to $V_{CS21[1]}$ less $V_{CS21[2]}$, or $2V_{CS21[2]}$ at the completion of the Stage 2201(17).

A reverse initiating cell [2] phase 2212-2 may begin on the cell 2101-2 after the completion of the reverse executing cell [2] phase 2213-2 at Stage 2201(17). The reverse initiating cell [2] phase 2212-2, which may constitute the initiating cell [2] phase 2212-1 operated in reverse order, has a two-stage reverse initiating cell [2] switching pattern 2202-2, in which the stages of the initiating cell [2] switching pattern 2202-1 may be operated in reverse order. The reverse initiating cell [2] switching pattern 2202-2 may be applied on the switches in the cell 2101-2, first to supply $V_{CS21[2]}$ to the output voltage in a Stage 2201(18), then in a repeat of Stage 2201(1), to bypass the cell 2101-2 to bring the output voltage of the circuit 2100 back to ground.

The changes to the phases and switching patterns for the methodology 2200 to drive the cell 2101-1 in reverse order follow:

A peaking cell [1] phase 2217 may proceed at the completion at the Stage 2201(10) of the first two stages of the peaking cell [2] phase 2214. The peaking cell [1] switching pattern 2207 of the phase 2217:
  continues to maintain the supply voltage $V_{DD21}$ on the input of the cell 2101-2 while cell 2101-2 is still undergoing the peaking cell [2] switching pattern 2204, and
  then operates during the Stages 2201(12)-2201(14) to again provide $V_{DD21}$ less $V_{CS21[1]}$ to the input of the cell 2101-2 while the cell 2101-2 is undergoing the first application of the reverse executing cell [2] switching pattern 2203-2.

A reverse initiating cell [1] phase 2215-2 begins after the completion of the peaking cell [1] phase 2217 for the cell 2101-1. The reverse initiating cell [1] phase 2215-2, which may constitute the initiating cell [1] phase 2215-1 operated in reverse order, may be applied to the cell 2101-1. The reverse initiating cell [1] phase 2215-2 has a five-stage reverse initiating cell [1] switching pattern 2205-2, in which the stages of the initiating cell [1] switching pattern 2205-1 may be operated in reverse order. The reverse initiating cell [1] switching pattern 2205-2 may be applied on the switches in the cell 2101-1:
  first to operate during the Stages 2201(15)-2201(17) to supply $V_{CS21[1]}$ to the input of the cell 2101-2 while the cell 2101-2 is undergoing the second application of the reverse executing cell [2] switching pattern 2203-2, and
  then, during the Stages 2201(18)-2201(1), with Stage 2201(1) constituting the first stage of the next operation of the driving cycle for the circuit 2100, to provide ground to the input of the cell 2101-2 while the cell 2101-2 is undergoing the application of the reverse initiating cell [2] switching pattern 2202-2 to bring the output voltage of the circuit 2100 back to ground in the manner described above.

FIG. 22M-2A1: 3-Cell Driving Circuit

The methodology 2220 shown in FIG. 22M-2A1 identifies switch activation for operating a driving circuit [wxy] with three driver cells [w], [x], [y], each with one non-dissipative element and four switches.

Comparing FIG. 22M-1A to FIG. 22M-2A1 and FIG. 22M-1B to FIG. 22M-2A2, it can be seen that the switching patterns that may be used to control the output voltage of a two-cell driving circuit may be modified to control a three-cell driving circuit. As in the switching methodology 2200, a cell in a driving circuit having three driver cells may be electrically bypassed by closing the first pair of switches (SW[0], SW[1]) in the series of switches in the cell and by closing the last pair of switches in the series of switches in the cell. Other switch sets may be operated to release the voltage storage capacity (and multiples thereof) of non-dissipative element(s), or to reduce the voltage output by the voltage storage capacity (and multiples thereof) of the non-dissipative element(s), to provide a step-wise change in the voltage output for the driving circuit. In further stages, the non-dissipative element of another cell may be bypassed and the previously bypassed cell may then be activated with or without other cells in the driving circuit to extend the step-wise switching pattern to release and discharge different amounts of voltage.

Going forward, it is to be understood that references to the first switch set (SW[0], SW[1]) and last switch set (in a one-non-dissipative element cell, set (SW[2], SW[3])), both identify a cell bypass operation and, when used in descriptions of switching methodologies for all but the first cell in a multi-cell driving circuit, may be used interchangeably despite which of the bypassing switch sets is described herein, shown in the figures, or selected for implementation in a system according to this invention.

Turning now to a more detailed look at FIG. 22M-2A1, a switching sequence methodology 2220 is shown for a driving circuit having three driver cells, cell [w], cell [x], cell [y], each with one non-dissipative element and four switches. The pattern of selective and sequential switch opening and closing that was disclosed in FIGS. 22K and 22M-1A may also be seen in FIGS. 22M-2A1 and 22M-2A2, in which voltage output increments in a step-wise manner by opening and closing selected switches to release voltage from selected cells while preventing other cells from contributing voltage to the driving circuit output, and, once the voltage is being output from the circuit is equal to the supply voltage for the circuit [wxy], ($V_{DD[wxy]}$), the stages of the process may be performed in reverse order to reduce the voltage output, again in a step-wise manner, back to an output voltage of V[y] at the Stage 2221(54). As with the exemplary driving cycle for the circuit 2100, the output voltage of the circuit [wxy] may be driven to ground with an application of the first stage, Stage 2221(1), of the $V_{O[wxy]}$ driving cycle.

Many of the patterns of switch closing and resultant voltage outputs of Stages 2201(1) to 2201(18) of the methodology 2200 in FIGS. 22M-1A, 22M-1B may be seen in the patterns of switch closing and resultant voltage outputs of the Stages 2221(1) to 2221(54) in the methodology 2220 in FIGS. 22M-2A1, 22M-2A2.

Further, as in the embodiments disclosed above, the number of stages in which a switched set activation is maintained on a selected cell of a multi-cell circuit may be based on its position in in the circuit. For the cell [w] or [x] in the circuit [wxy], the number of stages in which a switched set activation is maintained may be based on the number of non-dissipative elements in its adjacent, downstream cell in the circuit [wxy]. A switched set activation may be maintained on the selected cell for the duration of the methodology switching pattern that is concurrently being performed on its adjacent, downstream cell. When the selected cell is the cell [y], (the last cell), the switched set activation may be maintained in the selected cell for the duration of one stage of the methodology switching pattern.

For the last cell of the circuit [wxy] (cell [y]):
In an initiating cell [y] phase 2232-1, in Stages 2221(1) to 2221(2), the two-stage initiating cell [y] switching pattern 2202-1 (which is the same switching pattern as the initiating cell [2] switching pattern 2202-1 in the methodology 2200 disclosed above) may operate on the cell [y] (the last cell defined earlier as the one electrically connected to the output terminal of the driving circuit [wxy]) to bypass it and then to add V[y] to the input voltage of cell [y].

Then, in an executing phase 2233-1, the three-stage executing cell [y] switching pattern 2203-1 may be applied to first subtract V[y] from the input voltage of the cell [y], then to bypass cell [y], and then to add V[y] to the input voltage of the cell [y]. The executing cell [y] switching pattern 2203-1 (which is the same switching pattern as the executing cell [2] switching pattern 2203-1 in the methodology 2200 disclosed above) may be applied on cell [y] for seven more applications (for a total of eight applications of switching pattern 2203-1) to bring the output voltage of the cell [y] to $$V_{DD[wxy]} - V[x] + V[y] = 25V[y].$$

The peaking cell [y] phase 2234 may begin after the completion of the executing cell [y] phase 2233-1. The peaking cell [y] phase 2234 may have a peaking cell [y] switching pattern 2204, (which is the same switching pattern as the peaking cell [2] switching pattern 2204 in the methodology 2200 disclosed above). The peaking cell [y] switching pattern 2204 may operate on cell [y] to bring the cell [wxy] to a peak output voltage, first by subtracting V[y] from the input voltage of the cell [y] in Stage 2221(27) and then by bypassing cell [y] in a Stage 2221(28). When the driving circuit [wxy] is operated to stop after achieving $V_{DD[wxy]}$ as its output voltage, the peaking cell [y] phase 2234 may end at Stage 2221(28).

Simultaneously and synchronously, cell [x] may be activated as follows:

An initiating cell [x] phase 2235-1 may have an initiating cell [x] switching pattern 2205-1 (which is the same switching pattern as the initiating cell [1] switching pattern 2205-1 in the methodology 2200 disclosed above). The switching pattern 2205-1 operates for five stages on the cell [x], first to bypass cell [x] during the application of the two-stage initiating cell [y] switching pattern 2202-1 on the cell [y], and then to provide V[x] to the input of the cell [y] during the first application on the cell [y] of the three-stage executing cell [y] switching pattern 2203-1.

An executing cell [x] phase 2236-1 may begin after the completion of the initiating cell [x] phase 2235-1. In the executing cell [x] phase 2236-1, a nine-stage executing cell [x] switching pattern 2226-1 may operate repeatedly on the cell [x] across three applications of the executing cell [y] switching pattern 2203-1 on the cell [y],
   to first subtract V[x] from the voltage being input to the cell [x] (which is the output voltage of the cell [w]) during an entire application of the switching pattern 2203-1 on the cell [y],
   then to bypass cell [x] during another entire application of the switching pattern 2203-1 on the cell [y], and
   then to add V[x] to the output voltage of cell [x] during another entire application of the switching pattern 2203-1 on the cell [y].

The nine-stage executing cell [x] switching pattern 2226-1 then may be repeated on the cell [x] across three more applications of the executing cell [y] switching pattern 2203-1 on cell [y].

A peaking cell [x] phase 2237 may begin after the completion of the executing cell [x] phase 2236-1. The peaking cell [x] phase 2237 may have a peaking cell [x] switching pattern 2207 (which is the same switching pattern as the peaking cell [1] switching pattern 2207 in the methodology 2200 disclosed above) The switching pattern 2207 may operate on the cell [x] for its first three stages to subtract V[x] from the input of cell [x] during the final application of the three stage executing cell [y] switching pattern 2203-1 on the cell [y], and then to bypass cell [x] during the application of the first two stages of the peaking cell [y] switching pattern 2204 on the cell [y] until the peaking voltage of $V_{DD[wxy]}$ of the circuit [wxy] is achieved at the output terminal of the cell [y]. When the driving circuit [wxy] is operated to stop after achieving $V_{DD[wxy]}$ as its output voltage, the peaking cell [x] phase 2237 may end at Stage 2221(28).

Simultaneously and synchronously, cell [w] may be activated as follows:

In an initiating cell [w] phase 2238-1, a fourteen-stage initiating cell [w] switching pattern 2228-1 may begin by operating on the cell [w] to bypass the cell [w], thus applying ground to the input of cell [x] during the application of the initiating cell [x] phase 2235-1 on cell [x], and then to provide V[w] to the input of the cell [x] during the first application of the executing cell [x] switching pattern 2226-1 on the cell [x]. Throughout the initiating cell [w] phase 2238-1 on the circuit [wxy], the switch SW[0] in cell [w] remains closed and the switch SW[3] in cell [w] remains opened.

A peaking cell [w] phase 2239 may begin after the completion of the initiating cell [w] phase 2238-1. Throughout the phase 2239, the switch SW[0] in cell [w] remains open and switch SW[3] in cell [w] remains closed. In the peaking cell [w] phase 2239, a peaking cell [w] switching pattern 2229 operates on the cell [w] for its first nine stages to subtract V[w] from the input voltage of the cell [w] (which is the supply voltage $V_{DD[wxy]}$ of the voltage source that is electrically connected to the circuit [wxy]) during the second application of the executing cell [x] switching pattern 2226-1 on the cell [x], and then to provide $V_{DD[wxy]}$ to the input of the cell [x] during the five-stage peaking cell [x] switching pattern 2207, from Stages 2221(24) to 2221(28), until the output of the cell [x] also reaches the supply voltage $V_{DD[wxy]}$. When the driving circuit [wxy] is operated to stop after achieving $V_{DD[wxy]}$ as its output voltage, the peaking cell [w] phase 2239 may end at Stage 2221(28).

The switching methodology 2220, having thus achieved an output of $V_{DD[wxy]}$ for the driving circuit [wxy], may continue with the switch activation according to the already-describe phases and switching patterns for the methodology 2220 operating in reverse order to reduce the voltage output in a step-wise manner from $V_{DD[wxy]}$ in Stage 2221(28) to ground in an application of a Stage 2221(1).

For cell [y]:
As in the switching methodology 2200, the peaking cell [y] phase 2234 may continue with the third stage of the peaking cell [y] switching pattern 2204 to subtract V[y] from the output voltage $V_{DD[wxy]}$.

A reverse executing cell [y] phase 2233-2 may begin on the cell [y] after the completion of the peaking cell [y] phase 2234. The reverse executing cell [y] phase 2233-2 calls for repeated applications of a reverse executing cell [y] switching pattern 2203-2 on the cell [y]. In the embodiment of FIGS. 22M-2A1, 22M-2A2, the reverse executing cell [y] switching pattern 2203-2 may be applied eight times to the switches in the cell [y]. The reverse executing cell [y] pattern 2203-2, in which the stages of the executing cell [y] switching pattern 2203-1 may be applied on the cell [y] in reverse order, is arranged to first add V[y] to the output voltage of the cell [y], then to bypass cell [y], and then to subtract V[y] from the input voltage of the cell [y], to bring the output voltage of the circuit [wxy] to V[x] less V[y] after the eight application of the reverse executing cell [y] switching pattern 2203-2 at the completion of the Stage 2221(53).

A reverse initiating cell [y] phase 2232-2 may begin after the completion of the reverse executing cell [y] phase 2233-2. In the reverse initiating cell [y] phase 2232-2, a two-stage reverse initiating cell [y] switching pattern 2202-2 is performed on the cell [y]. The reverse initiating cell [y] switching pattern 2202-2, in which the stages of the initiating cell [y] switching pattern 2202-1 may be implemented in reverse, may operate on the cell [y], first adding V[y] to the input voltage of the cell [y] in a Stage 2221(54), then bypassing cell [y] to bring the output voltage of the cell [y] back to ground in an application of a Stage 2221(1).

For cell [x]:
The peaking cell [x] phase 2237 may continue with the Stage 2221(29) of the peaking cell [x] switching pattern 2207 to bypass the cell [x] to ensure that $V_{DD[wxy]}$ is provided to the input of the cell [y] for the duration of the peaking cell [y] switching pattern 2204 on the cell [y]; and then to reduce the voltage being input to the cell [y] by $V_{[x]}$ during the first application of the reverse executing cell [y] switching pattern 2203-2 on the cell [y].

A reverse executing cell [x] phase 2236-2 may begin after the completion of the peaking cell [x] phase 2237. The reverse executing cell [x] phase 2236-2 calls for two applications on the cell [x] of the reverse executing cell [x] switching pattern 2226-2, in which the stages of the executing cell [x] pattern 2226-1 are implemented in reverse order. Each application of the reverse executing cell [x] switching pattern 2226-2 in the phase 2236-2 operates on the cell [x] during three applications of the reverse executing cell [y] switching pattern 2203-2 on the cell [y]:

first adding V[x] to the input voltage of the cell [x] during an application of the reverse executing cell [y] switching pattern 2203-2 on the cell [y], which in the current embodiment is the second application of the reverse executing cell [y] switching pattern 2203-2 (the first application having operated on the cell [y] during the last stages of the peaking cell [x] switching pattern 2207);

then bypassing the cell [x] during another application of the reverse executing cell [y] switching pattern 2203-2 on the cell [y], which in the current embodiment is the third application of pattern 2203-2 on the cell [y]; and then subtracting V[x] from the input voltage for the cell [y] during another application of the reverse executing pattern 2203-2 on the cell [y] which in the current embodiment is the fourth application of pattern 2203-2 on the cell [y].

In the current embodiment, the second application of the reverse executing cell [x] switching pattern 2226-2 is performed during the fifth, sixth, and seventh applications of the switching pattern 2203-2 on the cell [y]. The two applications of the reverse executing cell [x] switching pattern 2226-2 brings the output voltage for the circuit [wxy] to V[w], less V[x], and less V[y], or 5V[y] at the completion of the reverse executing cell [x] phase 2236-2.

A reverse initiating cell [x] phase 2235-2 may begin after the completion of the reverse executing cell [x] pattern 2236-

2. In the phase 2235-2, a five-stage reverse initiating cell [x] pattern 2205-2, in which the stages of the initiating cell [x] pattern 2205-1 may be implemented in reverse order, first supplies V[x] to the voltage input for the cell [y] during the eighth application of the reverse executing cell [y] pattern 2203-2 on the cell [y], and then bypasses the cell [x] during the application of the reverse initiating cell [y] switching pattern 2202-2 on the cell [y], so that the switching pattern 2202-2 may bring the output voltage of the circuit [wxy] back to ground with an application of a Stage 2221(1).

For cell [w]:

The peaking cell [w] phase 2239 may continue with the Stage 2221(29) of the peaking cell [w] switching pattern 2229 to supply the circuit [wxy]'s supply voltage to the input of the cell [x] with a continuation of the supply voltage-bypass of the cell [w] for the duration of the peaking cell [x] switching pattern 2207 on the cell [x]; and then to reduce the voltage input to the cell [x] by V[w] during the first application of the reverse executing cell [x] switching pattern 2226-2.

A reverse initiating cell [w] phase 2238-2 may begin after the completion of the peaking cell [w] phase 2239 at the completion of Stage 2221(41). In the phase 2238-2, a 14-stage reverse initiating cell [w] switching pattern 2228-2, in which the stages of the initiating cell [w] switching pattern 2228-1 are implemented in reverse order, may be applied on the cell [w], first to add V[w] to the input voltage of the cell [w] during the second application of the reverse executing cell [x] switching pattern 2226-2 on the cell [x], and then to bring the input voltage for cell [x] back to ground by ground-bypassing cell [w] during the application of the reverse initiating cell [x] switching pattern 2205-2 on the cell [x]. As with cells [x], [y], the cell [w] may be brought to bypass after the completion of the output voltage driving cycle with an application of a Stage 2221(1).

FIG. 22M-2B1: 4-Cell Driving Circuit

Generalizing the methodology 2200 even further, FIG. 22M-2B1, 22M-2B2 presents an exemplary switching methodology 2240 for operating a driving circuit [vwxy] with four driver cells [v], [w], [x], [y], each with one non-dissipative element and four switches. The fourth driver cell in the driving circuit [vwxy] is presented here to illustrate how the same switch activation patterns that caused the activation of the switches in cells in the driving circuit [wxy] may be applied to activate the switches in cells in a driving circuit [vwxy] and in driving circuits with any number of driver cells.

FIG. 22M-2B1 employs the functional representation of switching activations presented in FIGS. 22L-1 through 22L-3, which map the activated switch sets in a stage of a methodology to the functional result of the switching. For example, in a cell with one non-dissipative element:

Activating the switch set (SW[0], SW[1]) (also known as the first and second switches) in the first cell of a multi-cell circuit, specifically the cell that is directly connected to the voltage source for the driving circuit, operates to bypass the non-dissipative element of the first cell and apply the voltage at the negative terminal of the voltage source, here ground, to the output terminal of that first cell, referred to in FIG. 22M-2B1 and in later switching charts as "b (ground)" or simply "b(g)."

Activating the last and second last switches in the first cell of a multi-cell circuit (the switch set (SW[2], SW[3]) in a one-non-dissipative element driving cell) also operates to bypass the cell; it applies the voltage at the positive terminal of the voltage source, here $V_{DD[vwxy]}$, to the output terminal of that first cell, referred to in FIG. 22M-2B1 and in later switching charts as "b ($V_{DD[*]}$)", where * is an identifier for the subject circuit.

As noted above, in any other cell other than the first cell in the described multi-cell circuit activating the first and second switches or the last and second last switches (the switch sets (SW[0], SW[1]) or (SW[2], SW[3]) in a one-non-dissipative element driving cell) also operates to bypass the cell, applying the voltage at the input terminal of the cell to the output terminal of the cell, referred to as "b."

Activating the first and third switch in any cell of the described multi-cell circuit (switch (SW[0], SW[2]) in a one-non-dissipative element driving cell) operates to activate the non-dissipative element of the cell to add the voltage storage capacity of the cell's non-dissipative element to the input voltage of the cell, referred to as "+."

Activating the last and third last switch in any cell of the described multi-cell circuit (switch (SW[1], SW[3]) in a one-non-dissipative element driving cell) operates to activate the non-dissipative element of the cell to subtract the amount of the voltage storage capacity of the cell's non-dissipative element from the input voltage of the cell, referred to as "−."

The notation change allows a switching pattern to be illustrated in a single line of a chart, allowing fewer lines to be used in charts illustrating switch sequence methodologies, and allows the charts to show the repetition of switching patterns more easily. The change also allows for direct comparison of the switch sequence methodology 2220 of FIG. 22M-2A1 to the switch sequence methodology 2240 of FIG. 22M-2B1, which demonstrates that, despite FIG. 22M-2A1 showing a single stage per row and FIG. 22M-2B1 showing a switching pattern in each row, and despite driving circuits [wxy], [vwxy] differing in the number of cells in the circuit, the methodologies 2220, 2240 (and methodology 2200) have essentially the same phases and switching patterns of switch activation. FIGS. 22M-1A through FIG. 22M-2B2 illustrate that, as the number of cells in a driver circuit increases, the phases and switching patterns of switching in one switch sequence methodology for operating the most basic multi-cell diving circuit may be applied to driver circuits with larger number of cells to achieve step-wise changes in the voltage being delivered to outputs of driving circuits.

For simplicity of example, in FIG. 22M-2B1, the cells in the driving circuit [vwxy] each contain one non-dissipative element, and all of the non-dissipative elements of the cell will have the same capacitance. The relaxation of those limitations will be discussed below. In the meantime, it can be seen that the switching sequencing of driving circuit [vwxy] continue to constitute switching patterns with functionality of (subtracting a selected voltage from a cell's output voltage "−," bypassing the circuit "b," and adding the selected amount of voltage to the cell's output voltage "+") hereinafter referred to as "(−,b,+)"; and the applications of switching patterns in forward order or reverse order on a cell while analogous switching patterns are applied on upstream cell(s) in the circuit, result in step-wise changes in the output voltage of the circuit.

The last cell in the driving circuit [vwxy] (which is directly connected to the output of the driving circuit, and which in the driving circuit [vwxy] is cell [y]) may operate with the following phases and activation patterns:

In an initiating cell [y] phase 2252-1, the two-stage initiating last cell switching pattern 2202-1 (which is the same switching pattern as the initiating cell [2] switching pattern 2202-1 in the methodology 2200 and the initiating cell [y] switching pattern 2202-1 in the methodology 2220) is shown with the switch activation functionality notation (b,+) for bypassing the last cell, and then for adding the voltage storage capacity of the last cell's non-dissipative element (constituting a voltage step V[y]) to the input voltage of the cell [y]. As noted above, in the last cell of a driving circuit, the bypass is achieved by activating the switches (SW[0], SW[1]) or the switches (SW[2], SW[3]) in the cell [y].

The executing cell [y] phase 2253-1 begins after the completion of the initiating cell [y] phase 2252-1. The phase 2253-1 calls for repeated applications of the three-stage executing cell [y] switching pattern 2203-1 (which is the same switching pattern as the executing cell [2] switching pattern 2203-1 in the methodology 2200 and the executing cell [y] switching pattern 2203-1 in the methodology 2220). The executing cell [y] switching pattern 2203-1, with the functionality (−,b,+) operates to first subtract a voltage step V[y] from the input voltage of the last cell, then to bypass the last cell, and then to add v[y] to the input voltage of the last cell. In the methodology 2240, the pattern 2203-1 may be applied twenty-six times, until the output voltage of the circuit [vwxy] is two voltage steps away from equaling the supply voltage from the voltage source.

A peaking cell [y] phase 2254 begins after the completion of the executing cell [y] phase 2253-1. The peaking cell [y] phase 2254 employs a peaking cell [y] switching pattern 2204 with functionality of (−,b,−) (which is the same switching pattern as the peaking cell [2] switching pattern 2204 in the methodology 2200 and the peaking cell [y] switching pattern 2204 in the methodology 2220). The first two stages (−, b) of the peaking cell [y] switching pattern 2204 subtract V[y] from the last cell's input voltage, and then bypass the last cell to achieve the supply voltage as the output voltage of the circuit [vwxy].

When operation of the driving circuit continues after an output voltage for cell [y] that is equal to the supply voltage is achieved, the peaking cell [y] phase 2254 may allow the peaking cell [y] switching pattern 2204 to apply its complete (−,b,−) functionality, by operating the last stage of the peaking cell [y] switching pattern 2204 to again subtract V[y] from the cell [y] input voltage.

A reverse executing cell [y] phase 2253-2 may begin after the completion of the peaking cell [y] phase 2254. The phase 2253-2 may have a reverse executing cell [y] switching pattern 2203-2, in which the stages of the executing cell [y] switching pattern 2203-1 with (−,b,+) functionality are applied to the cell [y] in reverse order, with the switching pattern applying (+,b,−) functionality on the cell [y]. The reverse executing cell [y] switching pattern 2203-2 may be repeated until the output voltage of the circuit [vwxy] is two voltage steps away from ground.

A reverse initiating phase 2252-2 may begin after the completion of the reverse executing cell [y] phase 2253-2. The reverse initiating phase 2252-2 has a reverse initiating cell [y] switching pattern 2202-2, in which the stages of the initiating cell [y] switching pattern 2202-1 with functionality (b,+) are applied to the cell [y] in reverse order, employs a two-stage reverse initiating pattern 2202-2 with (+,b) functionality that may be operated to drive the output voltage of the circuit [vwxy] to ground, with the b functionality provided after the completion of the output voltage driving cycle by an application of a Stage 2241(1).

The first cell in the driving circuit (which is directly connected to the voltage source for the driving circuit, and which in the driving circuit [vwxy] is cell [v], is upstream and adjacent to the second cell of the driving circuit. The second cell also is referred to herein as cell [2] and in the driving circuit [vwxy] as cell [w]. The first cell may operate with the following phases and activation patterns:

In an initiating cell [v] phase 2218-1, an initiating cell [v] switching pattern 2208-1 may operate on the first cell in the circuit, with a switch activation functionality notation b(ground) repeated for 14 stages for the duration of the application of an initiating cell [w] switching pattern 2228-1 on the cell [w], and another activation functionality notation+repeated 27 stages for the duration of the first application on the second cell [w] of an executing cell [w] switching pattern 2241-1;

A peaking cell [v] phase 2219 may follow the completion of the initiating cell [v] phase 2218-1. The peaking cell [v] phase 2219 may have a peaking cell [v] switching pattern 2209 that first reduces the supply voltage of the voltage source by V[v] during a second application of the executing cell [w] switching pattern 2241-1 on the downstream adjacent cell [w]; and then bypasses the cell [v] to ensure that the cell [v] provides the supply voltage of the voltage source ($V_{DD[vwxy]}$) as the output of the cell [v] during the application of the peaking cell [w] switching pattern 2229 (described below) until the cell [w] achieves $VDD_{[vwxy]}$ as its output.

When the methodology 2240 of the driving circuit [vwxy] continues after Stage 2241(82):

The peaking cell [v] switching pattern 2209 may continue its bypass ($V_{DD[vwxy]}$) of cell [v] until completion of the peaking cell [w] switching pattern 2229 on the downstream adjacent cell [w]; and then subtract V[y] from $V_{DD[vwxy]}$ during the first application on the second cell [w] of a reverse executing cell [w] switching pattern 2241-2.

A reverse cell [v] switching initiating phase 2218-2 may begin after completion of the peaking cell [v] switching phase 2219 upon completion of the first application of the reverse executing cell [w] switching pattern 2241-2. The phase 2218-2 may have a reverse initiating cell [v] switching pattern 2208-2 in which the stages of the initiating cell [v] switching pattern 2208-1 are implemented in reverse order to provide the functionality of (+ for the duration on the cell [w] of the second application of the reverse executing cell [w] switching pattern 2241-2, b (ground) for the duration of the reverse initiating cell [w] switching pattern 2228-2), thus driving the output of the cell [w] to ground after the completion of the output voltage driving cycle by an application of a Stage 2241(1).

It can be seen in reference to FIGS. 22M-2B1, 22M-2B2 that the methodology 2240 has the following phases and cell switching patterns:

The methodology for cell [w] has:
an initiating cell [w] phase 2258-1 with an initiating cell [w] switching pattern 2228-1 (which is the same switching pattern as the initiating cell [w] switching pattern 2228-1 in the methodology 2220);

an executing cell [w] phase 2251-1 which repeatedly applies an executing cell [w] switching pattern 2241-1;

a peaking cell [w] phase 2259 with a peaking cell [w] switching pattern 2229 (which is the same switching pattern as the peaking cell [w] switching pattern 2229 in the methodology 2220);

a reverse executing cell [w] phase 2251-2 which repeatedly applies a reverse executing cell [w] switching pattern 2241-2; and a reverse initiating cell [w] phase 2258-2 with a reverse initiating cell [w] switching pattern 2228-2.

The methodology for cell [x] has:

an initiating cell [x] phase 2255-1 with initiating cell [x] switching pattern 2205-1 (which is the same switching pattern as the initiating cell [1] switching pattern 2205-1 in the methodology 2200 and the initiating cell [x] switching pattern 2205-1 in the methodology 2220);

an executing cell [x] phase 2256-1 with an executing cell [x] switching pattern 2226-1 (which is the same switching pattern as the executing cell [x] switching pattern 2206-1 in the methodology 2220);

a peaking cell [x] phase 2257 with a peaking cell [x] switching pattern 2207 (which is the same switching pattern as the peaking cell [1] switching pattern 2207 in the methodology 2200 and the initiating cell [x] switching pattern 2207 in the methodology 2220);

a reverse executing reverse cell [x] phase 2256-2 with a reverse cell [x] switching executing pattern 2226-2; and a reverse initiating cell [x] phase 2255-2 with a reverse initiating cell [x] switching pattern 2205-2.

It may be seen that the driving circuit [vwxy] is one instantiation of a K-cell driving circuit in which the circuit has four cells, each cell in the driving circuit having a single non-dissipative element and four switches, and having the cell [I] and cell [y] of the circuit [vwxy] operate as cell [1] and cell [K], respectively, in a multi-cell driving circuit. Therefore, the above-described methodologies for controlling cells [v], [y] may serve as exemplary embodiments of methodologies for driving the cells [1], [K] of a generalized multi-cell circuit in which cells have a single non-dissipative element and four switches.

It may also be seen that the cells [w] and [x] are instantiations of a cell [i] in the so-defined generalized multi-cell driving circuit, where (2≤i≤K−1), and with i=2 for cell [w] and i=3 for cell [x] of the circuit [vwxy]. The methodologies for controlling cells [w], [x] may be understood in the methodology described below for controlling cell [i] of the multi-cell driving circuit in which each cell in the driving circuit has one non-dissipative element and four switches. The cell [i] may operate in accordance with a cell switching methodology having phases and switch activation patterns as follows:

An initiating cell [i] phase has an initiating cell [i] switching pattern with a functionality (of b for the duration of the application of an initiating cell [i+1] switching pattern on the cell [i+1], + for the duration of the first application in the driving cycle of an executing cell [i+1] switching pattern on the cell [i+1]).

An executing cell [i] phase may proceed after the completion of the initiating cell [i] phase. The executing cell [i] phase may operate multiple applications of an executing cell [i] switching pattern on the cell [i] When the cell [i] has one non-dissipative element, the executing cell [i] phase may end upon completion of the second last application in the driving cycle of the executing cell [i+1] switching pattern on the cell [i+1]. When the cell [i] has n non-dissipative elements, the executing cell [i] phase may end upon completion of the $(n+1)^{th}$ last application in the driving cycle of the executing cell [i+1] switching pattern on the cell [i+1].

The executing cell [i] switching pattern on the cell [i] may have the functionality of:

during an application of the executing cell [i+1] switching pattern on the cell [i+1], b during another application of the executing cell [i+1] switching pattern on the cell [i+1], and + during yet another application of the executing cell [i+1] switching pattern on the cell [i+1].

A peaking cell [i] phase may follow the completion of the executing cell [i] switching phase. The peaking cell [i] phase may have a peaking cell [i] switching pattern with the functionality of:

− for the duration of a final application in the driving cycle of the executing cell [i+1] switching pattern on the cell [i+1], and b during the application of a peaking cell [i+1] switching pattern on the cell [i+1] until the cell [i+1] achieves its peak voltage.

When operation of the driving circuit continues after the driving circuit achieves the supply voltage as its output voltage:

The peaking cell [i] switching pattern may continue: (b until completion of the peaking cell [i+1] switching pattern on the cell [i+1], − for the duration of the first application in the driving cycle of a reverse executing cell [i+1] switching pattern on the cell (i+1).

The reverse executing cell [i] phase may begin after completion of the peaking cell [i] phase. The reverse executing cell [i] phase may repeat a reverse executing cell [i] switching pattern. When the cell [i] has one non-dissipative element, the reverse executing cell [i] phase may end upon completion of the second last application in the driving cycle of the reverse executing cell [i+1] switching pattern on the cell [i+1]. When the cell [i] has n non-dissipative elements, the reverse executing cell [i] phase may end upon completion of the $(n+1)^{th}$ last application in the driving cycle of the executing cell [i+1] switching pattern on the cell [i+1].

A reverse executing cell [i] phase may the functionality of:

+ during an application of the reverse executing cell [i+1] switching pattern on the cell [i+1], b during another application of the reverse executing cell [i+1] switching pattern on the cell [i+1], and − during yet another application of the reverse executing cell [i+1] switching pattern on the cell [i+1].

A reverse initiating cell [i] phase may begin after completion of the reverse executing cell [i] phase.

The reverse initiating cell [i] phase may have a reverse initiating cell [i] switching pattern having the functionality of:

+ during the last application of the reverse executing cell [i+1] switching pattern on the cell [i+1], and b during the application of the reverse initiating cell [i+1] switching pattern on the cell [i+1], with the b functionality provided after the completion of the output voltage driving cycle by an application of a Stage 2241(1).

K-Cell Driving Circuits Having Cell(s) With More than One Non-Dissipative Element FIG. 22M-3A, 22M-4A: 2-Cell Driving Circuits Having a Cell with One Non-Dissipative Element and a Cell with Two Non-Dissipative Elements Similar switching patterns may also be seen in the switching sequence methodologies 2260, 2270 in FIGS. 22M-3A, 22M-3B and 22M-4A, 22M-4B, for a driving circuit having a cell with one non-dissipative element and another cell with two non-dissipative elements. For purposes of simplification, the capacitances of non-dissipative elements are assumed to be equivalent, but it is to be understood that driving circuits and switching sequence methodologies may be developed for step-wise increase and decrease in voltage output of a driving circuit having non-dissipative elements of non-equivalent capacitance.

It can be seen in the switching sequence methodologies 2260, 2270 that the phases of and the switching patterns for multi-cell driving circuits having non-dissipative elements distributed differently across the cells of the driving circuits are similar to switching patterns seen in methodologies 2200, 2220, and 2240, with the differences driven by the number of non-dissipative elements in the cells in the driving circuit, causing the switches in switch activation sets to be different due to the number of non-dissipative elements in the cells.

For example, a cell with a single non-dissipative element has one switch set (SW[0], SW[2]) that, when activated, causes an increase in the output voltage of the driving cell; while a cell with two non-dissipative elements has two switch sets (SW[0], SW[2]), (SW[0], SW[3]) that, when activated, cause an increase of the output voltage of the driving cell. Activation of the switch set (SW[0], SW[2]) supplies the voltage storage capacity of one non-dissipative element to the output voltage, while activation of the switch set (SW[0], SW[3]) supplies the voltage storage capacity of both non-dissipative elements to the output voltage.

Further, the cell with a single non-dissipative element has one switch set (SW[1], SW[3]) that, when activated, causes a reduction in the output voltage of the driving cell by the voltage storage capacity of its one non-dissipative element; while the cell with two non-dissipative elements has two switch sets (SW[1], SW[4]), (SW[2], SW[4]) that, when activated, cause a reduction in the output voltage of the driving cell. Activation of the switch set (SW[2], SW[4]) reduces the output voltage by the voltage storage capacity of one non-dissipative element, while activation of the switch set (SW[1], SW[4]) reduces the output voltage by the voltage storage capacity of both non-dissipative elements.

FIG. 22M-3A: Driving Circuit labl, Having Cell Tbl with Two Non-Dissipative Elements The switching sequence methodology 2260 of a driving circuit [ab] having a one-non-dissipative element cell [a] electrically connected to the voltage source of the driving circuit and a two-non-dissipative element cell [b] electrically connected to the output terminal of the driving circuit is shown in FIGS. 22M-3A, 22M-3B.

For the cell [b] of the circuit [ab], the methodology 2260 mirrors the methodology 2200 in having:

an initiating cell [b] phase 2262-1 similar to the initiating cell [2] phase 2212-1 of the methodology 2200 and having an initiating cell [b] switching pattern 2242-1 that is similar to the initiating cell [2] switching pattern 2202-1 for the initiating cell [2] phase 2212-1 in that the switching patterns 2242-1, 2202-1 both apply switch activations that increase the output voltage of their respective cells from bypass;

an executing cell [b] phase 2263-1 similar to the executing cell [2] phase 2213-1 of the methodology 2200 and having an executing cell [b] switching pattern 2243-1 that is similar to the executing cell [2] switching pattern 2203-1 for the executing cell [2] phase 2213-1 in that the switching patterns 2243-1, 2203-1 both apply switch activations that increase the output voltage of their respective cells from a minimum cell voltage to a peak cell voltage;

a peaking cell [b] phase 2264 similar to the peaking cell [2] phase 2214 of the methodology 2200 and having a peaking cell [b] switching pattern 2244 that is similar to the peaking cell [2] switching pattern 2204 for the peaking cell [2] phase 2214 in that the switching patterns 2244, 2204 both apply switch activations that increase the output voltage of their respective cells from a minimum cell voltage to a peak cell voltage and back to a minimum cell voltage;

a reverse executing cell [b] phase 2263-2 similar to the reverse executing cell [2] phase 2213-2 of the methodology 2200 and having a reverse executing cell [b] switching pattern 2243-2 that is similar to the reverse executing cell [2] switching pattern 2203-2, with the stages of the reverse switching patterns 2243-2, 2203-2 applied to their respective cells in reverse order from the switching patterns 2243-1, 2203-1, respectively; and a reverse initiating cell [b] phase 2262-2 similar to the reverse initiating cell [2] phase 2212-2 of the methodology 2200 and having a reverse initiating cell [b] switching pattern 2242-2 that is similar to the reverse initiating cell [2] switching pattern 2202-2, with the stages of the reverse switching patterns 2242-2, 2202-2 applied to their respective cells in reverse order from the switching patterns 2242-1, 2202-1, respectively, with the b functionality provided after the completion of the output voltage driving cycle by an application of a Stage 2261(1).

Further, the switch closing and resultant output voltages of the initial Stages 2261(1), 2261(2) of the methodology 2260 mirror the switch closing and resultant voltage outputs of Stages 2201(1), 2201(2), respectively, of the methodology 2200, with Stage 2261(3) added after Stage 2261(2) to allow activation of the switch set (SW[0], SW[3]) in cell [b] so that the voltage storage capacity of both of the non-dissipative elements in the cell [b] may supply voltage to the output of the driving circuit [ab]. When both non-dissipative elements have equivalent voltage capacities, the driving circuit output is 2V[b].

The two-stage initiating cell [2] switching pattern 2202-1 of (b,+) functionality for the cell 2101-2 may be modified to provide a three-stage initiating cell [b] switching pattern 2242-1 of (b, +, 2+) functionality for the two-non-dissipative element driver cell. By extension, the two-stage combination of a reverse initiating cell [2] switching pattern 2202-2 and a first stage of an initiating cell [2] switching pattern 2202-1 of (+,b) functionality for the cell 2101-2 may be modified to provide a three-stage combination of a reverse initiating cell [b] switching pattern 2242-2 and a first stage of an initiating cell [b] switching pattern 2242-1 of (2+,+,b) functionality for the two-non-dissipative element driver cell [b].

The switch closing and resultant voltage outputs of Stages 2261(5), 2261(6), 2261(7) of the methodology 2260 mirror the switch closing and resultant voltage outputs of Stages 2201(3), 2201(4), 2201(5), respectively of the methodology 2200, with the following stages added:

The Stage 2261(4) is added before the Stage 2261(5) to allow activation of the switch set (SW[1], SW[4]) in cell [b] so that voltage storage capacity of both of the non-dissipative elements in the cell [b] may contribute to reducing the input voltage of the cell [b], which is V[a]. When both non-dissipative elements have equivalent voltage capacities, the driving circuit output voltage is V[a]−2V[b]=3V[b].

The Stage 2261(8) is added after the Stage 2261(7) to allow activation of the switch set (SW[0], SW[3]) in cell [b] so that voltage storage capacity of both of the non-dissipative elements in the cell [b] may contribute to increasing V[a]. When both non-dissipative elements have equivalent voltage capacities, the driving circuit output voltage is $$V[a]+2V[b]=7V[b].$$

The switch closing and resultant voltage outputs of Stages 2261(10), 2261(11), 2261(12) of the methodology 2260 mirror the switch closing and resultant voltage outputs of Stages 2201(6), 2201(7), 2201(8), respectively, of the methodology 2200, with the following stages added:

The Stage 2261(9) is added before the Stage 2261(10) to allow activation of the switch set (SW[1], SW[4]) in cell [b] so that voltage storage capacities of both of the non-dissipative elements in the cell [b] contribute to reducing the input voltage of the cell [b], which is (VDD[ab]−V[a]), resulting, when both non-dissipative elements have equivalent voltage capacities, in the driving circuit output voltage being (VDD[ab]−V[a])−2V[b]=8V[b].

The Stage 2261(13) is added after the Stage 2261(12) to allow activation of the switch set (SW[0], SW[3]) in cell [b] so that voltage storage capacity of both of the non-dissipative elements in the cell [b] contributes to increasing the input voltage of the cell [b], resulting, when both non-dissipative elements have equivalent voltage capacities, in the driving circuit output being $(V_{DD[ab]}-V[a])+2V[b]=12V[b]$.

The three-stage executing cell [2] switching pattern 2203-1 of (−,b,+) functionality for the cell 2101-2 of FIG. 22M-1A may be modified to provide a five-stage executing cell [b] switching pattern 2243-1 of (2−,−,b,+,2+) functionality for the two-non-dissipative element driver cell [b]. By extension, the three-stage reverse executing cell [2] switching pattern 2203-2 of (+,b,−) functionality for the cell 2101-2 may be modified to provide a five-stage reverse executing cell [b] pattern 2243-2 with functionality of (2+,+,b,−,2−) for the two-non-dissipative element driver cell [b].

The switch closing and resultant output voltages of Stages 2261(15), 2261(16), of the methodology 2260 mirror the switch closing and resultant output voltages of Stages 2201(9), 2201(10), respectively, of the methodology 2200, with the Stage 2261(14) added before the Stage 2261(15) to allow activation of the switch set (SW[1], SW[4]) in cell [b] so that the voltage storage capacity of both of the non-dissipative elements in the cell [b] may contribute to reducing the input voltage of the cell [b], which is $V_{DD[ab]}$, resulting, when both non-dissipative elements have equivalent voltage capacities, in the driving circuit output being $V_{DD[ab]}-2V[b]=13V[b]$.

The three-stage peaking cell [2] switching pattern 2204 of (−, b, −) functionality for the cell 2101-2 may be modified to provide a five-stage peaking cell [b] switching pattern 2244 with a functionality of (2−,−,b,−,2−) for the 2-non-dissipative element driver cell [b].

For the cell [a] of the circuit [ab], the methodology 2260 mirrors the methodology 2200 in having:

an initiating cell [a] phase 2265-1 similar to the initiating cell [1] phase 2215-1 of the methodology 2200 and having an initiating cell [a] switching pattern 2245-1 that is similar to the initiating cell [1] switching pattern 2205-1 for the initiating cell [1] phase 2215-1 in that the switching patterns 2245-1, 2205-1 both apply switch activations that increase the output voltage of their respective cells from ground to a peak cell voltage and in that patterns 2245-1, 2205-1 both maintain their sets of switch activations for the duration of the cell switching patterns being applied to the adjacent, downstream cell in their respective circuits;

a peaking cell [a] phase 2267 similar to the peaking cell [1] phase 2217 of the methodology 2200 and having a peaking cell [a] switching pattern 2247 that is similar to the peaking cell [1] switching pattern 2207 for the peaking cell [1] phase 2217 in that patterns 2247, 2207 both maintain their sets of switch activations for the duration of the cell switching pattern being applied to the adjacent, downstream cell in their respective circuits; and a reverse initiating cell [a] phase 2265-2 similar to the reverse initiating cell [1] phase 2215-2 of the methodology 2200 and having a reverse initiating cell [a] switching pattern 2245-2 that is similar to the reverse initiating cell [1] switching pattern 2205-2 for the reverse initiating cell [1] phase 2215-2, with the stages of both switching patterns 2245-2, 2205-2 applied to their respective cells in reverse order from the switching patterns 2245-1, 2205-1, respectively.

Further, to accommodate the additional non-dissipative element in cell [b], the five-stage initiating cell [1] switching pattern 2205-1 for the cell 2101-1 may be modified to provide an eight-stage initiating cell [a] switching pattern 2245-1 for cell [a] with a functionality of (b,b,b,+,+,+,+,+). By extension, the five-stage combination of a reverse initiating cell [1] switching pattern 2205-2 and a first stage of an initiating cell [1] switching pattern 2205-1 for the cell 2101-1 may be modified to provide an eight-stage combination of a reverse initiating cell [a] switching pattern 2245-2 and a first stage of an initiating cell [a] switching pattern 2245-1 for cell [a] with functionality of (+,+,+,+,+, b,b,b).

The nine-stage peaking cell [1] switching pattern 2207 for the cell 2101-1 with functionality of (−,−,−,b,b,b,−,−,−) may be modified to provide a fifteen-stage peaking cell [a] switching pattern 2247 for cell [a] of (5 applications of, 3 applications of b (until the cell [b] achieves its peak voltage)) followed by (2 more applications of b, 5 applications of).

FIG. 22M-4A: Circuit [mn], Having Cell [m] with 2 Non-Dissipative Elements

The switching sequence methodology 2270 of a driving circuit [mn] having a two-non-dissipative element cell [m] electrically connected to the voltage source of the driving circuit and a one-non-dissipative element cell [n] electrically connected to the output terminal of the driving circuit is shown in FIGS. 22M-4A, 22M-4B.

For the cell [n], the methodology 2270 mirrors the methodology 2200 in having:

an initiating cell [n] phase 2272-1 identical to the initiating cell [2] phase 2212-1 of the methodology 2200 and having an initiating cell [n] switching pattern 2202-1 that is identical to the initiating cell [2] switching pattern 2202-1 for the initiating cell [2] phase 2212-1;

an executing cell [n] phase 2273-1 similar to the executing cell [2] phase 2213-1 of the methodology 2200 and having an executing cell [n] switching pattern 2203-1 that is identical to the executing cell [2] switching pattern 2203-1 for the executing cell [2] phase 2213-1;

a peaking cell [n] phase 2274 identical to the peaking cell [2] phase 2214 of the methodology 2200 and having the peaking cell [n] switching pattern 2204 that is identical to the peaking cell [2] switching pattern 2204 for the peaking cell [2] phase 2214, a reverse executing cell [n] phase 2273-2 similar to the reverse executing cell [2] phase 2213-2 of the methodology 2200 and having a reverse executing cell [n] switching pattern 2203-2 that is identical to the reverse executing cell [2] switching pattern 2203-2 for the executing cell [2] phase 2213-2; and a reverse initiating cell [n] phase 2272-2 identical to the reverse initiating cell [2] phase 2212-2 of the methodology 2200 and having a reverse initiating cell [n] switching pattern 2202-2 that is identical to the reverse initiating cell [2] switching pattern 2202-2 for the reverse initiating cell [2] phase 2212-2; for the cell [n]; and For the cell [m], the methodology 2270 mirrors the methodology 2200 in having:

an initiating cell [m] phase 2275-1 similar to the initiating cell [1] phase 2215-1 of the methodology 2200 and having an initiating cell [m] switching pattern 2248-1 that is similar to the initiating cell [1] switching pattern 2205-1 for the initiating cell [1] phase 2215-1 in that the switching patterns 2248-1, 2205-1 both apply switch activations that increase the output voltage of their respective cells from bypass and in that the patterns 2248-1, 2205-1 both maintain their sets of switch activations for the duration of the cell switching pattern being applied to the adjacent, downstream cell in their respective circuits;

a peaking cell [m] phase 2277 similar to the peaking cell [1] phase 2217 of the methodology 2200 and having the peaking cell [m] switching pattern 2249 that is similar to the peaking cell [1] switching pattern 2207 for the peaking cell [1] phase 2217 in that the switching patterns 2249, 2207 both apply switch activations that increase the output voltage of their respective cells from a minimum cell voltage to a peak cell voltage and back to a minimum voltage and in that patterns 2249, 2207 both maintain their sets of switch activations for the duration of the cell switching pattern being applied to the adjacent, downstream cell in their respective circuits; and a reverse initiating cell [m] phase 2275-2 similar to the reverse initiating cell [1] phase 2215-2 of the methodology 2200 and having a reverse initiating cell [m] switching pattern 2248-2 that is similar to the reverse initiating cell [1] switching pattern 2205-2 for the reverse initiating cell [1] phase 2215-2 in that the stages of both switching patterns 2248-2, 2205-2 are applied to their respective cells in reverse order from the switching patterns 2248-1, 2205-1, respectively.

Further, the switch closing and resultant output voltages of Stages 2271(1) through 2271(5) and 2271(12) through 2271(16) of the methodology 2270 mirror the switch closing and resultant voltage outputs of Stages 2201(1) through 2201(5) and 2201(6) through 2201(10), respectively, of the methodology 2200.

The Stages 2271(6) through 2271(11) have been added to the methodology 2270 to allow activation of the switch sets (SW[0], SW[3]) and (SW[1], SW[4]) in cell [m] so that the voltage storage capacity of both of the non-dissipative elements in the cell [m] may contribute to the operation of the driving circuit [mn].

To accommodate both of the non-dissipative elements of the cell [m], the five-stage initiating cell [1] switching pattern 2205-1 for the cell 2101-1 may be modified to provide an eight-stage initiating cell [m] switching pattern 2248-1 with functionality of (b,b,+,+,+,2+, 2+, 2+) for the two-non-dissipative element driver cell [m]. The activation of the switch set (SW[0], SW[3]) of cell [m] in switching pattern 2248-1 provides the voltage storage capacity of both of its non-dissipative elements, thus increasing the output voltage of the cell [m], when the voltage storage capacity of both cells are V[m], to 02V[m]. By extension, the five-stage combination of a reverse initiating cell [1] switching pattern 2205-2 and a first stage of an initiating cell [1] switching pattern 2205-1 for the cell 2101-1 may be modified to provide an eight-stage combination of a reverse initiating cell [m] switching pattern 2248-2 and a first stage of an initiating cell [m] switching pattern 2248-1 for cell [m] with functionality of (2+, 2+, 2+,+,+,+,b,b) for the two-non-dissipative element driver cell [m].

The nine-stage peaking cell [1] switching pattern 2207 with (−,−,−,b,b,b,−,−,−) functionality may be modified to provide a fifteen-stage peaking cell [m] switching pattern 2249 with functionality of (2−, 2−, 2−,−,−,−,b,b,b,−,−,−,2−, 2−, 2−) for the 2-non-dissipative element driver cell [m]. The activation of the switch set (SW[1], SW[4]) of cell [m] reduces the input voltage of cell [m] by the voltage storage capacity of both non-dissipative elements of the cell [m], thus reducing the output voltage of the cell [m], when the voltage storage capacity of both cells are V[m], to $V_{DD[mn]}$ 2V[m].

FIGS. 22M-5A1, 22M-5A2: Driving Circuit [mnp], Cell [m], [n] with Two Non-Dissipative Elements, Cell [p] with Three Non-Dissipative Elements FIGS. 22M-5A1, 22M-5A2 shows the switching sequence methodology 2280 with of a driving circuit [mnp] having a two-non-dissipative element cell [m] electrically connected to the voltage source of the driving circuit, a three-non-dissipative element cell [p] electrically connected to the output terminal of the driving circuit, and a two-non-dissipative element cell [n] electrically connected between cell [m] and cell [p]. FIGS. 22M-5A1, 22M-5A2 show the Stages 2281(z), where 1≤z≤350.

The methodology 2280 mirrors the methodology 2220, shown in FIGS. 22M-2A1, 22M-2A2, which is also arranged to control a three-cell driving circuit [wxy]. For the cell [p], the methodology 2280 has:

an initiating cell [p] phase 2292-1, an executing [p] phase 2293-1, a peaking cell [p] phase 2294, a reverse executing cell [p] phase 2293-2, and a reverse initiating cell [p] phase 2292-2 that are identical in their order and, except for the number of stages therein, switching patterns to the initiating cell [y] phase 2232-1, executing [y] phase 2233-1, peaking cell [y] phase 2234, reverse executing cell [y] phase 2233-2, and reverse initiating cell [y] phase 2232-2, respectively, of the methodology 2220;

for the cell [n], an initiating cell [n] phase 2295-1, an executing cell [n] phase 2296-1, a peaking cell [n]

phase 2297, a reverse executing cell [n] phase 2296-2, and a reverse initiating cell [n] phase 2295-2 that are identical in their order and, except for the number of stages therein, switching patterns to the initiating cell [x] phase 2235-1, executing cell [x] phase 2236-1, peaking cell [x] phase 2237, reverse executing cell [x] phase 2236-2, and reverse initiating cell [x] phase 2235-2, respectively, of the methodology 2220.

for the cell [m], an initiating cell [m] phase 2298-1, a peaking cell [m] phase 2299, and a reverse initiating cell [m] phase 2298-2 that are identical in their order and, except for the number of stages therein, switching patterns to the initiating cell [w] phase 2238-1, a peaking cell [w] phase 2239, and a reverse initiating cell [w] phase 2238-2, respectively, of the methodology 2220.

In addition, the switching patterns for cells [m], [n] in the methodology 2280 are similar to their counterpart switching patterns in their respective phases for cells [w], [x] in the methodology 2220 in that the switching patterns maintain their sets of switch activations for the duration of the cell switching patterns being applied to the adjacent, downstream cell in their respective circuits.

The switching sequence methodology 2280 is presented here to illustrate how the switching patterns disclosed herein may be modified to accommodate driving circuits created with any number of driver cells, each of which may be created with any number of non-dissipative elements.

Turning first to cell [p], which is a last cell in the multi-cell circuit and has three non-dissipative elements:

- The two-stage initiating cell [y] switching pattern 2202-1 of (b,+) functionality for the initiating cell [y] phase 2232-1 in the methodology 2220 for the cell [y] may be modified to provide a four-stage initiating cell [p] switching pattern 2282-1 with a functionality of (b,+, 2+,3+) in the methodology 2280 for the cell [p]. By extension, the two-stage combination of a reverse initiating cell [y] switching pattern 2202-2 and a first stage of an initiating cell [y] switching pattern 2202-1 of (+,b) functionality for the reverse initiating cell [y] phase 2232-2 in the methodology 2220 may be modified to provide the four-stage combination of a reverse initiating cell [p] switching pattern 2282-2 and a first stage of an initiating cell [p] switching pattern 2282-1 of (3+,2+,+,b) functionality in the methodology 2280 for the cell [p].

- The three-stage executing cell [y] switching pattern 2203-1 of ("−,b,+) functionality for the executing cell [y] phase 2233-1 in the methodology 2220 for the cell [y] may be modified to provide a seven-stage executing cell [p] switching pattern 2283-1 of (3−,2−,−,b,+,2+, 3+) functionality for the methodology 2280 for the cell [p]. By extension, the three-stage reverse executing switching pattern 2203-2 of (+,b,−) functionality for the reverse executing cell [y] phase 2233-2 in the methodology 2220 may be modified to provide the seven-stage reverse executing cell [p] switching pattern 2283-2 of (3+,2+,+,b,−,2−,3−) functionality for the methodology 2280 for the cell [p].

- The three stage peaking cell [y] switching pattern 2204 of (−,b,−) functionality for the peaking cell [y] phase 2234 in the methodology 2220 for the cell [y] may be modified to provide a seven-stage peaking cell [p] switching pattern 2284 of (3−,2−,−,b,−,2−,3−) functionality for the methodology 2280 for the cell [p].

Turning to cell [n], which is a two non-dissipative element driver cell upstream and adjacent to a last cell with three non-dissipative elements:

- The five-stage initiating cell [x] switching pattern 2205-1 of (b,b,+,+,+) functionality for the initiating cell [x] phase 2235-1 in the methodology 2220 for the cell [x] may be modified to provide an eighteen-stage initiating cell [n] switching pattern 2285-1 with the functionality of (4 stages of b, 7 stages of +, and 7 stages of 2+) for the cell [n]. By extension, the five-stage combination of a reverse initiating cell [x] switching pattern 2205-2 and a first stage of an initiating cell [x] switching pattern 2205-1 with functionality of (+,+,+,b,b) for the reverse initiating cell [x] phase 2235-2 of the methodology 2220 may be modified to provide the eighteen-stage combination of a reverse initiating cell [n] switching pattern 2285-2 and a first stage of an initiating cell [n] switching pattern 2285-1 with functionality of (7 stages of 2+, 7 stages of +, 4 stages of b) in the methodology 2280 for the cell [n].

- The nine-stage executing cell [x] switching pattern 2226-1 with a functionality of (3 stages of −, 3 stages of b, and 3 stages of +) for the cell [x] in the methodology 2220 may be modified to provide a 35-stage executing cell [n] switching pattern 2286-1 with a functionality of (7 stages of 2−, 7 stages of −, 7 stages of bypass, 7 stages of +, and 7 stages of 2+) for a cell [in]. By extension, the nine-stage reverse executing cell [x] switching pattern 2226-2 with a functionality of (+,+,+,b,b,b,−,−,−) of the methodology 2220 may be modified to provide the 35-stage reverse executing cell [n] switching pattern 2286-2 with functionality of (7 stages of 2+, 7 stages of +, 7 stages of b, 7 stages of −, and 7 stages of 2−) in the methodology 2280 for the cell [n].

- The nine-stage peaking cell [x] switching pattern 2207 with a functionality of (−,−,−,b,b,b,−,−,−) for the peaking cell [x] phase 2237 in the methodology 2220 for the cell [x] may be modified to provide a 35-stage peaking cell [n] switching pattern 2287 with a functionality of (7 stages of 2−, 7 stages of −, 7 stages of bypass, 7 stages of −, and 7 stages of 2−) in the methodology 2280 for the cell [n].

Turning to cell [m], which is a two non-dissipative element first cell in a three-driver cell driving circuit with the second cell having two non-dissipative elements and the third and last cell having three non-dissipative elements:

- The 14-stage initiating cell [w] switching pattern 2228-1 with a functionality of (5 stages of b, 9 stages of +) for the initiating cell [w] phase 2238-1 in the methodology 2220 for the cell [w] may be modified to provide an 88-stage initiating cell [m] switching pattern 2288-1 with functionality of (18 stages of b, 35 stages of +, and 35 stages of 2+) for the methodology 2280 for the cell [m]. By extension, the 14-stage combination of a reverse initiating cell [w] switching pattern 2228-2 and a first stage of an initiating cell [w] switching pattern 2228-1 with a functionality of (9 stages of +, 5 stages of b) for the reverse initiating cell [w] phase 2238-2 in the methodology 2220 may be modified to provide the 88-stage combination of a reverse initiating cell [m] switching pattern 2288-2 and a first stage of an initiating cell [m] switching pattern 2288-1 with functionality of (35 stages of 2+, 35 stages of +, and 18 stages of b) for the methodology 2280 for the cell [m]; and

- The 27-stage peaking cell [w] switching pattern 2229 with a functionality of (9 stages of −, 9 stages of b, 9 stages of −) of the peaking cell [w] phase 2239 in the methodology 2220 for the cell [w] may be modified to provide a 175-stage peaking cell [m] switching pattern 2289 with functionality of (35 stages of 2−, 35 stages of −, 35 stages of b, 35 stages of −, 35 stages of 2−) for the methodology 2280 for the cell [m].

A comparison of the methodologies presented herein shows, for the i-th cell of a K-cell driving circuit, that:
  the initiating cell [i] switching pattern and the peaking cell [i] switching pattern have the same number of stages when the circuit is operated repeatedly:
    when the i-th cell is the last cell and the driving circuit is arranged to operate repeatedly through multiple driving cycles, with the number of stages in the initiating and peaking cell [i] switching patterns being twice the number of non-dissipative elements in the cell plus 1 (when the driving circuit is arranged to cease operation after only one driving cycle, the number of stages in the initiating and peaking pattern for the cell is the number of non-dissipative elements in the cell+1); and
    when the i-th cell is not the last cell and the i-th cell has n non-dissipative elements, the number of stages in the initiating and peaking cell [i] switching patterns is equal to the number of stages in one application of the initiating or peaking cell [i+1] switching pattern plus the number of stages in n applications of the executing cell [i+1] switching pattern; and
  when the i-th cell has an executing cell [i] switching pattern (i.e., is not the first cell), the executing cell [i] switching pattern has the same number of stages as twice the number of non-dissipative elements in the i-th cell plus one, multiplied by twice the number of non-dissipative elements in the (i+1)-th cell plus one.

In the circuit [mnp] shown in FIG. 22M-5A1, 22M-5A2, in which the cell [n] has 2 non-dissipative elements and the cell [p] has 3 non-dissipative elements, the executing cell [n] switching pattern 2286-1 has (2n[i]+1)(2n[i+1]+1) stages, with n[i]=2, and n[i+1]=3; and the executing cell [p] switching pattern 2283-1 has (2n[i]+1) stages, with $n_i$=3.

In the general embodiment of a K-cell driving circuit, for a cell [i], 2≤i≤K, the cell [i] has an executing switching pattern and $n_i$ non-dissipative elements and the cell [i+1] has n[i+1] non-dissipative elements, and the executing cell [i] switching pattern has f(i−1) stages, with:

$$f(i) = N(K)/h(i)$$
$$= (2n[i+1]+1)(2n[i+2]+1) \ldots (2n[K]+1)$$
$$f(i-1) = (2n[i]+1)(2n[i+1]+1)(2n[i+2]+1) \ldots (2n[K]+1)$$
$$= (2 \cdot n[i]+1) \cdot f(i); \text{ in which } i \text{ ranges from 2 to } K.$$

It may be seen that f(i) is the number of combinations of activation of switches of the remaining cells (e.g. cell [i+1], cell [i+2], . . . , cell [K−1], and cell [K] in an output voltage driving cycle for a K-cell driving circuit).

Figure 23B:
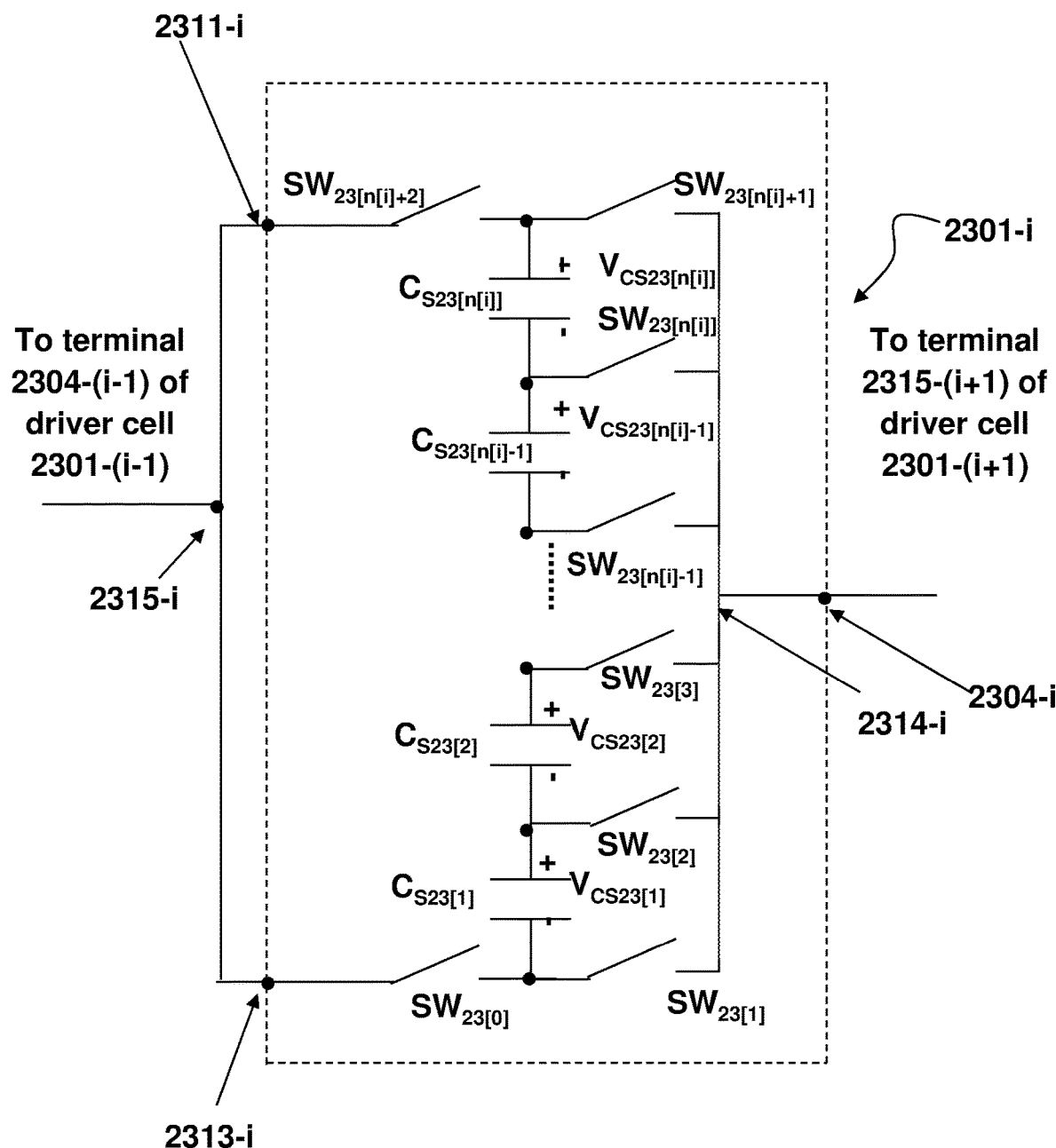
FIG. 23B is a circuit diagram showing one embodiment of a cell 2301-$i$ (for $2 \leq i \leq (K-1)$), for a K-cell driving circuit 2300.

FIGS. 23A-23B: Driving Circuit Generalized as to Number of Cells and Non-Dissipative Elements While FIG. 21 shows an exemplary embodiment of a two-cell non-dissipative element-enabled capacitive element driving circuit 2100 in which the two driver cells, each having one non-dissipative element, are connected in series, FIGS. 23A, 23B illustrate a generalized embodiment of a non-dissipative element-enabled capacitive element driving circuit 2300 in which K driver cells are connected in series,
  with each driver cell 2301-i (i being a positive integer and 1≤i≤K) having a selected number n[i] of non-dissipative elements;
  with N being the largest number of non-dissipative elements in a cell in the driving circuit 2300 and with n[i] being a positive integer and 1≤n[i]≤N, and
  with j identifying the j-th non-dissipative element in driver cell 2301-i, and with j being a positive integer and 1≤j≤n[i]).

Accordingly, the circuit 2100 is an instantiation of the circuit 2300, with K=2; and the cell 2000 is an instantiation of the cell 2301-i, with n[i]=n. As with the capacitive element driving circuit 2100, the capacitive element driving circuit 2300 may have the voltage source 2320 (also known as the voltage source $V_{DD23}$) for supplying a voltage of a selected value as a component of the capacitive element driving circuit 2300, but in other embodiments, the voltage source may be a unit separate from and electronically attachable to the capacitive driving circuit of the capacitive element driving circuit 2300. Also, as with the capacitive element 2130, the capacitive element 2330 may be a unit separate from and electronically attachable to the capacitive driving circuit of the capacitive element driving circuit 2300; in other embodiments, it may be a component of the driving circuit 2300.

Referring to FIG. 23A, the driver cells from 2301-1 to 2301-K may be similar in design to the driver cell 2000 of FIG. 20, with its n non-dissipative elements. In certain embodiments, all of the cells may have the same number of non-dissipative elements, and in other embodiments, at least one of the cells may have a different number of non-dissipative elements. Additionally, in an illustrative but not necessarily preferred embodiment, the non-dissipative elements in one or more cells may be of the same type, such as storage capacitors. In other embodiments, the non-dissipative elements in one or more driver cells may be of different types. Further, in this embodiment of FIG. 23A, for convenience of calculation, the non-dissipative elements are assumed to have identical capacitances, but it is to be understood that it will be the choice of designer to select the voltage storage capacities of any of the non-dissipative elements in any driver cell of driving circuit.

As shown in FIGS. 23A and 23B, and with reference to FIGS. 20 and 21, the driver cells 2301-1, 2301-2, . . . , 2301-K are electrically connected to the voltage source $V_{DD23}$ and the capacitive element 2330, respectively, in the manner disclosed for the cells
2101-1, 2101-2:
  with the positive terminal 2326 of the voltage source $V_{DD23}$ electrically connected to the input terminal 2311-1 of the cell 2301-1;
  with the negative terminal 2328 of the voltage source $V_{DD23}$ electrically connected to the input terminal 2313-1 of the cell 2301-1;
  with an output terminal 2304-1 of the cell 2301-1 electrically connected between a common node (shown in FIG. 22A as common node 2114) of the switches inclusively between SW[1] and SW[n[1]+1] of the cell 2301-1 and a common node 2315-2 of the input terminals 2311-2, 2313-2 of the cell 2301-2;
  with the input terminals 2311-K, 2313-K of the cell 2301-K electrically connected through a common node 2315-K to the output terminal 2304-(K−1) (shown as terminal 2304-$i$ in FIG. 23B) of a cell 2301-(K−1) (shown as cell 2301-$i$ in FIG. 23B);

with the input terminals 2311-K, 2313-K of the cell 2301-K also electrically connected to the switches SW[n[K]+2], SW[0] (shown in FIG. 23B as $SW_{23[n[i]+2]}$, $SW_{23[0]}$) respectively, of the cell 2301-K; and with the input terminal 2332 of the capacitive element 2330 (e.g. $C_{O23}$) electrically connected to the output terminal 2304-K of the cell 2301-K.

As shown in FIG. 23B, the cell 2301-$i$ (for 2≤$i$≤(K−1), and for 1≤$j$≤n[$i$]) has:

input terminals 2311-$i$, 2313-$i$ electrically connected to the switches $SW_{23[n[i]+2]}$, $SW_{23\ [0]}$, respectively, of the cell 2301-$i$;

the input terminals 2311-$i$, 2313-$i$ connected through a common node 2315-$i$ to a terminal 2304-($i$−1) of a driver cell 2301-($i$−1), and an output terminal 2304-$i$ electrically connected between a common node 2314-$i$ of the switches inclusively between switches $SW_{23[1]}$ and $SW_{23[n[i]+1]}$ of the cell 2301-$i$ and a common node 2315-($i$+1) of the input terminals 2311-($i$+1), 2313-($i$+1) (not shown) of the cell 2301-($i$+1) downstream and adjacent to the cell 2301-$i$.

The driving circuit 2300 has or is electrically connected via a path system to a controller 2360, which is arranged to provide control signals to signal the capacitive element driving circuit 2300 to start, operate the phases of and switching patterns in, and stop a switching sequence methodology. The switching controller 2360 controls the activation and deactivation of the switches in the K driver cells to drive the circuit 2300 through a $V_{O23}$ driving cycle, using a set of stages that may be implemented in a sequencing methodology having a plurality of phases, with the methodology defined to ensure the average value of voltage of the storage capacitors remains unchanged over time.

Switching Sequence Stages in a Complete Voltage Driving Cycle

The driving circuit 2300 may be operated as the driving circuit 2100, with phases and switching patterns of opening and closing switches in which driving circuit voltage output is incremented (or decremented) in a selected step-wise manner intended to release voltage from the non-dissipative elements of one or more selected cells (non-dissipative element by non-dissipative element) while selectively preventing other cells from contributing voltage to the driving circuit output or allowing other cells access to the driving circuit's supply voltage to increase the driving circuit output. The methodology defines a circuit control process for producing step-wise changes provided by a multi-cell driving circuit by allowing an activated driver cell to provide a selected amount of voltage to a cell [$i$+1], to maintain the provided voltage while a cell [$i$+1] produces a step-wise change in its voltage production; and, once the output voltage of the activated driver cell [$i$+1] reaches a maximum level (or minimum level, when the incremental change is a voltage decrease) available from its non-dissipative element(s), to change the selected amount of voltage to be provided to the cell [$i$+1], in order to continue the step-wise change of voltage releasable from the driving circuit.

In the following discussion of the cell methodologies for driving a K-cell circuit through a complete diving cycle, reference will be made to a "first cell" and a "last cell," which will be defined in the rest of the described embodiments with the cell in the circuit having one input terminal electrically connected to the positive terminal of a voltage source for the circuit and another input terminal electrically connected to the negative terminal of the voltage source for the circuit known as the first cell (or cell HD, and the cell in the circuit having its output terminal constitute or electrically connected to the output terminal of the circuit known as the last cell (or cell [K]).

For a cell [$i$] of a K-cell driving circuit with n[$i$] non-dissipative elements, the methodology 2400 may begin with an initiating cell phase having an initiating cell switching pattern that (1) bypasses the cell to allow the input voltage of the cell [$i$] reach its output voltage, and then (2) incrementally increases the output voltage of the cell [$i$] by multiples of v[$i$], starting with an increase of V($i$) to the cell [$i$] output voltage at the beginning of the initiating cell [$i$] phase and, by the end of the incremental increases in the initiating cell [$i$] phase, achieving an overall increase of n[$i$]V($i$) to the cell [$i$] output voltage since the start of the initiating cell [$i$] phase.

The bypassing of the cell [$i$] may be accomplished by selectively activating a set of switches of the cell that provides the input voltage of cell [$i$] as its output voltage, with the bypass maintained for the duration of one stage in the methodology when the cell is the last cell [$i$] in the circuit, or otherwise for the duration of an application of the initiating cell [$i$+1] switching pattern on the cell [$i$+1].

When the cell is the first cell [$i$] of the K-cell circuit, the bypass operation in the initiating cell [$i$] switching pattern constitutes a grounding of the output of the first cell, and may be achieved by activating the first and second switches of the cell [$i$] (switch set (SW[0], SW[1]) to electrically connect the negative terminal of the voltage source to the output terminal of the cell [$i$]. The grounding occurs because switch SW[0] connects the negative terminal of the voltage source to the output terminal of the cell[$i$], and the switch SW[1] is the one switch in the set of the n[$i$] switches in the cell 2301-1 electrically connectable to the common node to the terminal 2314-1 that is also electrically connectable to the switch SW[0] without a non-dissipative element intervening therebetween. Accordingly, closing the switch set (SW[0], SW[1]) electrically connects the negative terminal of the voltage source to the output terminal of the cell[$i$].

When cell [$i$] is any other cell in the K-cell circuit, the bypass operation in the initiating cell [$i$] switching pattern may be achieved by activating either the switch set (SW[0], SW[1]) or the switch set (SW[n[$i$]+2], SW[n[$i$]+1]), which is the set of the last and second last switches of the cell [$i$]. Both of the switches SW[0], SW[n[$i$]+2] are electrically connectable to the output of the cell 2301-($i$−1), and the switches SW[1], SW[n[$i$]+1] are the two switches in the set of the n[$i$] switches in the cell 2301-$i$ electrically connectable to the common node to the terminal 2314-$i$ that is also electrically connectable, through one of the switch sets (SW[0], SW[1]) or (SW[n[$i$]+2], SW[n[$i$]+1]), to the cell [$i$] input without a non-dissipative element intervening therebetween. Accordingly, closing the switch set (SW[0], SW[1]) or (SW[n[$i$]+2], SW[n[$i$]+1]), electrically connects the input of the cell to the output of cell [$i$].

The incremental increase in the cell [$i$]'s output voltage may be achieved by selectively activating the sets of switches of the cell [$i$] that increase the output voltage of the cell [$i$], with the switch set activations performed in an order to produce increasing amounts of output voltage increase, with the initiating cell [i] switching pattern ending when the switch set activation resulting in the highest amount of cell [i] output voltage increase has been completed, and with a switch set activation to implement an increase in the cell [i] input voltage by one multiple of V(i) maintained on the cell [i] for the duration of one stage in the methodology when the cell [i] is the last cell in the circuit, or otherwise for the duration of one application of an executing cell [i+1] switching pattern on the cell [i+1].

The methodology 2400 for the cell [i] may proceed to an executing cell [i] phase upon completion of the initiating cell [i] phase except when the cell [i] is the first cell in a multi-cell circuit. The executing cell [i] phase repeats an executing cell [i] switching pattern that (1) incrementally reduces the output voltage of the cell [i] by multiples of V(i) (starting with a reduction by n[i]V(i) in the cell [i] output voltage at the beginning of the executing cell [i] switching pattern and, by the end of the incremental reductions, achieving an overall reduction of V(i) in the cell [i] output voltage since the start of the executing cell [i] switching pattern); then (2) bypasses the cell [i] to allow the input voltage of the cell [i] reach its output voltage, and then (3) incrementally increases the output voltage of the cell [i] by multiples of V[i], starting with an increase of V(i) to the cell [i] output voltage at the beginning of the incremental increases and, by the end of the executing cell [i] phase switching pattern, achieving an overall increase of n[i]V(i) to the cell [i] output voltage since the start of the incremental increases.

The incremental reductions in the cell [i]'s output voltage may be achieved by selectively activating the sets of switches of the cell [i] that reduce the output voltage of the cell [i], with the switch set activations performed in an order to produce decreasing amounts of output voltage reductions, with the incremental reductions ending upon the completion of the switch set activation resulting in V[i] (the lowest amount of cell [i] output voltage reduction), and with a switch set activation to implement a reduction in the cell [i] input voltage by one multiple of V(i) maintained on the cell [i] for the duration of one stage in the methodology when the cell [i] is the last cell in the circuit, or otherwise for the duration of one application of an executing cell [i+1] pattern on the cell [i+1].

The bypassing of the cell [i] in an executing cell [i] switching pattern may be accomplished using the method described above in the initiating cell [i] switching pattern for bypassing operations on cells that are not the first cell in the cell [i], except that the bypass in the executing cell [i] switching pattern may be maintained for the duration of one stage in the methodology when the cell [i] is the last cell in the circuit, or otherwise for the duration of one application of the executing cell [i+1] switching pattern on the cell [i+1].

The incremental increases of the cell [i]'s output voltage in an executing cell [i] switching pattern, including the order of cell activations and the duration of an incremental increase operation, may be achieved using the methods described above in the initiating cell [i] switching pattern for incrementally increasing the cell [i]'s output voltage.

When the cell [i] is the last cell and n is the number of non-dissipative element of last cell, the executing cell [i] switching pattern is applied repeatedly until the (n+2)th last stage. When the cell [i] is not the last cell and n is the number of non-dissipative element of cell hi, the executing cell [i] switching pattern is applied repeatedly to the cell [i] until the completion of the (n+1)th last application of the executing cell [i+1] switching pattern on the cell [i+1]. The methodology 2400 for the cell [i] may proceed to a peaking cell [i] phase after the completion of the initiating cell [i] phase when the cell [i] is the first cell in the multi-cell circuit, or after the completion of the executing cell [i] phase when the cell [i] is any other cell in the multi-cell circuit. The peaking cell [i] phase may have a peaking cell [i] switching pattern that:

(1) incrementally reduces the cell [i] input voltage by multiples of V(i) (starting with a reduction by nV(i) at the beginning of the peaking cell [i] phase and, by the end of the incremental reductions, ending with an overall reduction of V(i) in the cell [i] output voltage since the start of the peaking cell [i] switching pattern);

(2) bypasses the cell [i] to allow the output voltage of the cell [i] to reach its input voltage; and (3) performs a second set of incremental reductions to the cell [i] output voltage by multiples of V(i) (starting with a reduction by V(i) at the beginning of the second set of incremental reductions in the peaking cell [i] phase and, by the end of the incremental reductions, ending with an overall reduction of n[i]V(i) in the cell [i] output voltage since the start of the incremental reductions):

The first set of incremental reductions in the cell [i]'s output voltage in a peaking cell [i] switching pattern, including the order of cell activations and the duration of an incremental reduction operation, may be achieved using the methods described above in the executing cell [i] switching pattern for incrementally reducing the cell [i]'s output voltage.

The bypassing of the cell [i] in a peaking cell [i] switching pattern when the cell [i] is not the first cell in the circuit may be accomplished using the method described above in the initiating cell [i] switching pattern for bypassing operations on cells that are not the first cell in the cell [i], except that the bypass in the peaking cell [i] switching pattern may be maintained for the duration of one stage in the methodology when the cell [i] is the last cell in the circuit, or otherwise for the duration of one application of the peaking cell [i+1] switching pattern on the cell [i+1].

When the cell [i] is the first cell of a K-cell circuit, the bypass operation in the peaking cell [i] switching pattern may be achieved by activating the switch set (SW[n[i]+2], SW[n[i]+1]) to electrically connect the positive terminal of the voltage source to the output terminal of the cell[i], thus providing the supply voltage of the circuit's voltage source to the input of the cell [i+1]. The supply voltage bypass operation in the peaking cell [i] switching pattern may be achieved because switch SW[n[i]+2] is electrically connected to the positive terminal of the voltage source of the circuit 2300, and switch SW[n[i]+1] is the one switch in the set of the n[i] switches in the cell 2301-1 electrically connected to the common node to the terminal 2314-1 that is also electrically connected to the switch SW[n[i]+2] without a non-dissipative element intervening therebetween. Accordingly, closing the switch set (SW[n[i]+2], SW[n[i]+1]) electrically connects the positive terminal of the voltage source to the output terminal of the cell[i].

The second set of incremental reductions may be achieved by selectively activating the sets of switches of the cell [i] that reduce the output voltage of the cell [i],
  with the switch activations being performed in an order to produce increasing amounts of output voltage reductions,
  with the incremental reductions ending upon the completion of the switch set activation resulting in n[i]V[i] (the highest amount of cell [i] output voltage reduction), and
  with a switch set activation to implement a reduction in the cell [i] input voltage by one multiple of V(i) maintained on the cell [i] for the duration of one stage in the methodology when the cell [i] is the last cell in the circuit, or otherwise for the duration of one application of a reverse executing cell [i+1] switching pattern on the cell [i+1].

The methodology 2400 for a cell [i] may proceed to a reverse executing cell [i] phase upon completion of the peaking cell [i] phase except for when the cell [i] is the first cell in a multi-cell circuit. The reverse executing cell [i] phase may repeat a reverse executing cell [i] switching pattern that
  (1) incrementally increases the output voltage of the cell [i] by multiples of V(i) (starting with an increase of n[i]V(i) in the cell [i] output voltage at the beginning of the reverse executing cell [i] switching pattern and, by the end of the incremental increases, ending with an overall increase of V(i) in the cell [i] output voltage since the start of the reverse executing cell [i] switching pattern;
  (2) then bypasses the cell [i] to allow the output voltage of the cell [i] to reach its output voltage; and then
  (3) incrementally reduces the output voltage of the cell [i] by V(i), starting with a reduction by V(i) in the cell [i] output voltage at the beginning of the incremental reductions and, by the end of the incremental reductions, ending with a reduction of n[i]V(i) in the output voltage at the completion of the reverse executing cell [i] switching pattern.
   The incremental increases in the cell [i]'s output voltage may be achieved by selectively activating the sets of switches of the cell [i] that increase the output voltage of the cell [i],
     with the switch set activations performed in an order to produce decreasing amounts of output voltage increases,
     with the incremental increase ending when the switch set activation resulting in the lowest amount of cell [i] output voltage increase has been completed, and
     with a switch set activation maintained on the cell [i] for the duration of one stage in the methodology when cell [i] is the last cell in the circuit, or otherwise for the duration of one application of a reverse executing cell [i+1] pattern on the cell [i+1].
   The bypassing of the cell [i] in a reverse executing cell [i] switching pattern, including the duration of a bypass operation, may be accomplished using the method described above in the executing cell [i] switching pattern for bypassing cell [1].
   The incremental reduction of the cell [i]'s output voltage in a reverse executing cell [i] switching pattern, including the order of cell activations and the duration of the incremental reduction operations, may be accomplished using the methods described above to achieve the second set of incremental reductions in the peaking cell [i] switching pattern for incrementally reducing the cell [i]'s output voltage.

When the cell [i] is the last cell and n is the number of non-dissipative element of last cell, the reverse executing cell [i] switching pattern is applied repeatedly until the (n+2)th last stage. When the cell [i] is not the last cell and n is the number of non-dissipative element of cell [i], the reverse executing cell [i] switching pattern is applied repeatedly to the cell [i] until the completion of the (n+1)th last application of the executing cell [i+1] switching pattern on the cell [i+1].

A reverse initiating cell [i] phase may begin after the completion of the peaking cell [i] phase when the cell [i] is the first cell in the multi-cell circuit, or after the completion of the reverse executing cell [i] phase when the cell [i] is any other cell in the multi-cell circuit. A reverse initiating cell [i] phase has a reverse initiating cell [i] switching pattern that
  (1) incrementally increases the output voltage of the cell [i] by multiples of V[i] (starting with an increase of n[i]V(i) in the cell [i] output voltage at the beginning of the reverse initiating cell [i] phase and, by the end of the incremental increases, ending with an overall increase of V(i) in the cell [i] output voltage since the start of the reverse initiating cell [i] phase; and
  (2) then bypasses the cell hi, ending with the input voltage of the cell [i] being applied to the output terminal of the cell [i] at the completion of the reverse initiating cell [i] switching pattern.
   The incremental increase in the cell [i]'s output voltage of the cell [i] in the reverse initiating cell [i] phase, including the order of cell activations and the duration of the incremental increase operations, may be achieved using the method described above to achieve the incremental increases in the executing cell [i] switching pattern.
   The bypassing of the cell [i] in the reverse initiating cell [i] phase, including the duration of the bypassing, may be accomplished using the method described above to achieve the bypassing in the initiating cell [i] switching phase. As noted previously, in the first cell, the bypass operation electrically connects the negative terminal of the voltage source to the output terminal of the first cell, thus grounding the cell [i+1].

As with the operation of the driving circuit 2300, the incremental change in the voltage output is achieved by releasing the voltage capacity of a cell upon which a switch activation has been performed and increasing the overall voltage output through selective and sequential operation of non-dissipative elements in upstream cells, using selective opening and closing of switches at the terminals of the non-dissipative elements. It can be seen that the patterns of switch opening/closing and cell activation/bypassing that may be employed for simpler driving circuits to accomplish step-wise delivery of voltage outputs may be adapted to accomplish the step-wise delivery of voltage outputs for more complex driving circuits, with larger numbers of cells and non-dissipative elements.

The generalized driving circuit 2300 is arranged to allow each of the K driver cells in a driving circuit 2300 to have a number n[i] of non-dissipative elements (the number n not necessarily being equivalent in each cell). In total, in this illustrative but not necessarily preferred embodiment, one complete $V_{O23}$ driving cycle may be accomplished in $2 \cdot \Pi_{i=1}^{K}[2 \cdot n[i]+1]$ stages, where:
  n[i] is the number of non-dissipative elements in the i-th driver cell in the driving circuit 2300; and
  K is the number of driver cells in the driving circuit, with $1 \leq i \leq K$.

Using the earlier described embodiment of the basic two-cell driving circuit 2100 shown in FIGS. 21 and 22A-22J, with each cell having one non-dissipative element (K=2 and n[i]=1 for both driver cells), the number of stages in the switching sequence methodology 2200 may be calculated as:

$$2 \cdot \prod_{i=1}^{K} [2 \cdot n[i] + 1] = 2 * \{[(2*1) + 1] * [(2*1) + 1]\}$$
$$= 2 * (3 * 3)$$
$$= 18.$$

Therefore, one complete $V_{O21}$ driving cycle for the basic driving circuit 2100 is accomplished in 18 stages.

FIG. 22M-3A illustrates a switching sequence methodology 2260 for a two-cell driving circuit with a first driver cell having one non-dissipative element and a second cell having two non-dissipative elements. As illustrated in the chart in FIG. 22M-3A, K=2; n[1]=1; and n[2]=2, and the number of stages in the switching sequence methodology 2260 may be calculated as:

$$2 \cdot \prod_{i=1}^{K} [2 \cdot n[i] + 1] = 2 * \{[(2*1) + 1] * [(2*2) + 1]\}$$
$$= 2 * [3 * 5]$$
$$= 30.$$

Therefore, one complete voltage driving cycle for driving circuit so defined is accomplished in 30 stages.

FIG. 22M-4A illustrates a switching sequence methodology 2270 for another two-cell driving circuit, with a first driver cell having two non-dissipative elements and a second cell having one non-dissipative element. As illustrated in the chart in FIG. 22M-4A, K=2; n[1]=2; and n[2]=1, and the number of stages in the switching sequence methodology 2270 may be calculated as:

$$2 \cdot \prod_{i=1}^{K} [2 \cdot n[i] + 1] = 2 * \{[(2*2) + 1] * [(2*1) + 1]\}$$
$$= 2 * [5 * 3]$$
$$= 30.$$

Therefore, one complete voltage driving cycle for a 2-cell driving circuit having one driving cell with one non-dissipative storage element and another driving cell with two non-dissipative storage elements would encompass 30 stages, irrespective of the position of the driver cells relative to each other in the driving circuit.

FIGS. 22M-3A, 22M-4A show that certain multi-cell driving circuits having the same number of non-dissipative elements but in which the non-dissipative elements are distributed differently across the cells of the driving circuits (with the number of non-dissipative elements varying from cell to cell), may have the same overall number of stages despite the location of the cells in the driving circuit (whether or not a cell with more non-dissipative elements is positioned first, second, or last in the driving circuit), driving circuits having varying numbers of cells may still have the same number of stages, as long as the driving circuits share the same number of non-dissipative elements.

As an example, the multi-cell driving circuits [ab], [mn] of FIGS. 22M-3A, 22M-4A, respectively, each have two cells and three non-dissipative elements overall. The driving circuit [ab] has a first cell [a] with one non-dissipative element and four switches and a second cell [b] with two non-dissipative elements and five switches. The driving circuit [mn] has a first cell [m] with two non-dissipative elements and five switches and a second cell [n] with one non-dissipative element and four switches. The switching sequence methodologies for operation of circuits [ab], [mn] both have 30 stages:

On the other hand, other driving circuits having an identical number of non-dissipative elements overall may not have an identical number of stages in their switching sequence methodologies. As an example, the two-cell driving circuits [cd], [ef], [gh] each may have four non-dissipative elements overall, with:

A circuit [cd] having a first cell [c] with one non-dissipative element and a second cell [d] with three non-dissipative elements (with K=2; n[c]=1; and n[d]=3);

a circuit [ef] having a first cell [e] with three non-dissipative elements and a second cell [f] with one non-dissipative element (with K=2; n[e]=3; and n[f]=1);

a circuit [gh] having a first cell [g] and a second cell [h] each with two non-dissipative elements (with K=2; n[g]=2; and n[h]=2).

While the switching sequence methodologies for operation of circuits [cd], [ef] both have 42 stages for step-wise operation, with:

$$2 \cdot \prod_{i=1}^{K} [2 \cdot n[i] + 1] = 2 * \{[(2*1) + 1] * [(2*3) + 1]\} =$$
$$= 2 * \{[2*3 + 1] * [(2*1) + 1]\} =$$
$$= 2 * [3 * 7] = 2 * [7 * 3] = 42;$$

the switching sequence methodologies for operation of circuit [gh] has:

$$2 \cdot \prod_{i=1}^{K} [2 \cdot n[i] + 1] = 2 * \{[(2*2) + 1] * [(2*2) + 1]\}$$
$$= 2 * [5 * 5] = 50 \text{ stages for step-wise operation.}$$

Further, the switching sequence methodology for operation of a circuit [pqr], [stuv], both also having four non-dissipative elements. The switching sequence methodology for operation of the three-cell circuit [pqr], (with K=3; n[p]=1, n[q]=2; n[r]=1), has:

$$2 \cdot \prod_{i=1}^{K} [2 \cdot n[i] + 1] = 2 * \{[(2*1) + 1] * [(2*2) + 1] * [(2*1) + 1]\}$$
$$= 2 * [3 * 5 * 3] = 90 \text{ stages for step-wise operation;}$$

while the switching sequence methodology for operation of the four-cell circuit [stuv], with (K=4; n[s]=n[t]=n[u]=n[v]=1), has:

$$2 \cdot \prod_{i=1}^{K}[2 \cdot n[i]+1] = 2 * \left\{[(2*1)+1]*[(2*1)+1]*[(2*1)+1]\right\} *$$

$$[(2*1)+1]\} =$$

$$2*[3*3*3*3] = 2*81 = 162 \text{ stages for step-wise operation}.$$

Selection of the number of cells and non-dissipative elements in a driving circuit is at the choice of the driving circuit designer, depending on the desired operational and functional specifications.

To generalize, when all K driver cells of a driving circuit have the same number n of non-dissipative elements, n[1]=n[2]=n, and the number of stages in the switching sequence methodology 2400 may be calculated as:

$$2 \cdot \prod_{i=1}^{K}[2 \cdot n[i]+1] = 2 \cdot \prod_{i=1}^{K}[2n+1]$$

$$= 2*[(2n+1)^K].$$

Therefore, one complete voltage driving cycle for a K-cell driving circuit, each cell with the same number n of non-dissipative elements, would encompass $2*[(2n+1)^K]$ stages. When K=1 (as in the embodiment of circuit 700A in FIG. 7a), $$2 \cdot \prod_{i=1}^{K}[2 \cdot n[i]+1] = 2 \cdot \prod_{i=1}^{K}[2n+1]$$

$$= 2(2n+1)$$

$$= 4n+2.$$

Therefore, as confirmed in FIGS. 8A-8C, one complete voltage driving cycle for a driving circuit having one driver cell with n non-dissipative storage elements would encompass (4n+2) stages.

Voltage Levels During a Complete Voltage Driving Cycle

Returning to the driving circuit 2300, in one illustrative and not necessarily preferred embodiment, and for convenience, within each driver cell 2301-$i$, $V_{CS23[x]}=V_{CS23[y]}$ for $x \neq y$ where both x and y are any integer from 1 to n[i]. When $V_{CS23[1]}=V_{CS23[x]}$, where x is any integer from 1 to n[i], $V_{CS23[1]}$, which is the voltage level at the driver cell 2301-$i$, may be expressed by equation (7), where i is any integer ranged from 1 to K:

$$V_{CS23[i]}=V_{DD23}/\prod_{j=1}^{i}[2 \cdot n[j]+1] \quad (7)$$

By setting i=K, the voltage of the storage capacitor at the K-th driver cell (e.g. $V_{CS23[K]}$) may be expressed by equation (8):

$$V_{CS23[K]}=V_{DD23}/\prod_{i=1}^{K}[2 \cdot n[i]+1] \quad (8)$$

Thus, $V_{CS23[K]}$ represents a change of $V_{O23}$ per stage over the $2 \cdot \prod_{j=1}^{K}[2 \cdot n[j]+1]$ stages of one complete $V_{O23}$ driving cycle of the driving circuit 2300. Therefore, At a Stage 2401(1), $V_{O23}$ is driven to the ground level (e.g. 0V).
At a Stage 2401(2), $V_{O23}$ is driven to $V_{CS23[K]}$.
At a Stage 2401(3), $V_{O23}$ is driven to $(2 \cdot V_{CS23[K]})$.
At a Stage 2401(4), $V_{O23}$ is driven to $(3 \cdot V_{CS23[K]})$.

At a Stage 2401($r$), where $r=\prod_{j=1}^{K}[2 \cdot n[j]+1]$, $V_{O23}$ is driven to $(V_{DD23}-V_{CS23[K]})$.
At a Stage 2401($r$), where $r=\prod_{j=1}^{K}[2 \cdot n[j]+1]+1$, $V_{O23}$ is driven to $V_{DD23}$.
At a Stage 2401($r$), where $r=\prod_{j=1}^{K}[2 \cdot n[j]+1]+2$, $V_{O23}$ is driven to $(V_{DD23}-V_{CS23[K]})$.
At a Stage 2401($r$), where $r=2 \cdot \prod_{j=1}^{K}[2 \cdot n[j]+1]-2$, $V_{O23}$ is driven to $(3 \cdot V_{CS23[K]})$.
At a Stage 2401($r$), where $r=2 \cdot \prod_{j=1}^{K}[2 \cdot n[j]+1]-1$, $V_{O23}$ is driven to $(2 \cdot V_{CS23[K]})$.
At a Stage 2401($r$), where $r=2 \cdot \prod_{j=1}^{K}[2 \cdot n[j]+1]$, $V_{O23}$ is driven to $V_{CS23[K]}$, after which another $V_{O23}$ driving cycle may be started by returning to the Stage 2401(1) described above.

It may be seen that:

From Stage 2401(2) to Stage 2401($r$), where $r=\prod_{j=1}^{K}[2 \cdot n[j]+1]$, $V_{O23}$ is driven from $V_{CS23[K]}$ to $V_{DD23}-V_{CS23[K]}$ with $V_{CS23[K]}$ as the $V_{O23}$ voltage change per stage.

From Stage 2401($r$), where $r=\prod_{j=1}^{K}[2 \cdot n[j]+1]+2$ to Stage 2401($r$), where $r=2 \cdot \prod_{j=1}^{K}[2 \cdot n[j]+1]$, $V_{O23}$ is driven from $(V_{DD23}-V_{CS23[K]})$ to $V_{CS23[K]}$ with $V_{CS23[K]}$ as the $V_{O23}$ voltage change per stage.

Stage 2401($p$) is identical in operation and result to Stage 2401($q$) when $p+q=2 \cdot \prod_{j=1}^{K}[2 \cdot n[j]+1]+2$, where p is any integer from 2 to $\prod_{j=1}^{K}[2 \cdot n[j]+1]$, and
q is any integer from $\prod_{j=1}^{K}[2 \cdot n[j]+1]+2$ to $2 \cdot \prod_{j=1}^{K}[2 \cdot n[j]+1]$.

For example,

Stage 2401(2) is identical in operation and result to 2401($r$), where $r=2 \cdot \prod_{j=1}^{K}[2 \cdot n[j]+1]$; and Stage 2401($r$), where $r=\prod_{j=1}^{K}[2 \cdot n[j]+1]$, is identical in operation and result to Stage 2401($r$), where $\prod_{j=1}^{K}[2 \cdot n[j]+1]+2$.

It is to be understood that in this embodiment, $V_{CS23[x]}=V_{CS23[y]}$, but it is not necessary that the voltage capacities of each of the non-dissipative elements be identical. It will be the choice of the designer to select the voltage storage capacities of the non-dissipative elements in any driver cell of driving circuit and to define the switching sequence methodology to accomplish the desired driving cycle, in which voltage available at the driving circuit output is built and then reduced by step-wise stages. As noted above, the number of stages (and so the number of steps) in the switching sequence methodology depends on the number of driver cells and the number of non-dissipative elements in the driving circuit. However, when the voltage capacities of each of the non-dissipative elements in the circuit are not identical, the amount of voltages released or stored in each of the stages (and the amount time spent at each stage) are not necessarily identical.

The energy dissipated on switches per stage may be calculated according to equation (9):

$$\frac{1}{2}C_{O23}\left(\frac{V_{DD23}}{\prod_{j=1}^{K}[2 \cdot n[j]+1]}\right)^2 = \frac{1}{2\left[\prod_{j=1}^{K}[2 \cdot n[j]+1]\right]^2}C_{O23}V_{DD23}^2 \quad (9)$$

As noted above, there are $2 \cdot \prod_{j=1}^{K}[2 \cdot n[j]+1]$ stages per one complete voltage driving cycle, so the total energy dissipation from the circuit 2300 over the complete $V_{O23}$ driving cycle, may be calculated according to equation (10):

$$E_{t\_circuit\_2300} = 2 \cdot \prod_{j=1}^{K}[2 \cdot n[j]+1] \times \frac{1}{2\left[\prod_{j=1}^{K}[2 \cdot n[j]+1]\right]^2} C_{O23} V_{DD23}^2 \quad (10)$$

$$E_{t\_circuit\_2300} = \frac{1}{\prod_{j=1}^{K}[2 \cdot n[j]+1]} C_{O23} V_{DD23}^2 \quad (11)$$

In the classical driving scheme total energy dissipation of one complete $V_O$ driving cycle $E_{t\_classic} = C_O V_{DD}^2$. Thus, it can be seen that the circuit 2300, constructed with K capacitive element driver cells 2000, each driver cell with n storage capacitors, can reduce total energy dissipation per one $V_{O23}$ driving cycle by $\prod_{j=1}^{K}[2 \cdot n[j]+1]$ times.

As an example, when a capacitive element driving circuit is constructed with K=3 capacitive element driver cells, each with n=1 storage capacitors (n[i]=1 for all i ranged from 1 to 3), total energy dissipation may be seen to be reduced per one $V_O$ driving cycle by 27 times.

FIGS. 24A-24B3: Switching Sequence Methodology 2400

A switching controller 2360 controls the activation and deactivation of the switches in driver cells 2301-1, 2301-2, . . . , 2301-K to drive the circuit 2300 through the complete $V_{O23}$ driving cycle using the above-identified stages, which results in a step-wise increase of the voltage $V_{O23}$ to a peak voltage $V_{DD23}$ (the voltage supplied by the voltage source 2320), and then a step-wise decrease of the voltage $V_{O23}$ to ground.

The switching sequence methodology 2400 is one embodiment of the sequencing followed by the switching controller 2360, in which switches are activated in combinations within one complete $V_{O23}$ driving cycle. In order to simplify the description of the stages and phases of the methodology 2400, the following parameters may be defined:

$$N(K) = \prod_{j=1}^{K}[2 \cdot n[j]+1];$$

$$h(i) = \prod_{l=1}^{i}[2 \cdot n[l]+1]; \text{ and}$$

$$f(i) = \frac{N(K)}{h(i)};$$

where i is any integer between 1 and K;
where K is the number of cells in the driving circuit;
where n[j], n[l] are the number of non-dissipative elements in a driver cell 2301-$j$, 2301-$l$, respectively;
where N(K) is half the number of stages of one complete $V_{O23}$ driving cycle, with N(K)+1 being the stage in which the circuit and its constituent cells reach their peak voltages;
where h(i) is the number of combinations of switch activations that the first i cells in the multi-cell circuit 2300 (e.g., cell 2301-1, cell 2301-2, . . . , cell 2301-($i$−1), and cell 2301-$i$) have contributed to one complete $V_{O23}$ driving cycle;
where f(i) is the number of combinations of switch activations that the remaining cells, e.g. cell 2301-($i$+1), cell 2301-($i$+2), . . . , cell 2301-(K−1), and cell 2301-K, have contributed to one complete $V_{O23}$ driving cycle.

It may be seen that there are h(z−1)−1 executing cell [z] switching patterns in one executing cell [z] phase.

In addition, the following equalities may be used to simplify the description of the stages and phases of the methodology 2400:

$$g(i) = \frac{f(i)+1}{2};$$

$$f(i-1) = (2 \cdot n[i]+1) \cdot f(i); \text{ and}$$

$$g(i-1) = n[i] \cdot f(i) + g(i).$$

Assuming continuous operation of the driving circuit 2300 and including the number of switching sets in a reverse initiating switching pattern in the count of the number of switching sets, it can be seen that:

f(i) is the number of stages that a selected switch in cell [i] (other than the first and last switch in cell [i]) is closed in any cell [i] switching pattern;

f(i−1) is the number of stages in an executing cell [i] switching pattern;

g(i) is the number of stages in the portion of a reverse initiating cell [i+1] switching pattern that brings the multi-cell circuit output to ground; and g(i) is also the number of stages in the portion of a peaking cell [i+1] pattern that brings the multi-cell circuit voltage output to its supply voltage, so that g(i−1) is the number of stages in the portion of a peaking cell [i] switching pattern that brings the multi-cell circuit voltage output to its supply voltage.

The charts shown in FIG. 24A to 24B-3 illustrate the switching sequence methodology 2400 in which switches are activated in combinations within one complete $V_{O23}$ driving cycle.

FIG. 24A: Switching Sequence Methodoloky 2400 for Cell 2301-1

FIG. 24A, showing the initiating cell [1] phase 2412[1]-1 and the peaking cell [1] phase 2414[1] for the first driver cell 2301-1 in the driving circuit 2300, illustrates the stages, phases, and switching patterns described below that control the (n[1]+3) switches in the first driver cell. FIGS. 24B-1, 24B-2, 24B-3 show the initiating cell [z] phase 2412[z]−1, the executing cell [z] phase 2413[z]−1, and the peaking cell [z] phase 2414[z], respectively, for one of the remainder of the driver cells in the driving circuit 2300 (generally, the cell 2301-$z$, where 2≤z≤K). FIG. 24B-1-24B-3 illustrate the stages, phases, and switching patterns that may be used to control the (n[z]+3) switches in the remainder of the K−1 driver cells (e.g. cell 2301-2, cell 2301-3, . . . , cell 2301-(K−1), and cell 2301-K) to drive the circuit to its peak voltage in a step-wise manner. The voltage to which $V_{O23}$ at the capacitive element 2330 is driven during the selected stage are identified below.

The driving circuits associated described above and illustrated in FIGS. 22M-1A through 22M-5B may be viewed as instantiations of the generalized driving circuit 2300 in which the number K of cells in the driving circuit range from 1 to 4 and in which the number n of non-dissipative elements in a cell range from 1 to 3. The methodologies associated with the driving circuits illustrate how to drive the multi-cell driving circuits from ground to a peak voltage to ground in step-wise increments.

it may be understood that the phases, switching patterns, stages, and switch activations for the methodology 2400 may be understood with reference to those in described in detail earlier for the methodologies 2200, 2220, 2240, 2260, 2270, 2280, and will not be completely repeated here. Further, it will be understood that, as with the other switching methodologies disclosed herein, the switching sequence methodology 2400 may be operated in reverse order to drive the output of the generalized driving circuit 2300 in a step-wise manner back to ground. The modifications presented for the above-described methodologies to allow operation of their associated driving circuits to reduce their voltage outputs in a step-wise manner from peak voltage to ground may be applied to the methodology 2400 to allow operation of the driving circuit 2300 in reverse order. To simplify the description further, the stages controlling the switches shown in FIGS. 24A-24B-3 are illustrated in Stage 2401(1) to Stage 2401(r), where $r = \Pi_{j=1}^{K}[2 \cdot n[j]+1]+1$, which constitutes the stage at which the voltage $V_{O23}$ is driven from ground level to $V_{DD23}$. As shown in the figures, the stages, phases, and switching patterns through which the driving circuit may drive voltage from ground to the supply voltage illustrate the stages and phases through which the driving circuit may operate to drive the voltage from the supply voltage to ground. Therefore, the stages after Stage 2401(r), where $r = \Pi_{j=1}^{K}[2 \cdot n[j]+1]+1$ may be known by reference to the Stages 2401(1) to Stage 2401(r), where $r = \Pi_{j=1}^{K}[2 \cdot n[j]+1]+1$.

Finally, unless specified in the following description of the stages and phases, the switches are open.

Initiating Cell 111 Phase 2412111-1:

In the initiating cell [1] phase 2412[1]-1 of the switching sequence methodology 2400 for the cell 2301-1, the switch SW[0] (the switch electrically connected to the negative terminal 2328 of voltage source $V_{DD23}$) of cell 2301-1 is closed and remains closed until the end of the initiating cell [1] phase 2412[1]-1, which closes at Stage 2401(r), where $r=(n[1]f(1)+g(1))$, after which the switch SW[0] is opened.

The initiating cell [1] phase 2412[1]-1 may have an initiating cell [1] switching pattern 2402[1]-1 which begins by grounding the cell 2301-1 from Stage 2401(1) to Stage 2401(r), where $r=g(1)$. The grounding may be achieved by closing the switch SW[1] of the cell 2301-1 (the one switch in the set of the n[1] switches in the cell 2301-1 electrically connected to the common node to the terminal 2314-1 that is also electrically connected to the switch SW[0] without a non-dissipative element intervening therebetween), thus bypassing the cell 2301-1 so that the input voltage of the cell 2301-1 (specifically, ground) is applied to the output of the cell 2301-1 and therefore to the input of cell 2301-2. The bypass is maintained for the duration of an application of an initiating cell [2] switching pattern 2402[2]-1 on the cell 2301-2, which ends upon the completion of the Stage 2401(r), where $r=g(1)$.

The initiating cell [1] switching pattern 2402[1]-1 may continue closing the remainder of the switches in cell 2301-1, specifically switch SW[2] to SW[n[1]+1], in a sequential manner, with the closing of the switch maintained for the duration of an application of an executing cell [2] switching pattern 2403[2]-1 on the cell 2301-2:

For example,
the switch SW[2] is closed from the Stage 2401(r), where $r=(g(1)+1)$, to the Stage 2401(r), where $r=(f(1)+g(1))$, and then opened; and
the switch SW[3] of the cell 2301-1 is closed from Stage 2401(r), where $r=(f(1)+g(1)+1)$ to Stage 2401(r), where $r=(g(1)+2 \cdot f(1))$, and then opened.

The described operation of switches continues until switch SW[n[1]+1] of the cell 2301-1 is closed from Stage 2401(r), where $r=\{g(1)+[(n[1]-1) \cdot f(1)]+1\}$ to Stage 2401 (r), where $r=(n[1]f(1)+g(1))$, after which the initiating cell [1] switching pattern 2402[1]-1 has been completed and the switch set (SW[0], SW[n[1]+1]) of the cell 2301-1 are opened.

Peaking Cell [1] Phase 2414[1]:

The peaking cell [1] phase 2414[1] drives the cell 2301-1 to reach a peak voltage. In the peaking cell [1] phase 2414[1], a peaking cell [1] switching pattern 2404[1] opens the switch SW[0] and closes the switch SW[n[1]+2] (the switch electrically connected to the positive terminal 2326 of voltage source $V_{DD23}$). The switch SW[n[1]+2] remains closed for the duration of the peaking cell [1] phase, which will be in effect until the end of the Stage 2401(r), where $r=(2g(1)+2n[1]f(1))$ when the driving circuit 2300 ceases operation when the multi-cell circuit output voltage reaches its supply voltage, or which will be in effect until the end of the peaking cell [1] phase at Stage 2401(r), where $r=(3g(1)+3n[1]f(1)-1)$ when the driving circuit 2300 continues operation after the multi-cell circuit output voltage reaches its supply voltage, after which it is opened.

Throughout the application of the peaking cell [1] switching pattern 2404[1], the switches SW[1] to SW[n[1]+1] are closed incrementally. The sequence of switching for switches SW[1] to SW[n[1]+1] in the peaking cell [1] switching pattern 2404[1] tracks the above-disclosed sequence of switching for the initiating cell [1] switching pattern 2402[1]-1. Specifically:

each switch closure incrementally subtracts $V_{CS23[1]}$ from the output voltage of the cell 2301-1, starting with adding $-n[1]V_{CS23[1]}$ and ending with adding $-V_{CS23[1]}$, and
the closure is maintained for the f(1) stages of an application of the executing cell [2] switching pattern 2403[2]-1 for the cell 2301-2. For example,
the switch SW[1] is closed from the Stage 2401(r), where $r=\{f(n[1] \cdot f(1))+g(1)+1\}$, to the Stage 2401(r), where $r=\{[(n[1]+1) \cdot f(1))+g(1)\}$, and then opened; and
the switch SW[2] is closed from Stage 2401(r), where $r=\{[(n[1]+1) \cdot f(1)]+g(1)+1\}$, to Stage 2401(r), where $r=\{[(n[1]+2) \cdot f(1)]+g(1)\}$, and then opened.

The above described switching pattern continues until SW[n[1]] of the cell 2301-1 is closed. The SW[n[1]] is maintained closed for the duration of one application of an executing cell [2] switching pattern 2403[2]-1 on the cell 2301-2 and ends at Stage 2401(r), where $r=\{[2 \cdot n[1] \cdot f(1)]+g(1)\}$, after which the peaking switching pattern 2404[1] closes the switch SW[n[1]+1] of the cell 2301-1, thus bypassing the cell 2301-1 so that the supply voltage of the voltage source for the circuit 2300 ($V_{DD23}$) is delivered to the input of the cell 2301-2. The bypass, which coincides with the start of the peaking cell [2] switching pattern 2404[2] of the peaking cell [2] phase 2414[2] for the cell 2301-2, continues until the output of the cell 2301-2 reaches its peak voltage at Stage 2401(r), where $r=\{[2 \cdot n[1] \cdot f(1)]+2 \cdot g(1)\}$. FIGS. 24B-1-24B-3 show the stages and the switching sequence methodology 2400 for the sequential switching in the remainder of the (K−1) driver cells (e.g. cell 2301-2, cell 2301-3, . . . , cell 2301-(K−1), and cell 2301-K) in the driving circuit 2300 throughout a $V_{O23}$ driving cycle.

In the cell 2301-z, the switch SW[0] and the switch SW[n[z]+2] are electrically connected through a common node to the output terminal of the cell 2301-(z−1). Accordingly, bypassing of the cell 2301-z may be achieved through closing either the switch set (SW[0], SW[1]) or (SW[n[z]+1], SW[n[z]+2]), with SW(n[z]+1) being the one switch in the set of the n[z] switches in the cell 2301-z electrically connected to the common node to the terminal 2314-z that is also electrically connected to the switch SW[n[z]+2] without a non-dissipative element intervening therebetween). As noted above, the representation in FIGS. 24B-1 through 24B-3 of the bypassing functionality with one of the bypassing switch sets does not preclude the application of bypassing with the other bypassing switch set.

FIGS. 24B-1-24B-3: Switching Sequence Methodology 2400 for Cell 2301-z

The following methodology may be applied to the remainder of the cells of the circuit 2300:

Initiating Cell [z] Phase 2412[z]-1:

The initiating cell [z] phase 2412[z]-1, which is implemented in a cell 2301-z, where 2≤z≤K, shown in FIG. 24B-1, is similar to the initiating cell [1] phase 2412[1]-1 for the cell 2301-1. As in phase 2412[1]-1, the switch SW[0] in the cell 2301-z may be closed and remain closed for the duration of the phase 2412[z]-1 until the phase ends upon the completion of the Stage 2401(r), where r=(n[z]f(z)+g(z)), after which the switch SW[0] in the cell 2301-z is opened.

The initiating cell [z] phase 2412[z]-1 has an initiating cell [z] switching pattern 2402[z]-1 that starts by closing the Switch SW[1] of cell 2301-z, thus bypassing the cell 2301-z for the duration of one stage in the methodology when the cell 2301-z is the last cell in the circuit, or otherwise for the duration of the initiating cell [z+1] switching pattern 2402[z+1]-1 of the initiating cell [z+1] phase 2412[z+1]-1 for the cell 2301-(z+1).

The initiating cell [z] switching pattern 2402[z]-1 then proceeds to incrementally close and then open the remainder of the switches in the cell 2301-z in a sequential manner in which the switch closures incrementally adds $V_{CS23[z]}$ to the output voltage of the cell 2301-z, starting with an increase of $V_{CS23[z]}$ to the cell 2301-z output voltage at the beginning of the initiating cell [z] phase and ending with an increase of $n[z]V_{CS23[z]}$ to the output voltage by the end of the initiating cell [z] phase 2412[z]-1. The incremental switching of SW[2] to SW[n[z]+1] while the switch SW[0] is closed selectively activates the sets of switches of the cell 2301-z that increase the output voltage of the cell 2301-z in an order to produce increasing amounts of output voltage increase.

The closures may be maintained for the duration of one stage in the methodology when the cell 2301-z is the last cell in the circuit 2300, or otherwise for the f(z) stages of the duration of an application of the executing cell [z+1] switching pattern 2403[z+1]-1 on the cell 2301-(z+1).

The described switching continues until switch SW[n[z]+1] of the cell 2301-z is closed from Stage 2401(r), where r={g(z)+[(n[z]-1)·f(1)]+1} to Stage 2401(r), where r=n[z]f(z)+g(z)=g(z-1), after which the initiating cell 2301-z phase 2412[z]-1 has been completed and the switches SW[0], SW[n[z]+1] of the cell 2301-z are opened.

Executing Cell [z] Phase 2413[z]-1:

The executing cell [z] phase 2413[z]-1 may proceed after the initiating cell [z] phase 2412[z]-1 is completed. As shown in FIG. 24B-2, the executing cell [z] phase 2413[z]-1 may begin with the switch SW[0] in the cell 2301-z open and the switch SW[n[z]+2] in the cell 2301-z closed. The executing cell [z] phase 2413[z]-1 may have an executing cell [z] switching pattern 2403[z]-1 that is applied h(z-1)-1 times.

The executing cell [z] switching pattern 2403[z]-1 may start by incrementally closing and opening the switches SW[1] through SW[n[z]] in the cell 2301-z in a sequential manner while the switch SW[n[z]+2] in the cell 2301-z is closed, causing an incremental reduction in the output voltage of the cell 2301-z by $V_{CS23[z]}$ (starting with a subtraction of $n[z]V_{CS23[z]}$ from output voltage of the cell 2301-(z-1) at the beginning of the executing cell [z] phase 2413[z]-1 and ending with a subtraction of $V_{CS23[z]}$ in the cell 2301-(z-1) output voltage by the end of the incremental reductions).

The incremental switching of SW[1] to SW[n[z]] while the switch SW[n[z]+2] is closed selectively activates the sets of switches of the cell 2301-z that decrease the output voltage of the cell 2301-z in an order to produce decreasing amounts of output voltage reductions. The closures may be maintained for the duration of one stage in the methodology when the cell 2301-z is the last cell in the circuit 2300, or otherwise for the f(z) stages of the duration of an application of an executing [z+1] switching pattern 2403[z+1]-1 on the cell 2301-(z+1).

At the completion of the closure of switch SW[n[z]], which occurs at the end of the Stage 2401(r), where r=g(z-1)+(n[z])·f(z), the incremental reduction of $V_{CS23[z]}$ in the output voltage of the cell 2301-z has been completed, and switch SW[n[z]] of cell 2301-z may be opened and the switch SW[n[z]+1] may be closed to bypass the cell 2301[z]-1 for the duration of one stage in the methodology when the cell 2301-z is the last cell in the circuit 2300, or otherwise for the duration of an application of an executing [z+1] switching pattern 2403[z+1]-1 on the cell 2301-(z+1).

At the completion of the bypassing of the cell 2301-z at Stage 2401(r), where r=g(z-1)+(n[z]+1)·f(z), is completed, the switch SW[n[z]+2] of cell 2301-z may be opened and the switch SW[0] may be closed and the executing cell [z] switching pattern 2403[z]-1 may proceed to incrementally close and then open the switches SW[2] through SW[n[z]+1] in the cell 2301-z in a sequential manner to incrementally add $V_{CS23[z]}$ to the output voltage of the cell 2301-z. The incremental switching of SW[2] to SW[n[z]+1] while the switch SW[0] is closed may be achieved using the methods described above in the initiating cell [z] switching pattern 2402[z]-1 to incrementally increasing the cell [i]'s output voltage starting with an increase of $V_{CS23[z]}$ to the cell 2301-z output voltage and ending with an increase of $n[z]V_{CS23[z]}$ to the output voltage. When the executing cell switching pattern has been applied h(z-1)-1 times, and the output voltage of the cell [i] at the start of the executing cell [z] phase 2413[z]-1 has been increased by $n[z]V_{CS23[z]}$, the executing cell [z] phase 2413[z]-1 has been completed.

Peaking Cell [z] Phase 2414[z]:

The peaking cell [z] phase 2414[z] may proceed after the executing cell [z] phase 2413[z]-1 is completed. As shown in FIG. 24B-3, the switch SW[0], which had been closed during the last stages of the executing cell [z] phase 2413[z]-1, has been opened and the switch SW[n[z]+2] has been closed and remains closed during the entirety of the peaking cell [z] phase 2414[z].

The peaking cell [z] phase 2414[z] has a peaking cell [z] switching pattern 2404[z] that starts as does the executing cell [z] switching pattern 2403[z]-1 by incrementally closing and opening the switches SW[1] through SW[n[z]] in the cell 2301-z in a sequential manner while the switch SW[n[z]+2] in the cell 2301-z is closed, causing an incremental reduction in the output voltage of the cell 2301-z by $V_{CS23[z]}$ (starting with a subtraction of $n[z]V_{CS23[z]}$ from the input voltage of the cell 2301-z at the beginning of the peaking cell [z] phase 2414[z] and ending with a subtraction of $V_{CS23[z]}$ from the cell 2301-z input voltage by the end of the incremental reductions.)

The incremental switching of SW[1] to SW[n[z]] while the switch SW[n[z]+2] is closed may be achieved using the methods described above in the executing cell [z] switching pattern 2403[z]−1 for incrementally decreasing the cell [z]'s output voltage.

At the completion of the closure of switch SW[n[z]], which occurs at the end of the Stage 2401(r), where r=N (K)+1−g(z−1)+n[z]·f(z), the switch SW[n[z]] may be opened and the switch SW[n[z]+1] of cell 2301-z may be closed to bypass the cell 2301-z for the duration of one stage in the methodology when the cell 2301-z is the last cell in the circuit 2300, or otherwise until the operation of the peaking [z+1] switching pattern 2404[z+1] on the cell 2301-(z+1) achieves as output voltage of the cell 2301-(z+1)'s peak voltage at Stage 2401(r), where r=N(K)+1−g(z−1)+g(z)+n[z]f(z)=N(K)+1.

General

The capacitive element driver disclosed herein may be formed of any type of transistor, including but not limited to a Metal Oxide Semiconductor Field Effect Transistor (MOSFET), a Gallium Nitride Field Effect Transistor (GaN-FET), a Silicon Carbide Field Effect Transistor (SiC-FET), a Junction Field Effect Transistor (JFET), or an Insulated Gate Bipolar Transistor (IGBT). Further, the capacitive element driver disclosed herein may be used to drive electrostatic actuators, electroactive polymer actuators, piezoelectric actuators, electroluminescent lighting/display devices, plasma display, smart film/glass based on liquid crystal technology, ultrasonic transducers, piezoelectric actuators, electronic paper displays (E-paper), and multiferroic/magnetoelectric devices.

The foregoing descriptions have been presented for purposes of illustration. They are not exhaustive and do not limit the invention to the precise forms or embodiments disclosed. In addition, although the disclosed components have been described above as being separate units, one of ordinary skill in the art will recognize that functionalities provided by one or more units may be combined. As one of ordinary skill in the art will appreciate, one or more units may be optional and may be omitted from implementations in certain embodiments. For example, in one configuration, the control processor and/or the capacitive elements, including without limitation items 730A, 730C, 730D, 730E, 1730, 1840, could be integrated into a capacitive element driver, or some or all of them could be separate electronic or electrical components that are electrically connected or connectable to the capacitive element driver. In another configuration, the control processor, control path system, and the capacitive element driver could be integrated with a voltage source and a capacitive element as separate electronics. In other embodiments, the capacitive driving circuit may form the entirety of the "capacitive element driver," with, for non-limiting example, voltage source(s) and/or the controller being electrically connected to terminals of the driver.

Modifications and adaptations of the invention will be apparent to those skilled in the art from consideration of the specification and practice of the disclosed embodiments. For example, it can be seen that the non-dissipative elements in a capacitive element driver 700A need not be limited to being electrically connected in a series configuration. For example, while one terminal of the non-dissipative element in the driver 700A is electrically and directly connected to one of the switches in the driver 700A, the second terminal of the non-dissipative element may be connected to another node between the nodes 705A[1] and 705A[n+1]. Similarly, the non-dissipative elements in a capacitive element driver 700C need not be limited to being electrically connected in a series configuration, and while one terminal of the non-dissipative element in the driver 700C is electrically and directly connected to one of the switches in the driver 700C, the second terminal of the non-dissipative element may be connected to another node between the nodes 705C[1] and 705C[n+1]. The voltages at such nodes will have the same average values as in the non-dissipative element series configuration of the drivers 700A, 700C.

Modifications and adaptations of the invention will be apparent to those skilled in the art from consideration of the specification and practice of the disclosed embodiments. It is intended that the specification and examples be considered as exemplary only, with a true scope and spirit of the invention being indicated by the following claims.

The invention claimed is:

1. A capacitive element driver for driving a capacitive element between voltage levels, the capacitive element comprising an element having capacitive functionality and the voltage supplied to the capacitive element driver by a voltage source, the capacitive element driver comprising:
   a plurality of switches having:
      a first switch electrically connectable in series directly or indirectly between a first terminal of the voltage source and an input terminal of the capacitive element, and
      a second switch electrically connectable in series directly or indirectly between a second terminal of the voltage source and the input terminal of the capacitive element; and
   a non-dissipative element arranged to store and transfer energy for driving the capacitive element between the voltage levels, wherein the non-dissipative element is electrically connectable directly or indirectly:
      at a first end to a first node between the first terminal of the voltage source and the input terminal of the capacitive element, and
      at a second end to a second node between the second terminal of the voltage source and the input terminal of the capacitive element;
   wherein the plurality of switches is arranged to open or close in combinations in a sequence of switching stages to step-wise transfer the energy to the capacitive element, the sequence of switching stages further comprising a switching pattern having a voltage change portion arranged to cause a change in an output voltage of the capacitive element driver during application thereof on the capacitive element driver.

2. The capacitive element driver of claim 1, further comprising:
   a first input terminal disposed and electrically connectable in series directly or indirectly between the first switch and the first terminal of the voltage source;
   an output terminal electrically connectable directly or indirectly to the input terminal of the capacitive element;
   a second input terminal disposed and electrically connectable in series directly or indirectly between the second switch and the second terminal of the voltage source;
   wherein the first node is disposed between the first input terminal and the output terminal and the second node is disposed between the second input terminal and the output terminal.

3. The capacitive element driver of claim 1, wherein the sequence of switching stages is arranged to maintain an average voltage level value of the non-dissipative element unchanged over time.

4. The capacitive element driver of claim 1, wherein the capacitive element driver is arranged to drive the capacitive element from a high voltage level to a low voltage level or from a low voltage level to a high voltage level.

5. The capacitive element driver of claim 1, wherein the capacitive element comprises a power switch.

6. The capacitive element driver of claim 1, further comprising a controller electrically connectable to the plurality of switches to control the operation of the switches to open or close in combinations in the sequence of switching stages.

7. The capacitive element driver of claim 6, wherein the controller is arranged to control the operation of the plurality of switches through the sequence of switching stages while maintaining the average value of the voltage level of the non-dissipative element unchanged over a complete voltage level driving cycle.

8. The capacitive element driver of claim 1, wherein the capacitive element driver is arranged to drive the capacitive element between the two voltage levels across a plurality of voltage level driving cycles.

9. The capacitive element driver of claim 1,
wherein the non-dissipative element comprises n non-dissipative elements, where n is a number greater than or equal to 1, and wherein, when n>1 and $2 \leq i \leq n$, a switch SW[i] is electrically connectable to and disposed between the input terminal of the capacitive element and a common node between an $(i-1)^{th}$ non-dissipative element and an $(i)^{th}$ non-dissipative element.

10. The capacitive element driver of claim 1,
wherein the first switch further comprises a first pair of switches electrically connectable in series between the first terminal of the voltage source and the input terminal of the capacitive element;
wherein the second switch further comprises a second pair of switches electrically connectable in series between the second terminal of the voltage source and the input terminal of the capacitive element; and
wherein the non-dissipative element is electrically connectable and disposed between a first common node of the first pair of switches and a second common node of the second pair of switches.

11. The capacitive element driver of claim 10,
wherein the non-dissipative element comprises n non-dissipative elements, where n is a number greater than or equal to 1;
wherein, when n>1 and $2 \leq i \leq n$, a switch SW[i] is electrically connectable to and disposed between the input terminal of the capacitive element and a common node between an $(i-1)^{th}$ non-dissipative element and an $(i)t^h$ non-dissipative element; and
wherein the sequence of switching stages comprises a methodology having a plurality of phases further comprising:
a first phase in which a switch SW[0] is closed, a switch SW[n+2] is open, and switches including and, if any, between a switch SW[1] and a switch SW[n+1] are closed in sequential order in a first sequence in which, starting with the switch SW[1] and ending with the switch SW[n+1], a switch SW[i] (with $1 \leq i \leq n+1$) is closed until a predetermined voltage V(i) is deliverable to the capacitive element; and
a second phase having a first sub-phase in which the switch SW[0] is open, the switch SW[n+2] is closed, and switches including and, if any, between the switch SW[1] and the switch SW[n+1] are closed in sequential order in a second sequence, in which, starting with the switch SW[1] and ending with the switch SW[n+1], a switch SW[i] (with $1 \leq i \leq n+1$) is closed until a predetermined voltage V(i+n+1) is deliverable to the capacitive element, wherein the switch SW[n+1] is closed until a supply voltage VDD is deliverable to the capacitive element.

12. The capacitive element driver of claim 11,
wherein the second phase further comprises a second sub-phase in which the switches including and, if any, between the switch SW[n+1] and the switch SW[1] are closed in a decreasing consecutive order in a third sequence, in which, starting with the switch SW[n] and ending with the switch SW[1], a switch SW[i] (with $1 \leq i \leq n$) is closed until the predetermined voltage V(i+n+1) is deliverable to the capacitive element; and
further comprising a third phase in which the switch SW[0] is closed, the switch SW[n+2] is open, and the switches including and, if any, between the switch SW[n+1] and the switch SW[1] are closed in reverse sequential order in a fourth sequence, in which, starting with the switch SW[n+1] and ending with the switch SW[2], a switch SW[i] (with $2 \leq i \leq n+1$) is closed until the predetermined voltage V(i) is deliverable to the capacitive element.

13. The capacitive element driver of claim 12, further comprising a fourth phase having a return to the first phase.

14. The capacitive element driver of claim 2, further comprising a capacitive element driving circuit;
wherein the capacitive element driver comprises a first driver cell of the capacitive element driving circuit, the plurality of switches comprises a first plurality of switches, the first input terminal comprises a first cell first input terminal, the output terminal comprises a first cell output terminal, and the non-dissipative element comprises a first cell non-dissipative element; and
wherein the capacitive element driving circuit further comprises a second driver cell electrically connectable between the first driver cell and the capacitive element, the second driver cell having:
a second cell first input terminal electrically connectable to the first cell output terminal,
a second cell output terminal electrically connectable directly or indirectly to the capacitive element;
a second plurality of switches with:
a second cell first pair of switches electrically connectable in series between the second cell first input terminal and the second cell output terminal, and
a second cell second pair of switches electrically connectable in series between the first cell output terminal and the second cell output terminal; and
a second non-dissipative element arranged to store and transfer additional energy for driving the capacitive element between the two voltage levels, and
wherein the second non-dissipative element is electrically connectable between a first common node of the second cell first pair of switches and a second common node of the second cell second pair of switches.

15. The capacitive element driver of claim 14,
wherein the sequence of switching stages comprises a first sequence of switching stages; and
wherein the second plurality of switches is arranged to open or close in combinations in a second sequence of switching stages to step-wise transfer the additional energy to the capacitive element.

16. The capacitive element driver of claim 15,
further comprising a circuit-wide sequence of switching states in which application of the first sequence of switching stages on the first driver cell is coordinated with application of the second sequence of switching stages on the second driver cell to perform the step-wise transfer of voltage; and
wherein the controller is further electrically connectable to the first plurality of switches and to the second plurality of switches to control opening or closing the first plurality of switches and the second plurality of switches based on the circuit-wide sequence of switching stages.

17. The capacitive element driver of claim 1,
wherein the voltage change portion of the switching pattern further comprises a subtraction portion arranged to cause subtraction of voltage from an input voltage of the capacitive element driver during application thereof on the capacitive element driver; and
wherein the switching pattern further comprises a bypass portion:
arranged to be applied to the capacitive element driver after application of the subtraction portion on the capacitive element driver, and
arranged to cause bypassing of the capacitive element driver during application thereof on the capacitive element driver.

18. The capacitive element driver of claim 17, wherein the switching pattern further has a second subtraction portion:
arranged to be applied to the capacitive element driver after application of the bypass portion on the capacitive element driver, and
arranged to cause another subtraction of voltage from the input voltage of the capacitive element driver during application thereof on the capacitive element driver.

19. The capacitive element driver of claim 1,
wherein the switching pattern further comprises a bypass portion arranged to cause bypassing of the capacitive element driver during application thereof on the capacitive element driver; and
wherein the voltage change portion of the switching pattern further comprises an addition portion:
arranged to be applied to the capacitive element driver after application of the bypass portion on the capacitive element driver, and
arranged to cause addition of voltage to an input voltage of the capacitive element driver during application thereof on the capacitive element driver.

20. The capacitive element driver of claim 19, wherein the switching pattern further comprises a second addition portion:
arranged to be applied to the capacitive element driver before application of the bypass portion on the capacitive element driver, and
arranged to cause another addition of voltage to the input voltage of the capacitive element driver during application thereof on the capacitive element driver.

21. The capacitive element driver of claim 1,
wherein the switching pattern further comprises a bypass portion arranged to cause bypassing of the capacitive element driver during application thereof on the capacitive element driver; and
wherein the voltage change portion of the switching pattern further comprises a subtraction portion:
arranged to be applied to the capacitive element driver after application of the bypass portion on the capacitive element driver, and
arranged to cause subtraction of voltage from an input voltage of the capacitive element driver during application thereof on the capacitive element driver.

22. The capacitive element driver of claim 21, wherein the switching pattern further comprises an addition portion:
arranged to be applied to the capacitive element driver before application of the bypass portion on the capacitive element driver, and
arranged to cause addition of voltage to the input voltage of the capacitive element driver during application thereof on the capacitive element driver.

23. The capacitive element driving circuit of claim 1,
wherein the voltage change portion of the switching pattern further comprises an addition portion arranged to cause addition of voltage to an input voltage of the capacitive element driver during application thereof on the capacitive element driver; and
wherein the switching pattern further comprises a bypass portion:
arranged to be applied to the capacitive element driver after application of the addition portion on the capacitive element driver, and
arranged to cause bypassing of the capacitive element driver during application thereof on the capacitive element driver.

24. The capacitive element driver of claim 19, wherein the switching pattern further comprises a subtraction portion:
arranged to be applied to the capacitive element driver before application of the bypass portion on the capacitive element driver, and
arranged to cause subtraction of voltage from the input voltage of the capacitive element driver during application thereof on the capacitive element driver.

25. The driver cell of claim 14, wherein the switches are arranged to open or close in combinations to step-wise transfer the energy to the capacitive element.

26. The capacitive element driver of claim 15, wherein the first sequence of switching stages and the second sequence of switching stages are operable in cooperation with each other such that an application of a first portion of the first pattern of switch activation on the first driver cell is sustained for duration of the application of the second pattern of switch activation on the second driver cell.

27. A driver cell in a capacitive element driving circuit electrically connectable between a capacitive element and a voltage source arranged to supply a selected voltage to the capacitive element driving circuit, the capacitive element comprising an element having capacitive functionality, and the driver cell arranged to drive the capacitive element between two voltage levels, wherein the driver cell comprises:
a first input terminal electrically connectable directly or indirectly to a first terminal of the voltage source;
an output terminal electrically connectable directly or indirectly to an input terminal of the capacitive element;
a second input terminal electrically connectable directly or indirectly to a second terminal of the voltage source;
a plurality of switches further having
a first switch electrically connectable in series between the first input terminal of the driver cell and the output terminal of the driver cell, and
a second switch electrically connectable in series between the second input terminal of the driver cell and the output terminal of the driver cell; and a non-dissipative element arranged to store and transfer energy for driving the capacitive element between the two voltage levels, wherein the non-dissipative element is electrically connectable:
at a first end to a first node between the first input terminal and the output terminal, and
at a second end to a second node between the second input terminal and the output terminal;
wherein the plurality of switches is arranged to open or close in combinations in a sequence of switching stages while maintaining an average voltage level value of the non-dissipative element unchanged over time, the sequence of switching stages further comprising a switching pattern having a voltage change portion arranged to cause a change in an output voltage of the capacitive element driver during application thereof on the capacitive element driver.

28. The driver cell of claim 27, wherein the first input terminal is electrically connectable to an output terminal of an additional driver cell that is electrically connectable directly or indirectly to the first terminal of the voltage source.

29. The driver cell of claim 28, further comprising an input common node between the first input terminal and the second input terminal, wherein the input common node is electrically connectable to an output terminal of the additional driver cell.

30. The driver cell of claim 27, wherein the output terminal is electrically connectable to an additional driver cell that is electrically connectable directly or indirectly to the input terminal of the capacitive element.

31. The driver cell of claim 27, further comprising a controller electrically connectable to the plurality of switches to control the operation of the switches to open or close in the combinations in the sequence of switching stages.

32. A capacitive element driver for driving a capacitive element between two voltage levels, the capacitive element comprising an element having capacitive functionality, and the capacitive element driver comprising a first circuit having:
a first circuit first voltage-receiving connection electrically connectable directly or indirectly to a first terminal of a voltage source for receiving the selected voltage from the voltage source;
a first circuit voltage-outputting connection electrically connectable directly or indirectly to an input terminal of the capacitive element;
a first circuit second voltage-receiving connection electrically connectable directly or indirectly to a second terminal of the voltage source; and
a first circuit non-dissipative element arranged to store and transfer energy for driving the capacitive element between the two voltage levels, wherein the first circuit non-dissipative element is electrically connectable:
at a first end to a first circuit first node between the first circuit first voltage-receiving connection and the first circuit voltage-outputting connection, and
at a second end to a first circuit second node between the first circuit second voltage-receiving connection and the first circuit voltage-outputting connection;
wherein the first circuit is arranged to step-wise transfer energy directly or indirectly to the capacitive element from a first high voltage level to a first low voltage level or from the first low voltage level to the first high voltage level; and
wherein the first circuit is arranged to perform the step-wise transfer through operation of a first sequence of switching stages on the first circuit non-dissipative element, the first sequence of switching stages further comprising a switching pattern having a voltage change portion arranged to cause a change in an output voltage of the capacitive element driver during application thereof on the capacitive element driver.

33. The capacitive element driver of claim 32, wherein the first circuit further comprises a first plurality of switches with:
a first circuit first switch electrically connectable in series between the first circuit first voltage-receiving connection and the first circuit voltage-outputting connection; and
a first circuit second switch electrically connectable in series between the first circuit second voltage-receiving connection and the first circuit voltage-outputting connection; and
wherein the first circuit is further arranged to maintain an average voltage level value of the first circuit non-dissipative element unchanged over time while operating the first capacitive element driver through the first sequence of switching stages.

34. The capacitive element driver of claim 33, further comprising a controller electrically connectable to the first plurality of switches to control the operation thereof to open or close in the combinations in the first sequence of switching stages.

35. The capacitive element driver of claim 32, wherein the capacitive element driver comprises a multi-cell capacitive element driving circuit, with
the first circuit comprising a first driver cell,
the first circuit first voltage-receiving connection having a first cell first input terminal directly or indirectly connectable to the first terminal of the voltage source,
the first circuit voltage-outputting connection having a first cell output terminal directly or indirectly connectable to the input terminal of the capacitive element,
the first circuit second voltage-receiving connection having a first cell second input terminal directly or indirectly connectable to the second terminal of the voltage source,
the first circuit first node comprising a first cell first node disposed between the first cell first input terminal and the first cell output terminal,
the first circuit second node comprising a first cell second node disposed between the first cell second input terminal and the first cell output terminal,
the first circuit non-dissipative element comprising a first cell non-dissipative element electrically connected at the first end to the first cell first node, and at the second end to the first cell second node;
further comprising a second driver cell having:
a second cell first input terminal electrically connectable to the first cell output terminal,
a second cell output terminal electrically connectable directly or indirectly to the capacitive element,
a second cell second input terminal electrically connectable to the first cell output terminal, and
a second cell non-dissipative element arranged to store and transfer additional energy for driving the capacitive element between the two voltage levels, wherein the second cell non-dissipative element is electrically connectable:

at one end to a second cell first node disposed between the second cell first input terminal and the second cell output terminal, and at another end to a second cell second node disposed between the second cell second input terminal and the second cell output terminal;

wherein the second driver cell is arranged to step-wise transfer the additional energy directly or indirectly to the capacitive element from a second high voltage level to a second low voltage level or from the second low voltage level to the second high voltage level; and wherein the second driver cell is arranged to step-wise transfer the additional energy through operation of a second sequence of switching stages on the second cell non-dissipative element.

36. The capacitive element driver of claim 35,
wherein the first driver cell further comprises a first plurality of switches with:
a first cell first switch electrically connectable in series between the first cell first input terminal and the first cell output terminal; and
a first cell second switch electrically connectable in series between the first cell second input terminal and the first cell output terminal;
wherein the second driver cell further comprises a second plurality of switches with:
a second cell first pair of switches electrically connectable in series between the second cell first input terminal and the second cell output terminal; and
a second cell second pair of switches electrically connectable in series between the second cell second input terminal and the second cell output terminal; and
wherein the first sequence of switching stages is arranged to cause the first plurality of switches to open or close in combinations while an average voltage level value of the first cell non-dissipative element is maintained unchanged over time;
wherein the second sequence of switching stages is arranged to cause the second plurality of switches to open or close in combinations while an average voltage level value of the second cell non-dissipative element is maintained unchanged over time; and
wherein the first sequence of switching stages and the second sequence of switching stages together comprise a circuit-wide sequence of switching stages to drive the capacitive element between the two voltage levels, with the first sequence of switching stages and the second sequence of switching stages operable in cooperation with each other such that an application of a first portion of a first pattern of switching activations of the first driver cell is sustained for duration of an application of a second pattern of switching activations of the second driver cell.

37. The capacitive element driver of claim 36, further comprising a controller electrically connectable to the first plurality of switches and the second plurality of switches to control the operation thereof to open or close in the combinations in the circuit-wide sequence of switching stages.

38. The capacitive element driver of claim 35,
wherein the first driver cell has a first number of first cell non-dissipative elements and the second driver cell has a second number of second cell non-dissipative elements, and
wherein the first number of first cell non-dissipative elements is different from the second number of second cell non-dissipative elements.

39. The capacitive element driver of claim 35,
wherein the first driver cell has a first number of first cell non-dissipative elements and the second driver cell has a second number of second cell non-dissipative elements, and
wherein the first number of first cell non-dissipative elements is the same as the second number of second cell non-dissipative elements.

40. The capacitive element driver of claim 32,
wherein the capacitive element driver further has one or more driver cells electrically connectable in series,
with the first circuit comprising a first driver cell electrically and directly or indirectly connectable to the voltage source and to input terminals of an additional driver cell, the first driver cell having:
a first cell first input terminal directly or indirectly connected to the first terminal of the voltage source,
a first cell output terminal directly or indirectly connected to the input terminal of the capacitive element,
a first cell second input terminal directly or indirectly connected to the second terminal of the voltage source,
a first cell non-dissipative element arranged to store and transfer energy for driving the capacitive element between the two voltage levels, wherein the first cell non-dissipative element is electrically connectable:
at its first end to a first cell first node between the first cell first input terminal and the first cell output terminal, and
at its second end to a first cell second node between the first cell second input terminal and the first cell output terminal; and
with the additional driver cell electrically connectable directly or indirectly to the capacitive element;
the additional driver cell having:
an additional cell first input terminal electrically connectable to the first cell output terminal;
an additional cell output terminal electrically connectable directly or indirectly to an input terminal of the capacitive element;
an additional cell second input terminal electrically connectable to the first cell output terminal;
an additional cell first node disposed between the additional cell first input terminal and the additional cell output terminal;
an additional cell second node disposed between the additional cell second input terminal and the additional cell output terminal; and
a first additional cell non-dissipative element arranged to store and transfer additional energy for driving the capacitive element between two additional voltage levels, wherein the additional cell non-dissipative element is electrically connectable:
at one end to the additional cell first node and
at another end to the additional cell second node; and;
wherein the additional driver cell is arranged to supply an additional step-wise transfer of the additional energy directly or indirectly to the capacitive element from an additional high voltage level to an additional low voltage level or from the additional low voltage level to the additional high voltage level; and
wherein the additional driver cell is arranged to supply the additional step-wise transfer of the additional energy through operation of an additional sequence of switching stages on the additional cell non-dissipative element.

41. The capacitive element driver of claim 32, wherein the first sequence of switching stages has an executing pattern of switch activation in the first circuit comprising subtracting a specified voltage from an input voltage of the first circuit, bypassing the first circuit, and adding the specified voltage to the input voltage of the first circuit.

42. The capacitive element driver of claim 40,
wherein the additional driver cell has an additional driver cell input common node between the additional cell first input terminal and the additional cell second input terminal, and
wherein the additional cell input common node is electrically connectable to the first cell output terminal.

43. The capacitive element driver of claim 32, wherein a first cell output terminal is electrically connectable to an input terminal of an additional driver cell having an additional cell output terminal that is electrically connectable directly or indirectly to the input terminal of the capacitive element.

44. The capacitive element driver of claim 32,
wherein the capacitive element driver comprises a multi-cell capacitive element driving circuit having one or more driver cells electrically connectable in series,
wherein one driver cell of the one or more driver cells has a one driver cell input common node between a one driver cell first input terminal and a one driver cell second input terminal,
wherein the one driver cell input common node is electrically connectable to an output terminal of another driver cell, and
wherein the first circuit comprises the one driver cell or the another driver cell.

45. The capacitive element driver of claim 32,
wherein the voltage change portion further comprises a subtraction portion arranged to cause subtraction of voltage from an input voltage of the first circuit during application thereof on the first circuit; and
wherein the switching pattern further comprises a bypass portion:
arranged to be applied to the first circuit after application of the subtraction portion on the first circuit, and
arranged to cause bypassing of the first circuit during application thereof on the first circuit.

46. The capacitive element driving circuit of claim 45, wherein the switching pattern further has a second subtraction portion:
arranged to be applied to the first circuit after application of the bypass portion on the first circuit, and
arranged to cause another subtraction of voltage from the input voltage of the first circuit during application thereof on the first circuit.

47. The capacitive element driving circuit of claim 32,
wherein the switching pattern further comprises a bypass portion arranged to cause bypassing of the first circuit during application thereof on the first circuit;
wherein the voltage change portion of the switching pattern further comprises an addition portion:
arranged to be applied to the first circuit after application of the bypass portion on the first circuit, and
arranged to cause addition of voltage to an input voltage of the first circuit during application thereof on the first circuit.

48. The capacitive element driving circuit of claim 47, wherein the switching pattern further comprises a second addition portion:
arranged to be applied to the first circuit before application of the bypass portion on the first circuit, and
arranged to cause another addition of voltage to the input voltage of the first circuit during application thereof on the capacitive element driver.

49. The capacitive element driver of claim 32,
wherein the switching pattern further comprises a bypass portion arranged to cause bypassing of the capacitive element driver during application thereof on the capacitive element driver; and
wherein the voltage change portion of the switching pattern further comprises a subtraction portion:
arranged to be applied to the capacitive element driver after application of the bypass portion on the capacitive element driver, and
arranged to cause subtraction of voltage from an input voltage of the capacitive element driver during application thereof on the capacitive element driver.

50. The capacitive element driver of claim 49, wherein the switching pattern further comprises an addition portion:
arranged to be applied to the capacitive element driver before application of the bypass portion on the capacitive element driver, and
arranged to cause addition of voltage to the input voltage of the capacitive element driver during application thereof on the capacitive element driver.

51. The capacitive element driver of claim 32,
wherein the switching pattern further comprises an addition portion arranged to cause addition of voltage to an input voltage of the capacitive element driver during application thereof on the capacitive element driver; and
wherein the switching pattern further comprises a bypass portion:
arranged to be applied to the capacitive element driver after application of the addition portion on the capacitive element driver, and
arranged to cause bypassing of the capacitive element driver during application thereof on the capacitive element driver.

52. A capacitive element driving circuit, comprising a capacitive element driver arranged to drive a capacitive element between two voltage levels, the capacitive element having capacitive functionality:
wherein the capacitive element driver is electrically connectable directly or indirectly to a first terminal of a voltage source for delivering a first voltage level to the capacitive element driver, and is electrically connectable directly or indirectly to a second terminal of the voltage source for delivering a second voltage level to the capacitive element driver;
wherein the capacitive element driver has:
a non-dissipative element arranged to store and transfer energy, directly or indirectly through an output terminal of the capacitive element driver, for driving the capacitive element between the two voltage levels; and
a plurality of switches electrically connectable directly or indirectly to the non-dissipative element and arranged to open or close in combinations in a sequence of switching stages to deliver an output voltage of the capacitive element driver that incrementally changes from the first voltage level to the second voltage level while maintaining an average voltage level value of the non-dissipative element unchanged over time, the sequence of switching stages further comprising a pattern of switch activation in the capacitive element driver having a voltage change portion arranged to cause a change in an output voltage of the capacitive element driver during application thereof on the capacitive element driver.

53. The capacitive element driving circuit of claim 52, wherein the pattern of switch activation further comprises a bypass portion arranged to cause bypassing of the capacitive element driver during application thereof on the capacitive element driver; and
wherein the voltage change portion of the pattern of switch activation further comprises an addition portion:
arranged to be applied to the capacitive element driver after application of the bypass portion on the capacitive element driver, and
arranged to cause addition of voltage to an input voltage of the capacitive element driver during application thereof on the capacitive element driver.

54. The capacitive element driving circuit of claim 53, wherein the pattern of switch activation further comprises a second addition portion:
arranged to be applied to the capacitive element driver before application of the bypass portion on the capacitive element driver, and
arranged to cause another addition of voltage to the input voltage of the capacitive element driver during application thereof on the capacitive element driver.

55. The capacitive element driver circuit of claim 53, wherein the pattern of switch activation further comprises a subtraction portion:
arranged to be applied to the capacitive element driver before application of the bypass portion on the capacitive element driver, and
arranged to cause subtraction of voltage from the input voltage of the capacitive element driver during application thereof on the capacitive element driver.

56. The capacitive element driving circuit of claim 52, wherein the pattern of switch activation further comprises a bypass portion arranged to cause bypassing of the capacitive element driver during application thereof on the capacitive element driver; and
wherein the voltage change portion of the pattern of switch activation further comprises a subtraction portion:
arranged to be applied to the capacitive element driver after application of the bypass portion on the capacitive element driver, and
arranged to cause subtraction of voltage from an input voltage of the capacitive element driver during application thereof on the capacitive element driver.

57. The capacitive element driving circuit of claim 56, wherein the pattern of switch activation further has a second subtraction portion:
arranged to be applied to the capacitive element driver before application of the bypass portion on the capacitive element driver, and
arranged to cause another subtraction of voltage from the input voltage of the capacitive element driver during application thereof on the capacitive element driver.

58. The capacitive element driving circuit of claim 56, wherein the pattern of switch activation further comprises an addition portion:
arranged to be applied to the capacitive element driver before application of the bypass portion on the capacitive element driver, and
arranged to cause addition of voltage to the input voltage of the capacitive element driver capacitive element during application thereof on the capacitive element driver.

59. The capacitive element driving circuit of claim 52, wherein the capacitive element driver further comprises a first driver cell with the output terminal comprising a first cell output terminal, the plurality of switches comprising a first plurality of switches, the sequence of switching stages comprising a first sequence of switching stages having a first pattern of switch activation;
further comprising a second driver cell connected in series with the first driver cell in the capacitive element driving circuit and positioned between the first driver cell and the capacitive element,
wherein the second driver cell is electrically and directly connectable to the first cell output terminal, and
wherein the second driver cell has a second plurality of switches arranged to open or close in combinations in a second sequence of switching stages, wherein the second sequence of switching stages has a second pattern of switch activation, and
wherein the first sequence of switching stages and the second sequence of switching stages are operable in cooperation with each other such that an application of a first portion of the first pattern of switch activation on the first driver cell is sustained for duration of the application of the second pattern of switch activation on the second driver cell.

60. The capacitive element driver circuit of claim 52:
wherein the capacitive element driver further comprises a first driver cell with the output terminal comprising a first cell output terminal;
further comprising a second driver cell adjacent to the first driver cell in the capacitive element driving circuit and positioned between the first driver cell and the capacitive element,
wherein the second driver cell has:
a second cell first input terminal indirectly electrically connectable to the first terminal of the voltage source, and
a second cell second input terminal indirectly electrically connectable to the second terminal of the voltage source; and
wherein the second cell first input terminal and the second cell second input terminal are electrically connectable to the first cell output terminal through a common node between the second cell first input terminal and the second cell second input terminal.

61. The capacitive element driving circuit of claim 52, wherein the voltage change portion of the pattern of switch activation further comprises a subtraction portion arranged to cause subtraction of voltage from an input voltage of the capacitive element driver during application thereof on the capacitive element driver; and
wherein the pattern of switch activation further comprises a bypass portion:
arranged to be applied to the capacitive element driver after application of the subtraction portion on the capacitive element driver, and arranged to cause bypassing of the capacitive element driver during application thereof on the capacitive element driver.

62. The capacitive element driving circuit of claim 52, wherein the voltage change portion of the pattern of switch activation further comprises an addition portion arranged to cause addition of voltage to an input voltage of the capacitive element driver during application thereof on the capacitive element driver; and wherein the pattern of switch activation further comprises a bypass portion:
  arranged to be applied to the capacitive element driver after application of the addition portion on the capacitive element driver, and
  arranged to cause bypassing of the capacitive element driver during application thereof on the capacitive element driver.

63. The capacitive element driving circuit of claim 52, wherein the switches are arranged to open or close in combinations to step-wise transfer the energy to the capacitive element.

64. A process for driving a capacitive element between two voltage levels, the process comprising:
  electrically connecting a first voltage-receiving connection of a first capacitive element driver directly or indirectly to a first terminal of a voltage source;
  electrically connecting a voltage-outputting connection of the first capacitive element driver directly or indirectly to an input terminal of the capacitive element;
  electrically connecting a second voltage-receiving connection of the first capacitive element driver directly or indirectly to a second terminal of the voltage source; and
  storing energy in a non-dissipative element of the first capacitive element driver, the non-dissipative element:
    electrically connectable at a first end to a first node disposed between the first voltage-receiving connection and the voltage-outputting connection, and
    electrically connectable at a second end to a second node disposed between the second voltage-receiving connection and the voltage-outputting connection, and
  operating the first capacitive element driver through a first sequence of switching stages, wherein the first sequence is arranged:
    to transfer the energy in a first set of voltage steps directly or indirectly to the capacitive element from a first high voltage level to a first low voltage level or from the first low voltage level to the first high voltage level, and
    to cause a change in an output voltage of the capacitive element driver during application on the capacitive element driver of a voltage change portion of a switching pattern in the first sequence.

65. The process of claim 64, further comprising maintaining an average voltage level value of the non-dissipative element unchanged over time while operating the first capacitive element driver through the first sequence of switching stages.

66. The process of claim 64,
  wherein the first capacitive element driver further comprises a first driver cell, with:
    the first voltage-receiving connection having a first cell first input terminal directly or indirectly connected to the first terminal of the voltage source,
    the voltage-outputting connection having a first cell output terminal directly or indirectly connected to the input terminal of the capacitive element,
    the second voltage-receiving connection having a first cell second input terminal directly or indirectly connected to the second terminal of the voltage source,
    the first node comprising a first cell first node disposed between the first cell first input terminal and the first cell output terminal,
    the second node comprising a first cell second node disposed between the first cell second input terminal and the first cell output terminal; and
    the non-dissipative element comprising a first cell non-dissipative element electrically connectable at the first end to the first cell first node, and electrically connectable at the second end to the first cell second node; and
  further comprising:
    electrically connecting a second driver cell between the first driver cell and the capacitive element by:
      electrically connecting a second cell first input terminal of the second driver cell directly or indirectly to the first terminal of the voltage source through the first driver cell,
      electrically connecting a second cell output terminal of the second driver cell directly or indirectly to the input terminal of the capacitive element, and
      electrically connecting a second cell second input terminal of the second driver cell directly or indirectly to a second terminal of the voltage source through the first driver cell;
    storing additional energy in a second cell non-dissipative element of the second driver cell, the second cell non-dissipative element:
      electrically connectable at one end to a second cell first node disposed between the second cell first input terminal and the second cell output terminal, and
      electrically connectable at another end to a second cell second node disposed between the second cell second input terminal and the second cell output terminal, and
    operating the second driver cell through a second sequence of switching stages,
      the second sequence transferring the additional energy in a second set of voltage steps directly or indirectly to the capacitive element from a second high voltage level to a second low voltage level or from the second low voltage level to the second high voltage level, and
      the second driver cell operating through the second sequence of switching stages in combination and cooperation with the first driver cell operating through the first sequence of switching stages, the cooperation further comprising sustaining an application of a first portion of a first pattern of activations of the first driver cell for duration of an application of a second pattern of activations of the second driver cell.

67. The process of claim 64, further comprising opening or closing the switches in combinations to step-wise transfer the energy to the capacitive element.

* * * * *

UNITED STATES PATENT AND TRADEMARK OFFICE
CERTIFICATE OF CORRECTION

PATENT NO. : 11,575,376 B2
APPLICATION NO. : 17/032409
DATED : February 7, 2023
INVENTOR(S) : Tsz Yin Man, Chi Fan Yung and Bruce C. Larson It is certified that error appears in the above-identified patent and that said Letters Patent is hereby corrected as shown below:

In the Claims

Column 92, Line 12: in Claim 23, Line 1: delete "The capacitive element driving circuit of claim 1" and replace with -- The capacitive element driver of claim 1 --;

Column 97, Line 49: in Claim 46, Line 1: delete "The capacitive element driving circuit of claim 45" and replace with -- The capacitive element driver of claim 45 --;

Column 97, Line 57: in Claim 47, Line 1: delete "The capacitive element driving circuit of claim 32" and replace with -- The capacitive element driver of claim 32 --;

Column 98, Line 1: in Claim 48, Line 1: delete "The capacitive element driving circuit of claim 47" and replace with -- The capacitive element driver of claim 47 --.

Signed and Sealed this
Ninth Day of July, 2024

Katherine Kelly Vidal
*Director of the United States Patent and Trademark Office*